(12) United States Patent
Kodama et al.

(10) Patent No.: US 7,189,492 B2
(45) Date of Patent: Mar. 13, 2007

(54) PHOTOSENSITIVE COMPOSITION AND PATTERN FORMING METHOD USING THE SAME

(75) Inventors: Kunihiko Kodama, Shizuoka (JP); Kenji Wada, Shizuoka (JP); Kenichiro Satoh, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/937,270

(22) Filed: Sep. 10, 2004

(65) Prior Publication Data

US 2005/0095532 A1 May 5, 2005

(30) Foreign Application Priority Data

| Sep. 10, 2003 | (JP) | ............ P.2003-318276 |
| Sep. 19, 2003 | (JP) | ............ P.2003-327608 |
| Sep. 25, 2003 | (JP) | ............ P.2003-333503 |

(51) Int. Cl.
*G03F 7/004* (2006.01)
*G03F 7/30* (2006.01)

(52) U.S. Cl. .............. 430/270.1; 430/326; 430/905; 430/907; 430/910

(58) Field of Classification Search ............ 430/270.1, 430/905, 907, 910, 326
See application file for complete search history.

(56) References Cited

U.S. PATENT DOCUMENTS 5,965,319 A * 10/1999 Kobayashi .............. 430/176
6,492,091 B2 * 12/2002 Kodama et al. .......... 430/270.1
6,514,656 B1 * 2/2003 Nakamura et al. ......... 430/157
2002/0001770 A1 1/2002 Cameron

FOREIGN PATENT DOCUMENTS

| EP | 1 199 603 A1 | 4/2002 |
| JP | 9-73173 A | 3/1997 |
| JP | 9-90637 A | 4/1997 |
| JP | 9-309874 A | 12/1997 |
| JP | 11-109632 A | 4/1998 |
| JP | 2776273 B2 | 5/1998 |
| JP | 10-161313 A | 6/1998 |
| JP | 10-207069 A | 8/1998 |
| JP | 10-254139 A | 9/1998 |
| JP | 10-274852 A | 10/1998 |
| JP | 3042618 B2 | 3/2000 |
| JP | 2000-137327 A | 5/2000 |
| JP | 2000-241964 A | 9/2000 |
| JP | 2001-109154 A | 4/2001 |
| JP | 2001-188351 A | 7/2001 |
| JP | 2001-215704 A | 8/2001 |
| JP | 2002-296783 A | 10/2002 |
| WO | WO 02/082185 A1 | 10/2002 |
| WO | WO 2004/107051 A2 | 12/2004 |

OTHER PUBLICATIONS

XP-002314167—abstract—Derwent Publications Ltd. (1998) Matsushita Denki Sangyo.
European Search Report dated Feb. 7, 2005.

* cited by examiner

*Primary Examiner*—John S. Chu
(74) *Attorney, Agent, or Firm*—Sughrue Mion, PLLC

(57) ABSTRACT

A photosensitive composition containing a compound capable of generating a specific acid having the plural number of sulfonic groups by irradiation with an actinic ray or a radiation and a pattern forming method using the same.

23 Claims, No Drawings

PHOTOSENSITIVE COMPOSITION AND PATTERN FORMING METHOD USING THE SAME

BACKGROUND OF THE INVENTION

1. Field of the Invention

The present invention relates to a photosensitive composition which causes reaction by irradiation with an actinic ray or a radiation, whereby its property changes. In more detail, the invention relates to a resist composition to be used in the manufacturing step of semiconductors such as IC, the manufacture of circuit boards such as liquid crystals and thermal heads, and other fabrication steps.

2. Description of the Related Art

A chemically amplified resist composition is a pattern forming material of forming an acid in an exposed area by irradiation with the radiation such as far ultraviolet light and changing the solubility in a developer between the actinic ray-irradiated area and the non-irradiated area due to a reaction using the formed acid as a catalyst, to form a pattern on a substrate.

In the case where a KrF excimer laser is an exposure light source, since a resin comprising as a basic skeleton poly(hydroxystyrene) exhibiting low absorption mainly in a region of 248 nm is used as the major component, this chemically amplified system is able to form a good pattern at high sensitivity and high resolution and is a good system as compared with a conventional naphthoquinonediazide/novolak resin system.

On the other hand, in the case where a light source having a shorter wavelength, for example, an ArF excimer laser (193 nm), is used as an exposure light source, since an aromatic group-containing compound exhibits high absorption substantially in a region of 193 nm, even the foregoing chemically amplified system was not satisfactory yet.

For this reason, a resist for ArF excimer laser containing a resin having an alicyclic hydrocarbon structure has been developed.

With respect to an acid generating agent which is the major constitutional component of a chemically amplified resist, a variety of compounds have been found. JP-A-9-309874 describes a positive photosensitive composition containing a divalent arylsulfonic acid sulfonium salt or iodonium salt.

However, performances such as an exposure margin in which the performance changes due to a fine change of the exposure amount and density dependency in which the performance changes due to the pattern density such as a dense pattern and an isolated pattern are not satisfactory yet, and therefore, improvements have been demanded.

Also, in a resin having an alicyclic hydrocarbon structure, the system becomes extremely hydrophobic as an evil influence of the alicyclic hydrocarbon structure. Therefore, development with a tetramethylammonium hydroxide (herein-after referred to as "TMAH") aqueous solution that has hitherto been widely used as a resist developer becomes difficult. Also, there is observed a phenomenon in which a resist peels away from a substrate during the development.

For example, JP-A-9-73173 and JP-A-10-161313 describe resist materials using an acid sensitive compound containing an alkali-soluble group protected by an alicyclic group-containing structure and a structural unit such that the alkali-soluble group is eliminated by an acid, thereby making the compound alkali-soluble. These materials are of an excellent design from which a hydrophilic/hydrophobic contrast is obtained because the structure containing a hydrophobic alicyclic group is eliminated. However, these materials were not satisfactory yet with respect to the developability with a TMAH aqueous solution and peeling of a resist from a substrate during the development. For this reason, there have been various investigations with respect to the introduction of a hydrophilic group into a resin having an alicyclic hydrocarbon site introduced thereinto.

Japanese Patent No. 2,776,273 and JP-A-11-109632 describe the use of a resin containing a polar group-containing alicyclic functional group and an acid decomposable group in a radiation sensitive material.

Also, JP-A-9-90637, JP-A-10-207069, JP-A-10-274852, JP-A-2001-188351, and Japanese Patent No. 3,042,618 describe photoresist compositions containing a polymer obtained by copolymerizing a (meth)acrylate derivative having a lactone structure with other polymerizable compound.

Also, JP-A-2001-109154, JP-A-2000-137327, JP-A-2002-296783, and JP-A-2001-215704 describe positive working photoresist compositions containing a copolymer resin of the foregoing lactone monomer and a monomer having a hydroxyadamantane structure as a polar group-containing alicyclic functional group.

As described previously, though there have been investigated a variety of measures for improving the hydrophobicity of the resin, the foregoing techniques involve a lot of unsatisfactory points, and improvements are desired. In particular, in forming a fine pattern with a line width of not more than 100 nm, it is required that a resist composition does not depend upon the coverage of a mask (rate of an exposed area to an unexposed area) or the pitch of a pattern, i.e., the presence of pattern density, and is hardly influenced by a change of the pattern forming condition (exposure amount and focus) (that is, the process window is wide). However, in the foregoing compositions, there was still room for improvements regarding the process window.

Also, in the resist for ArF excimer laser containing a resin having an alicyclic hydrocarbon structure, there was encountered such a problem that in forming a fine pattern with a line width of not more than 100 nm, the resist pattern collapses so that the subsequent processing of a substrate by dry etching cannot be achieved. This problem becomes remarkable as the processed line width becomes fine. Thus, a resist capable of forming a fine pattern without causing collapse is demanded.

Also, under the circumstance where it is necessary to form a fine pattern with a line width of not more than 100 nm, in particular, in forming an isolated pattern, it becomes difficult to ensure the focus latitude, i.e., the depth of focus (DOF). Thus, a resist composition having a wider DOF performance is demanded.

In forming a resist pattern from a resist composition, the composition is in general used upon dissolution in a proper solvent. In this regard, the precision, resolution, etc. of the resulting resist pattern are also largely influenced by the kind or combination of the solvent to be used in forming a resist pattern. Moreover, when the composition in the solution state is coated (especially, rotary coated) on a substrate, there was a problem that the surface of the coated resist film is not always satisfactorily uniform so that the uniformity in film thickness is not satisfactory.

Hitherto, for the solution of a chemical amplification type radiation sensitive composition, various solvents such as ethers, glycol ethers, glycol ether acetates, cellosolve esters, aromatic hydrocarbons, ketones, and esters have been used, and their kinds include many different materials. Also, the characteristics of the resist pattern are closely related to the composition to be used.

For example, JP-A-10-254139 describes a radiation sensitive resin composition comprising (A) an alkali-insoluble or sparingly alkali-soluble acid-cleavable group-containing resin having an alicyclic skeleton in the principal chain and/or the side chain, the resin becoming alkali-soluble upon cleavage of the acid-cleavable group, (B) a radiation sensitive acid generating agent capable of generating an acid by irradiation with the radiation, and (C) a solvent comprising a mixture of a cyclic ketone or at least one kind selected from the group consisting of propylene glycol monoalkyl ether acetates and alkyl 2-hydroxypropionates and a linear ketone, the radiation sensitive resin composition being excellent with respect to transparency against the radiation, dry etching resistance, uniformity in film thickness, adhesion to a substrate, sensitivity, resolution, developability, and the like.

Also, JP-A-2000-241964 describes that a photoresist composition containing a ketone based solvent such as cyclohexanone, isobutyl methyl ketone, 2-heptanone, 3-heptanone, 4-heptanone, cyclopentanone, 2-methylcyclopentanone, 3-methylcyclopentanone, 2-methylcyclohexanone, 3-methylcyclohexanone, and 2,4-dimethylpentanone exhibits shear thinning property and that even in an atmosphere where an amine in a high concentration is present, an excellent photoresist fine pattern can be obtained without adding another step for the removal of the amine, whereby a reduction of the costs can be achieved.

However, the application range of the contents disclosed in these documents is not always wide, and it is the actual situation that it is quite difficult to find out an adequate solvent or combinations thereof corresponding to the composition containing a resin, a photo acid generating agent, additives, and the like from the viewpoint of the overall performance as a resist. Further, in forming a fine pattern with a line width of not more than 100 nm, improvements in the defocus latitude performances regarding the prevention from pattern collapse and isolated line pattern of the resist were still demanded.

SUMMARY OF THE INVENTION

Accordingly, an object of the invention is to provide an excellent photosensitive composition having a wide exposure margin and little density dependency.

Further, another object of the invention is to provide a positive working resist composition that is low in the generation of pattern collapse in the formation of a fine pattern of not more than 110 nm and wide in the defocus latitude (DOF) in the formation of an isolated line pattern, or a positive working resist composition capable of ensuring a wide process window in the formation of isolated line and dense patterns, and a pattern forming method using the same.

The invention has the following constructions, and the foregoing objects of the invention are achieved by these constructions.

(1) A photosensitive composition comprising (A) a compound that generates a sulfonic acid by irradiation with one of an actinic ray and a radiation, wherein the sulfonic acid is represented by general formula (I):

in which $A_1$ represents a connecting group having a valence of n;

each of $A_2$'s represents a single bond or a divalent aliphatic group, and $A_2$'s are the same or different, with proviso that at least one of a group represented by $A_1$ and groups represented by $A_2$'s has a fluorine-atom; and n represents an integer of from 2 to 4.

(2) A positive photosensitive composition which is a photosensitive composition according to (1), further comprising (B) a resin that increases an solubility of the resin (B) in an alkaline developer by an action of an acid.

(3) The positive photosensitive composition as described in (2) above, wherein the resin (B) has a fluorine atom.

(4) The positive photosensitive composition as described in (3) above, wherein the resin (B) has a hexafluoroisopropanol structure.

(5) The positive photosensitive composition as described in (2) above, wherein the resin (B) has a hydroxystyrene structural unit.

(6) The positive photosensitive composition as described in (2) above, wherein the resin (B) is (Ba) a resin having a monocyclic or polycyclic alicyclic hydrocarbon structure.

(7) The positive photosensitive composition as described in (6) above, wherein the resin (B) further has a repeating unit having a lactone structure.

(8) The positive photosensitive composition as described in (6) above, which further comprises:

(Ha) a solvent comprising at least one cyclic ketone.

(9) The positive photosensitive composition as described in (2) above, wherein the resin (B) has at least one repeating unit selected from a repeating unit represented by general formula (1), a repeating unit represented by general formula (2), and a repeating unit represented by general formula (3), wherein the resin (Baa) increases a solubility of the resin (Baa) in an alkaline developer by an action of an acid:

in which R represents a hydrogen atom or a methyl group;

A represents a single bond or a connecting group; and

ALG represents a group represented by any one of general formulae (pI) to (pV):

-continued (pIII)
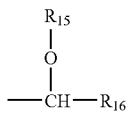

(pIV)
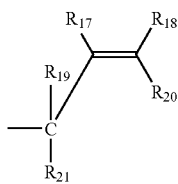

(pV)
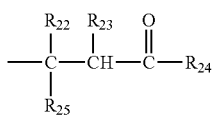

in which $R_{11}$ represents a methyl group, an ethyl group, an n-propyl group, an isopropyl group, an n-butyl group, an isobutyl group, or a sec-butyl group;

Z represents an atomic group necessary for forming an alicyclic hydrocarbon group together with a carbon atom;

$R_{12}$ to $R_{16}$ each independently represents a linear or branched alkyl group having from 1 to 4 carbon atoms or an alicyclic hydrocarbon group, with proviso that at least one of $R_{12}$ to $R_{14}$ and any one of $R_{15}$ and $R_{16}$ represents an alicyclic hydrocarbon group;

$R_{17}$ to $R_{21}$ each independently represents a hydrogen atom, a linear or branched alkyl group having from 1 to 4 carbon atoms or an alicyclic hydrocarbon group, with proviso that at least one of $R_{17}$ to $R_{21}$ represents an alicyclic hydrocarbon group and any one of $R_{19}$ and $R_{21}$ represents a linear or branched alkyl group having from 1 to 4 carbon atoms or an alicyclic hydrocarbon group; and $R_{22}$ to $R_{25}$ each independently represents a hydrogen atom, a linear or branched alkyl group having from 1 to 4 carbon atoms or an alicyclic hydrocarbon group, with proviso that at least one of $R_{22}$ to $R_{25}$ represents an alicyclic hydrocarbon group and $R_{23}$ and $R_{24}$ may be taken together to form a ring, (2)
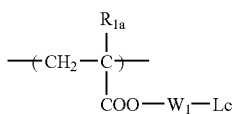

in which $R_{1a}$ represents a hydrogen atom or a methyl group;

$W_1$ represents a single bond, or a single group or a combination of two or more groups selected from the group consisting of an alkylene group, an ether group, a thioether group, a carbonyl group, and an ester group; and Lc represents a lactone residue represented by any one of general formulae (IV), (V-1) to (V-6) and (VI):

(IV)
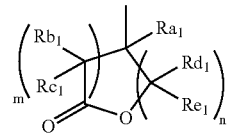

in which $R_{a1}$, $R_{b1}$, $R_{c1}$, $R_{d1}$, and $R_{e1}$ each independently represents a hydrogen atom or an alkyl group having from 1 to 4 carbon atoms; and m and n each independently represents an integer of from 0 to 3, and (m+n) is from 2 to 6, (V-1)
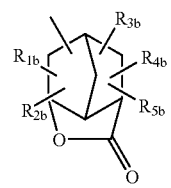

(V-2)
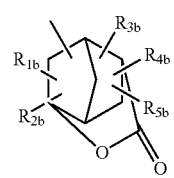

(V-3)
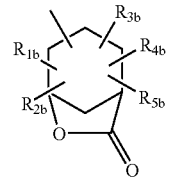

(V-4)
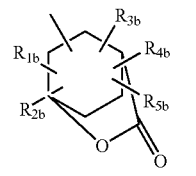

(V-5)
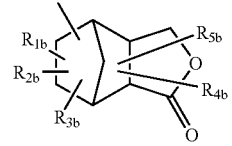

(V-6)
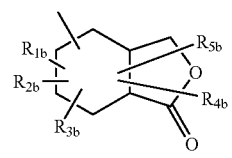

in which $R_{1b}$ to $R_{5b}$ each independently represents a hydrogen atom, an alkyl group, a cycloalkyl group, an alkenyl group, or $COOR_{6b}$, wherein $R_{6b}$ represents an alkyl group, and two of $R_{1b}$ to $R_{5b}$ may be taken together to form a ring, and

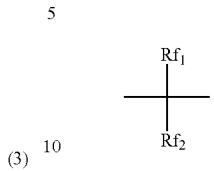

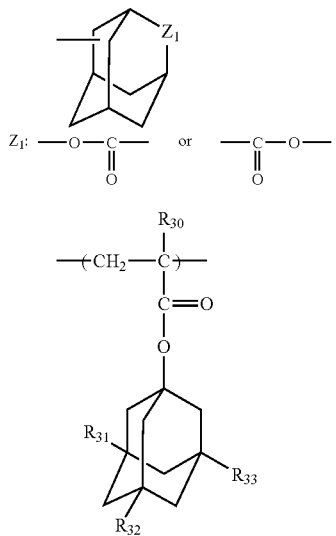

in which $R_{30}$ represents a hydrogen atom or a methyl group; and $R_{31}$ to $R_{33}$ each independently represents a hydrogen atom, a hydroxyl group or an alkyl group, with proviso that at least one of $R_{31}$ to $R_{33}$ represents a hydroxyl group.

(10) The positive photosensitive composition as described in (9) above, wherein the resin (B) has a repeating unit represented by the general formula (1) and at least one repeating unit selected from a repeating unit represented by the general formula (2) and a repeating unit represented by the general formula (3).

(11) The positive photosensitive composition as described in (9) above, wherein the resin (B) has a repeating unit represented by the general formula (1), a repeating unit represented by the general formula (2), and a repeating unit represented by the general formula (3).

(12) The positive photosensitive composition as described in any one of (2) to (11) above, which further comprises (C) a dissolution inhibiting compound that decomposes by an action of an acid and increases a solubility of the compound (C) in an alkaline developer, the compound (C) having a molecular weight of not more than 3,000.

(13) A positive photosensitive composition which is a photosensitive composition according to (1), further comprising:

(D) a resin soluble in an alkaline developer; and (C) a dissolution inhibiting compound that decomposes by an action of an acid and increases a solubility of the compound (C) in an alkaline developer, the compound (C) having a molecular weight of not more than 3,000.

(14) A negative photosensitive composition which is a photosensitive composition according to (1), further comprising:

(D) a resin soluble in an alkaline developer; and (E) an acid crosslinking agent that cross-links with the resin (D) by an action of an acid.

(15) The photosensitive composition as described in any one of (1) to (14) above, wherein in the general formula (I), $A_2$ represents an aliphatic group having a structure represented by general formula (II):

$$\begin{array}{c} Rf_1 \\ | \\ -C- \\ | \\ Rf_2 \end{array} \quad (II)$$

in which $Rf_1$ and $Rf_2$ each independently represents a hydrogen atom, a halogen atom, an alkyl group or a cycloalkyl group, with proviso that at least one of $Rf_1$ and $Rf_2$ represents a fluorine atom or a fluoroalkyl group.

(16) The photosensitive composition as described in any one of (1) to (15) above, wherein the compound (A) is one kind selected from a sulfonium salt compound of the sulfonic acid represented by the general formula (I), an iodonium salt compound of the sulfonic acid represented by the general formula (I), and an ester compound of the sulfonic acid represented by the general formula (I).

(17) The photosensitive composition as described in any one of (1) to (16) above, wherein each of $-SO_3H$'s in the sulfonic acid represented by the general formula (I) directly connects a carbon atom to which at least one of a fluorine atom and a fluoroalkyl group is directly connected.

(18) The photosensitive composition as described in any one of (1) to (17) above, which further comprises (A') a compound having one sulfonic acid group, the compound (A') generating a sulfonic acid by irradiation with one of an actinic ray and a radiation.

(19) The photosensitive composition as described in (18) above, wherein the compound (A') is a monovalent perfluoroalkanesulfonic acid sulfonium salt.

(20) The photosensitive composition as described in any one of (1) to (19) above, which further comprises a mixed solvent of a solvent containing a hydroxyl group in its structure and a solvent not containing a hydroxyl group in its structure.

(21) The photosensitive composition as described in any one of (1) to (20) above, which further comprises at least one of (F) a basic compound and (G) at least one of a surfactant containing a fluorine atom, a surfactant containing a silicon atom and a surfactant containing a fluorine atom and a silicon atom.

(22) The photosensitive composition as described in (21) above, wherein the basic compound (F) is at least one of (i) a compound having a structure selected from an imidazole structure, a diazabicyclo structure, an onium hydroxide structure, an onium carboxylate structure, a trialkylamine structure, an aniline structure, and a pyridine structure, (ii) an alkylamine derivative having at least one of a hydroxyl group and an ether bond and (iii) an aniline derivative having at least one of a hydroxyl group and an ether bond.

(23) A pattern forming method comprising:

forming a film by using a photosensitive composition as described in any one of (1) to (22) above;

exposing the film, so as to form a exposed film; and developing the exposed film.

DETAILED DESCRIPTION OF THE INVENTION

The invention will be described below in detail.

Incidentally, in the expressions of groups (atomic groups) in the present specification, the expression which does not express the term "substituted" or "unsubstituted" includes not only one having no substituent but also one having a substituent. For example, the term "alkyl group" includes not only an alkyl group having no substituent (unsubstituted alkyl group) but also an alkyl group having a substituent (substituted alkyl group).

The positive photosensitive composition of the invention, more preferably the positive working resist composition, contains (A) a compound capable of generating an acid by irradiation with the actinic ray or the radiation and (B) a resin which is decomposed by the action of an acid, whereby its solubility in an alkaline developer increases, and if desired, further contains (C) a dissolution inhibiting compound which is decomposed by the action of an acid, whereby its solubility in an alkaline developer increases, and which has a molecular weight of not more than 3,000, or contains (A) a compound capable of generating an acid by irradiation with the actinic ray or the radiation, (D) a resin soluble in an alkaline developer, and (C) a dissolution inhibiting compound which is decomposed by the action of an acid, whereby its solubility in an alkaline developer increases, and which has a molecular weight of not more than 3,000.

The negative photosensitive composition of the invention, more preferably the negative working resist composition, contains (A) a compound capable of generating an acid by irradiation with the actinic ray or the radiation, (D) a resin soluble in an alkaline developer, and (E) an acid crosslinking agent capable of crosslinking with the resin soluble in an alkaline developer by the action of an acid.

[1] Compound capable of generating a sulfonic acid represented by the general formula (I) by irradiation with the actinic ray or the radiation (sometimes referred to as "compound (A)"):

In the general formula (I), $A_1$ represents a connecting group having a valence of n, each of $A_2$'s represents a single bond or a divalent aliphatic group, and $A_2$'s are the same or different, with proviso that at least one of the group represented by $A_1$ and the group represented by $A_2$'s has a fluorine atom, and n represents an integer of from 2 to 4.

Examples of the connecting group as $A_1$ include an alkylene group, a cycloalkylene group, an arylene group, an alkenylene group, a single bond, an ether bond, an ester bond, an amide bond, a sulfide bond, a urea bond, a carbonyl group, a carbon atom, and a connecting group of the plural number of these groups.

The alkylene group as $A_1$ may have a substituent and preferably has from 1 to 8 carbon atoms. Examples thereof include a methylene group, an ethylene group, a propylene group, a butylene group, a hexylene group, and an octylene group.

The cycloalkylene group as $A_1$ may have a substituent and preferably has from 3 to 8 carbon atoms. Examples thereof include a cyclopentylene group and a cyclohexylene group.

The alkenylene group as $A_1$ may have a substituent and preferably has from 2 to 6 carbon atoms. Examples thereof include an ethenylene group, a propenylene group, and a butenylene group.

The arylene group as $A_1$ may have a substituent and preferably has from 6 to 15 carbon atoms. Examples thereof include a phenylene group, a tolylene group, and a naphthylene group.

Examples of substituents which may be substituted on these groups include ones having active hydrogen such as a cycloalkyl group, an aryl group, an amino group, an amide group, a ureido group, a urethane group, a hydroxyl group, and a carboxyl group, a halogen atom (for example, a fluorine atom, a chlorine atom, a bromine atom, and an iodine atom), an alkoxy group (for example, a methoxy group, an ethoxy group, a propoxy group, and a butoxy group), a thioether group, an acyl group (for example, an acetyl group, a propanoyl group, and a benzoyl group), an acyloxy group (for example, an acetoxy group, a propanoyloxy group, and a benzoyloxy group), an alkoxyarbonyl group (for example, a methoxycarbonyl group, an ethoxycarbonyl group, and a propoxycarbonyl group), a cyano group, and a nitro group. Also, with respect to the arylene group, an alkyl group (for example, a methyl group, an ethyl group, a propyl group, and a butyl group) can be further enumerated.

The divalent aliphatic group as $A_2$ is preferably an alkylene group or a cycloalkylene group each having from 1 to 8 carbon atoms, and more preferably an alkylene group or a cycloalkylene group each substituted with a fluorine atom or a fluoroalkyl group.

The alkylene group as $A_2$ may have a substituent and preferably has from 1 to 8 carbon atoms. Examples thereof include a methylene group, an ethylene group, a propylene group, a butylene group, a hexylene group, and an octylene group.

The cycloalkylene group as $A_2$ may have a substituent and preferably has from 3 to 8 carbon atoms. Examples thereof include a cyclopentylene group and a cyclohexylene group.

The fluoroalkyl group (alkyl group in which at least one hydrogen atom is substituted with a fluorine atom) which the alkylene group or cycloalkylene group as $A_2$ preferably has may have a substituent and preferably has from 1 to 8 carbon atoms, and more preferably from 1 to 3 carbon atoms. Examples thereof include a monofluoromethyl group, a difluoromethyl group, a trifluoromethyl group, a 2,2,2-trifluoroethyl group, a pentafluoroethyl group, a 2,2,3,3,3-pentafluoropropyl group, a heptafluoropropyl group, a 2,2,3,3,4,4,4-heptafluorobutyl group, a nonafluorobutyl group, and a perfluorohexyl group. Examples of the additional substituent of the fluoroalkyl group include a hydroxyl group, an alkoxy group (preferably one having from 1 to 5 carbon atoms), a halogen atom, and a cyano group.

Also, it is preferable that $A_2$ is an aliphatic group having a structure of the following formula (II).

In the general formula (II), $Rf_1$ and $Rf_2$ each independently represents a hydrogen atom, a halogen atom, an alkyl group, or a cycloalkyl group, with proviso that at least one of $Rf_1$ and $Rf_2$ represents a fluorine atom or a fluoroalkyl group.

The alkyl group as $Rf_1$ and $Rf_2$ may have a substituent and preferably has from 1 to 8 carbon atoms. Specific examples thereof include a methyl group, an ethyl group, a propyl group, an n-butyl group, and a sec-butyl group. As the substituent which the alkyl group as $Rf_1$ and $Rf_2$ may have, a halogen atom can be preferably enumerated.

The cycloalkyl group as $Rf_1$ and $Rf_2$ may have a substituent and preferably has from 3 to 8 carbon atoms. Examples thereof include a cyclopentyl group and a cyclohexyl group.

The fluoroalkyl group as $Rf_1$ and $Rf_2$ is a group resulting from substitution of a fluorine atom on the foregoing alkyl group or cycloalkyl group. Examples thereof include the foregoing groups enumerated for the fluoroalkyl group.

In the general formula (I), n represents an integer of from 2 to 4, preferably 2 or 3, and further preferably 2.

Incidentally, it is preferable that the structure of the general formula (II) is bonded to the adjacent position of the sulfonic acid (the sulfur atom of the sulfonic acid atomic group).

Further, as the sulfonic acid represented by the general formula (I), a sulfonic acid represented by the following general formula (III) is more preferable.

$$A_1\text{-((CF}_2)_b\text{---}A_3\text{---(CF}_2)_a\text{---SO}_3\text{H})_n \qquad (III)$$

$A_1$ and n are synonymous with $A_1$ and n in the general formula (I).

$A_3$ represents a single bond, an ether bond, a sulfide bond, an alkylene group, a cycloalkylene group, or an arylene group, and more preferably a single bond or an ether bond. $A_3$ of the number of n may be the same or different.

a represents an integer of from 1 to 4.

b represents an inter of from 0 to 4.

The alkylene group, the cycloalkylene group and the arylene group as $A_3$ are the same as the alkylene group, the cycloalkylene group and the arylene group as $A_1$, respectively.

a preferably represents 1 or 2.

b preferably represents from 0 to 2.

As the sulfonic acid represented by the general formula (I), sulfonic acids represented by the following general formulae (Ia) to (Ih) are further preferable.

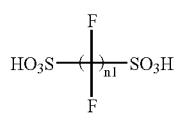
(Ia)

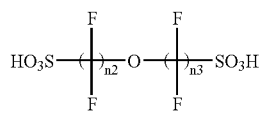
(Ib)

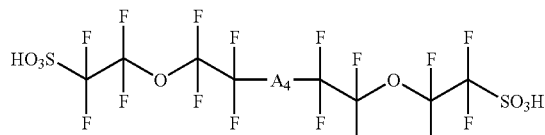
(Ic)

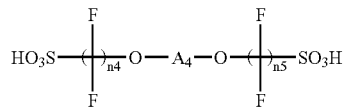
(Id)

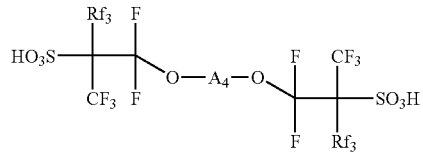
(Ie)

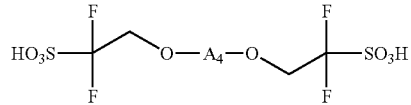
(If)

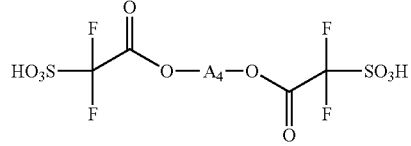
(Ig)

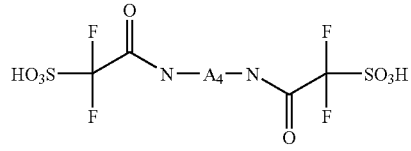
(Ih)

$A_4$ represents an alkylene group, a cycloalkylene group, an arylene group, or a group in which the plural number of these groups are connected to each other via at least one of a single bond, an ether bond, an ester bond, an amide bond, a sulfide bond, and a urea bond.

n1 to n5 each represents an integer of from 1 to 8, and preferably an integer of from 1 to 4.

$Rf_3$ each independently represents a fluorine atom or a fluoroalkyl group.

The alkylene group, the cycloalkylene group and the arylene group as $A_4$ are the same as the alkylene group, the cycloalkylene group and the arylene group as $A_1$, respectively.

The fluoroalkyl group as $Rf_3$ is the same as that described above.

Preferred specific examples of the sulfonic acid represented by the general formula (I) will be given below.

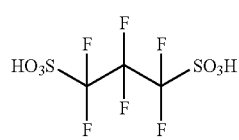

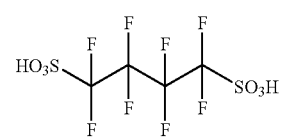

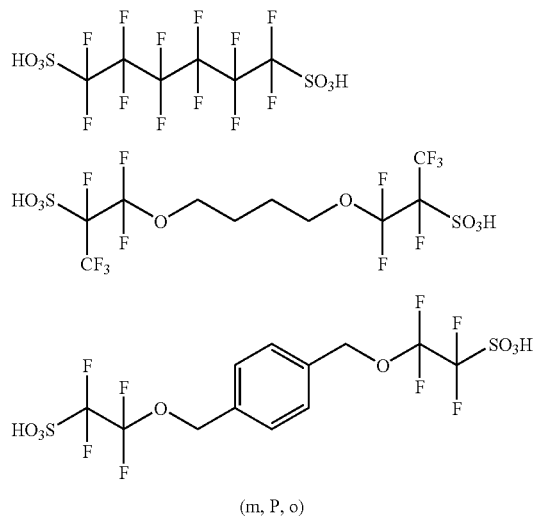
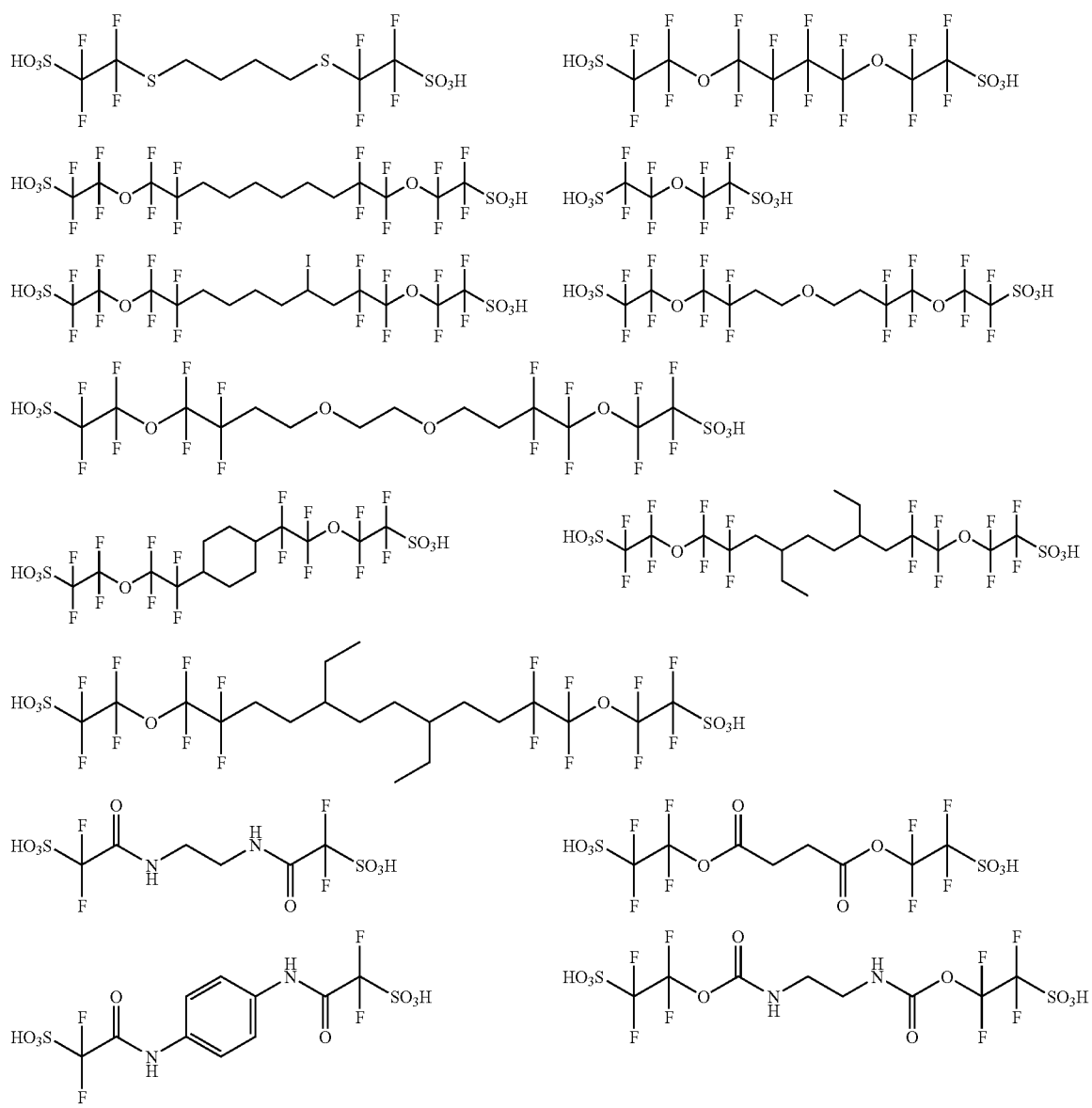

-continued

[Chemical structures showing various fluorinated sulfonic acid compounds]

$HO_3S-CF_2-C(=O)-O-CH_2CH_2-O-C(=O)-CF_2-SO_3H$ $HO_3S-CF_2-O-(CH_2)_4-O-CF_2-SO_3H$ $HO_3S-CF_2-CH_2-O-C(=O)-CH_2CH_2-C(=O)-O-CH_2-CF_2-SO_3H$ $HO_3S-CF_2-CH_2-O-C(=O)-NH-CH_2CH_2-NH-C(=O)-O-CH_2-CF_2-SO_3H$ $HO_3S-(CF_2)_2-O-(CH_2)_3-O-(CF_2)_2-SO_3H$ $HO_3S-(CF_2)_2-O-CH_2CH_2-\text{[phenyl]}-CH_2CH_2-O-(CF_2)_2-SO_3H$ —OCH₂CH₂CH₂(CF₂)₂O(CF₂)₂SO₃H
—OCH₂CH₂CH₂(CF₂)₂O(CF₂)₂SO₃H
—OCH₂CH₂CH₂(CF₂)₂O(CF₂)₂SO₃H
C[CH₂OCH₂CH₂CH₂(CF₂)₂O(CF₂)₂SO₃H]₄

—OCH₂CHlCH₂(CF₂)₂O(CF₂)₂SO₃H
—OCH₂CHlCH₂(CF₂)₂O(CF₂)₂SO₃H
—OCH₂CHlCH₂(CF₂)₂O(CF₂)₂SO₃H
C[CH₂OCH₂CHlCH₂(CF₂)₂O(CF₂)₂SO₃H]₄

As the compound (A) capable of generating a sulfonic acid represented by the general formula (I) by irradiation with the actinic ray or the radiation, one kind selected from sulfonium salt compounds or iodonium salt compounds of the sulfonic acid represented by the general formula (I) or one kind selected from ester compounds of the sulfonic acid represented by the general formula (I) is preferable, and compounds represented by the following general formulae (A-1) to (A-5) are more preferable.

$$\left(\begin{array}{c}R_{201}\\R_{202}-S^+\\R_{203}\end{array}\right)_n \quad A_1-\left(A_2-SO_3^\ominus\right)_n \quad \text{(A-1)}$$

$$\left(\begin{array}{c}R_{205}\\I^+\\R_{204}\end{array}\right)_n \quad A_1-\left(A_2-SO_3^\ominus\right)_n \quad \text{(A-2)}$$

$$A_1-\left(A_2-SO_3-N\begin{array}{c}O\\ \diagdown\\ A\\ \diagup\\ O\end{array}\right)_n \quad \text{(A-3)}$$

$$A_1-\left(A_2-SO_3-N\begin{array}{c}\\ \diagdown\\ R_{206}\quad R_{207}\end{array}\right)_n \quad \text{(A-4)}$$

$$A_1-A_2-SO_3^- \begin{array}{c}R_{210}\\ | \\ \text{CH} \\ \text{[phenyl with } R_{209}, R_{208}, O_2N \text{]}\end{array} \quad \text{(A-5)}$$

In the foregoing general formula (A-1), $R_{201}$, $R_{202}$, and $R_{203}$ each independently represents an organic group.

$A_1$ and $A_2$ are synonymous with $A_1$ and $A_2$ in the general formula (I), respectively.

n represents an integer of from 2 to 4.

The organic group as $R_{201}$, $R_{202}$, and $R_{203}$ generally has from 1 to 30 carbon atoms, and preferably from 1 to 20 carbon atoms.

Also, two of $R_{201}$ to $R_{203}$ may be taken together to form a ring structure, and the ring may contain an oxygen atom, a sulfur atom, an ester bond, an amide bond, or a carbonyl group.

Examples of the group which two of $R_{201}$ to $R_{203}$ are taken together to form include an alkylene group (for example, a butylene group and a pentylene group).

As specific examples of the organic group as $R_{201}$, $R_{202}$, and $R_{203}$, corresponding groups in compounds (A-1a) to (A-1c) described later can be enumerated.

Incidentally, compounds having the plural number of the structures represented by the general formula (A-1) may be employed. For example, compounds having a structure in which at least one of $R_{201}$ to $R_{203}$ of a compound represented by the general formula (A-1) is bonded to at least one of $R_{201}$ to $R_{203}$ of another compound represented by the general formula (A-1) may be employed.

More preferably, the compounds (A-1a), (A-1b) and (A-1c) described below can be enumerated as the compound (A-1).

The compound (A-1a) is an aryl sulfonium compound in which at least one of $R_{201}$ to $R_{203}$ of the foregoing general formula (A-1) is an aryl group, that is, a compound in which an aryl sulfonium is a cation.

In the aryl sulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the aryl sulfonium compound include triaryl sulfonium compounds, diarylalkyl sulfonium compounds, aryldialkyl sulfonium compounds, diarylcycloalkyl sulfonium compounds, and aryldicycloalkyl sulfonium compounds.

As the aryl group of the aryl sulfonium compound, a phenyl group and a naphthyl group are preferable, and a phenyl group is more preferable. In the case where the aryl sulfonium compound has two or more aryl groups, the two or more aryl groups may be the same or different.

The alkyl group or cycloalkyl group which the aryl sulfonium compound has as the need arises is preferably a linear or branched alkyl group having from 1 to 15 carbon atoms or a cycloalkyl group having from 3 to 15 carbon atoms. Examples thereof include a methyl group, an ethyl group, a propyl group, an n-butyl group, a sec-butyl group, a t-butyl group, a cyclopropyl group, a cyclobutyl group, and a cyclohexyl group.

The aryl group, alkyl group and cycloalkyl group as $R_{201}$ to $R_{203}$ may each have an alkyl group (for example, one having from 1 to 15 carbon atoms), a cycloalkyl group (for example, one having from 3 to 15 carbon atoms), an aryl group (for example, one having from 6 to 14 carbon atoms), an alkoxy group (for example, one having from 1 to 15 carbon atoms), a halogen atom, a hydroxyl group, or a phenylthio group as a substituent. As the substituent, a linear or branched alkyl group having from 1 to 12 carbon atoms, a cycloalkyl group having from 3 to 12 carbon atoms, and a linear, branched or cyclic alkoxy group having from 1 to 12 carbon atoms are preferable; and an alkyl group having from 1 to 4 carbon atoms and an alkoxy group having from 1 to 4 carbon atoms are more preferable. The substituent may be substituted on any one of three $R_{201}$ to $R_{203}$ or may be substituted on all of three $R_{201}$ to $R_{203}$. Also, in the case where $R_{201}$ to $R_{203}$ are an aryl group, it is preferable that the substituent is substituted at the p-position of the aryl group.

Next, the compound (A-1b) will be described below.

The compound (A-1b) is a compound in the case where in the formula (A-1), $R_{201}$ to $R_{203}$ each independently represents an aromatic ring-free organic group. The aromatic ring as referred to herein includes aromatic rings containing a hetero atom.

The aromatic ring-free organic group as $R_{201}$ to $R_{203}$ generally has from 1 to 30 carbon atoms, and preferably from 1 to 20 carbon atoms.

$R_{201}$ to $R_{203}$ are each independently preferably an alkyl group or a cycloalkyl group (especially, a linear, branched or cyclic oxoalkyl group which may have a double bond in the chain and an alkoxycarbonylmethyl group are preferable), an allyl group, or a vinyl group; more preferably a linear, branched or cyclic 2-oxoalkyl group; and most preferably a linear or branched 2-oxoalkyl group.

The alkyl group as $R_{201}$ to $R_{203}$ is preferably a linear or branched alkyl group having from 1 to 20 carbon atoms (for example, a methyl group, an ethyl group, a propyl group, a butyl group, and a pentyl group).

The cycloalkyl group as $R_{201}$ to $R_{203}$ is preferably a cyclic alkyl group having from 3 to 10 carbon atoms (for example, a cyclopentyl group, a cyclohexyl group, and a norbornyl group)

The 2-oxoalkyl group as $R_{201}$ to $R_{203}$ may be linear, branched or cyclic and is preferably a group having >C=O at the 2-position of the foregoing alkyl group or cycloalkyl group.

The alkoxy group in the alkxoycarbonylmethyl group as $R_{201}$ to $R_{203}$ is preferably an alkoxy group having from 1 to 5 carbon atoms (for example, a methoxy group, an ethoxy group, a propoxy group, a butoxy group, and a pentyloxy group).

Each of $R_{201}$ to $R_{203}$ may be further substituted with a halogen atom, an alkoxy group (for example, one having from 1 to 5 carbon atoms), a hydroxyl group, a cyano group, or a nitro group.

The compound (A-1c) is a compound represented by the following general formula (A-1c) and is a compound having an arylacyl sulfonium salt structure.

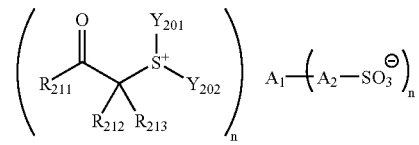

In the general formula (A-1c), $R_{21}$, represents an aryl group, and preferably a phenyl group or a naphthyl group. Examples of a preferred substituent which the aryl group as $R_{211}$ may have include an alkyl group, a cycloalkyl group, an alkoxy group, an acyl group, a nitro group, a hydroxyl group, an alkoxycarbonyl group, and a carboxy group.

$R_{212}$ and $R_{213}$ each independently represents a hydrogen atom, an alkyl group, or a cycloalkyl group.

$Y_{201}$ and $Y_{202}$ each independently represents an alkyl group (especially, a 2-oxoalkyl group, an alkoxycarbonylalkyl group, and a carboxyalkyl group are preferable), a cycloalkyl group (especially, a 2-oxocycloalkyl group, an alkoxycarbonylcycloalkyl group, and a carboxycycloalkyl group are preferable), an aryl group, or a vinyl group.

$R_{211}$ and $R_{212}$ may be taken together to form a ring structure; $R_{212}$ and $R_{213}$ may be taken together to form a ring structure; and $Y_{201}$ and $Y_{202}$ may be taken together to form a ring structure. These ring structures may contain an oxygen atom, a sulfur atom, an ester bond, or an amide bond. Examples of the group which $R_{21}$, and $R_{212}$ are taken together to form, the group which $R_{212}$ and $R_{213}$ are taken together to form, and the group which $Y_{201}$ and $Y_{202}$ are taken together to form include a butylene group and a pentylene group.

$A_1$ and $A_2$ are synonymous with $A_1$ and $A_2$ in the general formula (I), respectively.

n represents an integer of from 2 to 4.

The alkyl group as $R_{212}$ and $R_{213}$ is preferably an alkyl group having from 1 to 20 carbon atoms.

The cycloalkyl group as $R_{212}$ and $R_{213}$ is preferably a cycloalkyl group having from 3 to 20 carbon atoms.

The alkyl group as $Y_{201}$ and $Y_{202}$ is preferably an alkyl group having from 1 to 20 carbon atoms.

The cycloalkyl group as $Y_{201}$ and $Y_{202}$ is preferably a cycloalkyl group having from 3 to 20 carbon atoms.

The 2-oxoalkyl group as $Y_{201}$ and $Y_{202}$ is preferably a group having >C=O at the 2-position of the alkyl group as $Y_{201}$ and $Y_{202}$.

The 2-oxocycloalkyl group as $Y_{201}$ and $Y_{202}$ is preferably a group having >C=O at the 2-position of the cycloalkyl group as $Y_{201}$ and $Y_{202}$.

The alkoxycarbonyl group in the alkoxycarbonylalkyl group and alkxoycarbonylcycloalkyl group as $Y_{201}$ and $Y_{202}$ is preferably an alkoxycarbonyl group having from 2 to 20 carbon atoms.

$Y_{201}$ and $Y_{202}$ are each preferably an alkyl group or a cycloalkyl group each having 4 carbon atoms or more, preferably from 4 to 16 carbon atoms, and further preferably from 4 to 12 carbon atoms.

Also, it is preferable that at least one of $R_{212}$ and $R_{213}$ is an alkyl group or a cycloalkyl group; and it is more preferable that both $R_{212}$ and $R_{213}$ are an alkyl group or a cycloalkyl group.

In the general formula (A-2), $R_{204}$ and $R_{205}$ each independently represents an aryl group, an alkyl group, or a cycloalkyl group.

$A_1$ and $A_2$ are synonymous with $A_1$ and $A_2$ in the general formula (I), respectively.

n represents an integer of from 2 to 4.

The aryl group as $R_{204}$ and $R_{205}$ is preferably a phenyl group or a naphthyl group, and more preferably a phenyl group.

The alkyl group as $R_{204}$ and $R_{205}$ is preferably a linear or branched alkyl group having from 1 to 10 carbon atoms (for example, a methyl group, an ethyl group, a propyl group, a butyl group, and a pentyl group).

The cycloalkyl group as $R_{204}$ and $R_{205}$ is preferably a cycloalkyl group having from 3 to 10 carbon atoms (for example, a cyclopentyl group, a cyclohexyl group, and a norbornyl group).

Examples of the substituent which the group as $R_{204}$ and $R_{205}$ may have include an alkyl group (for example, one having from 1 to 15 carbon atoms), a cycloalkyl group (for example, one having from 3 to 15 carbon atoms), an aryl group (for example, one having from 6 to 15 carbon atoms), an alkoxy group (for example, one having from 1 to 15 carbon atoms), a halogen atom, a hydroxyl group, and a phenylthio group.

In the general formula (A-3), A represents an alkylene group, an alkenylene group, or an arylene group.

$A_1$ and $A_2$ are synonymous with $A_1$ and $A_2$ in the general formula (I), respectively.

n represents an integer of from 2 to 4.

In the general formula (A-4), $R_{206}$ represents an alkyl group, a cycloalkyl group, or an aryl group.

$R_{207}$ represents an alkyl group (especially, an oxoalkyl group is preferable), a cycloalkyl group (especially, an oxocycloalkyl group is preferable), a cyano group, or an alkoxycarbonyl group, and preferably a halogen-substituted alkyl group, a halogen-substituted cycloalkyl group, or a cyano group.

$A_1$ and $A_2$ are synonymous with $A_1$ and $A_2$ in the general formula (I), respectively.

n represents an integer of from 2 to 4.

In the general formula (A-5), $R_{208}$ and $R_{209}$ each represents a hydrogen atom, an alkyl group, a cycloalkyl group, a cyano group, a nitro group, or an alkoxycarbonyl group, and preferably a halogen-substituted alkyl group, a halogen-substituted cycloalkyl group, a nitro group, or a cyano group.

$R_{210}$ represents a hydrogen atom, an alkyl group, a cycloalkyl group, a cyano group, or an alkoxycarbonyl group.

$A_1$ and $A_2$ are synonymous with $A_1$ and $A_2$ in the general formula (I), respectively.

Of these, the compounds represented by the general formula (A-1) are especially preferable.

Specific examples of the compound (A) will be given below, but it should not be construed that the invention is limited thereto.

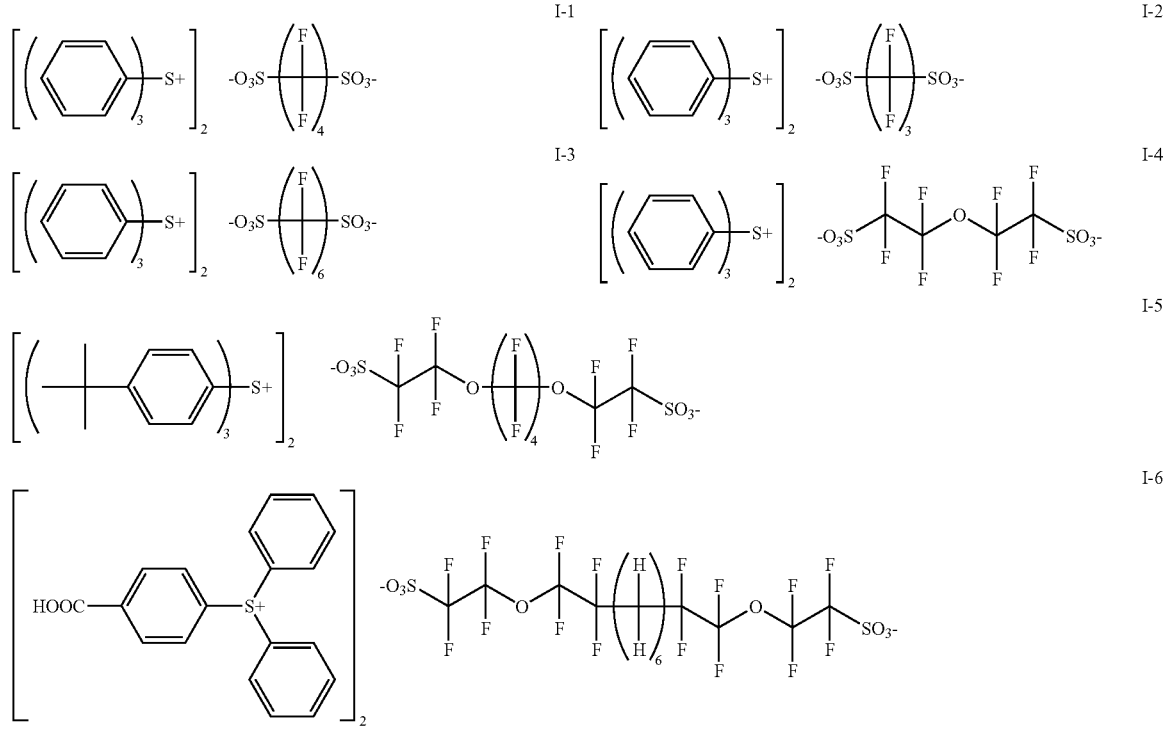

-continued
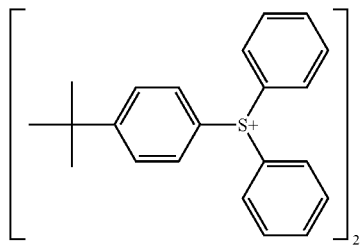 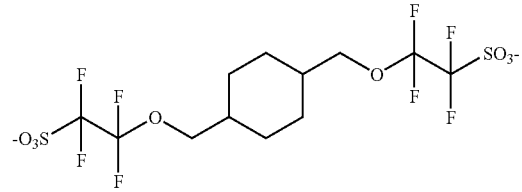
I-7
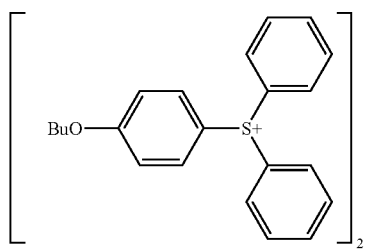 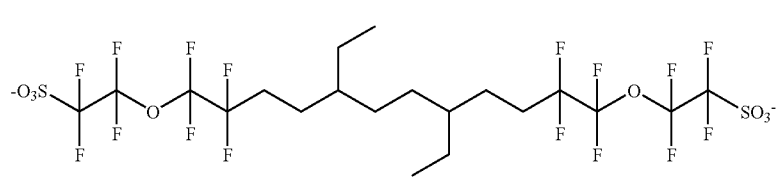
I-8
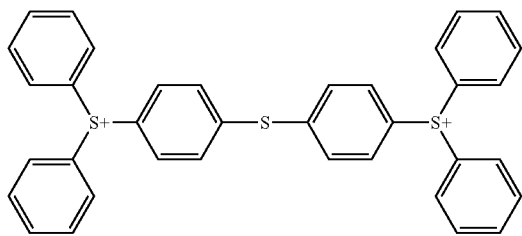 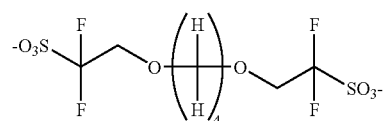
I-9
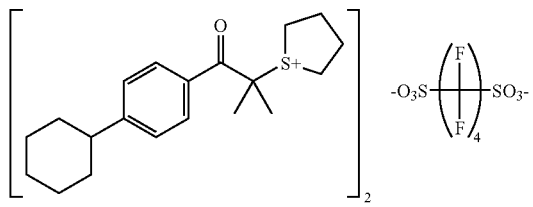 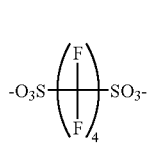 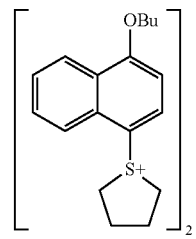 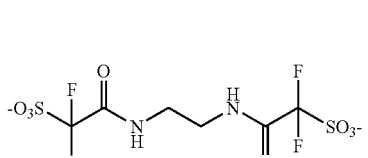
I-10 I-11
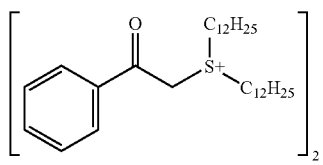 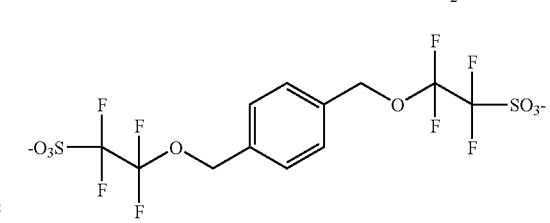
I-12
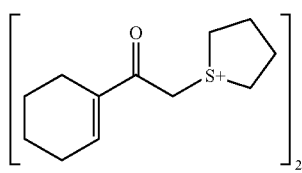 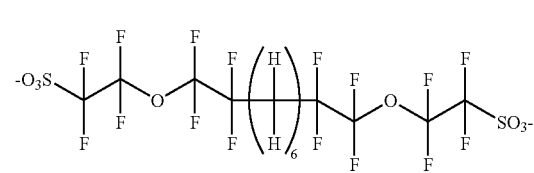
I-13
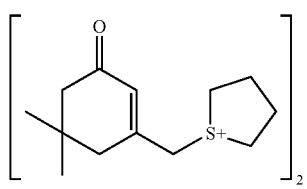 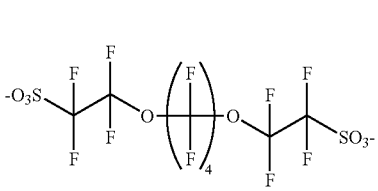
I-14

-continued
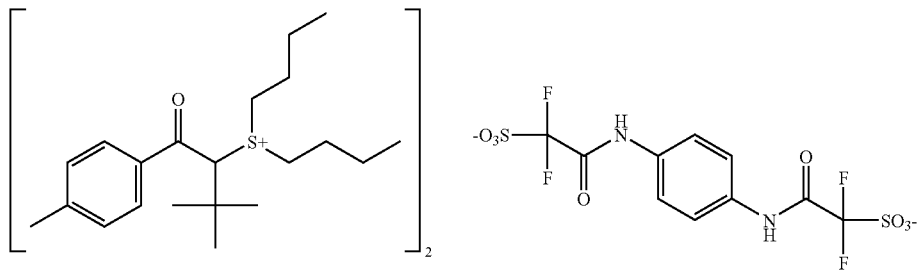
I-15
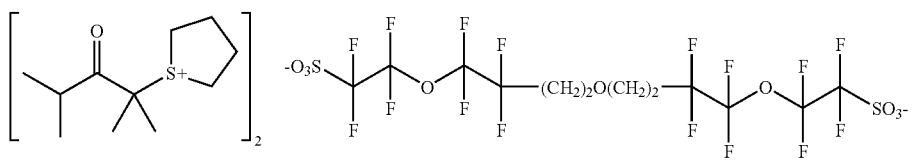
I-16
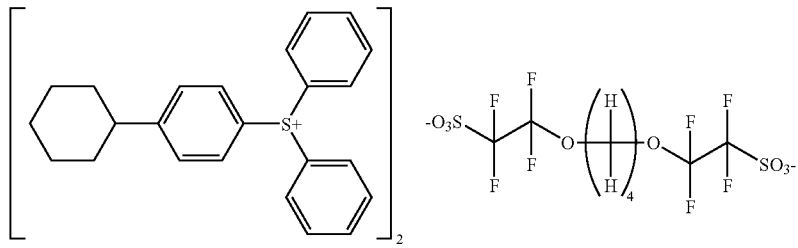
I-17
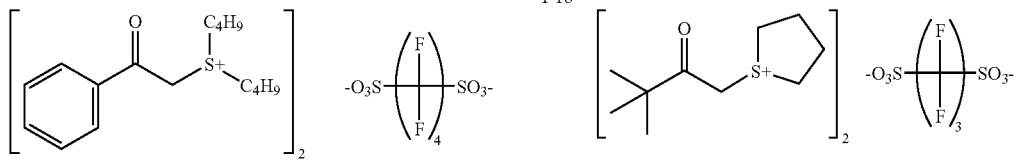
I-18 I-19
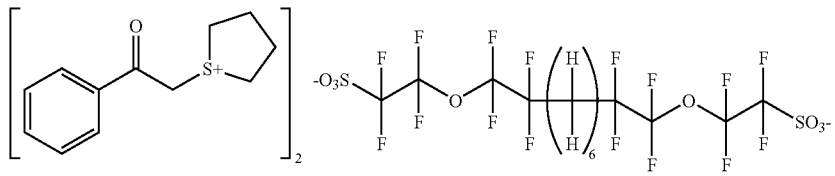
I-20
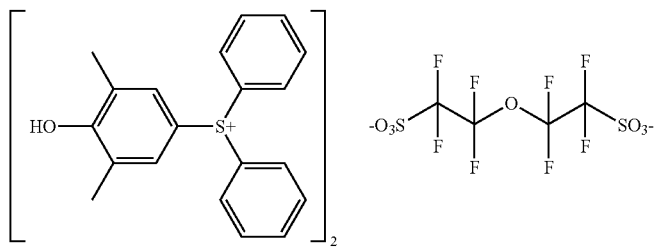
I-21
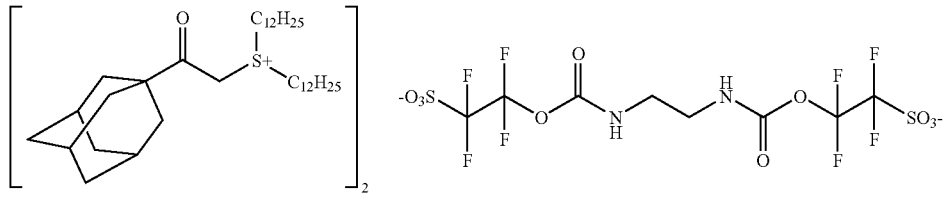
I-22

-continued

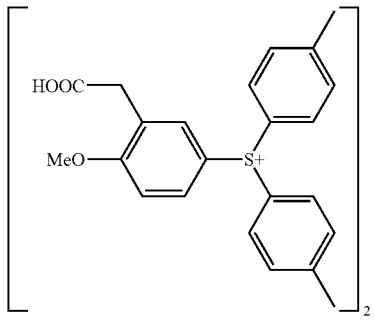
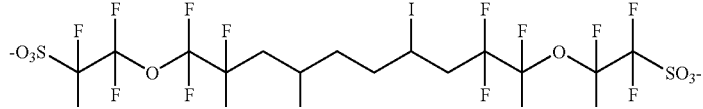

I-23

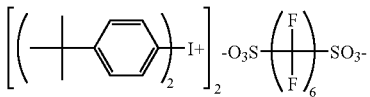
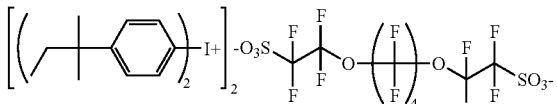

I-24    I-25

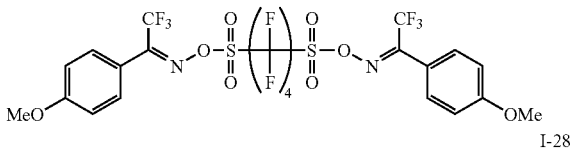
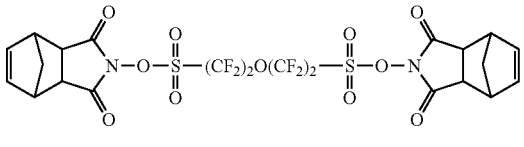

I-26    I-27

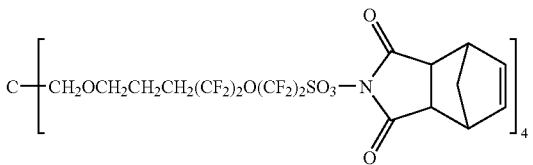
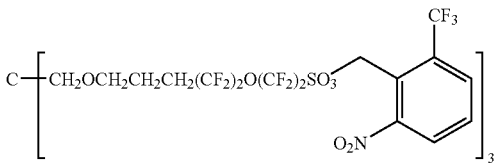

I-28    I-29

The compound (A) can be synthesized by synthesizing a derivative of the sulfonic acid represented by the general formula (I) and then subjecting it to salt exchange with an onium halide, etc. or esterification with a hydroxyl group-containing compound. The derivative of the sulfonic acid represented by the general formula (I) can be synthesized by methods described in, for example, JP-A-2001-322975, *J. Org. Chem.*, Vol. 56, No. 22 (1991), p. 6348, and *Synthesis*, (1989), p. 464.

The content of the compound (A) in the photosensitive composition of the invention is preferably from 0.1 to 20% by weight, more preferably from 0.5 to 10% by weight, and further preferably from 1 to 7% by weight based on the solids of the composition.

(Associative Acid Generating Agent)

In the invention, a compound capable of generating an acid by irradiation with the actinic ray or the radiation may be further used jointly in addition to the compound (A).

The amount of the photo acid generating agent which can be used jointly is usually from 100/0 to 20/80, preferably from 100/0 to 40/60, and more preferably from 100/0 to 50/50 in terms of a molar ratio (compound (A)/other acid generating agent).

As such a photo acid generating agent that can be used jointly, photoinitiators of photo cationic polymerization, photoinitiators of photo radical polymerization, light fading agents of dyes, light discoloring agents, known compounds capable of generating an acid by irradiation with the actinic ray or the radiation, which are used in micro resists, etc., and mixtures thereof can be adequately chosen and used.

Examples thereof include diazonium salts, phosphonium salts, sulfonium salts, iodonium salts, imide sulfonates, oxime sulfonates, diazo disulfones, disulfones, and o-nitrobenzyl sulfonate.

Also, compounds in which a group or compound capable of generating an acid by irradiation with the actinic ray or the radiation is introduced into the principal chain or the side chain of a polymer, for example, compounds described in U.S. Pat. No. 3,849,137, German Patent No. 3,914,407, JP-A-63-26653, JP-A-55-164824, JP-A-62-69263, JP-A-63-146038, JP-A-63-163452, JP-A-62-153853, and JP-A-63-146029, can be used.

Further, compounds capable of generating an acid by light described in U.S. Pat. No. 3,779,778 and European Patent No. 126,712 can be used.

Of the compounds that are decomposed by irradiation with the actinic ray or the radiation to generate an acid, which may be used jointly, compounds represented by the following general formulae (ZI), (ZII) and (ZIII) are preferable.

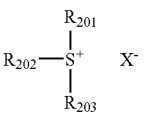

ZI

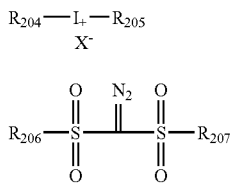

In the foregoing general formula (ZI), $R_{201}$, $R_{202}$, and $R_{203}$ each independently represents an organic group.

The organic group as $R_{201}$, $R_{202}$, and $R_{203}$ generally has from 1 to 30 carbon atoms, and preferably from 1 to 20 carbon atoms.

Also, two of $R_{201}$, $R_{202}$, and $R_{203}$ may be taken together to form a ring structure. The ring may contain an oxygen atom, a sulfur atom, an ester bond, an amide bond, or a carbonyl group.

Examples of the group which two of $R_{201}$ to $R_{203}$ are taken together to form include an alkylene group (for example, a butylene group and a pentylene group).

$X^-$ represents a non-nucleophilic anion.

Examples of the non-nucleophilic anion as $X^-$ include a sulfonic anion, a carboxylic anion, a sulfonylimide anion, a bis(alkylsulfonyl)imide anion, and a tris(alkylsulfonyl)methyl anion.

The non-nucleophilic anion as referred to herein means an anion having a remarkably low ability to cause nucleophilic reaction and an anion capable of inhibiting decomposition with time due to intramolecular nucleophilic reaction. By this, stability with time of the resist is enhanced.

Examples of the sulfonic anion include an aliphatic sulfonic anion, an aromatic sulfonic anion, and a camphor sulfonic anion.

Examples of the carboxylic anion include an aliphatic carboxylic anion, an aromatic carboxylic anion, and an aralkyl carboxylic anion.

The aliphatic site in the aliphatic sulfonic anion may be an alkyl group or a cycloalkyl group, and preferably an alkyl group having from 1 to 30 carbon atoms or a cycloalkyl group having from 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eucosyl group, a cyclopropyl group, a cyclopentyl group, a cyclohexyl group, an adamantyl group, a norbornyl group, and boronyl group.

The aromatic group in the aromatic sulfonic anion is preferably an aryl group having from 6 to 14 carbon atoms, and examples thereof include a phenyl group, a tolyl group, and a naphthyl group.

Each of the alkyl group, the cycloalkyl group and the aryl group in the foregoing aliphatic sulfonic anion and aromatic sulfonic anion may have a substituent.

Examples of such a substituent include a nitro group, a halogen atom (for example, a fluorine atom, a chlorine atom, a bromine atom, and an iodine atom), a carboxyl group, a hydroxyl group, an amino group, a cyano group, an alkoxy group (preferably, one having from 1 to 5 carbon atoms), a cycloalkyl group (preferably, one having from 3 to 15 carbon atoms), an aryl group (preferably, one having from 6 to 14 carbon atoms), an alkoxycarbonyl group (preferably, one having from 2 to 7 carbon atoms), an acyl group (preferably, one having from 2 to 12 carbon atoms), and an alkoxycarbonyloxy group (preferably, one having from 2 to 7 carbon atoms). With respect to the aryl group and ring structure which the respective groups have, an alkyl group (preferably, one having from 1 to 15 carbon atom) can be further enumerated as the substituent.

As the aliphatic site in the aliphatic carboxylic anion, the same alkyl group and cycloalkyl group as in the aliphatic sulfonic anion can be enumerated.

As the aryl group in the aromatic carboxylic anion, the same aryl group as in the aromatic sulfonic anion can be enumerated.

The aralkyl group in the aralkyl carboxylic anion is preferably an aralkyl group having from 6 to 12 carbon atoms, and examples thereof include a benzyl group, a phenethyl group, a naphthylmethyl group, a naphthylethyl group, and a naphthylmethyl group.

Each of the alkyl group, the cycloalkyl group, the aryl group and the aralkyl group in the foregoing aliphatic carboxylic anion, aromatic carboxylic anion and aralkyl carboxylic anion may have a substituent. Likewise the case of the aromatic sulfonic anion, examples of the substituent include a halogen atom, an alkyl group, a cycloalkyl group, an alkoxy group, and an alkylthio group.

Examples of the sulfonylimide anion include a saccharin anion.

The alkyl group in the bis (alkylsulfonyl) imide anion and tris(alkylsulfonyl)methyl anion is preferably an alkyl group having from 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Theses alkyl groups may have a substituent. Examples of the substituent include a halogen atom, a halogen atom-substituted alkyl group, an alkoxy group, and an alkylthio group. Of these, a fluorine atom-substituted alkyl group is preferable.

Examples of other non-nucleophilic anion include phosphorus fluoride, boron fluoride, and antimony fluoride.

As the non-nucleophilic anion represented by $X^-$, an aliphatic sulfonic anion in which the α-position of the sulfonic acid is substituted with a fluorine atom, an aromatic sulfonic anion substituted with a fluorine atom or a fluorine atom-containing group, a bis(alkylsulfonyl)imide anion in which the alkyl group is substituted with a fluorine atom, and a tris (alkylsulfonyl)methyl anion in which the alkyl group is substituted with a fluorine atom are preferable. As the non-nucleophilic anion, a perfluoro aliphatic sulfonic anion having from 4 to 8 carbon atoms and a fluorine atom-containing benzenesulfonic anion are especially preferable; and a nonafluorobutanesulfonic anion, a perfluorooctanesulfonic anion, pentafluorobenzenesulfonic anion, and a 3,5-bis (trifluoromethyl)benzenesulfonic anion are the most preferable.

As specific examples of the organic group as $R_{201}$, $R_{202}$, and $R_{203}$, corresponding groups in compounds (Z1-1), (Z1-2) and (Z1-3) described later can be enumerated.

Incidentally, compounds having the plural number of the structures represented by the general formula (ZI) may be employed. For example, compounds having a structure in which at least one of $R_{201}$ to $R_{203}$ of a compound represented by the general formula (Z1) is bonded to at least one of $R_{201}$ to $R_{203}$ of another compound represented by the general formula (Z1) may be employed.

More preferably, the compounds (Z1-1), (Z1-2) and (Z1-3) described below can be enumerated as the compound (ZI).

The compound (Z-1) is an aryl sulfonium compound in which at least one of $R_{201}$ to $R_{203}$ of the foregoing general formula (ZI) is an aryl group, that is, a compound in which the cation thereof is an aryl sulfonium.

In the aryl sulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the aryl sulfonium compound include triaryl sulfonium compounds, diarylalkyl sulfonium compounds, aryldialkyl sulfonium compounds, diarylcycloalkyl sulfonium compounds, and aryldicycloalkyl sulfonium compounds.

As the aryl group of the aryl sulfonium compound, a phenyl group and a naphthyl group are preferable, and a phenyl group is more preferable. In the case where the aryl sulfonium compound has two or more aryl groups, the two or more aryl groups may be the same or different.

The alkyl group which the aryl sulfonium compound has as the need arises is preferably a linear or branched alkyl group having from 1 to 15 carbon atoms. Examples thereof include a methyl group, an ethyl group, a propyl group, an n-butyl group, a sec-butyl group, and a t-butyl group.

The cycloalkyl group which the aryl sulfonium compound has as the need arises is preferably a cycloalkyl group having from 3 to 15 carbon atoms. Examples thereof include a cyclopropyl group, a cyclobutyl group, and a cyclohexyl group.

The aryl group, the alkyl group, and the cycloalkyl group as $R_{201}$ to $R_{203}$ may each have an alkyl group (for example, one having from 1 to 15 carbon atoms), a cycloalkyl group (for example, one having from 3 to 15 carbon atoms), an aryl group (for example, one having from 6 to 14 carbon atoms), an alkoxy group (for example, one having from 1 to 15 carbon atoms), a halogen atom, a hydroxyl group, or a phenylthio group as a substituent. As the substituent, a linear or branched alkyl group having from 1 to 12 carbon atoms, a cycloalkyl group having from 3 to 12 carbon atoms, and a linear, branched or cyclic alkoxy group having from 1 to 12 carbon atoms are preferable; and an alkyl group having from 1 to 4 carbon atoms and an alkoxy group having from 1 to 4 carbon atoms are more preferable. The substituent may be substituted on any one of three $R_{201}$ to $R_{203}$ or may be substituted on all of three $R_{201}$ to $R_{203}$. Also, in the case where $R_{201}$ to $R_{203}$ are an aryl group, it is preferable that the substituent is substituted at the p-position of the aryl group.

Next, the compound (Z1-2) will be described below.

The compound (Z1-2) is a compound in the case where in the formula (ZI), $R_{201}$ to $R_{203}$ each independently represents an aromatic ring-free organic group. The aromatic ring as referred to herein includes aromatic rings containing a hetero atom.

The aromatic ring-free organic group as $R_{201}$ to $R_{203}$ generally has from 1 to 30 carbon atoms, and preferably from 1 to 20 carbon atoms.

$R_{201}$ to $R_{203}$ are each independently preferably an alkyl group, a cycloalkyl group, an allyl group, or a vinyl group; more preferably a linear or branched 2-oxoalkyl group, a 2-oxocycloalkyl group, or an alkoxycarbonylmethyl group; and most preferably a linear or branched 2-oxoalkyl group.

The alkyl group as $R_{201}$ to $R_{203}$ is preferably a linear or branched alkyl group having from 1 to 10 carbon atoms, and examples thereof include a methyl group, an ethyl group, a propyl group, a butyl group, and a pentyl group. The alkyl group is more preferably a 2-oxoalkyl group or an alkoxycarbonylmethyl group.

The cycloalkyl group as $R_{201}$ to $R_{203}$ is preferably a cycloalkyl group having from 3 to 10 carbon atoms, and examples thereof include a cyclopentyl group, a cyclohexyl group, and a norbornyl group. The cycloalkyl group is more preferably a 2-oxocycloalkyl group.

The 2-oxoalkyl group may be linear or branched and is preferably a group having >C=O at the 2-position of the foregoing alkyl group.

The 2-oxocycloalkyl group is preferably a group having >C=O at the 2-position of the foregoing cycloalkyl group.

The alkoxy group in the alkxoycarbonylmethyl group is preferably an alkoxy group having from 1 to 5 carbon atoms (for example, a methoxy group, an ethoxy group, a propoxy group, a butoxy group, and a pentyloxy-group).

Each of $R_{201}$ to $R_{203}$ may be further substituted with a halogen atom, an alkoxy group (for example, one having from 1 to 5 carbon atoms), a hydroxyl group, a cyano group, or a nitro group.

The compound (Z1-3) is a compound represented by the following general formula (Z1-3) and is a compound having an phenacyl sulfonium salt structure.

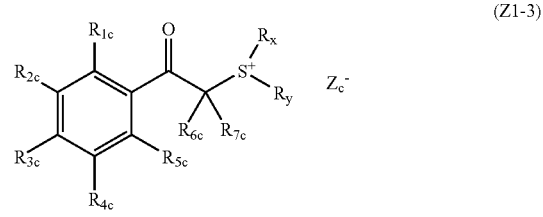

(Z1-3)

In the general formula (Z1-3), $R_{1c}$ to $R_{5c}$ each independently represents a hydrogen atom, an alkyl group, a cycloalkyl group, an alkoxy group, or a halogen atom.

$R_{6c}$ and $R_{7c}$ each independently represents a hydrogen atom, an alkyl group, or a cycloalkyl group.

$R_x$ and $R_y$ each independently represents an alkyl group, a cycloalkyl group, an allyl group, or a vinyl group.

Two or more of $R_{1c}$ to $R_{5c}$, $R_{6c}$ and $R_{7c}$, or $R_x$ and $R_y$ may be taken together to form a ring structure. This ring structure may contain an oxygen atom, a sulfur atom, an ester bond, or an amide bond. Examples of the group which two or more of $R_{1c}$ to $R_{5c}$, $R_{6c}$ and $R_{7c}$, or $R_x$ and $R_y$ are taken together to form include a butylene group and a pentylene group.

$Zc^-$ represents a non-nucleophilic anion, and the same non-nucleophilic anion as in the general formula (ZI) can be enumerated.

The alkyl group as $R_{1c}$ to $R_{7c}$ may be linear or branched, and examples thereof include an alkyl group having from 1 to 20 carbon atoms, and preferably a linear or branched alkyl group having from 1 to 12 carbon atom (for example, a methyl group, an ethyl group, a linear or branched propyl group, a linear or branched butyl group, and a linear or branched pentyl group).

The cycloalkyl group is preferably a cycloalkyl group having from 3 to 8 carbon atoms (for example, a cyclopentyl group and a cyclohexyl group).

The alkoxy group as $R_{1c}$ to $R_5$, may be linear, branched or cyclic, and examples thereof include an alkoxy group having from 1 to 10 carbon atoms, and preferably a linear or branched alkoxy group having from 1 to 5 carbon atoms (for example, a methoxy group, an ethoxy group, a linear or branched propoxy group, a linear or branched butoxy group, and a linear or branched pentoxy group), and a cyclic alkoxy group having from 3 to 8 carbon atoms (for example, a cyclopentyloxy group and a cyclohexyloxy group).

Preferably, any one of $R_{1c}$ to $R_5$, is a leaner or branched alkyl group, a cycloalkyl group, or a linear, branched or cyclic alkoxy group; and more preferably, the sum of carbon atoms of $R_{1c}$ to $R_{5c}$ is from 2 to 15. In this regard, the solvent solubility is more enhanced so that the generation of particles is inhibited at the time of storage.

The alkyl group and the cycloalkyl group as $R_x$ and $R_y$ are the same as the alkyl group and the cycloalkyl group as $R_{1c}$ to $R_{7c}$, respectively. Of these, a 2-oxoalkyl group, a 2-oxocycloalkyl group, and an alkoxycarbonylmethyl group are more preferable.

As the 2-oxoalkyl group and the 2-oxocycloalkyl group, groups having >C=O at the 2-position of each of the alkyl group and the cycloalkyl group as $R_{1c}$ to $R_{7c}$ can be enumerated.

The alkoxy group in the alkoxycarbonylmethyl group is the same as the alkoxy group as $R_{1c}$ to $R_{5c}$.

$R_x$ and $R_y$ are preferably an alkyl group or a cycloalkyl group each having 4 or more carbon atoms, more preferably an alkyl group or a cycloalkyl group each having 6 or more carbon atoms, and further preferably an alkyl group or a cycloalkyl group each having 8 or more carbon atoms.

In the general formulae (ZII) and (ZIII), $R_{204}$ to $R_{207}$ each independently represents an aryl group, an alkyl group, or a cycloalkyl group.

The aryl group as $R_{204}$ to $R_{207}$ is preferably a phenyl group or a naphthyl group, and more preferably a phenyl group.

The alkyl group as $R_{204}$ to $R_{207}$ is preferably a linear or branched alkyl group having from 1 to 10 carbon atoms, and examples thereof include a methyl group, an ethyl group, a propyl group, a butyl group, and a pentyl group.

The cycloalkyl group as $R_{204}$ to $R_{207}$ is preferably a cycloalkyl group having from 3 to 10 carbon atoms, and examples thereof include a cyclopentyl group, a cyclohexyl group, and a norbornyl group.

Examples of the substituent which $R_{204}$ to $R_{207}$ may have include an alkyl group (for example, one having from 1 to 15 carbon atoms), a cycloalkyl group (for example, one having from 3 to 15 carbon atoms), an aryl group (for example, one having from 6 to 15 carbon atoms), an alkoxy group (for example, one having from 1 to 15 carbon atoms), a halogen atom, a hydroxyl group, and a phenylthio group.

$X^-$ represents a non-nucleophilic anion, and the same non-nucleophilic anion as $X^-$ in the general formula (ZI) can be enumerated.

Examples of the compounds capable of generating an acid by irradiation with the actinic ray or the radiation, which may be used jointly, include compounds represented by the following general formulae (ZIV), (ZV) and (ZVI).

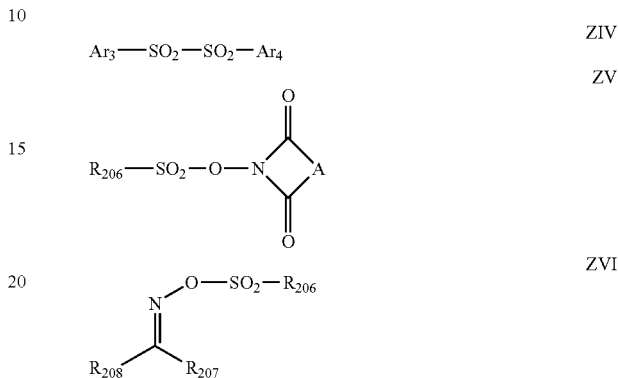

In the general formulae (ZIV) to (ZVI), $Ar_3$ and $Ar_4$ each independently represents an aryl group.

$R_{206}$, $R_{207}$, and $R_{208}$ each independently represents an alkyl group or an aryl group.

A represents an alkylene group, an alkenylene group, or an arylene group.

Of the compounds capable of generating an acid by irradiation with the actinic ray or the radiation, which may be used jointly, the compounds represented by the general formulae (ZI) to (ZIII) are more preferable.

Also, as the compound capable of generating an acid by irradiation with the actinic ray or the radiation, which may be used jointly, a compound capable of generating a sulfonic acid having one sulfonic group is preferable; a compound capable of generating a monovalent perfluoro aliphatic sulfonic acid and a compound capable of generating an aromatic sulfonic acid substituted with a fluorine atom or a fluorine atom-substituted group are more preferable.

Of the compounds capable of generating an acid by irradiation with the actinic ray or the radiation, which may be used jointly, the following compounds are especially preferable.

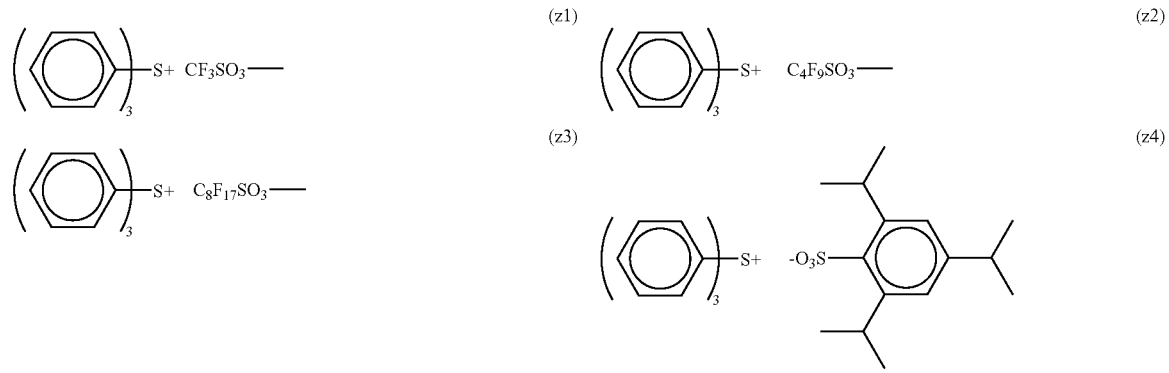

-continued
(z5)
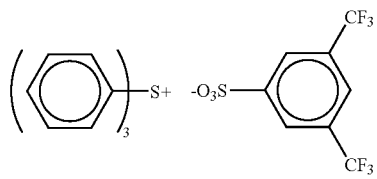
(z6)
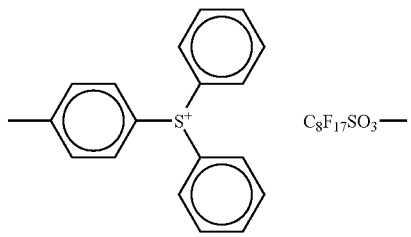
(z7)
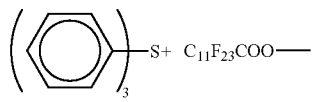
(z8)
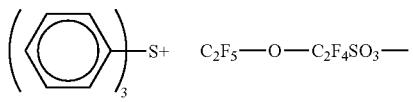
(z9)
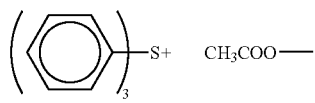
(z10)
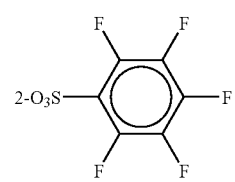
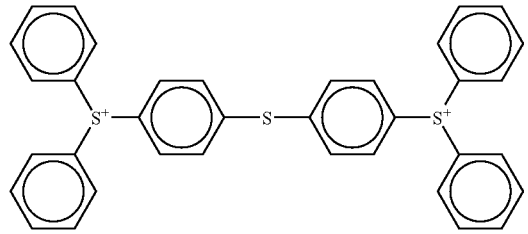
(z11)
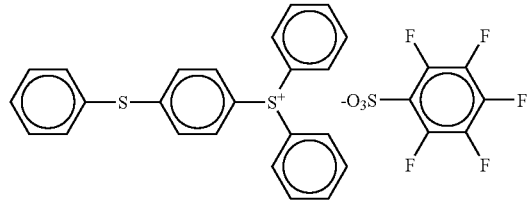
(z12)
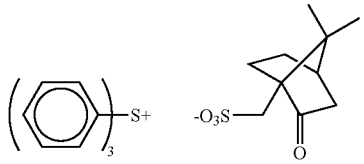
(z13)
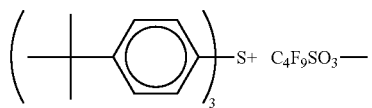
(z14)
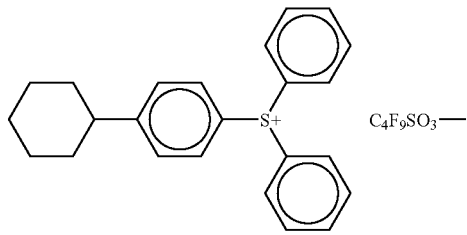
(z15)
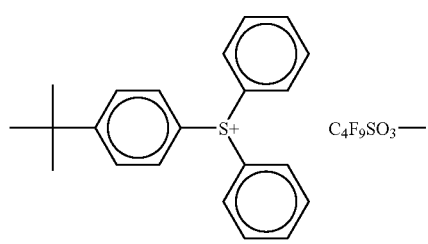
(z16)
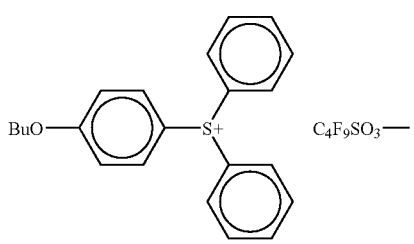
(z17)
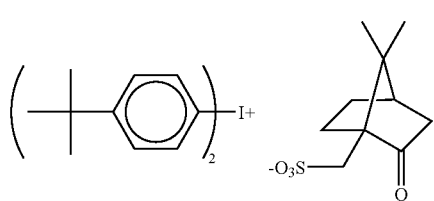
(z18)
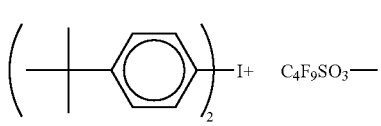

-continued

-continued
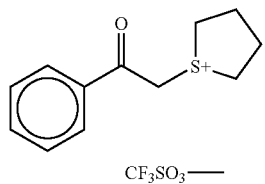
(z35)
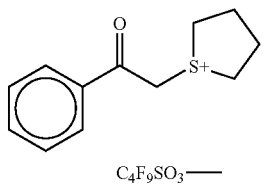
(z36)
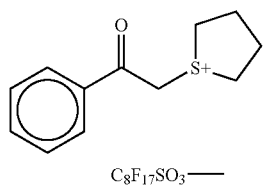
(z37)
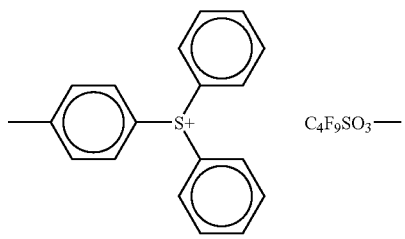
(z38)
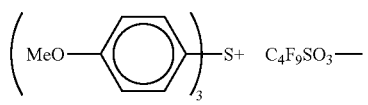
(z39)
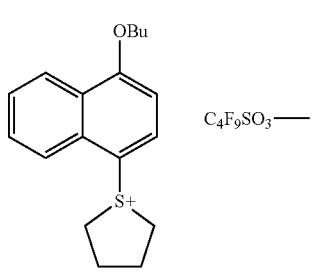
(z40)
(z41)
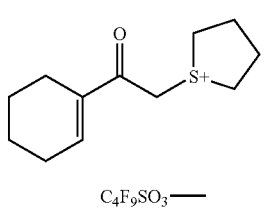
(z42)
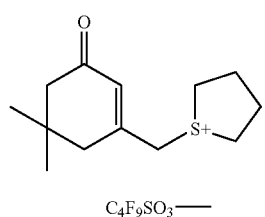
(z43)
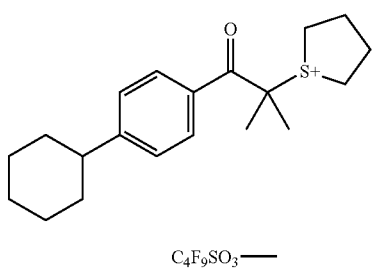
(z44)
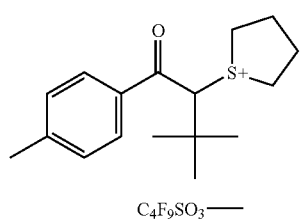
(z45)
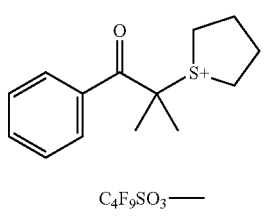
(z46)

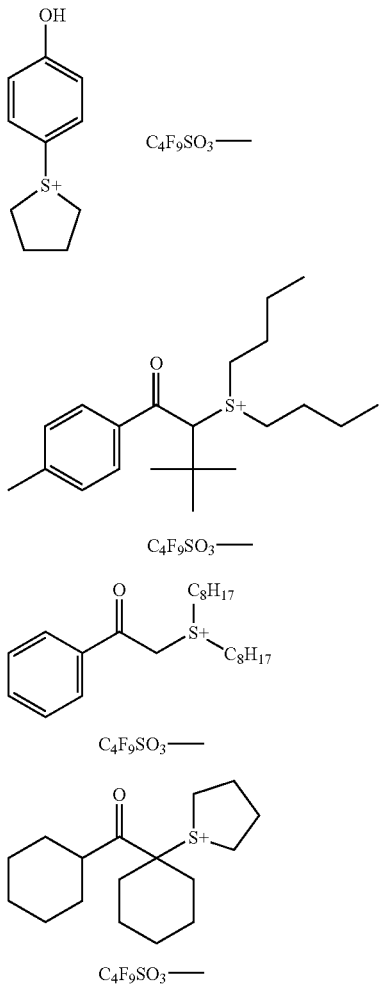
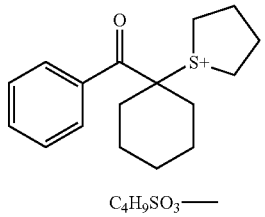
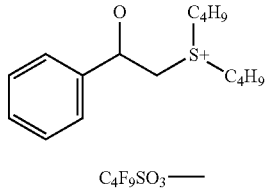
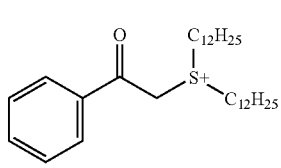
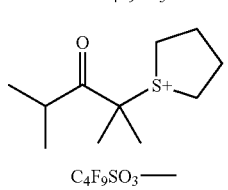

[2] (B) Resin, the solubility of which in an alkaline developer increases by the action of an acid (hereinafter sometimes referred to as "component (B)"):

The resin, the solubility of which in an alkaline developer increases by the action of an acid, and which is used in the positive photosensitive composition of the invention, is a resin having a group capable of being decomposed by an acid (hereinafter sometimes referred to as "acid decomposable group") in the principal chain or the side chain or both the principal chain and the side chain of the resin. Above all, a resin having a group capable of being decomposed by an acid in the side chain is more preferable.

The group capable of being decomposed by an acid is preferably a group resulting from substitution of the hydrogen atom of a —COOH group or an —OH group with a group capable of being eliminated by an acid.

In the invention, it is preferable that the acid decomposable group is an acetal group or a tertiary ester group.

In the case where a group capable of being decomposed by an acid is bonded as the side chain, the matrix resin is an alkali-soluble resin having an —OH or —COOH group in the side chain. For example, alkali-soluble resins described later can be enumerated.

The alkali dissolution rate of such an alkali-soluble resin is preferably 170 A/sec or more, and especially preferably 330 A/sec or more ("A" means an angstrom) as measured (at 23° C.) in 0.261N tetramethylammonium hydroxide (TMAH).

From this viewpoint, alkali-soluble resins having a hydroxystyrene structural unit, such as o-, m- or p-poly (hydroxystyrene) and copolymers thereof, hydrogenated poly (hydroxystyrene), halogen- or alkyl-substituted poly (hydroxystyrene), partly O-alkylated or O-acylated products of poly(hydroxystyrene), a styrene-hydroxystyrene copolymer, an α-methylstyrene-hydroxystyrene copolymer, and hydrogenated novolak resins, are especially preferable as the alkali-soluble resin.

As the preferred acid decomposable group-containing repeating unit in the invention, t-butoxycarbonyloxystyrene, a 1-alkoxyethoxystyrene, and a (meth)acrylic acid tertiary alkyl ester can be enumerated.

The component (B) to be used in the invention can be obtained by reacting the alkali-soluble resin with a precursor of a group capable of being decomposed by an acid, or copolymerizing an alkali-soluble resin monomer having a group capable of being decomposed by an acid bonded thereto and a variety of monomers as disclosed in European Patent No. 254853, JP-A-2-25850, JP-A-3-223860 and JP-A-4-251259.

Specific examples of the component (B) to be used in the invention will be given below, but it should not be construed that the invention is limited thereto.

p-t-Butoxystyrene/p-hydroxystyrene copolymer
p-(t-Butoxycarbonyloxy)styrene/p-hydroxystyrene copolymer
p-(t-Butoxycarbonylmethyloxy)styrene/p-hydroxystyrene copolymer
4-(t-Butoxycarbonylmethyloxy)-3-methylstyrene/4-hydroxy-3-methylstyrene copolymer
p-(t-Butoxycarbonylmethyloxy)styrene/p-hydroxystyrene (10% hydrogenated product) copolymer
m-(t-Butoxycarbonylmethyloxy)styrene/m-hydroxystyrene copolymer
o-(t-Butoxycarbonylmethyloxy)styrene/o-hydroxystyrene copolymer
p-(Cumyloxycarbonylmethyloxy)styrene/p-hydroxystyrene copolymer
Cumyl methacrylate/methyl methacrylate copolymer
4-t-Butoxycarbonylstyrene/dimethyl maleate copolymer
Benzyl methacrylate/tetrahydropyranyl methacrylate copolymer
p-(t-Butoxycarbonylmethyloxy)styrene/p-hydroxystyrene/styrene copolymer
p-t-Butoxystyrene/p-hydroxystyrene/fumaronitrile copolymer
t-Butoxystyrene/hydroxyethyl methacrylate copolymer
Styrene/N-(4-hydroxyphenyl)maleimide/N-(4-t-butoxycarbonyloxyphenyl)maleimide copolymer
p-Hydroxystyrene/t-butyl methacrylate copolymer
Styrene/p-hydroxystyrene/t-butyl methacrylate copolymer
p-Hydroxystyrene/t-butyl methacrylate copolymer
Styrene/p-hydroxystyrene/t-butyl acrylate copolymer
p-(t-Butoxycarbonylmethyloxy)styrene/p-hydroxystyrene/N-methylmaleimide copolymer
t-Butyl methacrylate/1-adamantylmethyl methacrylate copolymer
p-Hydroxystyrene/t-butyl acrylate/p-acetoxystyrene copolymer
p-Hydroxystyrene/t-butyl acrylate/p-(t-butoxycarbonyloxy)styrene copolymer
p-Hydroxystyrene/t-butyl acrylate/p-(t-butoxycarbonylmethyloxy)styrene copolymer

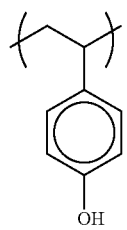 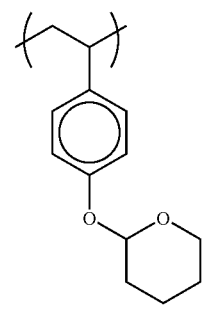 (R-1)

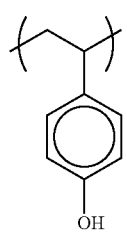 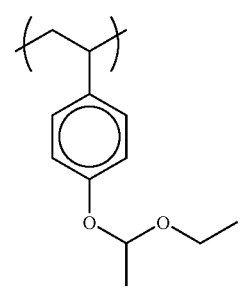 (R-2)

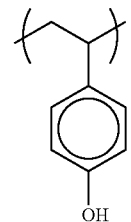 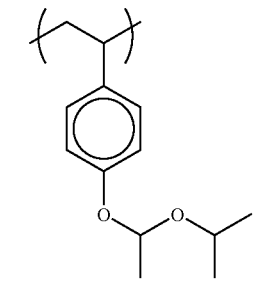 (R-3)

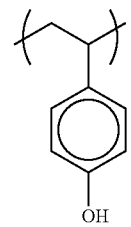 (R-4)

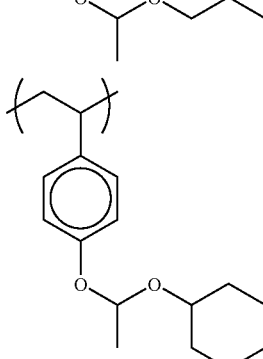

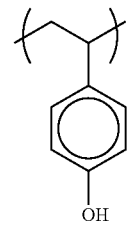 (R-5)

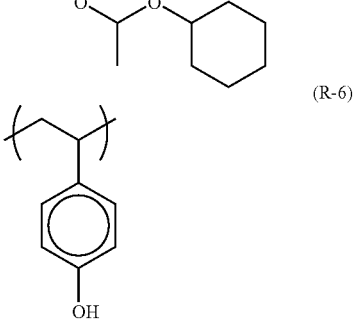

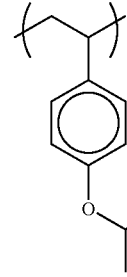 (R-6)

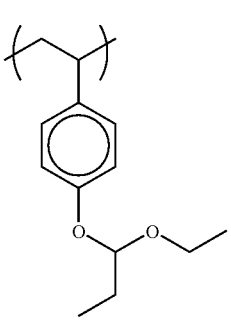 (R-7)

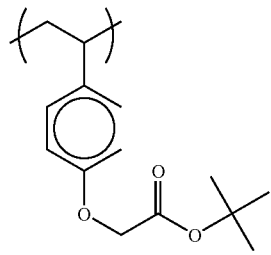
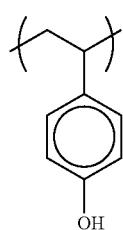
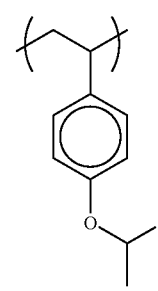
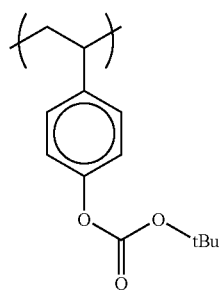
(R-9)
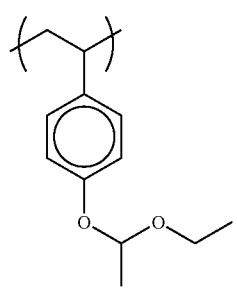
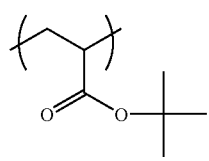
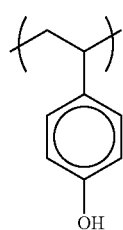
(R-10)
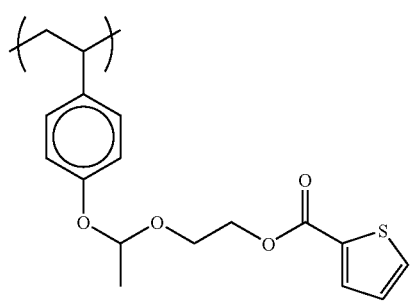
(R-11)
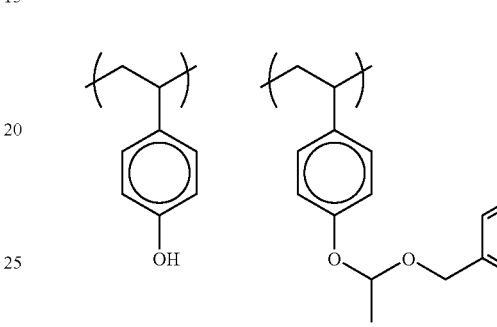
(R-12)
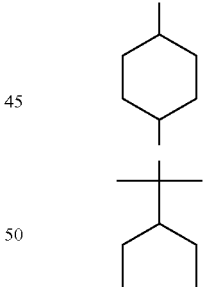
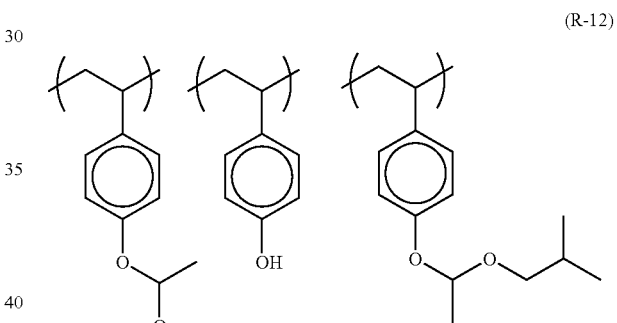
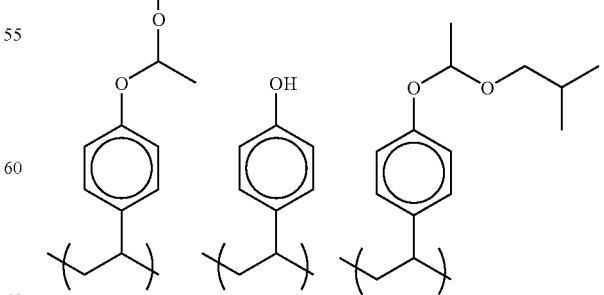

(R-13)
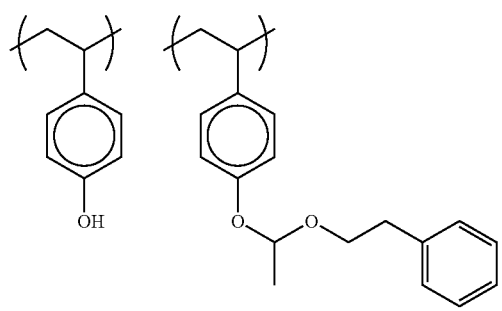
(R-14)
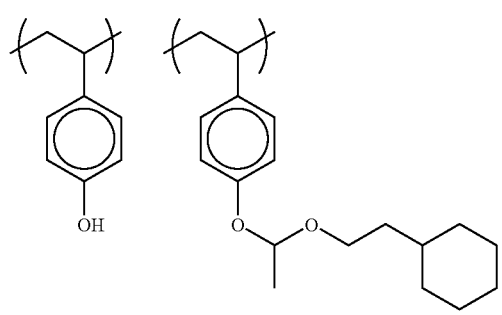
(R-15)
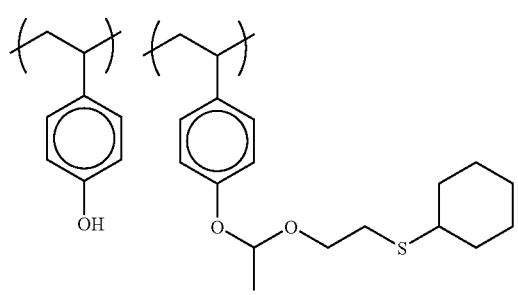
(R-16)
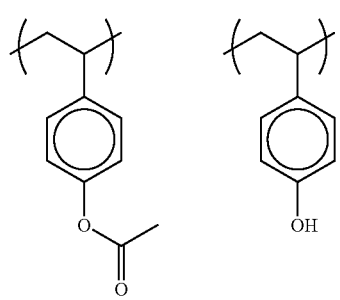
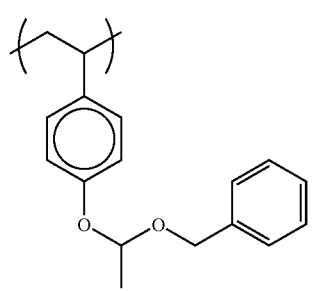
(R-17)
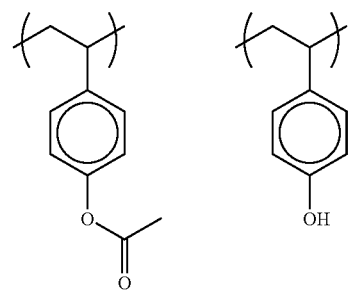
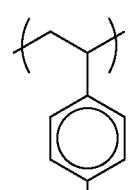
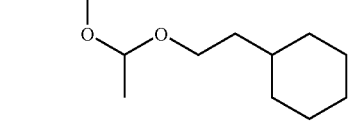
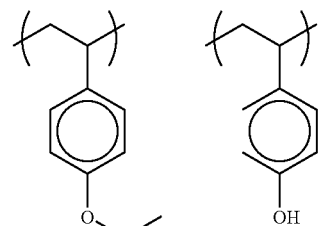
(R-18)
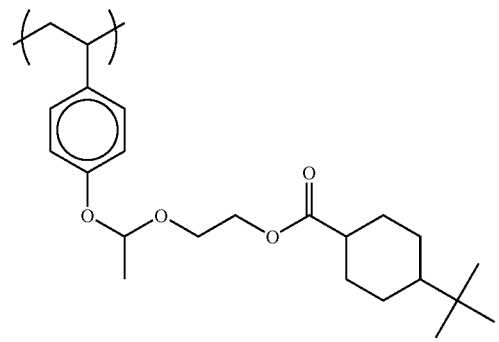
(R-19)
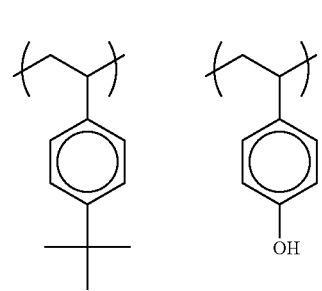

-continued

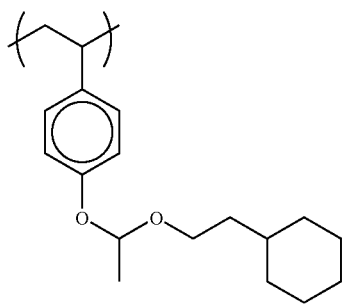
(R-20)

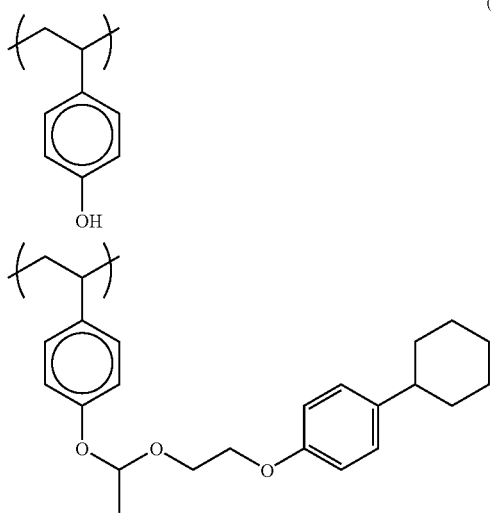
(R-21)

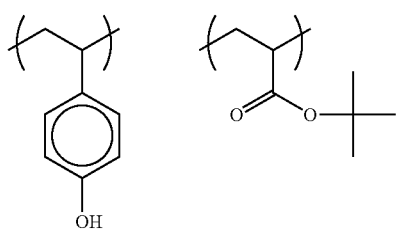
(R-22)

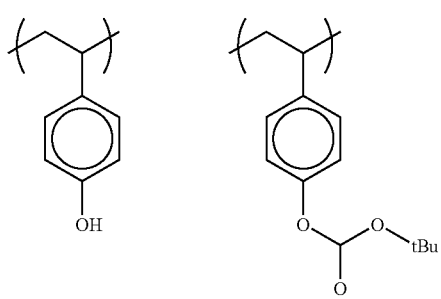
(R-23)

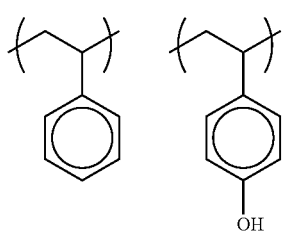

-continued

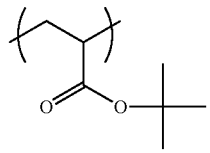

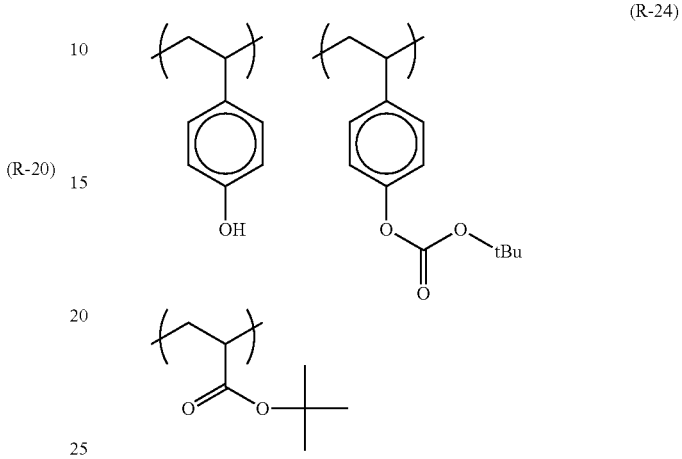
(R-24)

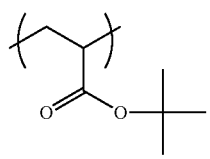

In the foregoing specific examples, the symbol "tBu" represents a t-butyl group.

The content of the group capable of being decomposed by an acid is expressed by [B/(B+S)] wherein B represents the number of the group capable of being decomposed by an acid in the resin, and S represents the number of the alkali-soluble group not protected by a group capable of being eliminated by an acid. The content is preferably from 0.01 to 0.7, more preferably from 0.05 to 0.50, and further preferably from 0.05 to 0.40.

(Ba) Resin having a monocyclic or polycyclic alicyclic hydrocarbon structure, the solubility of which in an alkaline developer increases by the action of an acid:

In the case where the positive photosensitive composition of the invention is irradiated with an ArF excimer laser, it is preferable that the resin as the component (B) is a resin having a monocyclic or polycyclic alicyclic hydrocarbon structure, the solubility of which in an alkaline developer increases by the action of an acid.

As the resin having a monocyclic or polycyclic alicyclic hydrocarbon structure, the solubility of which in an alkaline developer increases by the action of an acid (this resin will be hereinafter sometimes referred to as "alicyclic hydrocarbon based acid decomposable resin"), a resin having at least one member selected from the group consisting of a repeating unit having a partial structure containing an alicyclic hydrocarbon represented by any one of the following general formulae (pI) to (pVI) and a repeating unit represented by the following general formula (II-AB).

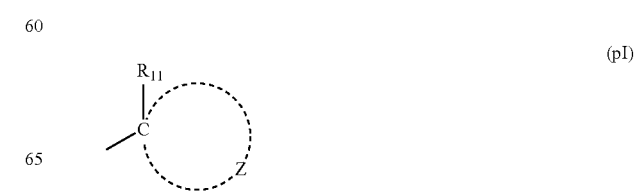
(pI)

-continued

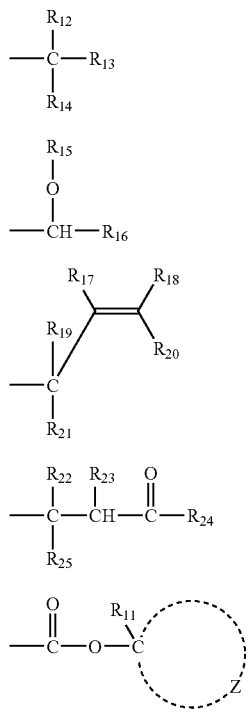

(pII)

(pIII)

(pIV)

(pV)

(pVI)

In the formulae, $R_{11}$ represents a methyl group, an ethyl group, an n-propyl group, an isopropyl group, an n-butyl group, an isobutyl group, or a sec-butyl group.

Z represents an atomic group necessary for forming an alicyclic hydrocarbon group together with a carbon atom.

$R_{12}$ to $R_{16}$ each independently represents a linear or branched alkyl group having from 1 to 4 carbon atom or an alicyclic hydrocarbon group, with proviso that at least one of $R_{12}$ to $R_{14}$ and any one of $R_{15}$ and $R_{16}$ represent an alicyclic hydrocarbon group.

$R_{17}$ to $R_{21}$ each independently represents a hydrogen atom, a linear or branched alkyl group having from 1 to 4 carbon atoms or an alicyclic hydrocarbon group, with proviso that at least one of $R_{17}$ to $R_{21}$ represents an alicyclic hydrocarbon group and that any one of $R_{19}$ and $R_2$, represents a linear or branched alkyl group having from 1 to 4 carbon atoms or an alicyclic hydrocarbon group.

$R_{22}$ to $R_{25}$ each independently represents a hydrogen atom, a linear or branched alkyl group having from 1 to 4 carbon atoms or an alicyclic hydrocarbon group, with proviso that at least one of $R_{22}$ to $R_{25}$ represents an alicyclic hydrocarbon group and that $R_{23}$ and $R_{24}$ may be taken together to form a ring.

(II-AB)

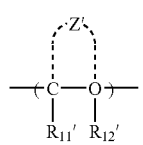

In the general formula (II-AB), $R_{11}'$ and $R_{12}'$ each independently represents a hydrogen atom, a cyano group, a halogen atom, or an alkyl group.

$Z'$ represents an atomic group for forming an alicyclic structure, which contains bonded two carbon atoms (C—C).

Also, the foregoing general formula (II-AB) is further preferably the following general formula (II-A) or (II-B).

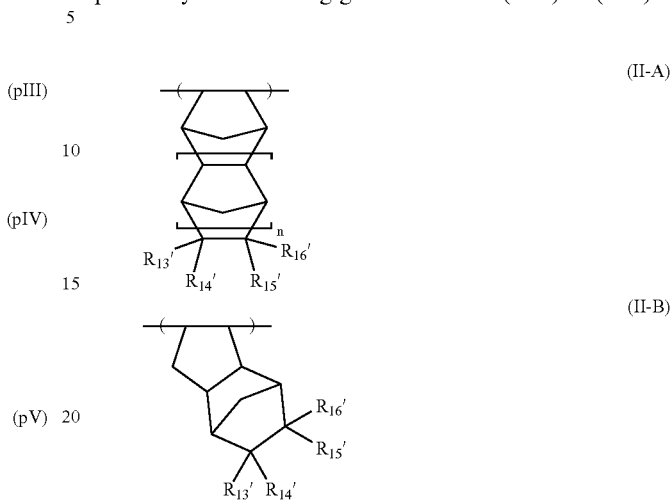

In the formulae (II-A) and (II-B), $R_{13}'$ to $R_{16}'$ each independently represents a hydrogen atom, a halogen atom, a cyano group, —COOH, —COOR$_5$, a group capable of being decomposed by an acid, —C(=O)—X-A'-R$_{17}'$, an alkyl group, or a cyclic hydrocarbon group.

Here, $R_5$ represents an alkyl group, a cyclic hydrocarbon group, or the following —Y group.

X represents an oxygen atom, a sulfur atom, —NH—, —NHSO$_2$—, or —NHSO$_2$NH—.

A' represents a single bond or a divalent connecting group.

$R_{17}'$ represents —COOH, —COOR$_5$, —CN—, a hydroxyl group, an alkoxy group, —CO—NH—R$_6$, —CO—NH—SO$_2$—R$_6$, or the following —Y group.

$R_6$ represents an alkyl group or a cyclic hydrocarbon group.

Also, at least two of $R_{13}'$ to $R_{16}'$ may be taken together to form a ring.

n represents 0 or 1.

—Y group:

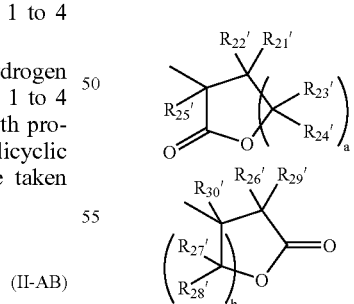

In the —Y group, $R_{21}'$ to $R_{30}'$ each independently represents a hydrogen atom or an alkyl group.

a and b each represents 1 or 2.

In the general formulae (pI) to (pVI), the alkyl group as $R_{12}$ to $R_{25}$ is preferably a linear or branched alkyl group having from 1 to 4 carbon atoms. Examples of the alkyl group as $R_{12}$ to $R_{25}$ include a methyl group, an ethyl group, an n-propyl group, an isopropyl group, an n-butyl group, an isobutyl group, a sec-butyl group, and a t-butyl group.

The foregoing alkyl group may further have a substituent. Examples of the substituent which the alkyl group may have include an alkoxy group having from 1 to 4 carbon atoms, a halogen atom (for example, a fluorine atom, a chlorine atom, a bromine atom, and an iodine atom), an acyl group, an acyloxy group, a cyano group, a hydroxyl group, a carboxy group, an alkoxycarbonyl group, and a nitro group.

The alicyclic hydrocarbon group as $R_{12}$ to $R_{25}$ or the alicyclic hydrocarbon group which Z forms together with the carbon atom may be monocyclic or polycyclic. Specifically, groups having a monocyclic, bicyclic, tricyclic or tetracyclic structure having 5 or more carbon atoms can be enumerated. The number of carbon atoms is preferably from 6 to 30, and especially preferably from 7 to 25. These alicyclic hydrocarbon groups may have a substituent.

Preferred examples of the alicyclic hydrocarbon group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. Of these, an adamantyl group, a decalin residue, a norbornyl group, a cedrol group, a cyclohexyl group, a cycloheptyl group, a cyclooctyl group, a cyclodecanyl group, and a cyclododecanyl group are more preferable.

The alicyclic hydrocarbon group may further have a substituent. Examples of the substituent of the alicyclic hydrocarbon group include an alkyl group, a halogen atom, a hydroxyl group, an alkoxy group, a carboxyl group, and an alkoxycarbonyl group. As the alkyl group, lower alkyl groups such as a methyl group, an ethyl group, a propyl group, an isopropyl group, and a butyl group are preferable. More preferably, the alkyl group is selected from the group consisting of a methyl group, an ethyl group, a propyl group, and an isopropyl group. As the alkoxy group, those having from 1 to 4 carbon atoms, such as a methoxy group, an ethoxy group, a propoxy group, and a butoxy group can be enumerated. The foregoing alkyl group, alkoxy group and alkoxycarbonyl group may further have a substituent. Examples of the substituent which the alkyl group, the alkoxy group, or the alkoxycarbonyl group may have include a hydroxyl group, a halogen atom, and an alkoxy group.

The structures represented by the general formulae (pI) to (pVI) in the foregoing resin can be used for protecting an alkali-soluble group. As the alkali-soluble group, various groups known in this technical field are enumerated.

Specifically, a carboxylic group, a sulfonic group, a phenol group, and a thio group are enumerated. Of these, a carboxylic group and a sulfonic group are preferable.

As the alkali-soluble group protected by any one of the structures represented by the general formulae (pI) to (pVI) in the foregoing resin, structures resulting from substitution of a hydrogen atom of a carboxyl group with any one of the structures of the general formulae (pI) to (pVI) are preferably enumerated.

As a repeating unit having an alkali-soluble group protected by any one of the structures represented by the general formulae (pI) to (pVI), a repeating unit represented by the following general formula (pA) is preferable.

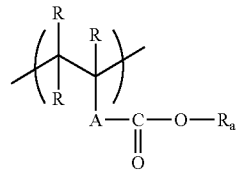

(pA)

Here, R represents a hydrogen atom, a halogen atom, or a linear or branched alkyl group having from 1 to 4 carbon atoms. Plural R may be the same or different.

A represents a single group or a combination of two or more groups selected from the group consisting of a single bond, an alkylene group, an ether group, a thioether group, a carbonyl group, an ester group, an amide group, a sulfonamide group, a urethane group, and a urea group.

Ra represents any one group of the foregoing formulae (pI) to (pVI).

The repeating unit represented by the general formula (pA) is most preferably a repeating unit by a 2-alkyl-2-adamantyl (meth) acrylate or a dialkyl (1-adamantyl) methyl (meth)acrylate.

Specific examples of the repeating unit represented by the general formula (pA) will be given below.

($Rx$ represents H, $CH_3$ or $CF_3$)

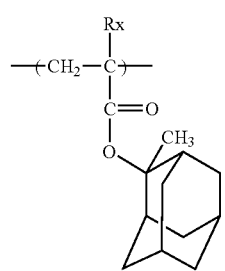

1

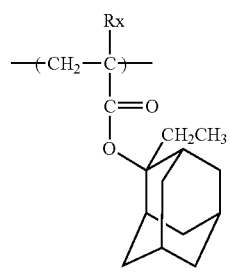

2

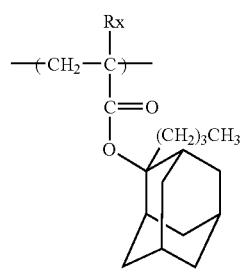

3

-continued
4
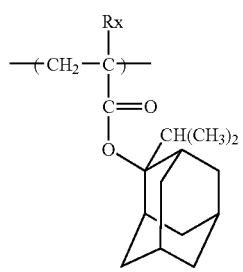
5
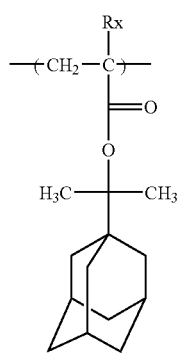
6
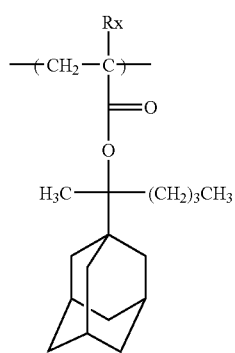
7
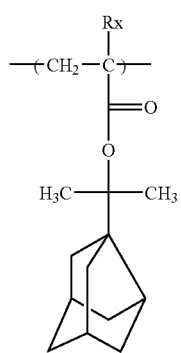
8
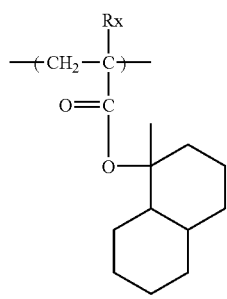
-continued
9
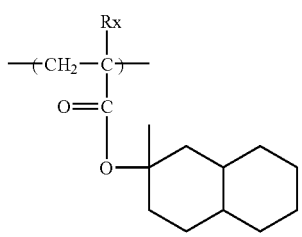
10
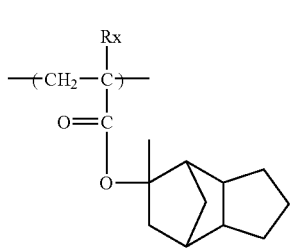
11
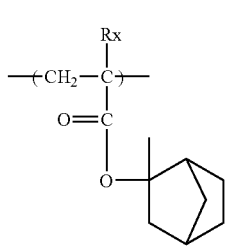
12
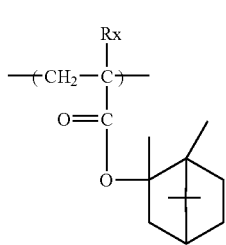
13
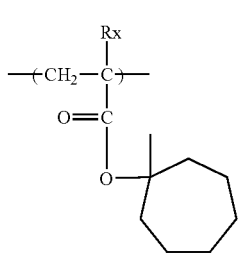
14
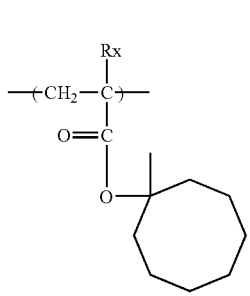

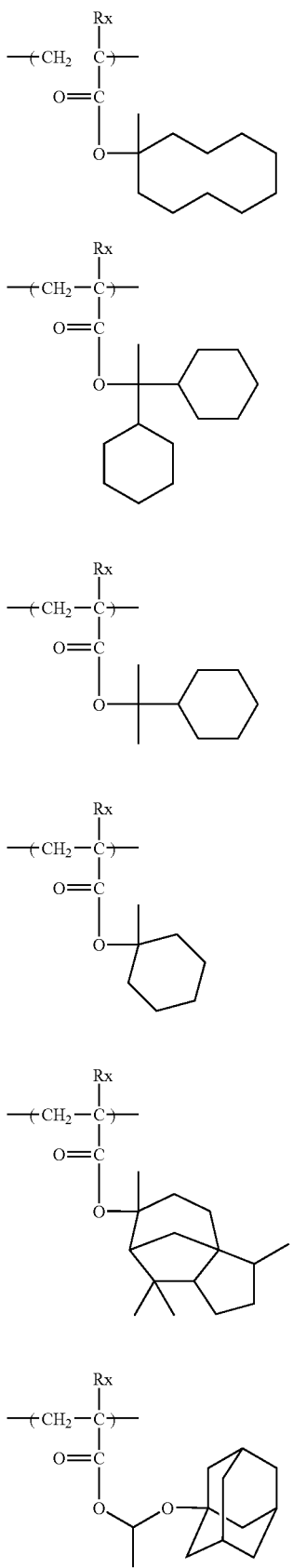

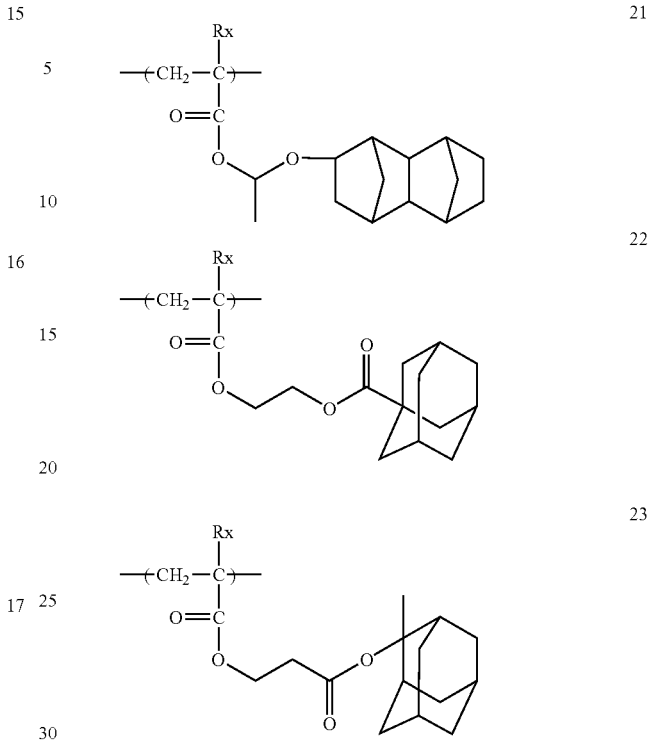

In the foregoing general formula (II-AB), $R_{11}'$ and $R_{12}'$ each independently represents a hydrogen atom, a cyano group, a halogen atom, or an alkyl group.

Z' represents an atomic group for forming an alicyclic structure, which contains bonded two carbon atoms (C—C).

Examples of the halogen atom in the foregoing $R_{11}'$ and $R_{12}'$ include a chlorine atom, a bromine atom, a fluorine atom, and an iodine atom.

As the alkyl group in the foregoing $R_{11}'$ and $R_{12}'$, a linear or branched alkyl group having from 1 to 10 carbon atoms is preferable; a linear or branched alkyl group having from 1 to 6 carbon atoms is more preferable; and a methyl group, an ethyl group, a propyl group, an isopropyl group, an n-butyl group, an isobutyl group, a sec-butyl group, and a t-butyl group are further preferable.

Examples of a substituent which the foregoing alkyl group may further have include a hydroxyl group, a halogen atom, a carboxyl group, an alkoxy group, an acyl group, a cyano group, and an acyloxy group. Examples of the halogen atom include a chlorine atom, a bromine atom, a fluorine atom, and an iodine group. Examples of the alkoxy group include one having from 1 to 4 carbon atoms, such as a methoxy group, an ethoxy group, a propoxy group, and a butoxy group. Examples of the acyl group include a formyl group and an acetyl group. Examples of the acyloxy group include an acetoxy group.

The atomic group for forming the alicyclic structure of the foregoing Z' is an atomic group of forming a repeating unit of an optionally substituted alicyclic hydrocarbon in the resin. Above all, an atomic group for forming a bridged alicyclic structure of forming a repeating unit of a bridged alicyclic hydrocarbon is preferable.

As a skeleton of the alicyclic hydrocarbon to be formed, the same alicyclic hydrocarbon groups as in $R_{11}$ to $R_{25}$ in the general formulae (pI) to (pVI) are enumerated.

The foregoing alicyclic hydrocarbon skeleton may have a substituent. As the substituent, $R_{13}'$ to $R_{16}'$ in the foregoing general formula (II-A) or (II-B) can be enumerated.

Of the foregoing repeating units having a bridged alicyclic hydrocarbon, the repeating unit represented by the foregoing general formula (II-A) or (II-B) is further preferable.

In the alicyclic hydrocarbon based acid decomposable resin according to the invention, the acid decomposable group may be contained in the foregoing —C(=O)—X-A'-$R_{17}'$ or may be contained as a substituent of Z' of the general formula (II-AB).

The structure of the acid decomposable group is represented by —C(=O)—$X_1$—$R_0$.

In the formula, examples of $R_0$ include a tertiary alkyl group such as a t-butyl group and a t-amyl group, a 1-alkoxyethyl group such as an isoboronyl group, a 1-ethoxyethyl group, a 1-butoxyethyl group, a 1-isobutoxyethyl group, and a 1-cyclohexyloxyethyl group, an alkoxymethyl group such as a 1-methoxymethyl group and a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, and a mevalonic lactone residue. $X_1$ is synonymous with the foregoing X.

Examples of the halogen atom in the foregoing $R_{13}'$ to $R_{16}'$ include a chlorine atom, a bromine atom, a fluorine atom, and an iodine atom.

The alkyl group in the foregoing $R_{13}'$ to $R_{16}'$, $R_5$, $R_6$, and $R_{21}'$ to $R_{30}'$ is preferably a linear or branched alkyl group having from 1 to 10 carbon atoms, more preferably a linear or branched alkyl group having from 1 to 6 carbon atoms, and further preferably a methyl group, an ethyl group, a propyl group, an isopropyl group, an n-butyl group, an isobutyl group, a sec-butyl group, or a t-butyl group.

Examples of the alicyclic hydrocarbon group in the foregoing $R_{13}'$ to $R_{16}'$, $R_5$, and $R_6$ include an alicyclic alkyl group and a bridged hydrocarbon, for example, a cyclopropyl group, a cyclopentyl group, a cyclohexyl group, an adamantly group, a 2-methyl-2-adamntyl group, a norbornyl group, a boronyl group, an isoboronyl group, a tricyclodecanyl group, a dicyclopentenyl group, a norborane epoxy group, a mentyl group, an isomentyl group, a neomentyl group, and a tetracyclododecanyl group.

Examples of the ring which at least two of the foregoing $R_{13}'$ to $R_{16}'$ are taken together to form include a ring having from 5 to 12 carbon atoms, such as cyclopentene, cyclohexene, cycloheptane, and cyclooctane.

Examples of the alkoxy group in the foregoing $R_{17}'$ include one having from 1 to 4 carbon atoms, such as a methoxy group, an ethoxy group, a propoxy group, and a butoxy group.

Examples of a substituent which the foregoing alkyl group, alicyclic hydrocarbon group or alkoxy group may further have include a hydroxyl group, a halogen atom, a carboxyl group, an alkoxy group, an acyl group, a cyano group, an acyloxy group, an alkyl group, and an alicyclic hydrocarbon group. Examples of the halogen atom include a chlorine atom, a bromine atom, a fluorine atom, and an iodine atom. Examples of the alkoxy group include one having from 1 to 4 carbon atoms, such as a methoxy group, an ethoxy group, a propoxy group, and a butoxy group. Examples of the acyl group include a formyl group and an acetyl group. Examples of the acyloxy group include an acetoxy group.

Also, as the alkyl group and the cyclic hydrocarbon group, those enumerated above are enumerated.

The divalent connecting group of the foregoing A' is one member or a combination of two or more members selected from the group consisting of an alkylene group, an ether group, a thioether group, a carbonyl group, an ester group, an amide group, a sulfonamide group, a urethane group, and a urea group.

In the alicyclic hydrocarbon based acid decomposable resin according to the invention, the group capable of being decomposed by the action of an acid can contain at least one repeating unit of a repeating unit having a partial structure containing the alicyclic hydrocarbon represented by any one of the foregoing general formulae (pI) to (pVI), a repeating unit represented by the general formula (II-AB), and a repeating unit of copolymerization component described later.

The respective substituent of $R_{13}'$ to $R_{16}'$ in the foregoing general formula (II-A) or general formula (II-B) will each become a substituent of the atomic group for forming the alicyclic structure or the atomic group Z for forming the bridged alicyclic structure in the foregoing general formula (II-AB).

Specific examples of the repeating unit represented by the foregoing general formula (II-A) or general formula (II-B) will be given below, but it should not be construed that the invention is limited to these specific examples.

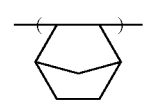

[II-1]

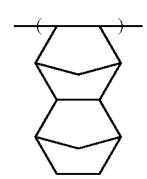

[II-2]

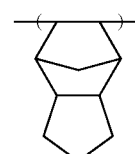

[II-3]

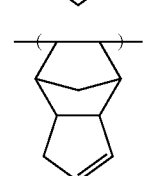

[II-4]

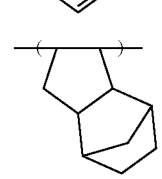

[II-5]

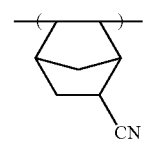

[II-6]

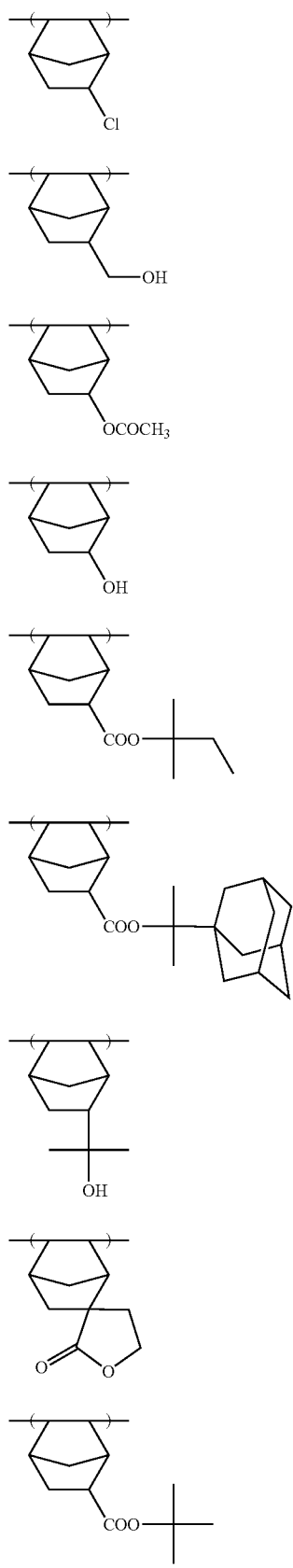
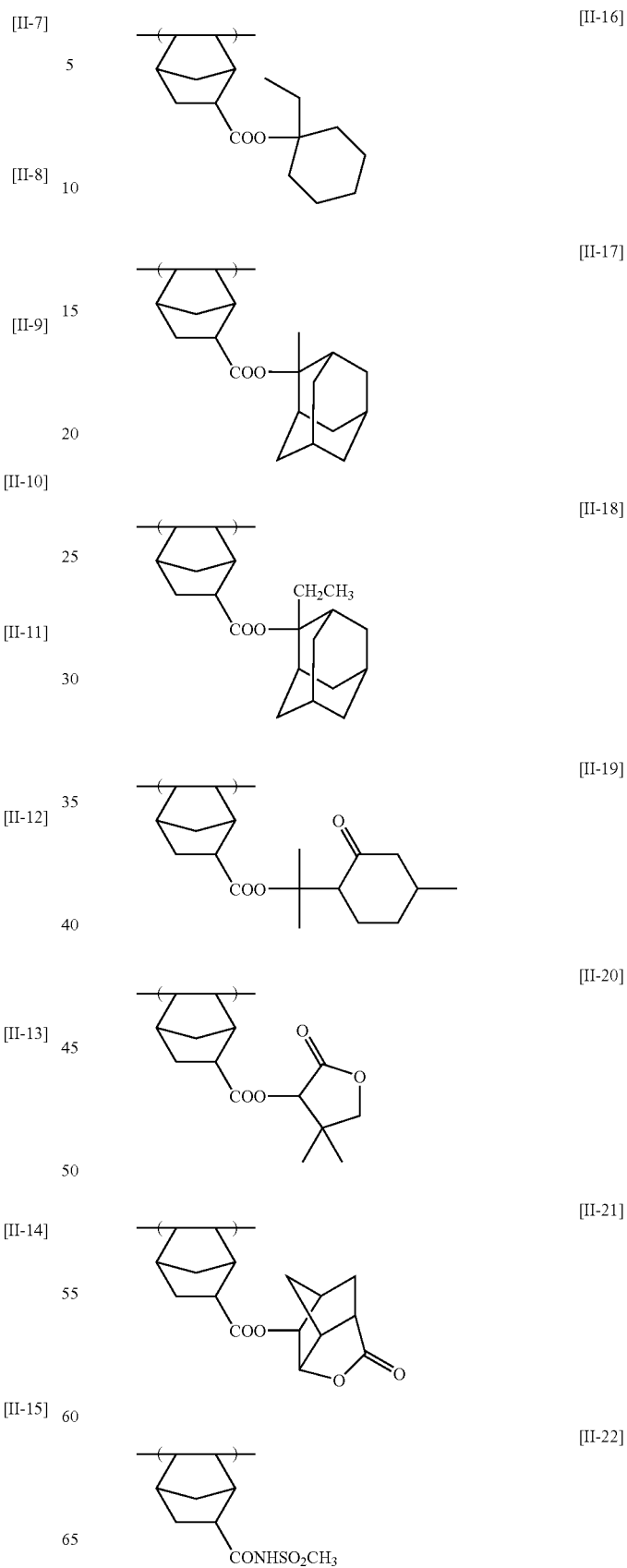

[II-23]
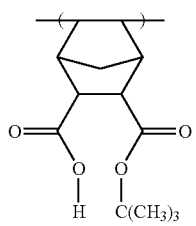

[II-24]
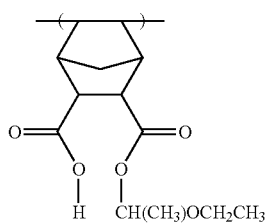

[II-25]
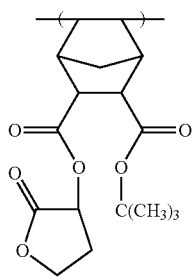

[II-26]
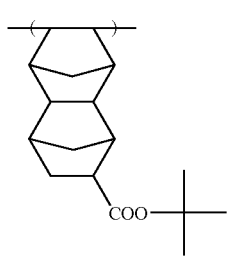

[II-27]
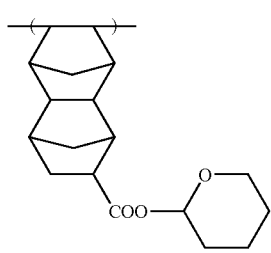

[II-28]
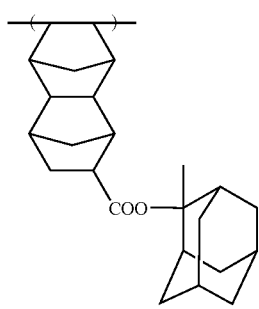

[II-29]
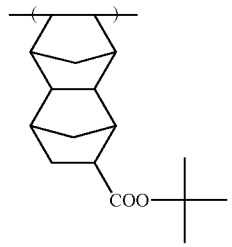

[II-30]
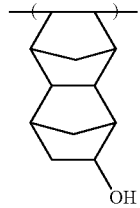

[II-31]
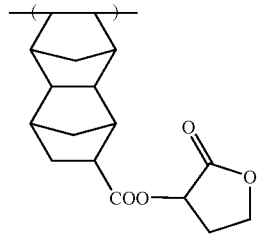

[II-32]
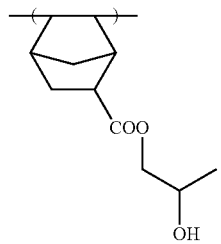

The alicyclic hydrocarbon based acid decomposable resin of the invention preferably has a lactone group, and more preferably a repeating unit having a group having a lactone structure represented by the following general formula (Lc) or any one of the following general formulae (V-1) to (V-5). The group having a lactone structure may be bonded directly to the principal chain.

(Lc)
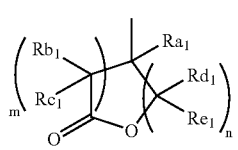

(V-1)
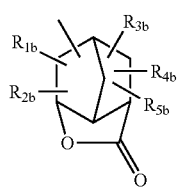

-continued

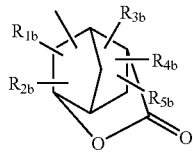
(V-2)

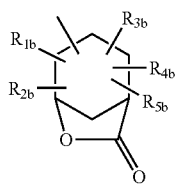
(V-3)

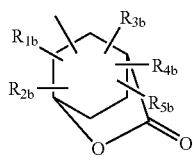
(V-4)

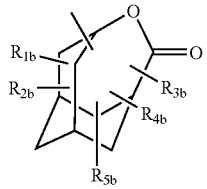
(V-5)

In the general formula (Lc), $Ra_1$, $Rb_1$, $Rc_1$, $Rd_1$, and $Re_1$ each independently represents a hydrogen atom or an alkyl group; m and n each independently represents an integer of from 0 to 3; and (m+n) is from 2 to 6.

In the general formulae (V-1) to (V-5), $R_{1b}$ to $R_{5b}$ each independently represents a hydrogen atom, an alkyl group, a cycloalkyl group, an alkoxy group, an alkoxycarbonyl group, an alkylsulfonylimino group, or an alkenyl group, and two of $R_{1b}$ to $R_{5b}$ may be taken together to form a ring.

As the alkyl group of $Ra_1$ to $Re_1$ in the general formula (Lc) and the alkyl group in the alkyl group, alkoxy group, alkoxycarbonyl group and alkylsulfonylimino group of $R_{1b}$ to $R_{5b}$ in the general formulae (V-1) to (V-5), an optionally substituted linear or branched alkyl group is enumerated.

Examples of the repeating unit having a group having the lactone structure represented by the general formula (Lc) or any one of the general formulae (V-1) to (V-5) include a group in which at least one of $R_{13}'$ to $R_{16}'$ in the foregoing general formula (II-A) or (II-B) is represented by the general formula (Lc) or any one of the general formulae (V-1) to (V-5) (for example, a group in which $R_5$ of —$COOR_5$ is represented by the general formula (Lc) or any one of the general formulae (V-1) to (V-5)) and a repeating unit represented by the following general formula (AI).

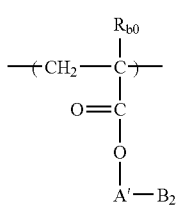
(AI)

In the general formula (AI), $R_{b0}$ represents a hydrogen atom, a halogen atom, or an alkyl group having from 1 to 4 carbon atoms.

Examples of the halogen atom of $R_{b0}$ include a fluorine atom, a chlorine atom, a bromine atom, and an iodine atom. $R_{b0}$ is preferably a hydrogen atom.

A' represents a single bond, an ether group, an ester group, a carbonyl group, an alkylene group, or a divalent group comprising a combination of these groups.

$B_2$ represents a group represented by the general formula (Lc) or any one of the general formulae (V-1) to (V-5).

Specific examples of the repeating unit having a group having the lactone structure will be given below, but it should not be construed that the invention is limited thereto.

(Rx represent H, $CH_3$ or $CF_3$)

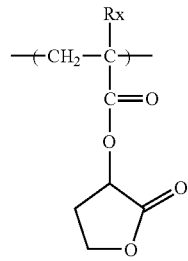
(IV-1)

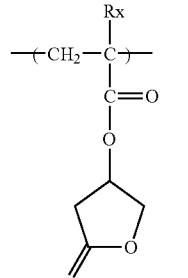
(IV-2)

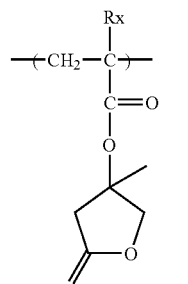
(IV-3)

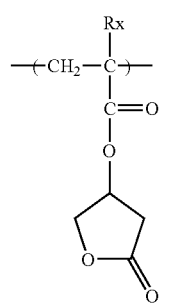
(IV-4)

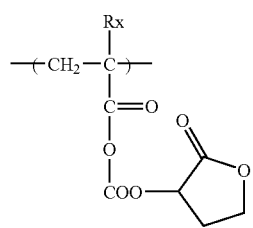 (IV-5)
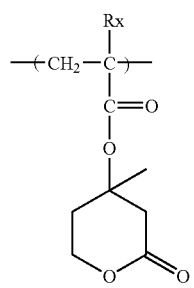 (IV-6)
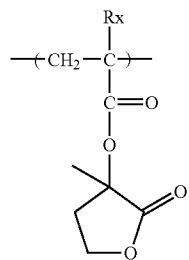 (IV-7)
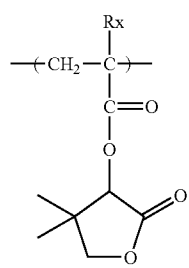 (IV-8)
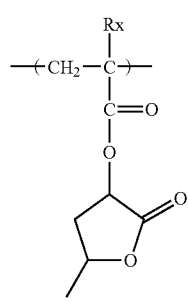 (IV-9)
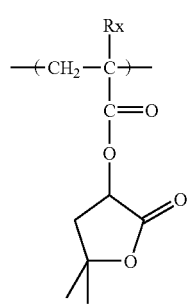 (IV-10)
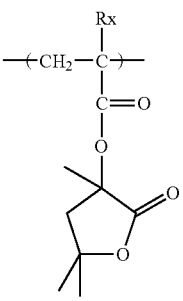 (IV-11)
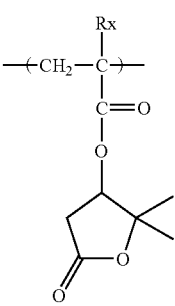 (IV-12)
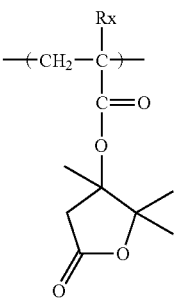 (IV-13)
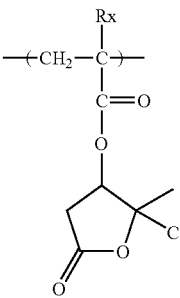 (IV-14)
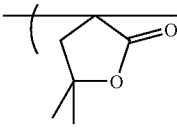 (IV-15)
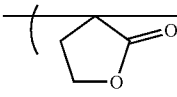 (IV-16)
(Rx represents H, CH$_3$ or CF$_3$)

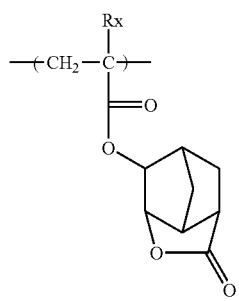
(Ib-1)
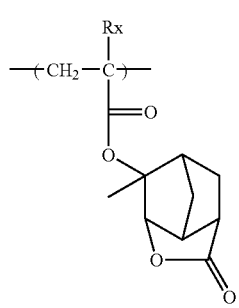
(Ib-2)
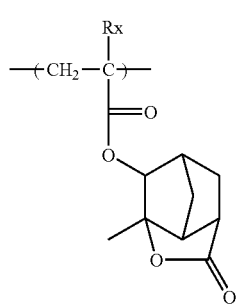
(Ib-3)
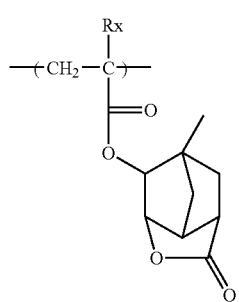
(Ib-4)
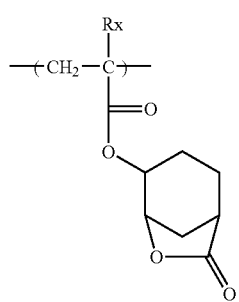
(Ib-5)
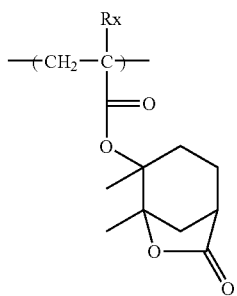
(Ib-6)
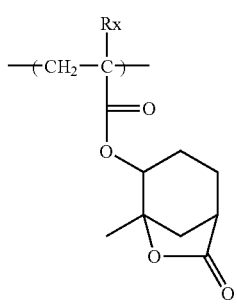
(Ib-7)
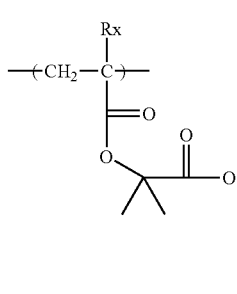
(Ib-8)
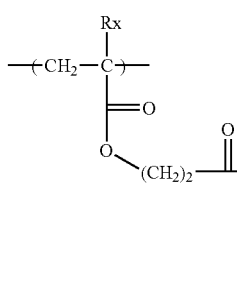
(Ib-9)
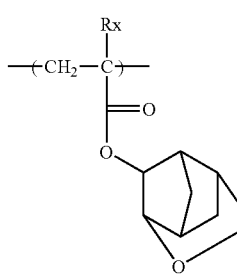
(Ib-10)

-continued

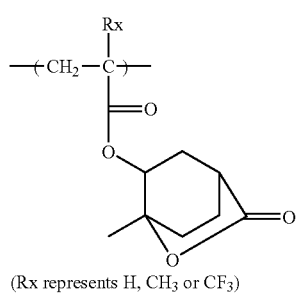
(Ib-11)

(Rx represents H, CH₃ or CF₃)

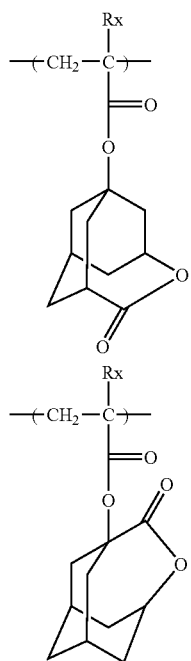

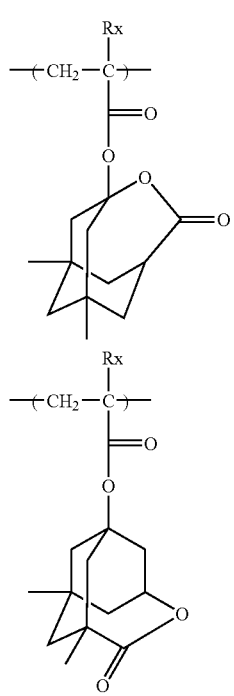

-continued

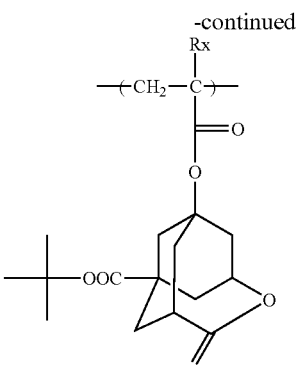

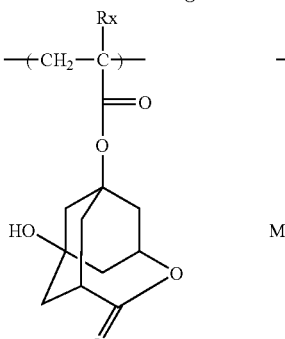

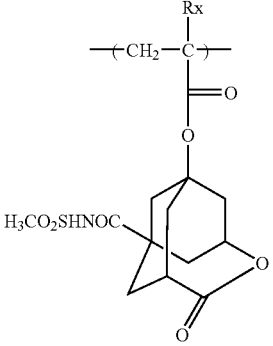

The alicyclic hydrocarbon based acid decomposable resin of the invention may contain a repeating unit having a group represented by the following general formula (VII).

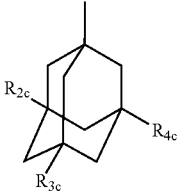
(VII)

In the general formula (VII), $R_{2c}$ to $R_{4c}$ each independently represents a hydrogen atom or a hydroxyl group, with proviso that at least one of $R_{2c}$ to $R_{4c}$ represents a hydroxyl group.

The group represented by the general formula (VII) is preferably a dihydroxy body or a monohydroxy body, and more preferably a dihydroxy body.

Examples of the repeating unit having the group represented by the general formula (VII) include one having a group in which at least one of $R_{13}'$ to $R_{16}'$ in the foregoing general formula (II-A) or (II-B) is represented by the foregoing general formula (VII) (for example, a group in which $R_5$ of —COOR$_5$ is represented by the general formula (VII)) and a repeating unit represented by the following general formula (AII).

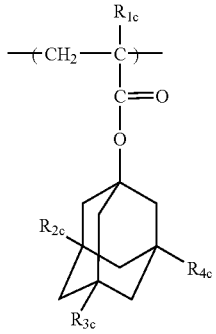
(AII)

In the general formula (AII), $R_{1c}$ represents a hydrogen atom or a methyl group.

$R_{2c}$ to $R_{4c}$ each independently represents a hydrogen atom or a hydroxyl group, with proviso that at least one of $R_{2c}$ to $R_{4c}$ represents a hydroxyl group. It is preferable that two of $R_2$, to $R_4$, represent a hydroxyl group.

Specific examples of the repeating unit having the structure represented by the general formula (AII) will be given below, but it should not be construed that the invention is limited thereto.

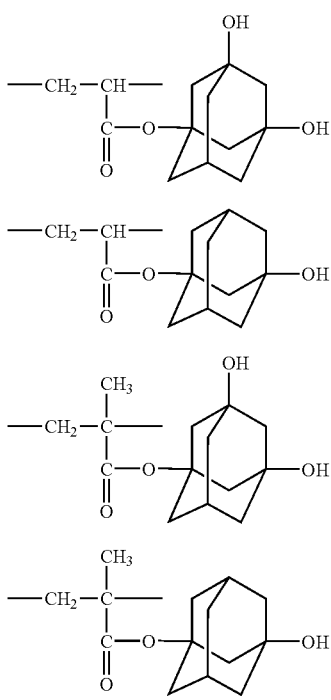

The alicyclic hydrocarbon based acid decomposable resin of the invention may contain a repeating unit represented by the following general formula (VIII).

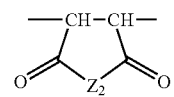
(VIII)

In the foregoing general formula (VIII), $Z_2$ represents —O— or —N($R_{41}$)—; $R_{41}$ represents a hydrogen atom, a hydroxyl group, an alkyl group, or —OSO$_2$—R$_{42}$; and $R_{42}$ represents an alkyl group, a cycloalkyl group, or a camphor residue. The alkyl group as $R_{41}$ and $R_{42}$ may be substituted with a halogen atom (preferably, a fluorine atom).

Specific examples of the repeating unit represented by the foregoing general formula (VIII) will be given below, but it should not be construed that the invention is limited thereto.

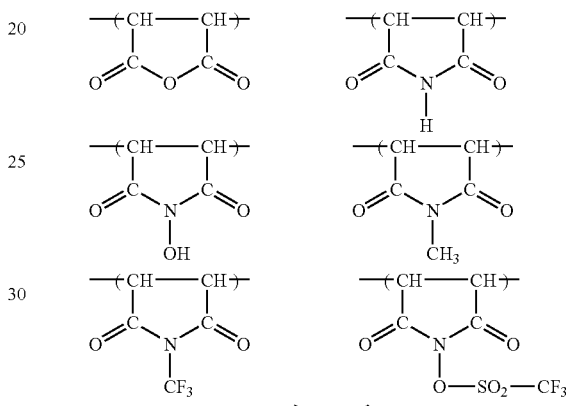

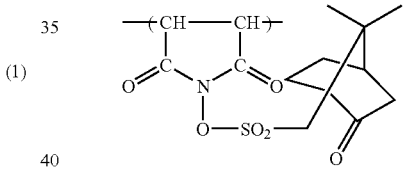

In addition to the foregoing repeating structural units, the alicyclic hydrocarbon based acid decomposable resin of the invention can contain various repeating structural units for the purpose of adjusting the dry etching resistance, standard developer adaptability, adhesion to a substrate, resist profile, and additional characteristics, such as resolving power, heat resistance, and sensitivity, that are generally required in resists.

As such repeating structural units, repeating structural units corresponding to the following monomers can be enumerated. However, it should not be construed that the invention is limited thereto.

In this way, it becomes possible to finely control performances required for the alicyclic hydrocarbon based acid decomposable resin, especially the following performances.

(1) Dissolution in a coating solvent
(2) Film forming property (glass transition point)
(3) Alkali developability
(4) Wear of film (hydrophilic/hydrophobic property and selection of alkali-soluble group)
(5) Adhesion to a substrate in the unexposed area
(6) Dry etching resistance Examples of such monomers include compounds having one addition polymerizable unsaturated bond selected from acrylic esters, methacrylic esters, acrylamides, methacrylamides, allyl compounds, vinyl ethers, and vinyl esters.

Besides, the monomers may be copolymerized so far as they are an addition polymerizable unsaturated compound copolymerizable with monomers corresponding the foregoing various repeating structural units.

In the alicyclic hydrocarbon based acid decomposable resin, the molar ratio of the respective repeating structural units to be contained is adequately set up for the purpose of adjusting the dry etching resistance of a resist, standard developer adaptability, adhesion to a substrate, resist profile, and additional characteristics such as resolving power, heat resistance, and sensitivity that are generally required in resists.

Preferred embodiments of the alicyclic hydrocarbon based acid decomposable resin of the invention are as follows.
(1) One containing a repeating unit having a partial structure containing an alicyclic hydrocarbon represented by any one of the foregoing general formulae (pI) to (pVI) (side chain type).
(2) One having a repeating unit represented by the general formula (II-AB) (principal chain type). However, in (2), the following is further enumerated.
(3) One having a repeating unit represented by the general formula (II-AB), a maleic anhydride derivative, and a (meth)-acrylate structure (hybrid type).

In the alicyclic hydrocarbon based acid decomposable resin, the content of the acid decomposable group-containing repeating unit is preferably from 10 to 60% by mole, more preferably from 20 to 50% by mole, and further preferably from 25 to 40% by mole in the whole of the repeating structural units.

In the alicyclic hydrocarbon based acid decomposable resin, the content of the repeating unit having a partial structure containing the alicyclic hydrocarbon represented by any one of the general formulae (pI) to (pVI) is preferably from 30 to 70% by mole, more preferably from 35 to 65% by mole, and further preferably from 40 to 60% by mole in the whole of the repeating structural units.

In the alicyclic hydrocarbon based acid decomposable resin, the content of the repeating unit represented by the general formula (II-AB) is preferably from 10 to 60% by mole, more preferably from 15 to 55% by mole, and further preferably from 20 to 50% by mole in the whole of the repeating structural units.

Also, the content of the repeating structural unit based on the foregoing additional copolymerization component monomer in the resin can be adequately set up depending upon the desired performance of the resist. In general, it is preferably not more than 99% by mole, more preferably not more than 90% by mole, and further preferably not more than 80% by mole based on the total molar number of the repeating structural unit having a partial structure containing the alicyclic hydrocarbon represented by any one of the foregoing general formulae (pI) to (pVI) and the repeating unit represented by the foregoing general formula (II-AB).

When the composition of the invention is used for ArF exposure, it is preferable in view of the transparency to ArF light that the resin does not have an aromatic group.

The alicyclic hydrocarbon based acid decomposable resin to be used in the invention can be synthesized by the customary method (for example, radical polymerization). For example, as a general synthesis method, monomer seeds are charged in a reactor collectively or on the way of reaction; if desired, the monomers are dissolved in a reaction solvent such as ethers (for example, tetrahydrofuran, 1,4-dioxane, and diisopropyl ether), ketones (for example, methyl ethyl ketone and methyl isobutyl ketone), and ester solvents (for example, ethyl acetate) and a solvent capable of dissolving the composition of the invention as described later (for example, propylene glycol monomethyl ether acetate) to form a uniform solution; and the solution is then initiated to polymerize using a commercially available radical initiator (for example, azo based initiators and peroxides) in an inert gas atmosphere such as nitrogen and argon upon heating as the need arises. If desired, the initiator is supplemented or added dividedly. After completion of the reaction, the reaction mixture is thrown into a solvent, and the desired polymer is recovered by a powder or solid recovery method. The reaction concentration is 20% by weight or more, preferably 30% by weight or more, and more preferably 40% by weight or more. The reaction temperature is from 10° C. to 150° C., preferably from 30° C. to 120° C., and more preferably from 50 to 100° C.

(Baa) Resin having at least one repeating unit selected from a repeating unit represented by the following general formula (1), a repeating unit represented by the following general formula (2), and a repeating unit represented by the following general formula (3), the solubility of which in an alkaline developer increases by the action of an acid:

It is preferable that the alicyclic hydrocarbon based acid decomposable resin is a resin having at least one repeating unit selected from a repeating unit represented by the following general formula (1), a repeating unit represented by the following general formula (2), and a repeating unit represented by the following general formula (3), the solubility of which in an alkaline developer increases by the action of an acid (this resin will be hereinafter sometimes referred to as "alicyclic hydrocarbon based acid decomposable resin (Baa)").

It is preferable that the alicyclic hydrocarbon based acid decomposable resin (Baa) has at least one repeating unit selected from a repeating unit represented by the general formula (1), a repeating unit represented by the general formula (2), and a repeating unit represented by the general formula (3).

It is more preferable that the alicyclic hydrocarbon based acid decomposable resin (Baa) has a repeating unit represented by the general formula (1), a repeating unit represented by the general formula (2), and a repeating unit represented by the general formula (3).

By using the alicyclic hydrocarbon based acid decomposable resin (Baa), the positive photosensitive composition of the invention can ensure a wide process window in the isolated line and dense pattern.

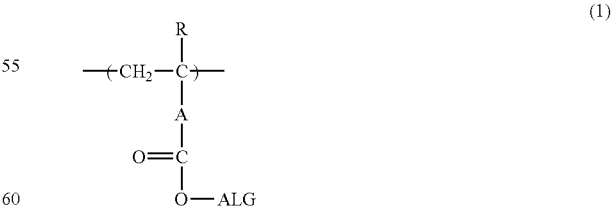

(1)

In the general formula (1), R represents a hydrogen atom or a methyl group.

A represents a single bond or a connecting group.

ALG represents a group represented by any one of the following general formulae (pI) to (pV).

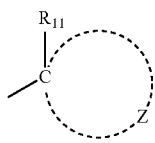
(pI)

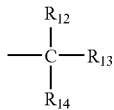
(pII)

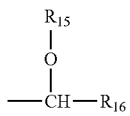
(pIII)

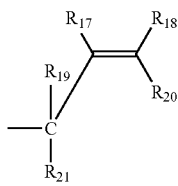
(pIV)

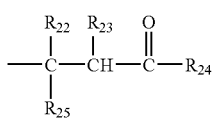
(pV)

In the general formulae (pI) to (pV), $R_{11}$ represents a methyl group, an ethyl group, an n-propyl group, an isopropyl group, an n-butyl group, an isobutyl group, or a sec-butyl group.

Z represents an atomic group necessary for forming an alicyclic hydrocarbon group together with a carbon atom.

$R_{12}$ to $R_{16}$ each independently represents a linear or branched alkyl group having from 1 to 4 carbon atom or an alicyclic hydrocarbon group, with proviso that at least one of $R_{12}$ to $R_{14}$ and any one of $R_{15}$ and $R_{16}$ represents an alicyclic hydrocarbon group.

$R_{17}$ to $R_{21}$ each independently represents a hydrogen atom, a linear or branched alkyl group having from 1 to 4 carbon atoms or an alicyclic hydrocarbon group, with proviso that at least one of $R_{17}$ to $R_{21}$ represents an alicyclic hydrocarbon group and that any one of $R_{19}$ and $R_{2}$, represents a linear or branched alkyl group having from 1 to 4 carbon atoms or an alicyclic hydrocarbon group.

$R_{22}$ to $R_{25}$ each independently represents a hydrogen atom, a linear or branched alkyl group having from 1 to 4 carbon atoms or an alicyclic hydrocarbon group, with proviso that at least one of $R_{22}$ to $R_{25}$ represents an alicyclic hydrocarbon group and that $R_{23}$ and $R_{24}$ may be taken together to form a ring.

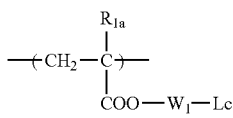
(2)

In the general formula (2), $R_{1a}$ represents a hydrogen atom or a methyl group.

$W_1$ represents a single bond, or a single group or a combination of two or more groups selected from the group consisting of an alkylene group, an ether group, a thioether group, a carbonyl group, and an ester group.

Lc represents a lactone residue represented by any one of the following general formulae (IV), (V-1) to (V-6) and (VI).

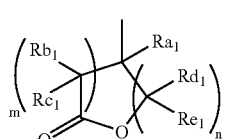
(IV)

In the general formula (IV), $R_{a1}$, $R_{b1}$, $R_{c1}$, $R_{d1}$, and $R_{e1}$ each independently represents a hydrogen atom or an alkyl group having from 1 to 4 carbon atoms.

m and n each independently represents an integer of from 0 to 3, and (m+n) is from 2 to 6.

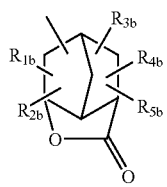
(V-1)

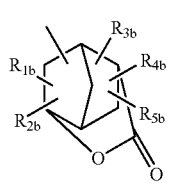
(V-2)

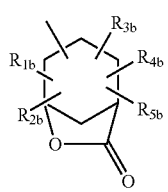
(V-3)

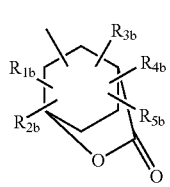
(V-4)

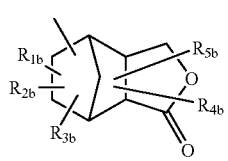
(V-5)

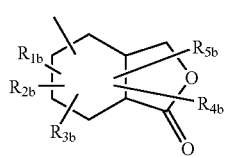
(V-6)

In the general formulae (V-1) to (V-6), $R_{1b}$ to $R_{5b}$ each independently represents a hydrogen atom, an alkyl group, a cycloalkyl group, an alkenyl group, or COOR$_{6b}$, wherein R$_{6b}$ represents an alkyl group, and two of R$_{1b}$ to R$_{5b}$ may be taken together to form a ring.

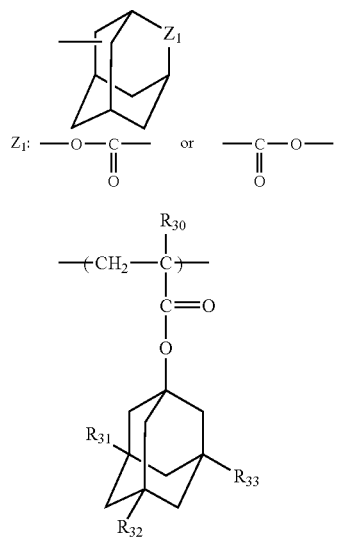

In the general formula (3), R$_{30}$ represents a hydrogen atom or a methyl group.

R$_{31}$ to R$_{33}$ each independently represents a hydrogen atom, a hydroxyl group, or an alkyl group, with proviso that at least one of R$_{31}$ to R$_{33}$ represents a hydroxyl group.

First of all, the general formula (1) will be described below.

The alicyclic hydrocarbon based acid decomposable resin (Baa) is a resin, the solubility of which in an alkaline developer increases by the action of an acid (acid decomposable resin) and preferably has a repeating unit represented by the general formula (1), which is capable of generating a carboxyl group that is decomposed by the action of an acid and is an alkali-soluble group.

In the general formula (1), R represents a hydrogen atom or a methyl group; A represents a single bond or a connecting group; and ALG represents a group represented by any one of the foregoing general formulae (pI) to (pV).

The connecting group as A represents a single group or a combination of two or more groups selected from the group consisting of an alkylene group, an ether group, a thioether group, a carbonyl group, an ester group, an amide group, a sulfonamide group, a urethane group, and a urea group. As the alkylene group in the foregoing A, a group represented by the following formula can be enumerated.

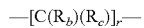

In the formula, R$_b$ and R$_c$ may be the same or different and each represents a hydrogen atom, an alkyl group, a halogen atom, a hydroxyl group, or an alkoxy group. As the alkyl group, lower alkyl groups such as a methyl group, an ethyl group, a propyl group, an isopropyl group, and a butyl group are preferable. More preferably, the alkyl group is selected from a methyl group, an ethyl group, a propyl group, and an isopropyl group. Examples of the alkoxy group include ones having from 1 to 4 carbon atoms, such as a methoxy group, an ethoxy group, a propoxy group, and a butoxy group. Examples of the halogen atom include a chlorine atom, a bromine atom, a fluorine atom, and an iodine atom. r represents an integer of from 1 to 10. The foregoing alkyl group and alkoxy group may have a substituent. Examples of the substituent which the alkyl group and the alkoxy group may have include a hydroxyl group, a halogen atom, and an alkoxy group (preferably, one having from 1 to 4 carbon atoms).

In the general formulae (pI) to (pV), the alkyl group in R$_{12}$ to R$_{25}$ represents a linear or branched alkyl group having from 1 to 4 carbon atoms, which may be substituted or unsubstituted. Examples of the alkyl group include a methyl group, an ethyl group, an n-propyl group, an isopropyl group, an n-butyl group, an isobutyl group, a sec-butyl group, and a t-butyl group.

Also, examples of a substituent which the foregoing alkyl group may further have include an alkoxy group having from 1 to 4 carbon atoms, a halogen atom (for example, a fluorine atom, a chlorine atom, a bromine atom, and an iodine atom), an acyl group, an acyloxy group, a cyano group, a hydroxyl group, a carboxy group, an alkoxycarbonyl group, and a nitro group.

The alicyclic hydrocarbon group as R$_{12}$ to R$_{25}$ or the alicyclic hydrocarbon group which Z forms together with the carbon atom may be monocyclic or polycyclic. Specifically, groups having a monocyclic, bicyclic, tricyclic or tetracyclic structure having 5 or more carbon atoms can be enumerated. The number of carbon atoms is preferably from 6 to 30, and especially preferably from 7 to 25. These alicyclic hydrocarbon groups may have a substituent.

Examples of a structure of the alicyclic moiety in the alicyclic hydrocarbon group will be given below.

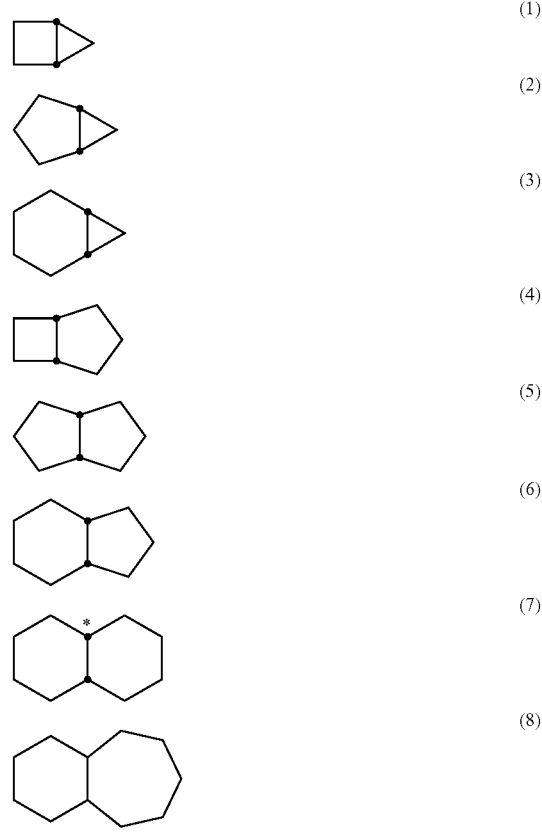

-continued
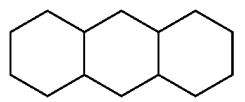 (9)
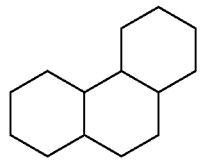 (10)
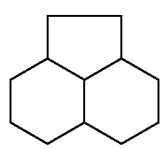 (11)
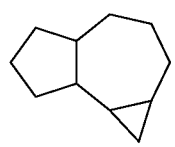 (12)
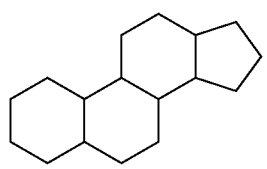 (13)
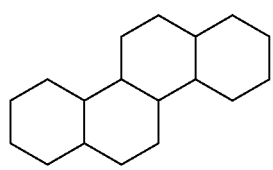 (14)
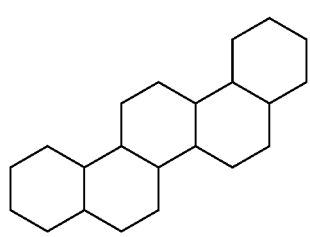 (15)
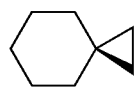 (16)
 (17)
 (18)
 (19)
-continued
 (20)
 (21)
 (22)
 (23)
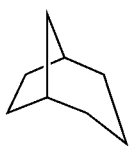 (24)
 (25)
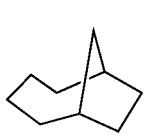 (26)
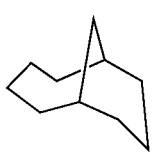 (27)
 (28)
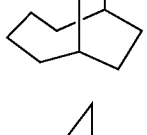 (29)
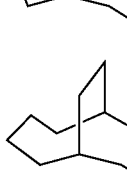 (30)
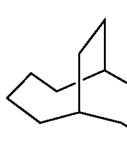 (31)

-continued

(32) 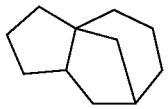

(33) 

(34) 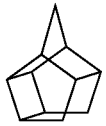

(35) 

(36) 

(37) 

(38) 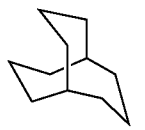

(39) 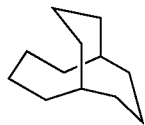

(40) 

(41) 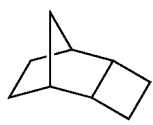

(42) 

(43) 

(44) 

(45) 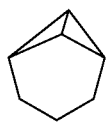

(46) 

(47) 

(48) 

(49) 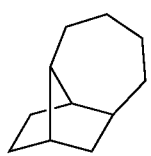

(50)

In the invention, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group are preferable as the foregoing alicyclic moiety. Of these, an adamantyl group, a decalin residue, a norbornyl group, a cedrol group, a cyclohexyl group, a cycloheptyl group, a cyclooctyl group, a cyclodecanyl group, a cyclododecanyl group, and a tricyclodecanyl group are more preferable.

Examples of a substituent of these alicyclic hydrocarbon groups include an alkyl group, a halogen atom, a hydroxyl group, an alkoxy group, a carboxyl group, and an alkoxycarbonyl group.

As the alkyl group, lower alkyl groups such as a methyl group, an ethyl group, a propyl group, an isopropyl group, and a butyl group are preferable. Of these, a methyl group, an ethyl group, a propyl group, and an isopropyl group are more preferable.

As the alkoxy group, those having from 1 to 4 carbon atoms, such as a methoxy group, an ethoxy group, a propoxy group, and a butoxy group can be enumerated.

The alkyl group and the alkoxy group may have a substituent. Examples of a substituent which the alkyl group and the alkoxy group may have include a hydroxyl group, a halogen atom, and an alkoxy group.

Incidentally, it is especially preferable that the general formula (1) is a repeating unit wherein A represents a single bond, and ALG represents a group represented by the following formula from the standpoint that in observing the resulting profile by a scanning electron microscope, the profile stability (SEM resistance) is good.

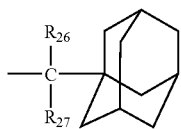
$R_{26}$ and $R_{27}$ each independently represents a linear or branched alkyl group having from 1 to 4 carbon atoms.
Specific examples of a monomer corresponding to the repeating unit represented by the general formula (1) will be described below.
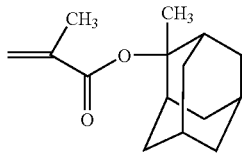
1
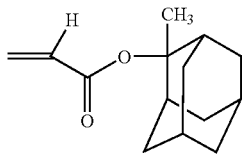
2
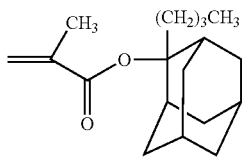
3
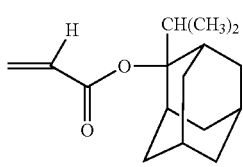
4
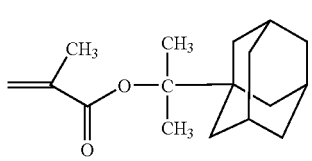
5
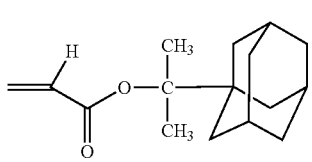
6
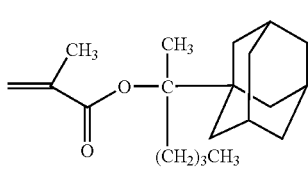
7
-continued
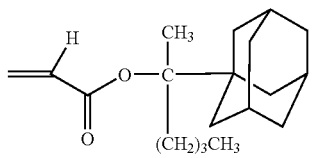
8
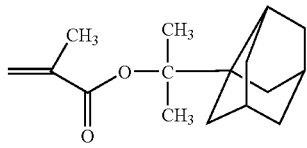
9
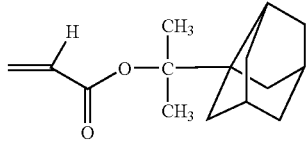
10
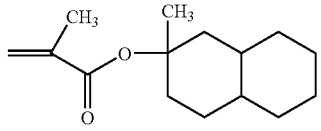
11
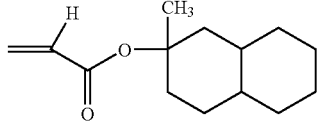
12
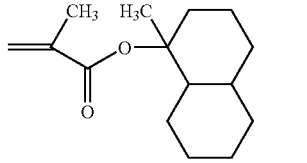
13
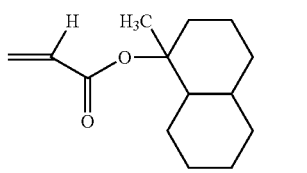
14
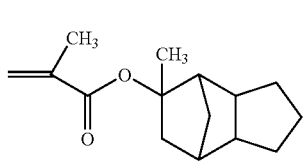
15
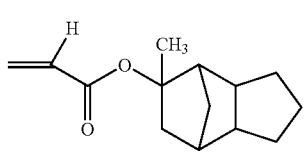
16
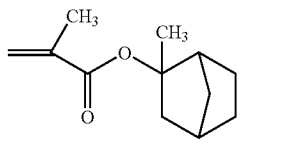
17

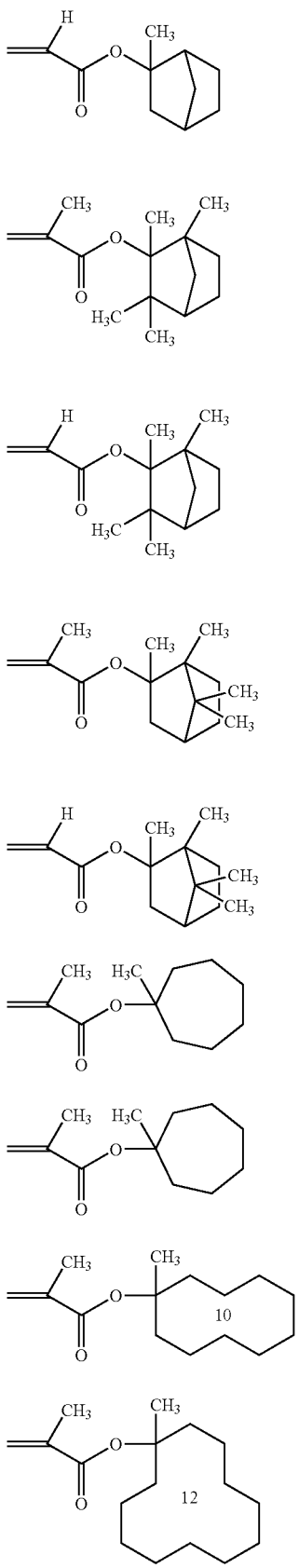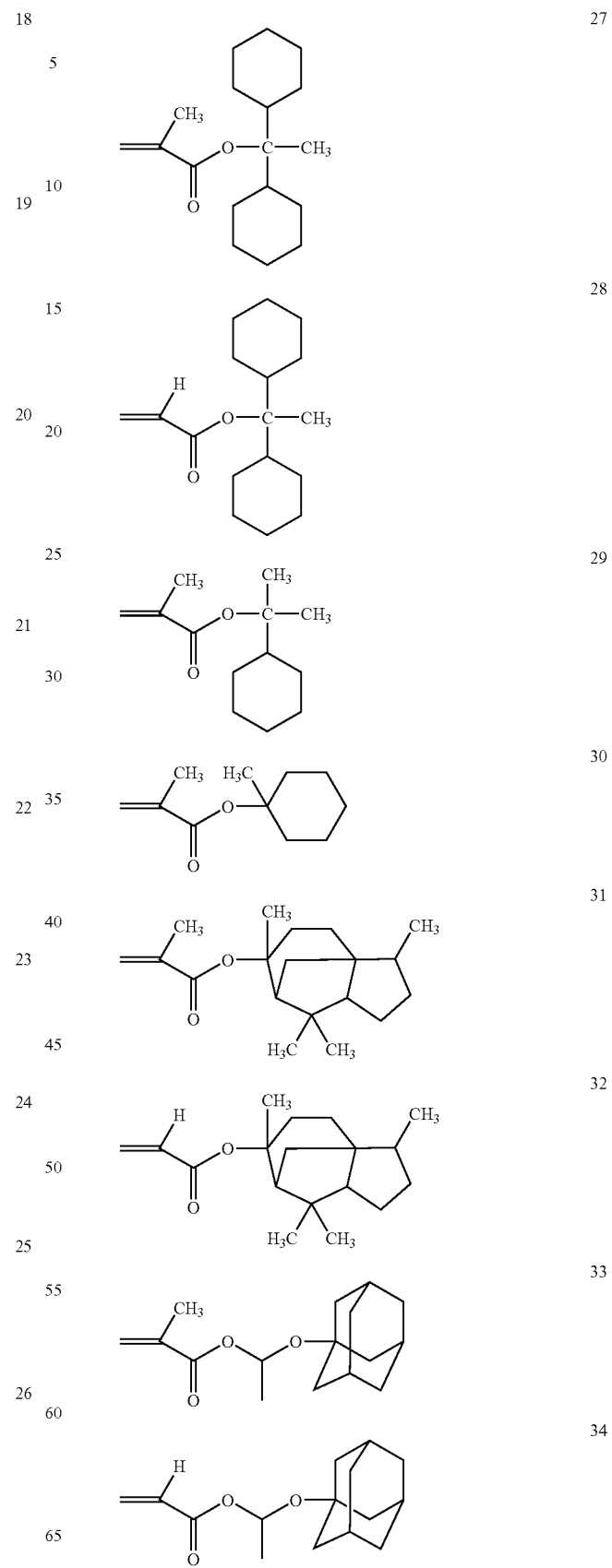

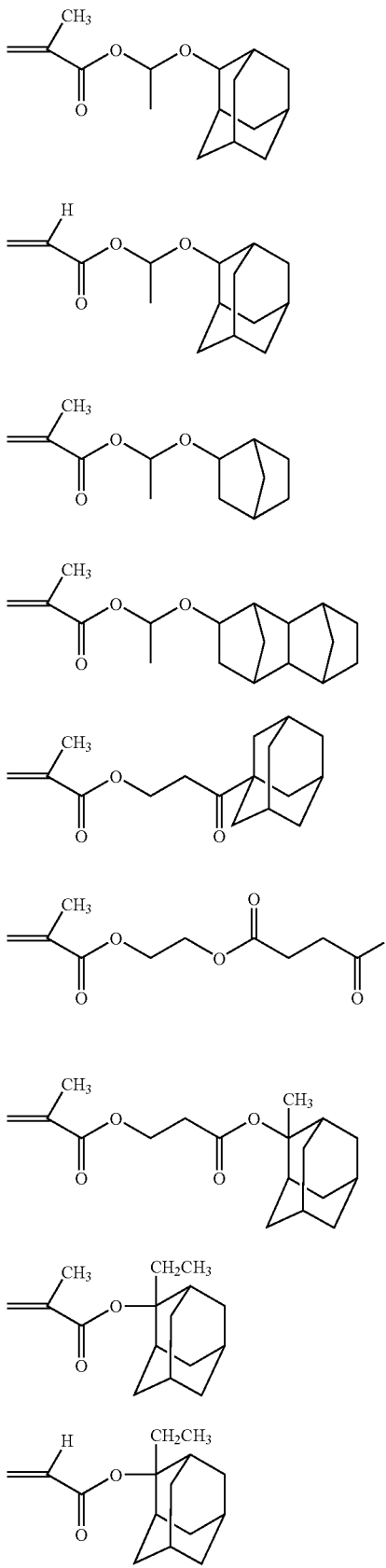

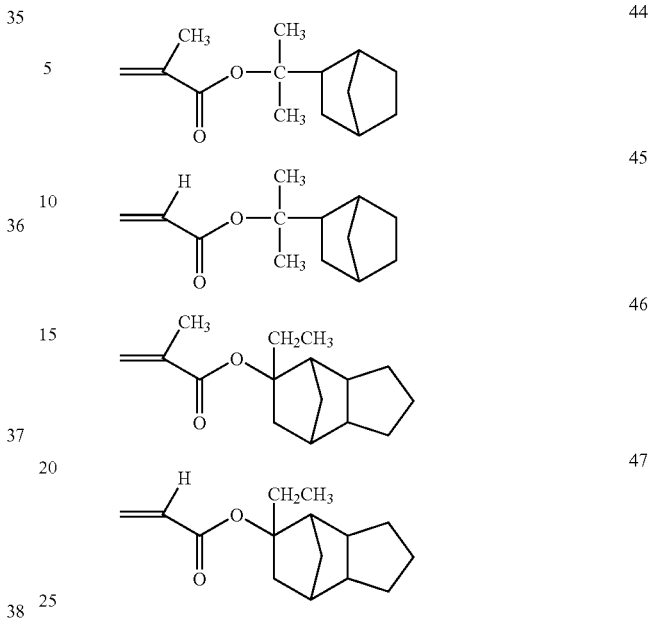

Next, the general formula (2) will be described below.

$R_{1a}$ represents a hydrogen atom or a methyl group.

$W_1$ represents a single bond, or a single group or a combination of two or more groups selected from the group consisting of an alkylene group, an ether group, a thioether group, a carbonyl group, and an ester group. Lc represents a lactone residue represented by any one of the foregoing general formulae (IV), (V-1) to (V-6) and (VI):

As the alkylene group as $W_1$, a group represented by the following formula can be enumerated.

$$—[C(Rf)(Rg)]_{r1}—$$

In the foregoing formula, Rf and Rg may be the same or different and each represents a hydrogen atom, an alkyl group, a halogen atom, a hydroxyl group, or an alkoxy group. As the alkyl group, lower alkyl groups such as a methyl group, an ethyl group, a propyl group, an isopropyl group, and a butyl group are preferable. More preferably, the alkyl group is selected from a methyl group, an ethyl group, a propyl group, and an isopropyl group.

Examples of the alkoxy group include ones having from 1 to 4 carbon atoms, such as a methoxy group, an ethoxy group, a propoxy group, and a butoxy group.

Examples of the halogen atom include a chlorine atom, a bromine atom, a fluorine atom, and an iodine atom. $r_1$ represents an integer of from 1 to 10.

The foregoing alkyl group and alkoxy group may have a substituent. Examples of the substituent which the alkyl group and the alkoxy group may have include a hydroxyl group, a halogen atom, and an alkoxy group.

In the general formula (IV), examples of the alkyl group having from 1 to 4 carbon atoms as $R_{a1}$ to $R_{e1}$ include a methyl group, an ethyl group, a propyl group, an isopropyl group, an n-butyl group, an isobutyl group, a sec-butyl group, and a t-butyl group.

In the general formulae (V-1) to (V-6), examples of the alkyl group as $R_{1b}$ to $R_{5b}$ include a linear or branched alkyl group, which may have a substituent. As the alkyl group as $R_{1b}$ to $R_{5b}$, a linear or branched alkyl group having from 1 to 12 carbon atoms is preferable; a linear or branched alkyl group having from 1 to 10 carbon atoms is more preferable; and a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group, and a decyl group are further preferable.

$R_{6b}$ in $COOR_{6b}$ as $R_{1b}$ to $R_{5b}$ in the general formulae (V-1) to (V-6) is preferably a linear or branched alkyl group having from 1 to 12 carbon atoms; more preferably a linear or branched alkyl group having from 1 to 10 carbon atoms; and further preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group, or a decyl group.

As the cycloalkyl group in $R_{1b}$ to $R_{5b}$, those having from 3 to 8 carbon atoms, such as a cyclopropyl group, a cyclopentyl group, a cyclohexyl group, a cycloheptyl group, and a cyclooctyl group, are preferable.

As the alkenyl group in $R_{1b}$ to $R_{5b}$, those having from 2 to 6 carbon atoms, such as a vinyl group, a propenyl group, a butenyl group, and a hexenyl group, are preferable.

Also, as the ring which two of $R_{1b}$ to $R_{5b}$ are taken together to form, those having from 3 to 8 members, such as a cyclopropane ring, a cyclobutane ring, a cyclopentane ring, a cyclohexane ring, and a cyclooctane ring, are preferable.

Incidentally, $R_{1b}$ to $R_{5b}$ in the general formulae (V-1) to (V-6) may be connected to any carbon atom constituting the ring skeleton.

Also, examples of the substituent which the foregoing alkyl group, cycloalkyl group and alkenyl group may have include an alkoxy group having from 1 to 4 carbon atoms, a halogen atom (for example, a fluorine atom, a chlorine atom, a bromine atom, and an iodine atom), an acyl group having from 2 to 5 carbon atoms, an acyloxy group having from 2 to 5 carbon atoms, a cyano group, a hydroxyl group, a carboxy group, an alkoxycarbonyl group having from 2 to 5 carbon atoms, and a nitro group.

Specific examples of the repeating unit having a group having the lactone structure represented by any one of the general formulae (IV), (V-1) to (V-6) and (VI) will be given below, but it should not be construed that the invention is limited thereto.

First of all, specific examples of the repeating unit of the general formula (2) having the lactone structure represented by the general formula (IV) will be given below, but it should not be construed that the invent-ion is limited thereto.

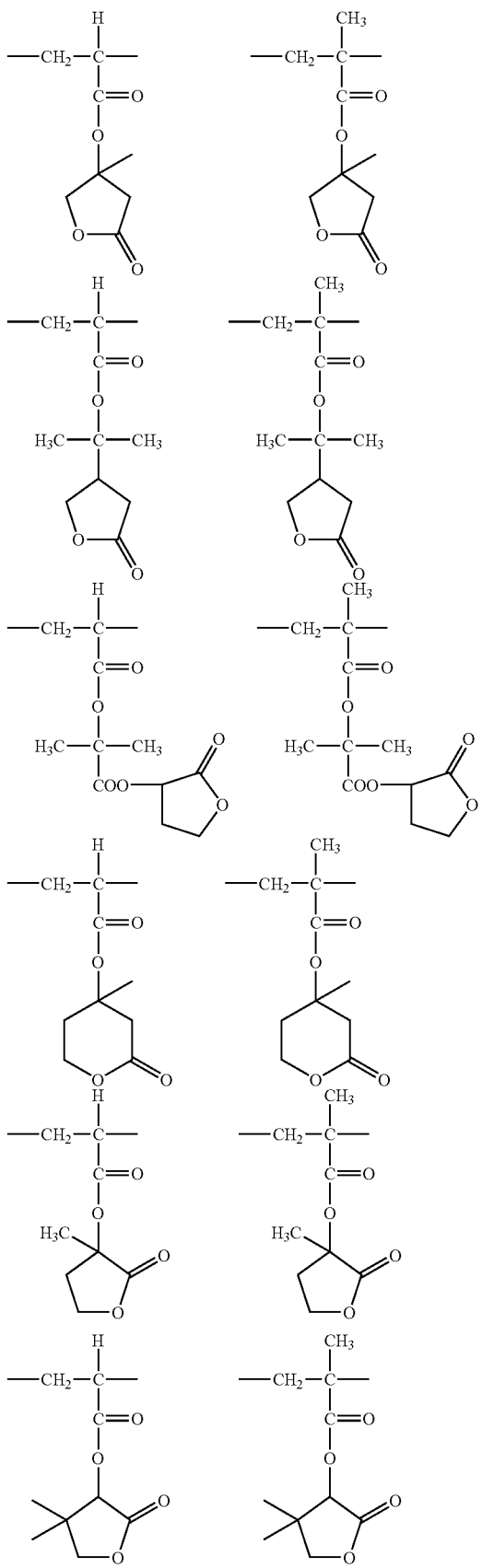

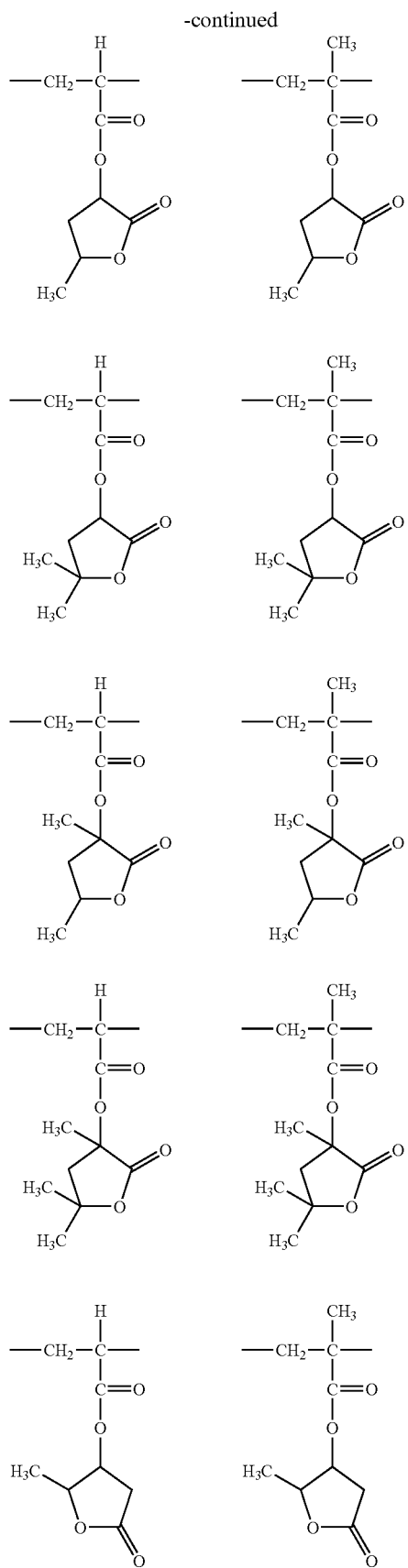
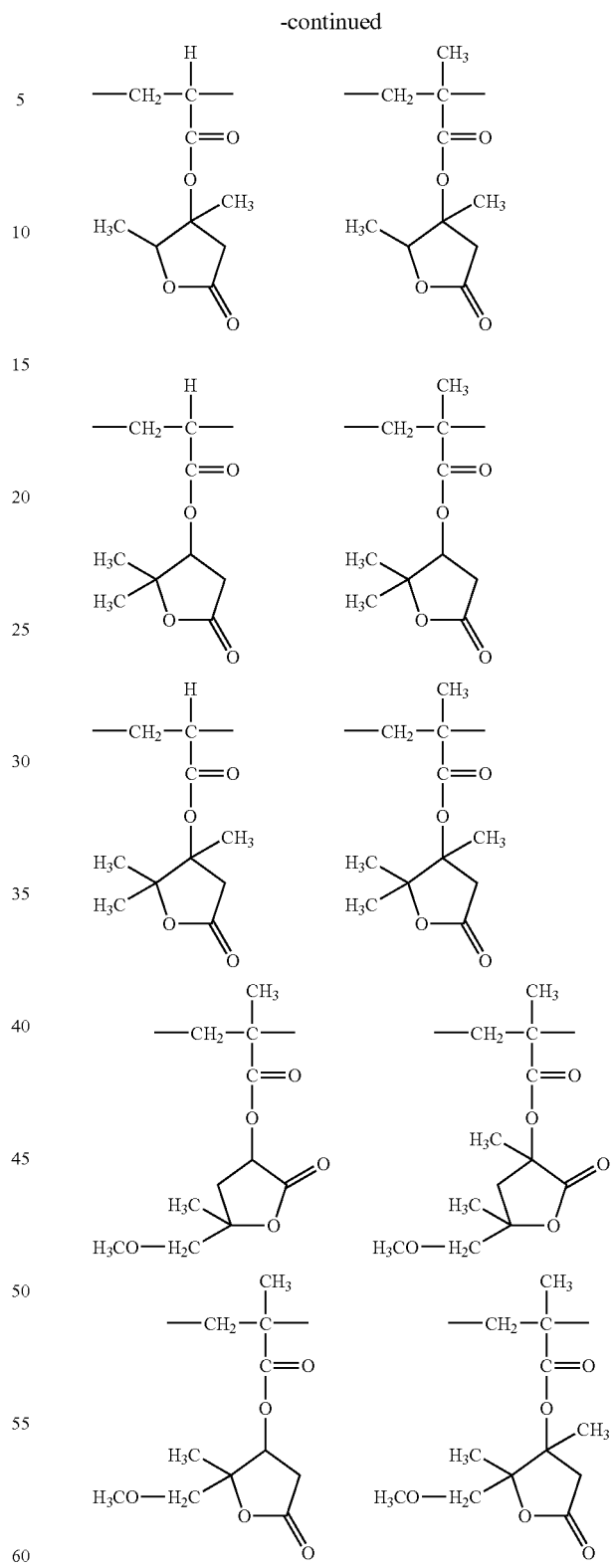
Next, specific examples of the repeating unit of the general formula (2) having the lactone structure represented by any one of the general formulae (V-1) to (V-6) will be given below, but it should not be construed that the invention is limited thereto.

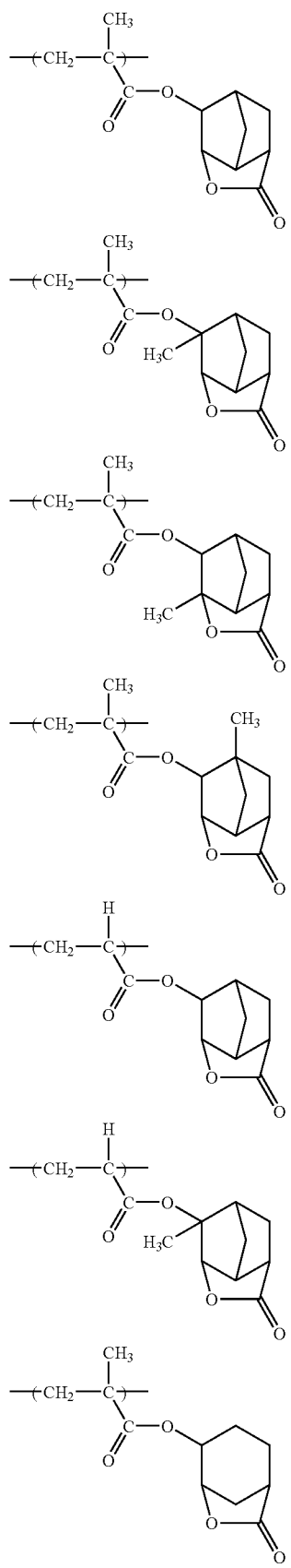
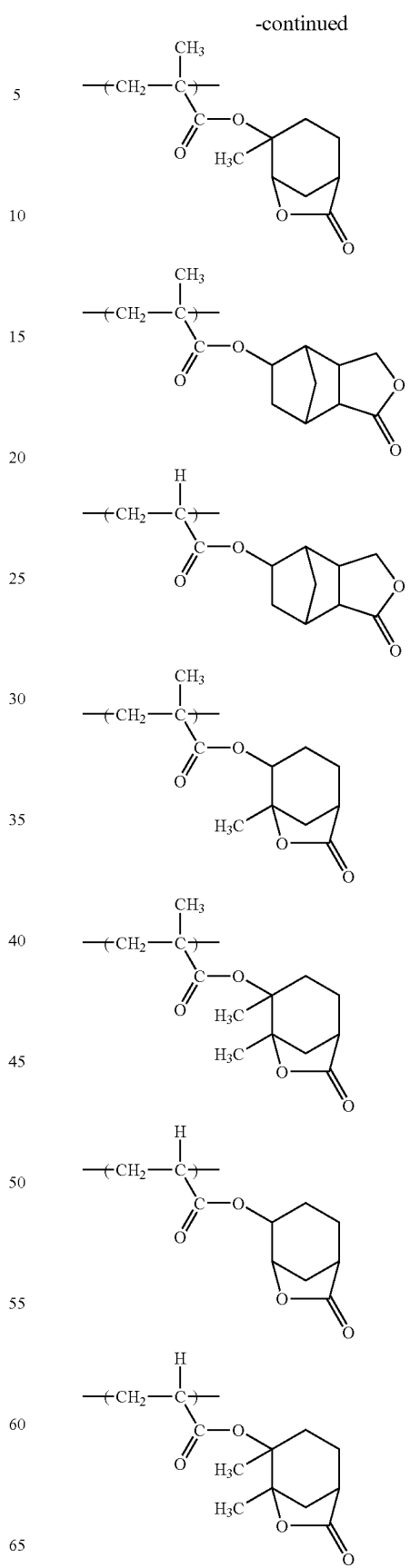

95
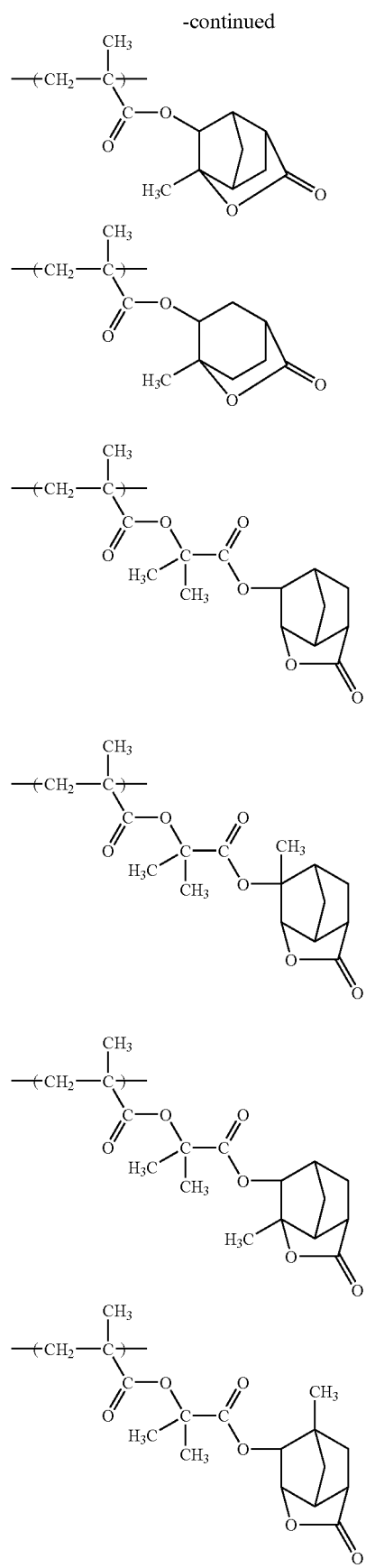
96
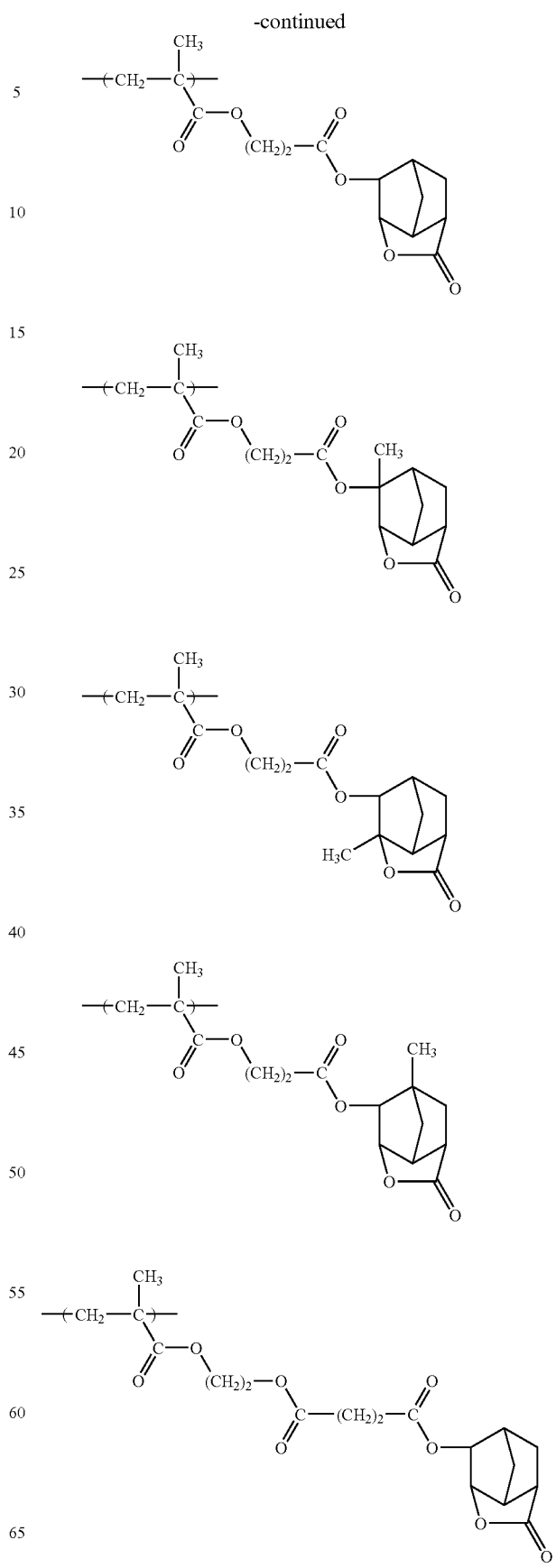

-continued
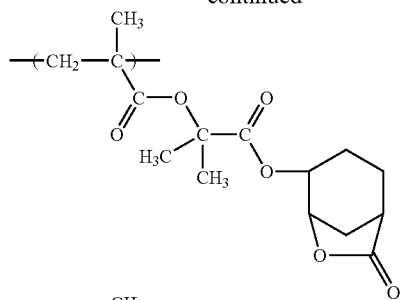
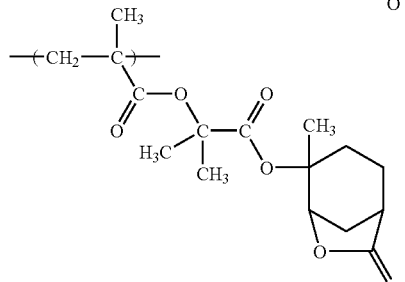
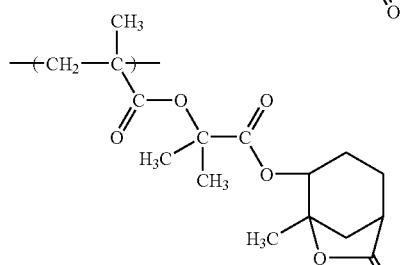
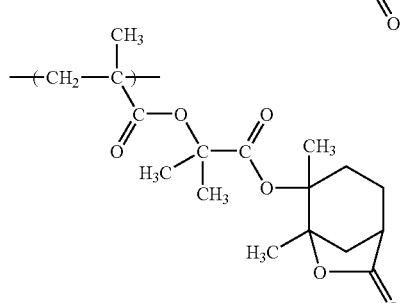
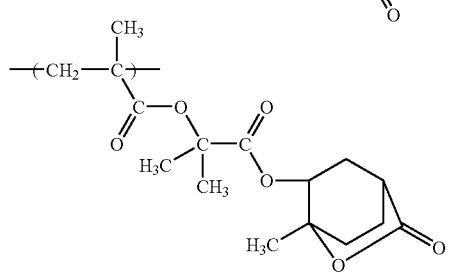
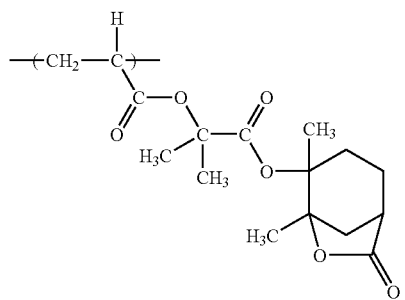
-continued
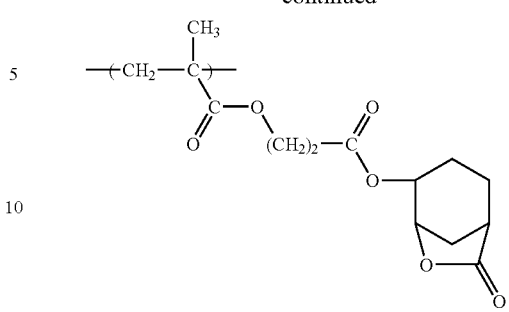
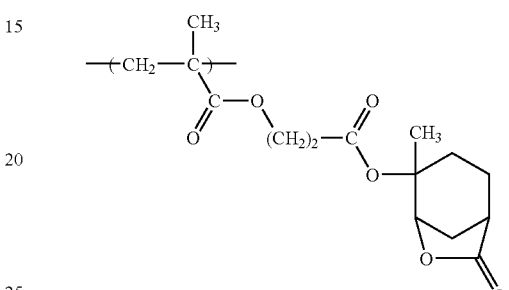
Specific examples of the repeating unit of the general formula (2) having the lactone structure represented by the general formula (VI) will be given below.
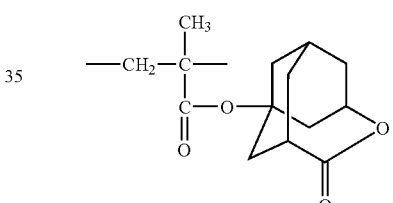
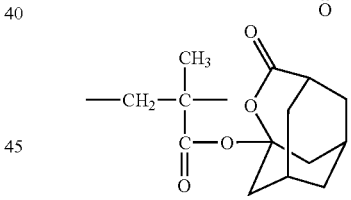
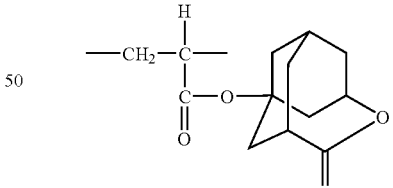
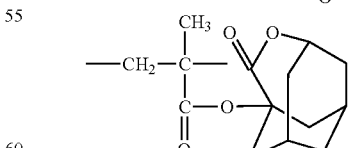
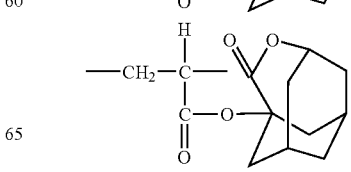

-continued

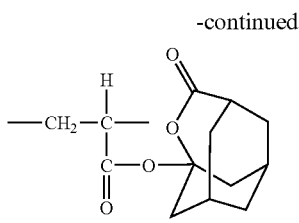

Next, the repeating unit represented by the general formula (3) will be described below.

In the general formula (3), $R_{30}$ represents a hydrogen atom or a methyl group.

$R_{31}$ to $R_{33}$ each independently represents a hydrogen atom, a hydroxyl group, or an alkyl group, with proviso that at least one of $R_{31}$ to $R_{33}$ represents a hydroxyl group.

As the alkyl group of $R_{31}$ to $R_{33}$, an alkyl group having from 1 to 5 carbon atoms is preferable, and examples thereof include a methyl group, an ethyl group, a propyl group, an isopropyl group, an n-butyl group, an isobutyl group, a sec-butyl group, and a t-butyl group.

In the repeating unit represented by the general formula (3), it is preferable that one or two of $R_{31}$ to $R_{33}$ represent a hydroxyl group, and it is especially preferable that two of $R_{31}$ to $R_{33}$ represent a hydroxyl group.

Specific examples of the repeating unit represented by the general formula (3) will be given below, but it should not be construed that the invention is limited thereto.

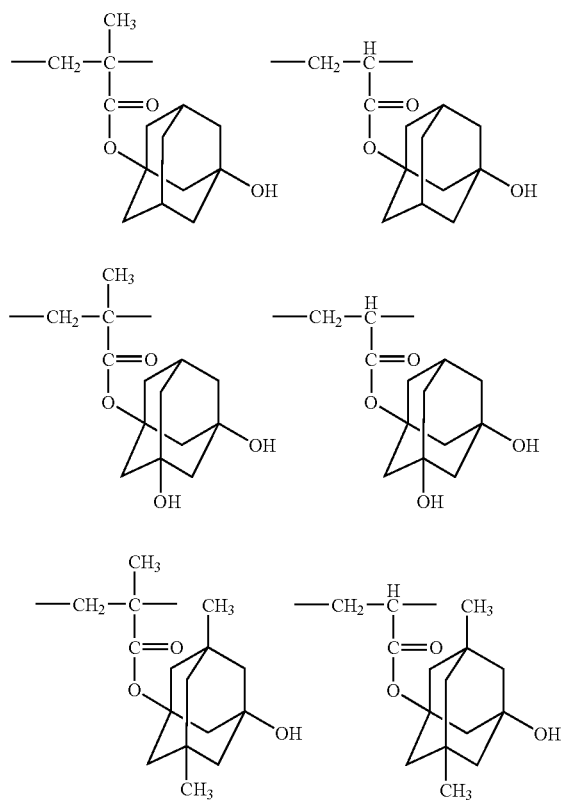

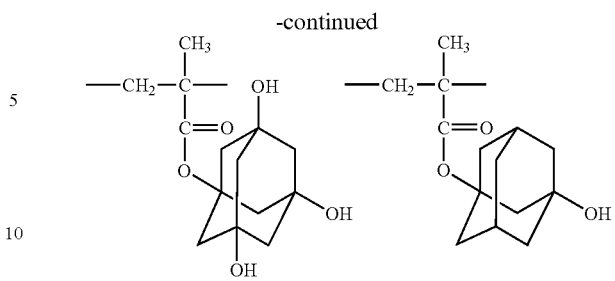

In addition to the foregoing repeating structural units, the alicyclic hydrocarbon based acid decomposable resin (Baa) can contain various repeating structural units for the purpose of adjusting the dry etching resistance, standard developer adaptability, adhesion to a substrate, resist profile, and additional characteristics such as resolving power, heat resistance, and sensitivity that are generally required in resists.

As such repeating structural units, repeating structural units corresponding to the following monomers can be enumerated, but it should not be construed that the invention is limited thereto.

In this way, it becomes possible to finely control performances required for the resin, especially the following performances.
(1) Dissolution in a coating solvent
(2) Film forming property (glass transition point)
(3) Alkali developability
(4) Wear of film (hydrophilic/hydrophobic property and selection of alkali-soluble group)
(5) Adhesion to a substrate in the unexposed area
(6) Dry etching resistance Examples of such monomers include compounds having one addition polymerizable unsaturated bond selected from acrylic esters, methacrylic esters, acrylamides, methacrylamides, allyl compounds, vinyl ethers, and vinyl esters.

Besides, the monomers may be copolymerized so far as they are an addition polymerizable unsaturated compound copolymerizable with monomers corresponding the foregoing various repeating structural units.

In the alicyclic hydrocarbon based acid decomposable resin (Baa), the molar ratio of the respective repeating structural units to be contained is adequately set up for the purpose of adjusting the dry etching resistance of a resist, standard developer adaptability, adhesion to a substrate, resist profile, and additional characteristics, such as resolving power, heat resistance, and sensitivity that are generally required in resists.

In the alicyclic hydrocarbon based acid decomposable resin (Baa), the content of the repeating unit represented by the general formula (1) is preferably from 0 to 60% by mole, more preferably from 20 to 55% by mole, and further preferably from 25 to 50% by mole in the whole of the repeating structural units.

The content of the repeating unit of the general formula (2) is preferably from 0 to 70% by mole, more preferably from 20 to 65% by mole, and further preferably from 25 to 60% by mole in the whole of the repeating structural units.

The content of the repeating unit of the general formula (3) is preferably from 0 to 50% by mole, more preferably from 15 to 45% by mole, and further preferably from 20 to 40% by mole in the whole of the repeating structural units.

Also, the content of the repeating structural unit based on the foregoing additional copolymerization component monomer in the resin can be adequately set up depending upon the desired performance of the resist. In general, it is preferably not more than 50% by mole, more preferably not more than 40% by mole, and further preferably not more than 30% by mole based on the total molar number of the general formulae (1) to (3).

When the composition of the invention is used for ArF exposure, it is preferable in view of the transparency to ArF light that the alicyclic hydrocarbon based acid decomposable resin (Baa) does not have an aromatic group.

The alicyclic hydrocarbon based acid decomposable resin (Baa) can be synthesized by the customary method (for example, radical polymerization). For example, as a general synthesis method, monomer seeds are charged in a reactor collectively or on the way of reaction; if desired, the monomers are dissolved in a reaction solvent such as cyclic ethers (for example, tetrahydrofuran and 1,4-dioxane), ketones (for example, methyl ethyl ketone, methyl isobutyl ketone, and cyclohexanone), and a solvent capable of dissolving the composition of the invention as described later (for example, propylene glycol monomethyl ether acetate and propylene glycol monomethyl ether) to form a uniform solution; and the solution is then initiated to polymerize using a commercially available radical initiator (for example, azo based initiators and peroxides) in an inert gas atmosphere such as nitrogen and argon upon heating as the need arises. If desired, the initiator is supplemented or added dividedly. After completion of the reaction, the reaction mixture is thrown into a solvent, and the desired polymer is recovered by a powder or solid recovery method. The reaction concentration is 10% by weight or more, preferably 15% by weight or more, and more preferably 20% by weight or more. The reaction temperature is from 10° C. to 150° C., preferably from 30° C. to 120° C., and more preferably from 50 to 110° C.

The repeating structural units represented by the foregoing specific examples may be used singly or in admixture for every repeating structural unit.

Also, in the invention, the alicyclic hydrocarbon based acid decomposable resin (Baa) may be used singly or in admixture.

In the case where the composition of the invention is used an upper layer resist of a multilayered resist, it is preferable that the resin as the component (B) has a silicon atom.

As the resin having a silicon atom, the solubility of which in an alkaline developer increases by the action of an acid, any resin having a silicon atom in at least one of the principal chain and the side chain can be used. Examples of a resin having a siloxane structure in the side chain thereof include copolymers of an olefin based monomer having a silicon atom in the side chain, maleic anhydride and a (meth)acrylic acid based monomer having an acid decomposable group in the side chain.

In the case where the positive photosensitive composition of the invention is irradiated with an $F_2$ excimer laser, the resin as the component (B) is preferably a resin having a structure in which a fluorine atom is substituted in the principal chain and/or the side chain of the polymer skeleton, which is decomposed by the action of an acid, whereby its solubility in an alkaline developer increases (this resin will be hereinafter sometimes referred to as "fluorine-containing resin"); more preferably a resin containing a hydroxyl group substituted with a fluorine atom or a fluoroalkyl group at the 1-position or an acid decomposable group-protected hydroxyl group substituted with a fluorine atom or a fluoroalkyl group at the 1-position; and most preferably a resin containing a hexafluoro-2-propanol structure or a structure in which the hydroxyl group of hexafluoro-2-propanol is protected by an acid decomposable group. By introducing a fluorine atom, it is possible to enhance the transparency to far ultraviolet light, especially $F_2$ (157 nm) light.

As the fluorine group-containing resin in the acid decomposable resin (B), resins having at least one of repeating units represented by the following general formulae (FA) to (FG) can be enumerated.

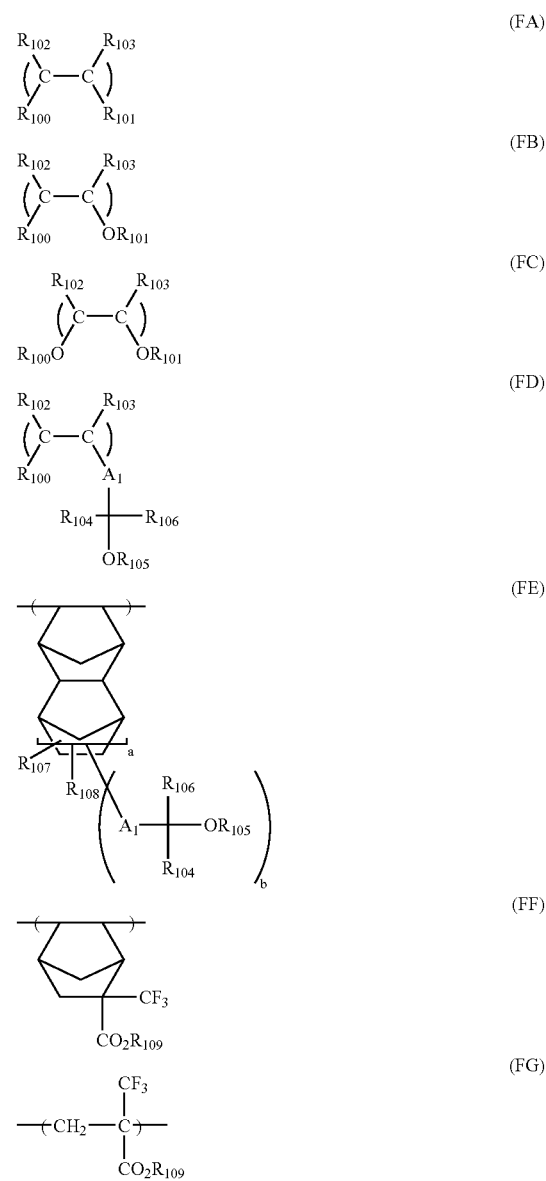

In the foregoing general formulae, $R_{100}$ to $R_{103}$ each represents a hydrogen atom, a fluorine atom, an alkyl group, a cycloalkyl group, an aryl group, an aralkyl group, an alkenyl group, an acyl group, an acyloxy group, or an alkynyl group.

$R_{104}$ and $R_{106}$ each represents a hydrogen atom, a fluorine atom, or an alkyl group; and at least one of $R_{104}$ and $R_{106}$ represents a fluorine atom or a fluoroalkyl group. It is preferable that both of $R_{104}$ and $R_{106}$ represent a trifluoromethyl group.

$R_{105}$ represents a hydrogen atom, an alkyl group, an acyl group, an alkoxycarbonyl group, or a group capable of being decomposed by the action of an acid.

$A_1$ represents a single bond, a divalent connecting group (for example, an alkylene group, a cycloalkylene group, an alkenylene group, an arylene group, —OCO—, —COO—, and —CON($R_{24}$)—), or a connecting group containing the plural number of these groups. $R_{24}$ represents a hydrogen atom or an alkyl group.

$R_{107}$ and $R_{108}$ each represents a hydrogen atom, a halogen atom, an alkyl group, an alkoxy group, an alkoxycarbonyl group, or a group capable of being decomposed by the action of an acid.

$R_{109}$ represents a hydrogen atom, an alkyl group, or a group capable of being decomposed by the action of an acid.

b is 0, 1 or 2.

Each of the repeating units represented by the general formulae (FA) to (FG) contains at least one fluorine atom, and preferably three or more fluorine atoms per repeating unit.

In the foregoing general formulae (FA) to (FG), examples of the alkyl group include an alkyl group having from 1 to 8 carbon atoms, and specifically, a methyl group, an ethyl group, a propyl group, an n-butyl group, a sec-butyl group, a hexyl group, a 2-ethylhexyl group, and an octyl group can be preferably enumerated.

The cycloalkyl group may be monocyclic or polycyclic. The monocyclic type is one having from 3 to 8 carbon atoms, and examples thereof include a cyclopropyl group, a cyclopentyl group, a cyclohexyl group, a cycloheptyl group, and a cyclooctyl group. The polycyclic type is one having from 6 to 20 carbon atoms, and examples thereof include an adamantly group, a norbornyl group, an isoboronyl group, a camphanyl group, a dicyclopentyl group, an α-pinel group, a tricyclodecanyl group, a tetracyclodecyl group, and an androstanyl group. However, the carbon atom in the foregoing monocyclic or polycyclic cycloalkyl group may be substituted with a hetero atom such as an oxygen atom.

Examples of the fluoroalkyl group include one having from 1 to 12 carbon atoms, and specifically, a trifluoromethyl group, a perfluoroethyl group, a perfluoropropyl group, a perfluorobutyl group, a perfluorohexyl group, a perfluorooctyl group, a perfluorooctylethyl group, and a perfluorododecyl group can be preferably enumerated.

Examples of the aryl group include an aryl group having from 6 to 15 carbon atoms, and specifically, a phenyl group, a tolyl group, a dimethylphenyl group, a 2,4,6-trimethyl phenyl group, a naphthyl group, an anthryl group, and a 9,10-dimethoxyanthryl group can be preferably enumerated.

Examples of the aralkyl group include an aralkyl group having from 7 to 12 carbon atoms, and specifically, a benzyl group, a phenethyl group, and a naphthylmethyl group can be preferably enumerated.

Examples of the alkenyl group include an alkenyl group having from 2 to 8 carbon atoms, and specifically, a vinyl group, an allyl group, a butenyl group, and a cyclohexenyl group can be preferably enumerated.

Examples of the alkoxy group include an alkoxy group having from 1 to 8 carbon atoms, and specifically, a methoxy group, an ethoxy group, an n-propoxy group, an isopropoxy group, a butoxy group, a pentoxy group, an allyoxy group, and an octoxy group can be preferably enumerated.

Examples of the acyl group include an acyl group having from 1 to 10 carbon atoms, and specifically, a formyl group, an acetyl group, a propanoyl group, a butanoyl group, a pivaloyl group, an octanoyl group, and a benzoyl group can be preferably enumerated.

As the acyloxy group, an acyloxy group having from 2 to 12 carbon atoms is preferable, and examples thereof include an acetoxy group, a propionyloxy group, and a benzoyloxy group.

As the alkynyl group, an alkynyl group having from 2 to 5 carbon atoms is preferable, and examples thereof include an ethynyl group, a propynyl group, and a butynyl group.

The alkoxycarbonyl group is preferably a secondary or tertiary alkoxycarbonyl group, and more preferably a tertiary alkoxycarbonyl group, such as an isopropoxycarbonyl group, a t-butoxycarbonyl group, a t-amyloxycarbonyl group, and a 1-methyl-1-cyclohexyloxycarbonyl group.

Examples of the halogen atom include a fluorine atom, a chlorine atom, a bromine atom, and an iodine atom.

The alkylene group is preferably one having from 1 to 8 carbon atoms, such as a methylene group, an ethylene group, a propylene group, a butylene group, a hexylene group, and an octylene group, each of which may have a substituent.

The alkenylene group is preferably one having from 2 to 6 carbon atoms, such as an ethenylene group, a propenylene group, a butenylene group, each of which may have a substituent.

The cycloalkylene group is preferably one having from 5 to 8 carbon atoms, such as a cyclopentylene group and a cyclohexylene group, each of which may have a substituent.

The arylene group is preferably one having from 6 to 15 carbon atoms, such as a phenylene group, a tolylene group, and a naphthylene group, each of which may have a substituent.

Also, these groups may have a substituent. Examples of the substituent include ones having active hydrogen such as an alkyl group, a cycloalkyl group, an aryl group, an amino group, an amide group, a ureido group, a urethane group, a hydroxyl group, and a carboxyl group, a halogen atom (for example, a fluorine atom, a chlorine atom, a bromine atom, and an iodine atom), an alkoxy group (for example, a methoxy group, an ethoxy group, a propoxy group, and a butoxy group), a thioether group, an acyl group (for example, an acetyl group, a propanoyl group, and a benzoyl group), an acyloxy group (for example, an acetoxy group, a propanoyloxy group, and a benzoyloxy group), an alkoxycarbonyl group (for example, a methoxycarbonyl group, an ethoxycarbonyl group, and a propoxycarbonyl group), a cyano group, and a nitro group.

Here, as the alkyl group, the cycloalkyl group, and the aryl group, those described previously are enumerated. The alkyl group may be further substituted with a fluorine atom or a cycloalkyl group.

Examples of the group capable of being decomposed by the action of an acid, which is contained in the fluorine group-containing resin of the invention, include —O—C—($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$), and —COO—C($R_{36}$)($R_{37}$)(O$R_{39}$).

$R_{36}$ to $R_{39}$ each represents an alkyl group, a cycloalkyl group, an aryl group, an aralkyl group, or an alkenyl group; and $R_{01}$ and $R_{02}$ each represents a hydrogen atom, an alkyl group, a cycloalkyl group, an alkenyl group, an aralkyl group, or an aryl group.

Preferred specific examples thereof include an ether group or an ester group of a tertiary alkyl group such as a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group, an acetal group or an acetal ester group such as a 1-alkoxy-1-ethoxy group, and a tetrahydropyranyl group, a t-alkyl carbonate group, and a t-alkylcarbonylmethoxy group.

Specific examples of the repeating structural units represented by the general formulae (FA) to (FG) will be given below, but it should not be construed that the invention is limited thereto.

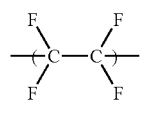
(F-1)

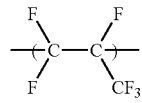
(F-2)

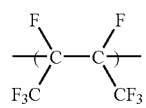
(F-3)

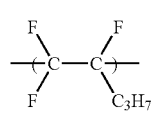
(F-4)

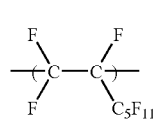
(F-5)

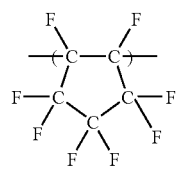
(F-6)

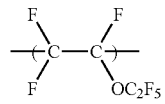
(F-7)

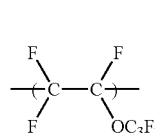
(F-8)

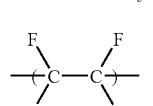
(F-9)

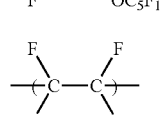
(F-10)

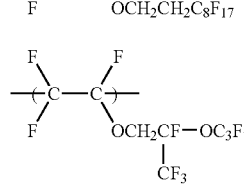
(F-11)

-continued

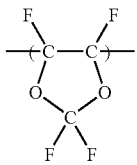
(F-12)

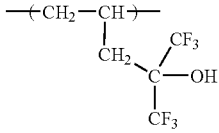
(F-13)

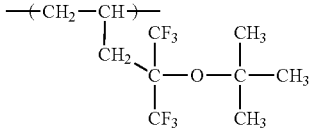
(F-14)

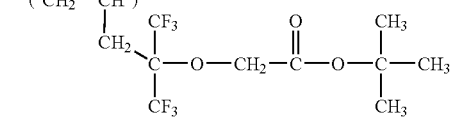
(F-15)

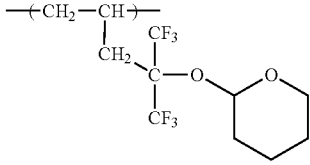
(F-16)

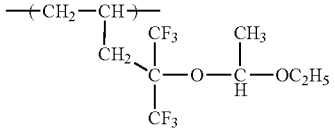
(F-17)

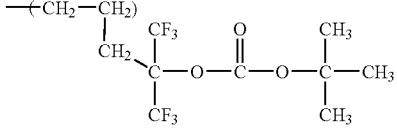
(F-18)

(F-19)

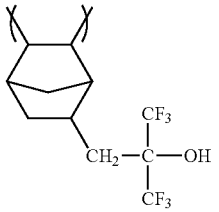

(F-20)

(F-21)
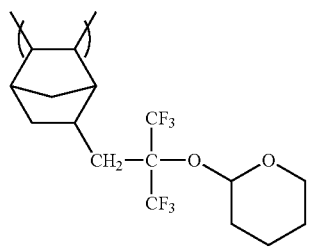
(F-22)
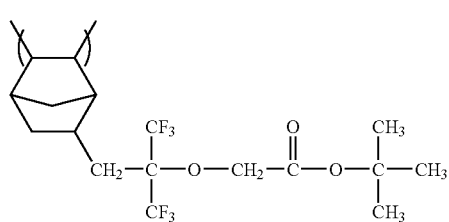
(F-23)
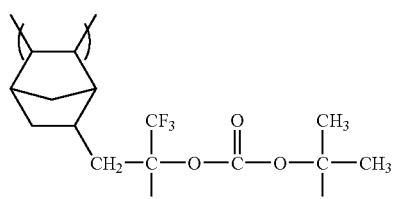
(F-24)
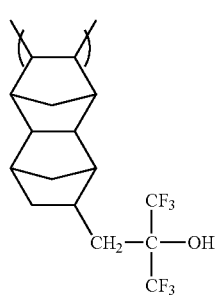
(F-25)
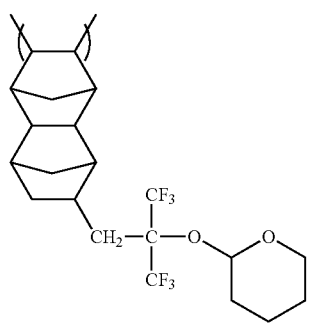
(F-26)
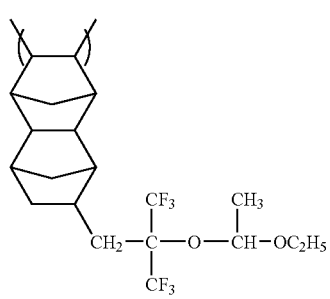
(F-27)
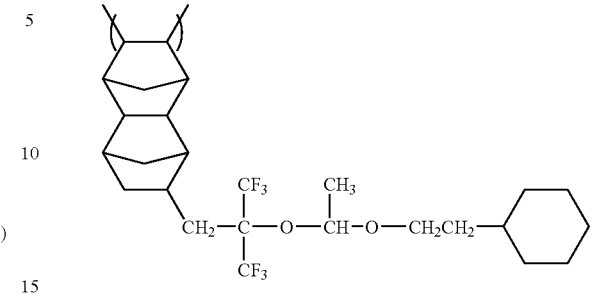
(F-28)
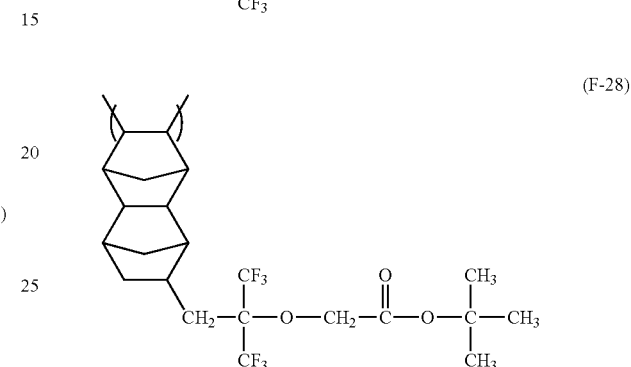
(F-29)
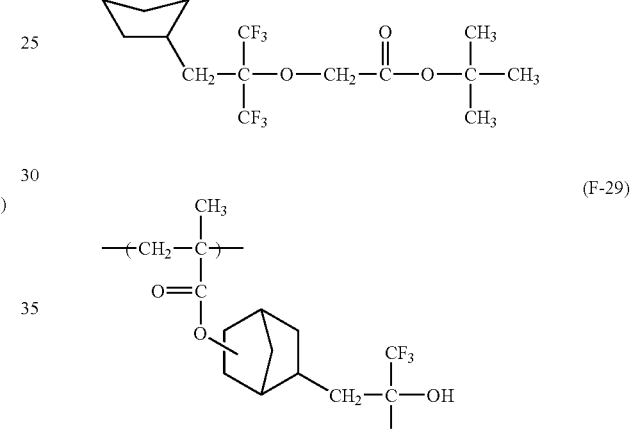
(F-30)
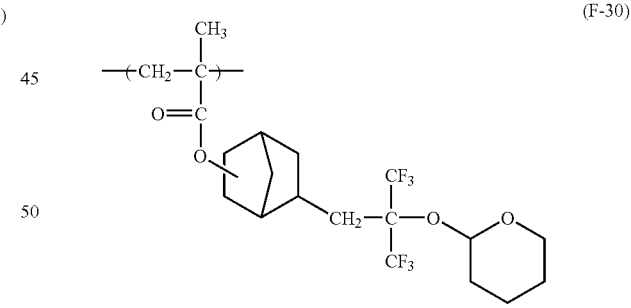
(F-31)
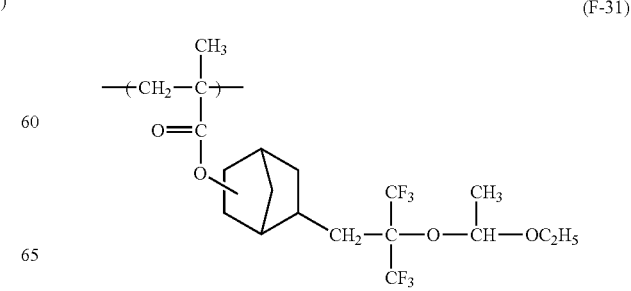

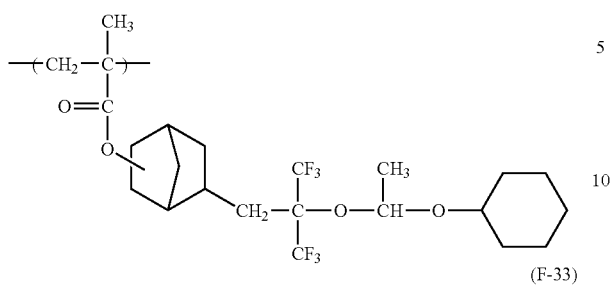
(F-32)
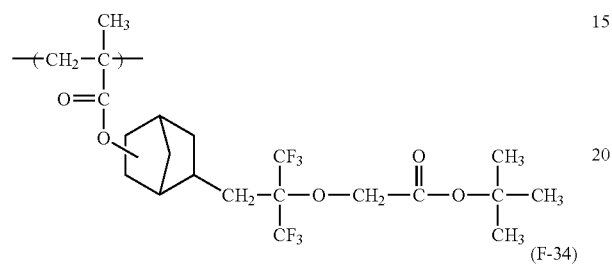
(F-33)
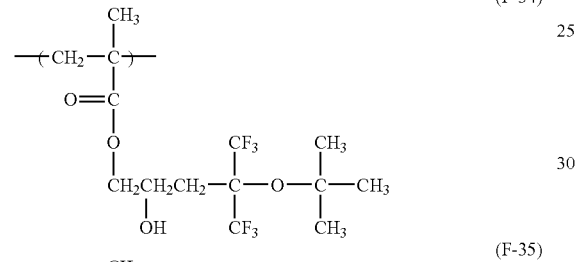
(F-34)
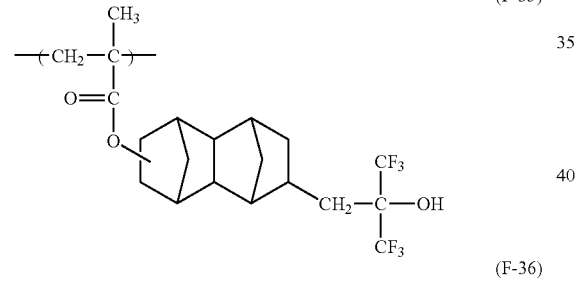
(F-35)
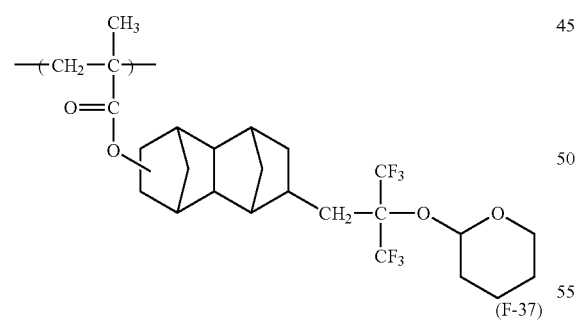
(F-36)
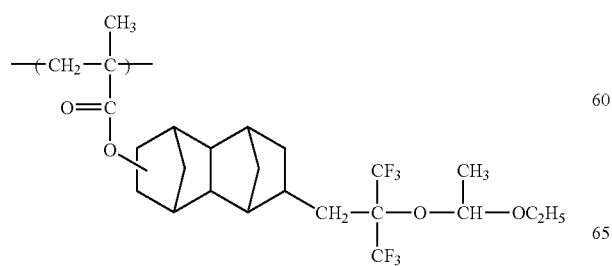
(F-37)
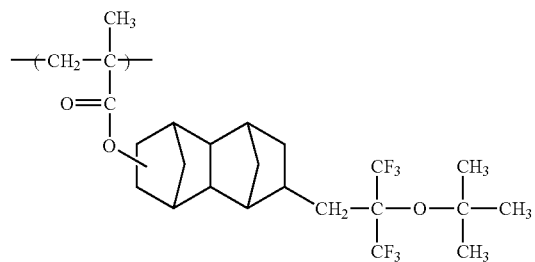
(F-38)
(F-39)
(F-40)
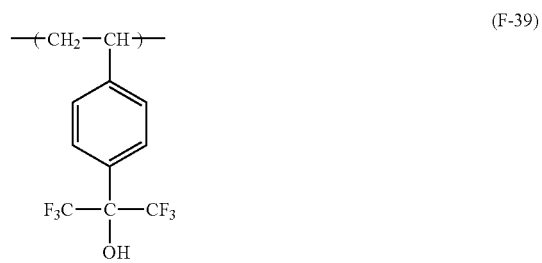
(F-41)
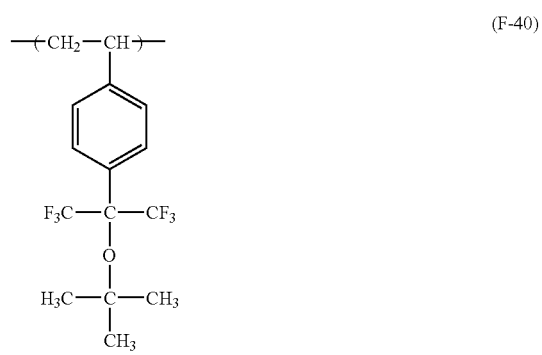
(F-42)
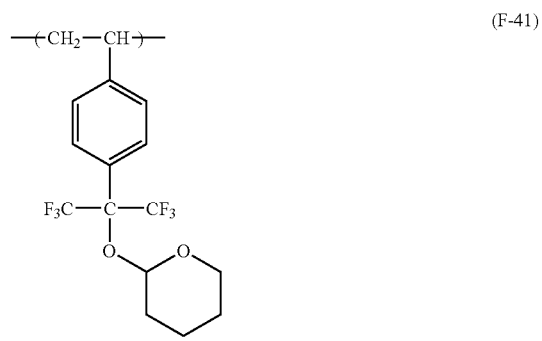

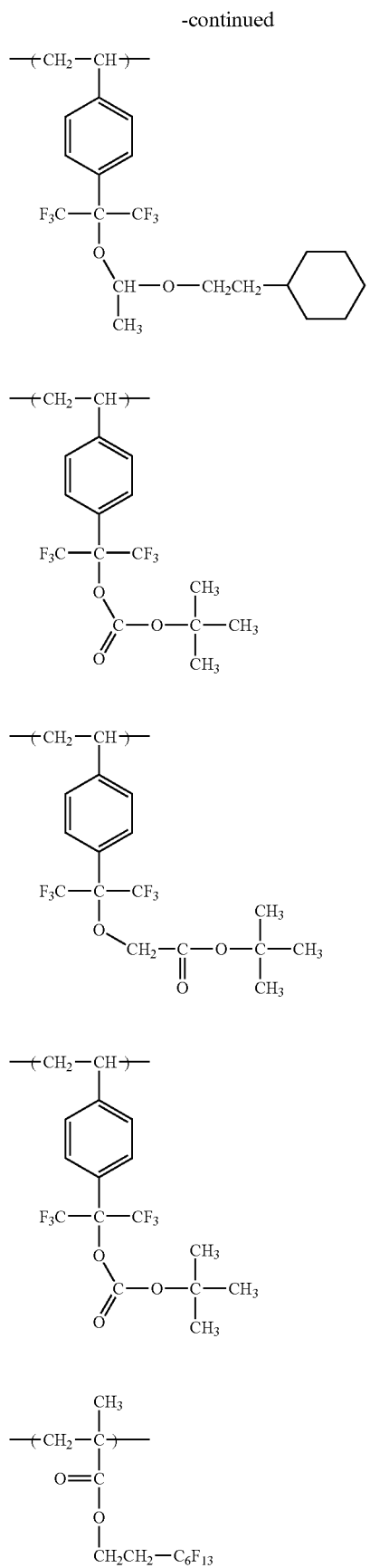
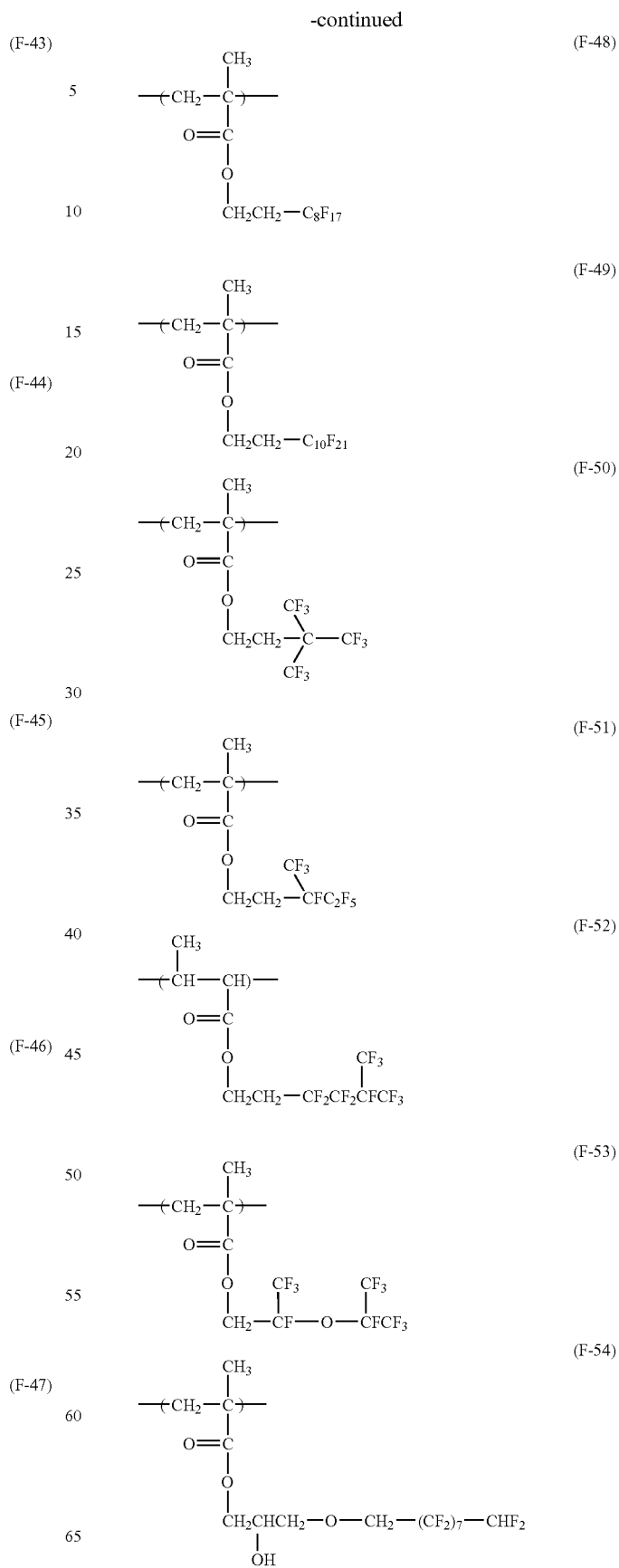

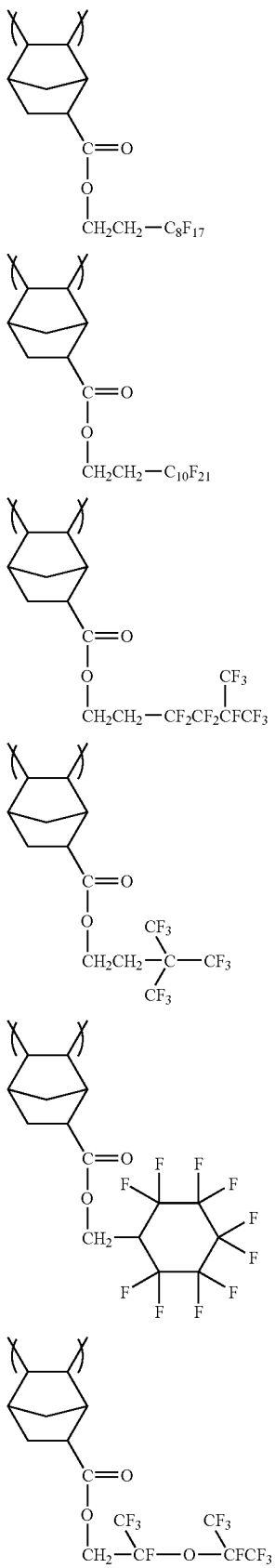

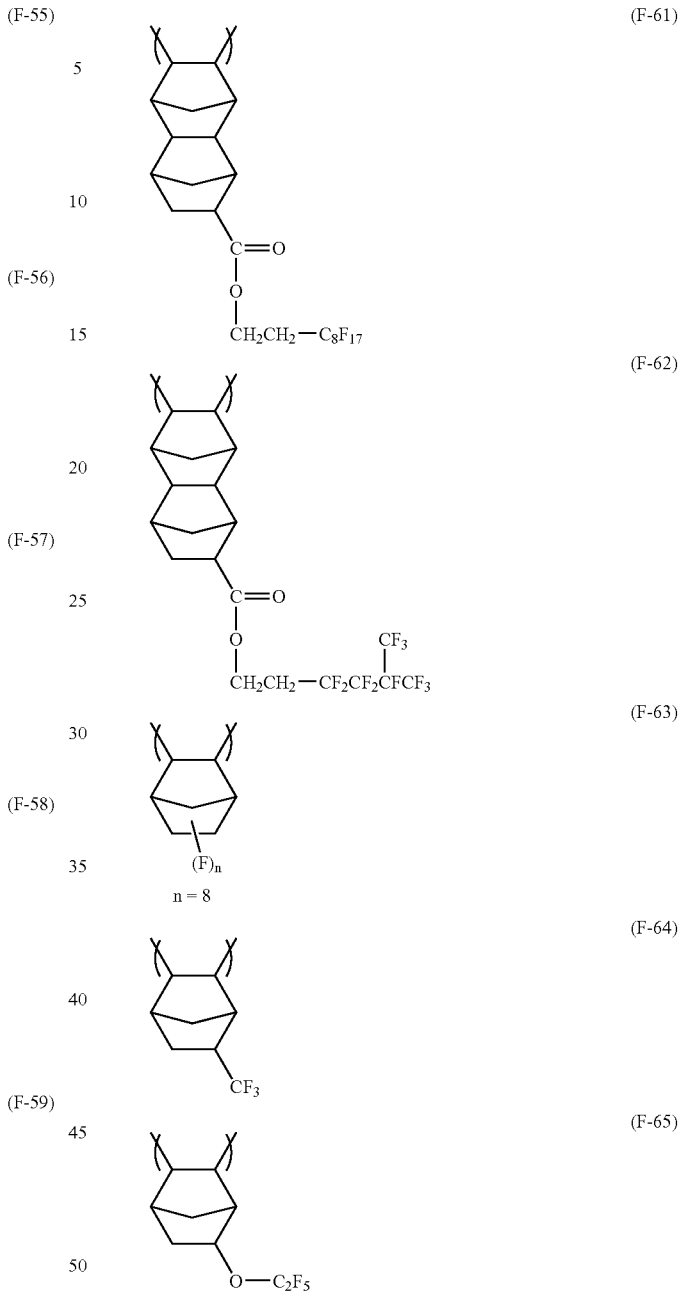

The total content of the repeating units represented by the general formulae (FA) to (FG) is generally in the range of from 10 to 80% by mole, preferably from 30 to 70% by mole, and more preferably from 35 to 65% by mole based on the whole of the repeating units constituting the resin.

In addition to the foregoing repeating structural units, the resin (B) of the invention may be copolymerized with other polymerizable monomer for the purpose of further enhancing the performance of the resin of the invention.

Examples of copolymerizable monomers that can be used include those described blow. That is, examples include compounds having one addition polymerizable unsaturated bond, which are selected from acrylic esters, acrylamides, methacrylic esters, methacrylamides, allyl compounds, vinyl ethers, vinyl esters, styrenes, and crotonic esters other than those described above.

From the viewpoints of enhancing the dry etching resistance, adjusting the alkali solubility, and enhancing the adhesion to a substrate, it is preferable that such a fluorine group-containing resin contains other repeating unit as a copolymerization component in addition to the foregoing fluorine atom-containing repeating unit. Preferred examples of other repeating unit include those described below.

1) A repeating unit having the alicyclic hydrocarbon structure represented by any one of the foregoing general formulae (pI) to (pVI) and (II-AB). Specifically, the repeating units of the foregoing 1 to 23 and the repeating units of the foregoing [II-1] to [II-32]. Above all, the foregoing specific examples 1 to 23 in which $R_x$ is $CF_3$ are preferable.

2) A repeating unit having the lactone structure represented by any one of the foregoing general (Lc) and (V-1) to (V-5). Specifically, the repeating units of the foregoing (IV-1) to (IV-16) and the repeating units of the foregoing (Ib-1) to (Ib-11).

3) A repeating unit represented by any one of the following general formulae (XV), (XVI) and (XVII), which is derived from maleic anhydride, vinyl ether, or a cyano group-containing vinyl compound. Specifically, the repeating units of the foregoing (C-1) to (C-15). A fluorine atom may not be contained in these other repeating units.

(XV)

(XVI)

(XVII)

In the formulae, $R_{41}$ represents an alkyl group, a cycloalkyl group, an aralkyl group, or an aryl group. The alkyl group of $R_4$, may be substituted with an aryl group.

$R_{42}$ represents a hydrogen atom, a halogen atom, a cyano group, or an alkyl group.

$A_5$ represents a single bond, a divalent alkyl group, alkenylene group, cycloalkylene group or arylene group, —O—CO—$R_{22}$—, —CO—O—$R_{23}$—, or —CO—N($R_{24}$)—$R_{25}$—.

$R_{22}$, $R_{23}$, and $R_{25}$ may be the same or different and each represents a single bond or a divalent alkylene group, alkenylene group, cycloalkylene group or arylene group, each of which may have an ether group, an ester group, an amide group, a urethane group, or a ureido group.

$R_{24}$ represents a hydrogen atom, an alkyl group, a cycloalkyl group, an aralkyl group, or an aryl group.

Here, as examples of the respective substituents, the same examples as in the substituents of the foregoing general formulae (FA) to (FG) are enumerated.

Also, specific examples of the repeating structural units represented by the general formulae (XVI) to (XVII) will be given below, but it should not be construed that the invention is limited thereto.

-continued

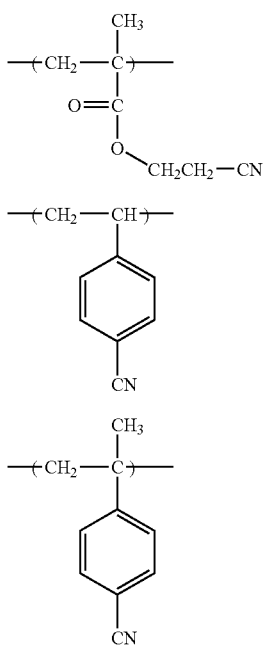

(C-13)

(C-14)

(C-15)

The content of other repeating units including the repeating units represented by the general formulae (XV) to (XVII) is generally in the range of from 0 to 70% by mole, preferably from 10 to 60% by mole, and more preferably from 20 to 50% by mole based on the whole of the repeating structural units constituting the resin.

In the fluorine group-containing resin as the acid decomposable resin (B), the acid decomposable group may be contained in any repeating unit.

The content of the repeating unit having an acid decomposable group is preferably from 10 to 70% by mole, more preferably from 20 to 60% by mole, and further preferably from 30 to 60% by mole based on the whole of the repeating units.

The fluorine group-containing resin can be synthesized by radical polymerization likewise the alicyclic hydrocarbon based acid decomposable resin.

The resin as the component (B) according to the invention preferably has a weight average molecular weight, as reduced into polystyrene by the GPC method, of from 1,000 to 200,000. When the weight average molecular weight is 1,000 or more, it is possible to enhance the heat resistance and dry etching resistance. Also, when the weight average molecular weight is not more than 200,000, not only it is possible to enhance the developability, but also since the viscosity is extremely low, it is possible to enhance the film forming property.

In the positive working composition of the invention, the compounding amount of the resin as the component (B) according to the invention in the whole of the composition is preferably from 40 to 99.99% by weight, and more preferably from 50 to 99.97% by weight in the whole of solids.

[3] (C) Dissolution inhibiting compound which is decomposed by the action of an acid, whereby its solubility in an alkaline developer increases, and which has a molecular weight of not more than 3,000 (hereinafter sometimes referred to as "component (C)" or "dissolution inhibiting compound"):

As the dissolution inhibiting compound (C) which is decomposed by the action of an acid, whereby its solubility in an alkaline developer increases, and which has a molecular weight of not more than 3,000, for the purpose of not reducing the transmission at not longer than 220 nm, alicyclic or aliphatic compounds having an acid decomposable group, such as acid decomposable group-containing cholic acid derivatives as described in *Proceeding of SPIE*, 2724, 355 (1996). With respect to the acid decomposable group and alicyclic structure, those described in the foregoing alicyclic hydrocarbon based acid decomposable resin are enumerated.

In the case where the photosensitive composition of the invention is exposed with KrF excimer laser or irradiated with electron beams, one having a structure in which a phenolic hydroxyl group of a phenol compound is substituted with an acid decomposable group is preferable. As the phenol compound, one having from 1 to 9 phenol skeletons is preferable, and one having from 2 to 6 phenol skeletons is more preferable.

In the invention, the dissolution inhibiting compound has a molecular weight of not more than 3,000, preferably from 300 to 3,000, and more preferably from 500 to 2,500.

The amount of the dissolution inhibiting compound to be added is preferably from 3 to 50% by weight, and more preferably from 5 to 40% by weight based on the solids of the photosensitive composition.

Specific examples of the dissolution inhibiting compound will be given below, but it should not be construed that the invention is limited thereto.

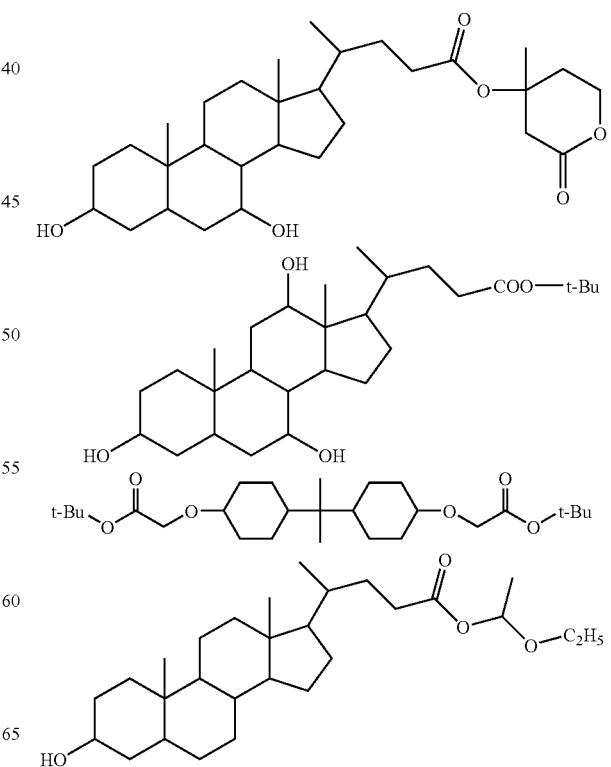

-continued

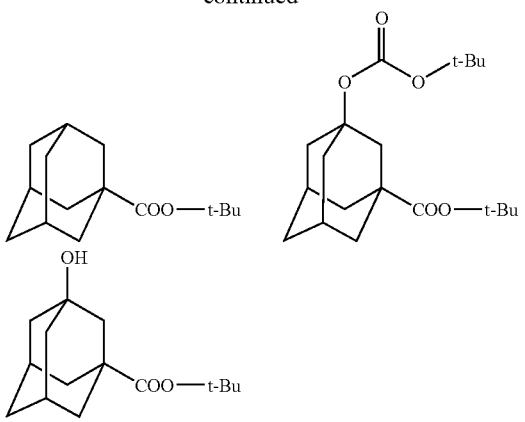

[4] (D) Resin soluble in an alkaline developer thereinafter sometimes referred to as "component (D)" or "alkali-soluble resin"):

The alkali-soluble resin preferably has an alkali dissolution rate, as measured (at 23° C.) in 0.261N tetramethylammonium hydroxide (TMAH), of 20 angstrom or more per second, and especially preferably 200 angstrom or more per second.

Examples of the alkali-soluble resin to be used in the invention include novolak resins, hydrogenated novolak resins, acetone-pyrogallol resins, o-polyhydroxystyrene, m-polyhydroxystyrene, p-polyhydroxystyrene, hydrogenated polyhydroxystyrene, halogen- or alkyl-substituted polyhydroxylstyrenes, hydroxystyrene-N-substituted maleimide copolymers, o/p- and m/p-hydroxystyrene copolymers, partially O-alkylated products (for example, O-methylated products of from 5 to 30% by mole, O-(1-methoxy) ethylated products, O-(1-ethoxy)ethylated products, O-2-tetra hydropyranylated products, and O-(t-butoxycarbonyl) methylated products) or O-acylated products (for example, o-acetylated products of from 5 to 30% by mole and O-(t-butoxy)carbonylated products) against the hydroxyl group of polyhydroxystyrene, styrene-maleic anhydride copolymers, styrene-hydroxystyrene copolymers, α-methyl styrene-hydroxystyrene copolymers, carboxyl group-containing methacrylic resins and derivatives thereof, and polyvinyl alcohol derivatives. However, it should not be construed that the invention is limited thereto.

Of these alkali-soluble resins, novolak resins, o-polyhydroxystyrene, m-polyhydroxystyrene, p-polyhydroxystyrene and copolymers thereof; alkyl-substituted polyhydroxystyrenes; partially O-alkylated or O-acylated products of polyhydroxystyrene; styrene-hydroxystyrene copolymers; and α-methylstyrene-hydroxystyrene copolymers are especially preferable.

The novolak resins can be obtained by subjecting a prescribed monomer as the major component to addition condensation with an aldehyde in the presence of an acid catalyst.

Also, the alkali-soluble resin has a weight average molecular weight of 2,000 or more, preferably from 5,000 to 200,000, and more preferably from 5,000 to 100,000.

The weight average molecular weight as referred to herein is defined as a value as reduced into polystyrene by the gel permeation chromatography.

In the invention, the alkali-soluble resin (D) may be used in combinations of two or more thereof.

The amount of the alkali-soluble resin to be used is from 40 to 97% by weight, and preferably from 60 to 90% by weight based on the solids of the whole of the composition of the photosensitive composition.

(5) (E) Acid crosslinking agent capable of crosslinking with the foregoing alkali-soluble resin by the action of an acid (hereinafter sometimes referred to as "component (E)" or "crosslinking agent"):

Though any compound can be used as the crosslinking agent so far as it cross-links the resin soluble in an alkaline developer by the action of an acid, the following (1) to (3) are preferable.

(1) Hydroxymethyl body, alkoxymethyl body, or acyloxymethyl body of phenol derivative.
(2) Compound having an N-hydroxymethyl group, an N-alkoxymethyl group, or an N-acyloxymethyl group.
(3) Compound having an epoxy group.

The alkoxymethyl group is preferably one having not more than 6 carbon atoms; and the acyloxymethyl group is preferably one having not more than 6 carbon atoms.

Of these crosslinking agents, the following compounds are especially preferable.

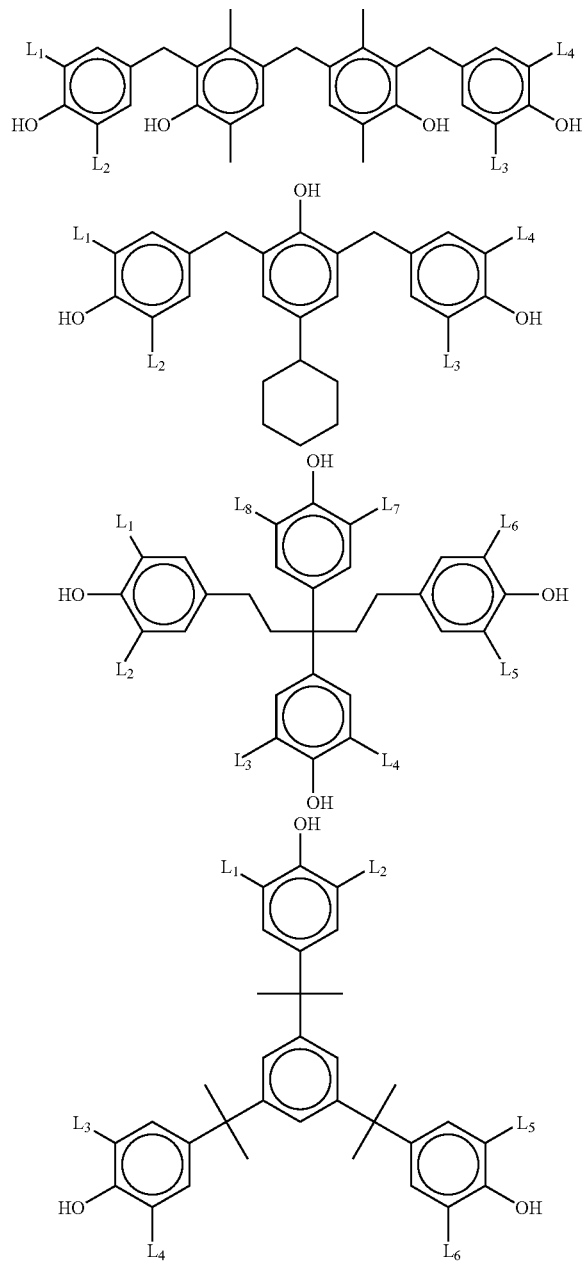

-continued

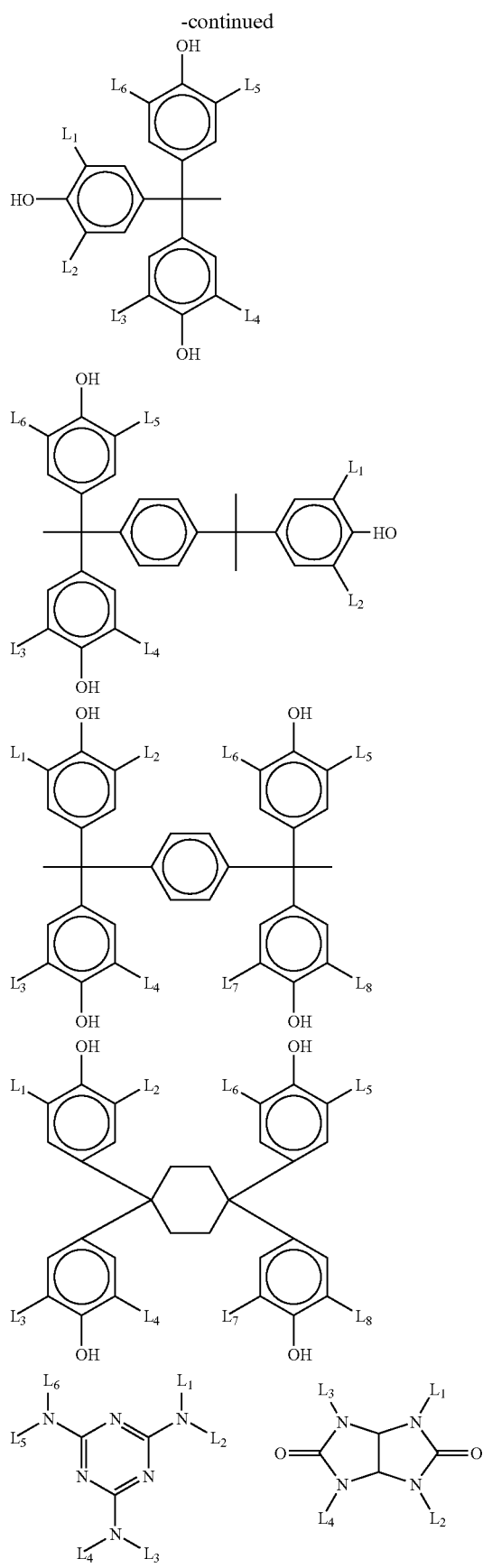

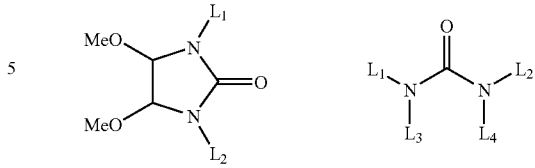

In the formulae, $L_1$ to $L_8$ may be the same or different and each represents a hydrogen atom, a hydroxymethyl group, a methoxymethyl group, an ethoxymethyl group, or an alkyl group having from 1 to 6 carbon atoms.

The crosslinking agent is usually used in an addition amount of from 3 to 70% by weight, and preferably from 5 to 50% by weight in the solids of the photosensitive composition.

<Other Components>

[5] (F) Basic Compound:

For the purpose of reducing a change of the performance with time from exposure to heating, it is preferable that the photosensitive composition of the invention contains (F) a basic compound.

Structures represented by the following formulae (A) to (E) can be enumerated as the preferred structure.

(A)

Here, $R^{250}$, $R^{251}$, and $R^{252}$ each independently represents a hydrogen atom, an alkyl group having from 1 to 20 carbon atoms, a cycloalkyl group having from 3 to 20 carbon atoms, or an aryl group having from 6 to 20 carbon atoms; and $R^{250}$ and $R^{251}$ may be taken together to form a ring. These groups may have a substituent. As the substituted alkyl group and cycloalkyl group, an aminoalkyl group having from 1 to 20 carbon atoms or an aminocycloalkyl group having from 3 to 20 carbon atoms, and a hydroxyalkyl group having from 1 to 20 carbon atoms or a hydroxycycloalkyl group having from 3 to 20 carbon atoms are preferable.

Also, these alkyl chains may contain an oxygen atom, a sulfur atom, or a nitrogen atom.

(B)

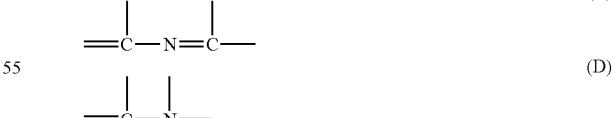
(C)

(D)

(E)

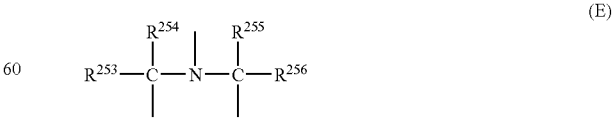

In the formulae, $R^{253}$, $R^{254}$, $R^{255}$ and $R^{256}$ each independently represents an alkyl group having from 1 to 20 carbon atoms or a cycloalkyl group having from 3 to 20 carbon atoms.

Preferred examples of compounds include guanidine, aminopyrrolidine, pyrazole, pyrazoline, piperazine, aminomorpholine, aminoalkylmorpholines, and piperidine, each of which may have a substituent. As more preferable compounds, compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, and aniline derivatives having a hydroxyl group and/or an ether bond can be enumerated.

Examples of compounds having an imidazole structure include imidazole, 2,4,5-triphenylimidazole, and benzimidazole. Examples of compounds having a diazabicyclo structure include 1,4-diazabicyclo[2,2,2]octane, 1,5-diazabicyclo[4,3,0]nona-5-ene, and 1,8-diazabicyclo [5,4,0] undeca-7-ene. Examples of compounds having an onium hydroxide structure include triarylsulfonium hydroxides, phenacylsulfonium hydroxides, and sulfonium hydroxides having a 2-oxoalkyl group, specifically, triphenylsulfonium hydroxide, tris(t-butylphenyl)sulfonium hydroxide, bis(t-butylphenyl) iodonium hydroxide, phenacylthiophenium hydroxide, and 2-oxopropylthiophenium hydroxide. Examples of compounds having an onium carboxylate structure include compounds having an onium hydroxide structure in which an anion moiety thereof is a carboxylate, for example, acetates, adamantane-1-carboxylates, and perfluoroalkyl carboxylates. Examples of compounds having a trialkylamine structure include tri (n-butyl) amine and tri (n-octyl) amine. Examples of aniline compounds include 2,6-diisopropylaniline and N,N-dimethylaniline. Examples of alkylamine derivatives having a hydroxyl group and/or an ether bond include ethanolamine, diethanolamine, triethanolamine, and tris (methoxyethoxyethyl)amine. Examples of aniline derivatives having a hydroxyl group and/or an ether bond include N,N-bis(hydroxyethyl)aniline.

These basic compounds are used singly or in admixture of two or more thereof. The amount of the basic compound to be used is usually from 0.001 to 10% by weight, and preferably from 0.01 to 5% by weight based on the solids of the photosensitive composition. For the sake of obtaining sufficient addition effects, it is preferable that the amount of the basic compound to be used is 0.001% by weight or more. On the other hand, in view of the sensitivity and the developability in a non-exposed area, it is preferable that the amount of the basic compound to be used is not more than 10% by weight.

[6] (G) Fluorine based and/or silicon based surfactant:

It is preferable that the photosensitive composition of the invention containing either one of a fluorine based surfactant and a silicon based surfactant (for example, a fluorine based surfactant and a silicon based surfactant, and a surfactant containing both of a fluorine atom and a silicon atom), or two or more thereof.

When the photosensitive composition of the invention contains a fluorine and/or silicon based surfactant, it is possible to give a resist pattern having good sensitivity and resolution and having little adhesion and development defect at the time of using a light source of exposure of not longer than 250 nm, especially not longer than 220 nm.

Examples of such fluorine and/or silicon based surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511, and 5,824,451. Also, commercially available surfactants described below can be used as they are.

Examples of commercially available surfactants that can be used include fluorine based surfactants or silicon based surfactants such as Eftop Series EF301 and EF303 (manufactured by Shin-Akita Kasei K. K.), Fluorad Series FC430 and FC431 (manufactured by Sumitomo 3M Ltd.), Megafoam Series F171, F173, F176, F189, and $R_{08}$ (manufactured by Dainippon Ink and Chemicals, Incorporated), Sarfron Series S-382, SC101, SC102, SC103, SC104, SC105, and SC106 (manufactured by Asahi Glass Co., Ltd.), and Troysol S-366 (manufactured by Troy Chemical Industries, Inc.). Also, a polysiloxane polymer KP-341 (manufactured by Shin-Etsu Chemical Co., Ltd.) can be used as the silicon based surfactant.

Also, in addition to the foregoing known surfactants, surfactants using a polymer having a fluoro aliphatic group derived from a fluoro aliphatic compound produced by the telomerization method (also called "telomere method") or the oligomerization method (also called "oligomer method") can be used as the surfactant. The fluoro aliphatic compound can be synthesized by a method described in JP-A-2002-90991.

As the fluoro aliphatic group-containing polymer, copolymers of a fluoro aliphatic group-containing monomer and a (poly(oxyalkylene)) acrylate and/or a (poly(oxyalkylene)) methacrylate are preferable, and these copolymers may be one in which the monomers are irregularly distributed or block copolymerized. Also, examples of the poly(oxyalkylene) group include a poly(oxyethylene) group, a poly (oxypropylene) group, and a poly(oxybutylene) group. Also, units having alkylene groups having a different chain length in the same chain length, such as a poly(oxyethylene/oxypropylene/oxyethylene block linking body) and a poly (oxyethylene/oxypropylene block linking body), may be employed. Further, the copolymer of a fluoro aliphatic group-containing monomer and a (poly (oxyalkylene)) acrylate (or methacrylate) includes not only binary copolymers but also ternary or more copolymers in which two or more of different fluoro aliphatic group-containing monomers and two or more of different (poly (oxyalkylene)) acrylates (or methacrylates) are copolymerized simultaneously.

For example, Megaface Series F178, F-470, F-473, F-475, F-476, and F-472 (manufactured by Dainippon Ink and Chemicals, Incorporated) can be enumerated as a commercially available surfactant. Further, copolymers of a $C_6F_{13}$ group-containing acrylate (or methacrylate) and a (poly (oxyalkylene)) acrylate (or methacrylate), copolymers of a $C_6F_{13}$ group-containing acrylate (or methacrylate), a (poly (oxyethylene)) acrylate (or methacrylate) and a (poly (oxypropylene)) acrylate (or methacrylate), copolymers of a $C_8F_{17}$ group-containing acrylate (or methacrylate) and a (poly (oxyalkylene)) acrylate (or methacrylate), and copolymers of a $C_8F_{17}$ group-containing acrylate (or methacrylate), a (poly (oxyethylene)) acrylate (or methacrylate) and a (poly (oxypropylene)) acrylate (or methacrylate) can be enumerated.

The amount of the fluorine and/or silicon based surfactant to be used is preferably from 0.0001 to 2% by weight, and more preferably from 0.001 to 1% by weight based on the total amount (exclusive of the solvent) of the photosensitive composition.

[7] (H) Organic Solvent:

The photosensitive composition of the invention is used upon dissolving the foregoing components in a prescribed organic solvent.

Examples of the organic solvent that can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran.

In the invention, though the organic solvent may be used singly or in admixture, it is preferred to use a mixed solvent of a solvent containing a hydroxyl group in the structure and a solvent not containing a hydroxyl group in the structure. In this way, it is possible to reduce the generation of particles at the time of storage of the resist.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are especially preferable.

Examples of the solvent not containing a hydroxyl group include propylene glycol monomethyl ether acetate, ethyl ethoxypropionate, 2-heptanone, γ-butyrolactone, cyclohexanone, cyclohexanone, butyl acetate, N-methylpyrrolidone, N,N-dimethylacetamide, and dimethyl sulfoxide. Of these, propylene glycol monomethyl ether acetate, ethyl ethoxypropionate, 2-heptanone, γ-butyrolactone, cyclohexanone, and butyl acetate are especially preferable; and propylene glycol monomethyl ether acetate, ethyl ethoxypropionate, and 2-heptanone are the most preferable.

A mixing ratio (by weight) of the solvent containing a hydroxyl group to the solvent not containing a hydroxyl group is from 1/99 to 99/1, preferably from 10/90 to 90/10, and more preferably from 20/80 to 60/40. A mixed solvent containing 50% by weight or more of the solvent not containing a hydroxyl group is especially preferable in view of coating uniformity.

(Ha) Solvent containing at least one cyclic ketone:

In the case where the positive photosensitive composition contains the alicyclic hydrocarbon based acid decomposable resin, it is preferred to use a solvent containing at least one cyclic ketone as the organic solvent.

By using the alicyclic hydrocarbon based acid decomposable resin and the cyclic ketone, the positive photosensitive composition of the invention hardly causes pattern collapse and can widen the defocus latitude with respect to the isolated line pattern.

Examples of the cyclic ketone include compounds having from 5 to 8 carbon atoms in total, such as cyclopentanone, 3-methyl-2-cyclopentanone, cyclohexanone, 2-methylcyclohexanone, 2,6-dimethylcyclohexanone, cycloheptanone, cyclooctanone, and isophorone. Of these, cyclohexanone and cycloheptanone are preferable.

The cyclic ketone can be used singly or as a mixed solvent with other solvent. Examples of the solvent to be mixed (associative solvent) include propylene glycol monoalkyl ether carboxylates, alkyl lactates, propylene glycol monoalkyl ethers, alkyl alkoxypriopionates, and linear ketones.

Specific examples of propylene glycol monoalkyl ether carboxylates include propylene glycol monomethyl ether acetate, propylene glycol monomethyl ether propionate, and propylene glycol monoethyl ether acetate.

Examples of alkyl lactates include methyl lactate and ethyl lactate.

Examples of propylene glycol monoalkyl ethers include propylene glycol monomethyl ether and propylene glycol monoethyl ether.

Examples of alkyl alkoxypropionates include methyl methoxypropionate, ethyl methoxypropionate, methyl ethoxypropionate, and ethyl ethoxypropionate.

Examples of linear ketones include methyl ethyl ketone, 2-heptanone, 3-heptanone, and 4-heptanone.

Preferred examples of the associative solvent include propylene glycol monoalkyl ether carboxylates, alkyl lactates, and propylene glycol monoalkyl ethers.

By combining the cyclic ketone with the associative solvent, the adhesion to a substrate, developability, DOF, and the like are improved.

A ratio (weight ratio) of the cyclic ketone to the associative solvent is preferably from 30/70 to 95/5, more preferably from 35/65 to 90/10, and further preferably from 40/60 to 80/20.

Also, from the viewpoint of enhancing the uniformity of film thickness and the development defect performance, it is preferred to mix a high-boiling solvent having a boiling point of 200° C. or higher, such as ethylene carbonate, propylene carbonate, and γ-butyrolactone.

The addition amount of the high-boiling solvent is from 0.1 to 15% by weight, preferably from 0.5 to 10% by weight, and further preferably from 1 to 5% by weight in the whole of solvents.

By using such a cyclic ketone singly or a mixed solvent with other solvent, the photosensitive composition having a concentration of solids of generally from 3 to 25% by weight, preferably from 5 to 22% by weight, and more preferably from 7 to 20% by weight is prepared.

<Other Additives>

If desired, the photosensitive composition of the invention may further contain a dye, a plasticizer, a surfactant other than the foregoing component (G), a photosensitizer, a compound capable of accelerating the dissolution in a developer, and the like.

A dissolution accelerating compound in a developer, which can be used in the invention, is a low-molecular compound having two or more OH phenolic groups or one or more carboxy groups and having a molecular weight of not more than 1,000. In the case where the dissolution accelerating compound has a carboxy group(s), alicyclic or aliphatic compounds are preferable.

The addition amount of the dissolution accelerating compound is preferably from 2 to 50% by weight, and more preferably from 5 to 30% by weight based on the resin as the component (B) or the resin as the component (D). In view of inhibition of development residues and prevention of pattern deformation at the time of development, it is preferable that the addition amount of the dissolution accelerating compound is not more than 50% by weight.

Such a phenolic compound having a molecular weight of not more than 1,000 can be easily synthesized by those skilled in the art by referring to methods described in, for example, JP-A-4-122938, JP-A-2-28531, U.S. Pat. No. 4,916,210, and European Patent No. 219,294.

Specific examples of the carboxyl group-containing alicyclic or aliphatic compound include carboxylic acid derivatives having a steroid structure (for example, cholic acid, deoxycholic acid, and lithocholic acid), adamantanecarboxylic acid derivatives, adamantanedicarboxylic acids, cyclohexanecarboxylic acid, and cyclohexanedicarboxylic acids. However, it should not be construed that the invention is limited thereto.

In the invention, surfactants other than the foregoing fluorine based and/or silicon based surfactant (G) can be added. Specific examples thereof include nonionic surfactants such as polyoxyethylene alkyl ethers, polyoxyethylene alkylaryl ethers, polyoxyethylene/polyoxypropylene block copolymers, sorbitan aliphatic esters, and polyoxyethylene sorbitan aliphatic esters.

These surfactants can be added singly or in combinations.

<<Use Method>>

The photosensitive composition of the invention is used by dissolving the respective components in a prescribed solvent, preferably the foregoing mixed solvent and coating the solution on a prescribed support in the following manner.

For example, the photosensitive composition is coated on a substrate to be used in the manufacture of precision integrated circuit devices (for example, a silicon/silicon dioxide coating) by an adequate coating method using a spinner, a coater, etc., and then dried to form a photosensitive film.

The photosensitive film is irradiated with the actinic ray or the radiation through a prescribed mask, baked (heated), and then developed. In this way, a good pattern can be obtained.

Though as the the actinic ray or the radiation, infrared light, visible light, ultraviolet light, far ultraviolet light, X-rays, and electron beams can be enumerated, far ultraviolet light preferably having a wavelength of not longer than 250 nm, and more preferably not longer than 220 nm, specifically, a KrF excimer laser (248 nm), an ArF excimer laser (193 nm), an $F_2$ excimer laser (157 nm), X-rays, and electron beams are preferable, and an ArF excimer laser and an $F_2$ excimer laser, and EUV (13 nm) are more preferable.

In the development step, an alkaline developer is used in the following manner. As the alkaline developer of the resist composition, alkaline aqueous solutions of, for example, inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine, can be used.

Further, suitable amounts of alcohols or surfactants can be added to and used in the foregoing alkaline developer.

The alkaline developer generally has an alkali concentration of from 0.1 to 20% by weight.

The alkaline developer generally has a pH of from 10.0 to 15.0.

EXAMPLES

The invention will be described below in more detail with reference to the following Examples, but it should not be construed that the contents of the invention are limited thereto.

<Compound (A)>

Synthesis Example 1

Synthesis of Compound (I-1)

8.44 g (18.6 mmoles) of diiodoperfluorobutane, 8.50 g (48.8 mmoles) of sodium hydrosulfite, 4.60 g (55 mmoles) of sodium hydrogencarbonate, 25 mL of acetonitrile, and 15 mL of water were added, and the mixture was stirred at room temperature for one hour. The reaction solution was filtered, and a filtrate was ice cooled to deposit a white solid. This solid was collected by filtration and dried to obtain 6.8 g (98%) of sodium perfluorobutane-1,5-disulfinate.

15.77 g (40.4 mmoles) of triphenylsulfonium iodide, 7.07 g (42.4 mmoles) of silver acetate, 400 mL of acetonitrile, and 200 mL of water were added, and the mixture was stirred at room temperature for one hour. The reaction solution was filtered to obtain a triphenylsulfonium acetate solution.

7.2 g (19.2 mmoles) of sodium perfluorobutane-1,5-disulfinate, 80 mL of aqueous hydrogen peroxide (30%), and 8 mL of acetic acid were added, and the mixture was stirred at 60° C. for 4 hours. After confirming the completion of the reaction by $^{19}$F-NMR, the reaction solution was neutralized by the addition of 30 mL of 1N-NaOH, to which was then added the foregoing triphenylsulfonium acetate solution, and the mixture was stirred at room temperature for three hours. 500 mL of chloroform was added, and an organic layer was washed successively with water, an aqueous saturated sodium sulfite solution, water, an aqueous saturated ammonium chloride solution, and water. The organic layer was filtered using a 0.1 μm filter, and the solvent was removed using an evaporator to obtain a colorless transparent oil. This oil was crystallized by allowing to stand at −10° C. for 6 hours, and crystals were collected by filtration and dried to obtain a desired compound (I-1) (7.5 g, 44%).

$^1$H-NMR (300 MHz, CDCl$_3$): δ7.27 to 7.55 (m, 9H), 7.70 to 7.69 (m, 6H)

$^{19}$F-NMR (300 MHz, CDCl$_3$): δ−114 (t, 4F), −120 (t, 4F)

Other acid generating agents were synthesized in the same manner.

<Resin (B)>

Synthesis Example 1

Synthesis of Resin (1) (Side Chain Type)

2-Ethyl-2-adamantyl methacrylate and butyrolactone methacrylate were charged in a proportion of 55/45 and dissolved in methyl ethyl ketone/tetrahydrofuran (5/5) to prepare 100 mL of a solution having a concentration of solids of 20%. To this solution, 2% by mole of V-65, manufactured by Wako Pure Chemical Industries, Ltd. was added, and the mixture was dropped in 10 mL of methyl ethyl ketone heated at 60° C. over 4 hours in a nitrogen atmosphere. After completion of dropping, the reaction solution was heated for 4 hours, 1% by mole of V-65 was again added, and the mixture was stirred for 4 hours. After completion of the reaction, the reaction solution was cooled to room temperature and crystallized from 3 L of a mixed solvent of distilled water/isopropyl alcohol (1/1), thereby recovering a resin (1) as a deposited white powder.

The polymer formulation ratio determined by $C^{13}$-NMR was 46/54. Also, the weight average molecular weight as reduced into standard polystyrene by the GPC measurement was 10,700.

Resins (2) to (12) and (26) to (31) were synthesized in the same manner as in the foregoing Synthesis Example 1.

Synthesis Example 2

Synthesis of Resin (13) (Principal Chain Type)

t-Butyl norbornenecarboxylate, butyrolactone norbornenecarboxylate and maleic anhydride (molar ratio: 40/10/50) and THF (reaction concentration: 60% by weight) were charged in a separable flask, and the mixture was heated at 60° C. under a nitrogen gas stream. When the reaction temperature became stable, 2% by mole of a radical initiator V-601, manufactured by Wako Pure Chemical Industries, Ltd. was added to initiate reaction. The mixture was heated for 12 hours. The resulting reaction mixture was diluted two times with tetrahydrofuran and then thrown into a mixed solution of hexane/isopropyl alcohol (1/1) to deposit a white powder. The deposited powder was taken out by filtration and dried to obtain a desired resin (13).

The resulting resin (13) was subjected to molecular weight analysis by GPC and found to be 8,300 (weight average) as reduced into polystyrene. Also, according to the NMR spectrum, the resin (13) was confirmed to have a molar ratio of t-butyl norbornenecarboxyllate/butyrolactone norbornenecarboxylate/maleic anhydride repeating units of 42/8/50.

Resins (14) to (19) were synthesized in the same manner as in Synthesis Example 2.

Synthesis Example 3

Synthesis of Resin (20) (Hybrid Type)

Norbornene, maleic anhydride, t-butyl acrylate, and 2-methylcyclohexyl-2-propyl acrylate were charged in a molar ratio of 35/35/20/10 in a reactor, and the mixture was dissolved in tetrahydrofuran to prepare a solution having a content of solids of 60%. This solution was heated at 65° C. under a nitrogen gas stream. When the reaction temperature became stable, 1% by mole of a radical initiator V-601, manufactured by Wako Pure Chemical Industries, Ltd. was added to initiate reaction. After heating for 8 hours, the reaction mixture was diluted two times with tetrahydrofuran, and the reaction mixed solution was thrown into a five-time volume of hexane to deposit a white powder. The deposited powder was taken out by filtration, dissolved in methyl ethyl ketone, and re-precipitated in a five-time volume of a hexane/t-butyl methyl ether (1/1) solution. A deposited white powder was collected by filtration and dried to obtain a desired resin (20).

The resulting resin (20) was subjected to molecular weight analysis by GPC and found to be 12,100 (weight average) as reduced into polystyrene. Also, according to the NMR spectrum, the resin (20) had a formulation having a molar ratio of norbornene/maleic anhydride/t-butyl acrylate/2-methyl cyclohexyl-2-propyl acrylate of 32/39/19/10.

Resins (21) to (25) were synthesized in the same manner as in Synthesis Example 3.

Structures and molecular weights of the resins (1) to (31) will be given below.

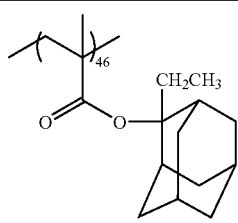

| | Molecular weight |
|---|---|
| 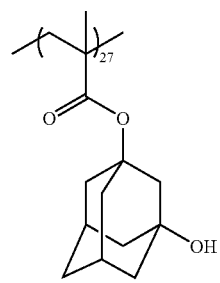 | |
| (4) 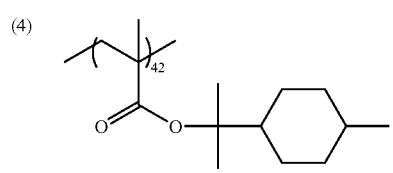 | 10300 |
| 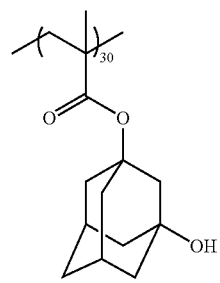 | |
| 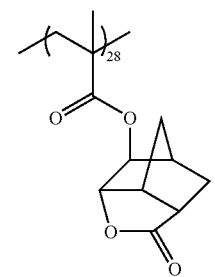 | |
| (5) 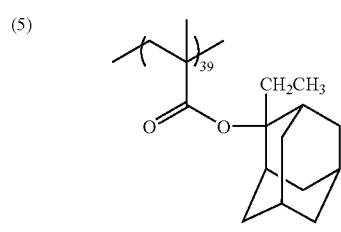 | 8900 |
| | Molecular weight |
|---|---|
| 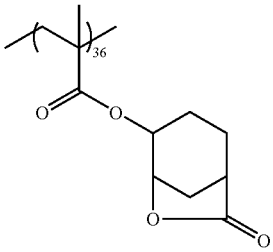 | |
| 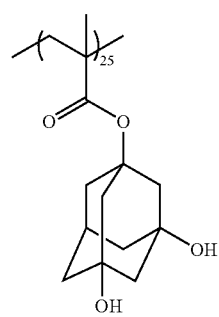 | |
| (6)  | 11300 |
| 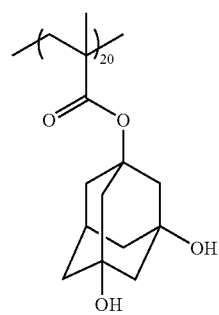 | |
| 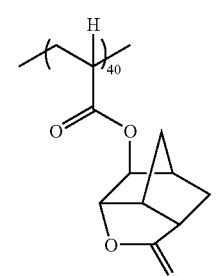 | |
| (7) 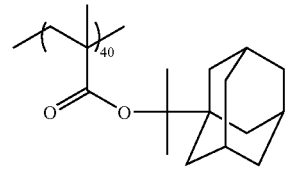 | 8900 |

-continued
| | Molecular weight |
|---|---|
| 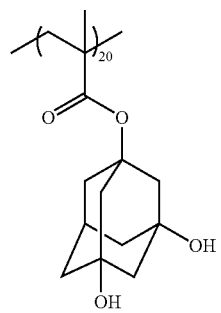 | |
| 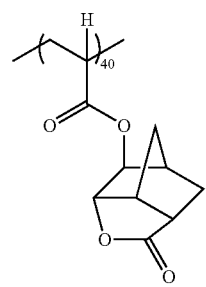 | |
| (8) 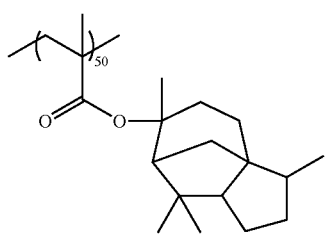 | 11700 |
| 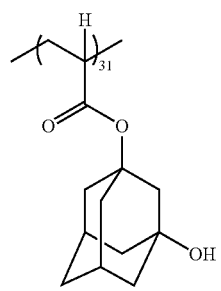 | |
| 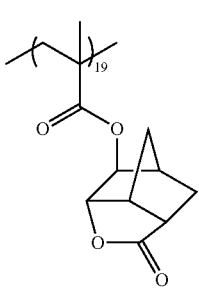 | |
-continued
| | Molecular weight |
|---|---|
| (9) 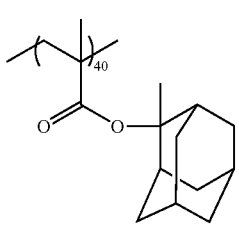 | 9800 |
| 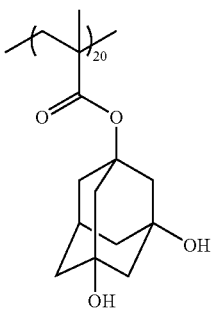 | |
| 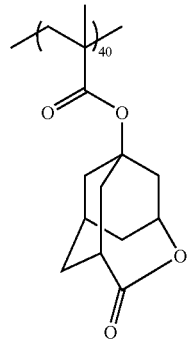 | |
| (10) 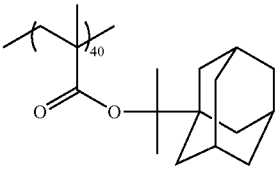 | 8700 |
| 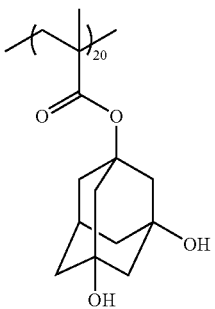 | |

-continued
| | | Molecular weight |
|---|---|---|
| | 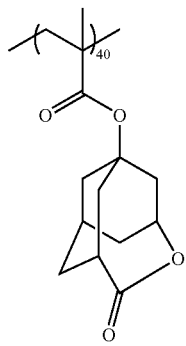 | |
| (11) | 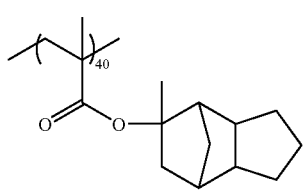 | 13400 |
| | 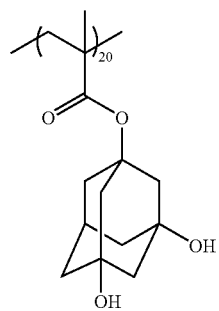 | |
| (12) | 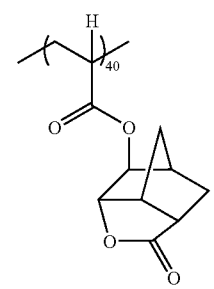 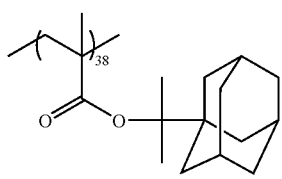 | 10900 |
-continued
| | | Molecular weight |
|---|---|---|
| | 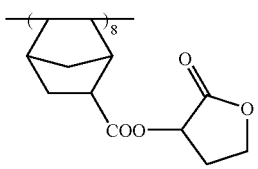 | |
| (13) | 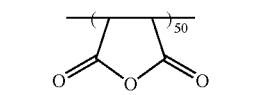 | 8300 |
| (14) | 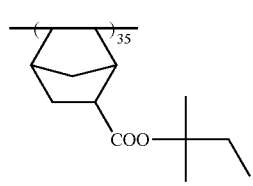 | 8200 |

| | | Molecular weight |
|---|---|---|
| (15) | 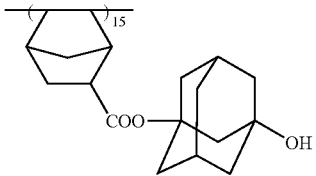 | 9600 |
| (16) | 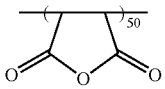 | 5800 |
| (17) | 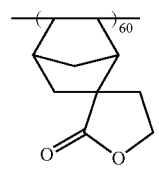 | 4700 |
| | | Molecular weight |
|---|---|---|
| (18) | 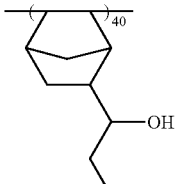 | 8500 |
| (19) | 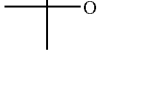 | 8900 |
| (20) | 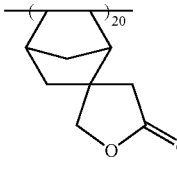 | 12100 |

-continued
| | | Molecular weight |
|---|---|---|
| (21) | 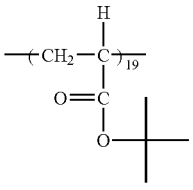 | 13900 |
| (22) | 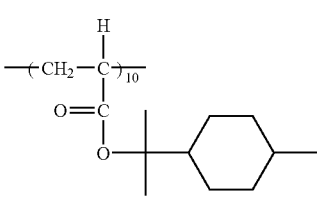 | 12400 |
-continued
| | | Molecular weight |
|---|---|---|
| (23) | 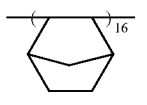 | 12700 |
| (24) | 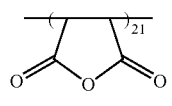 | 10800 |

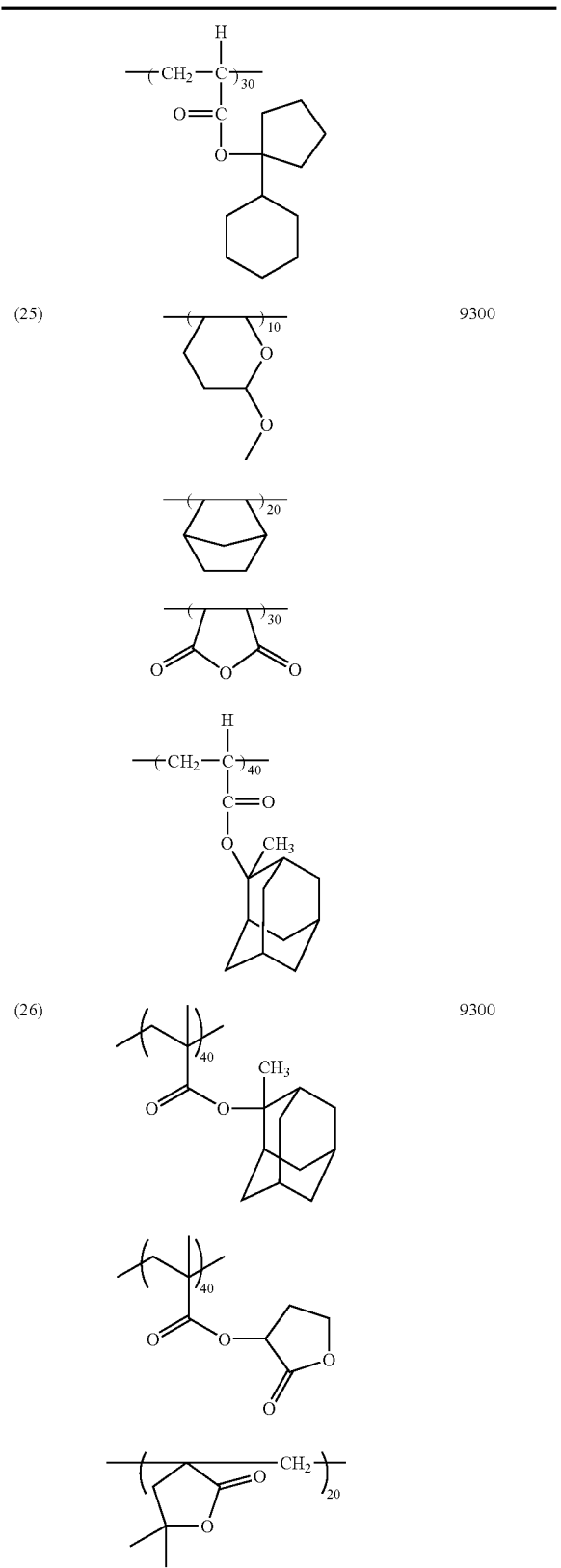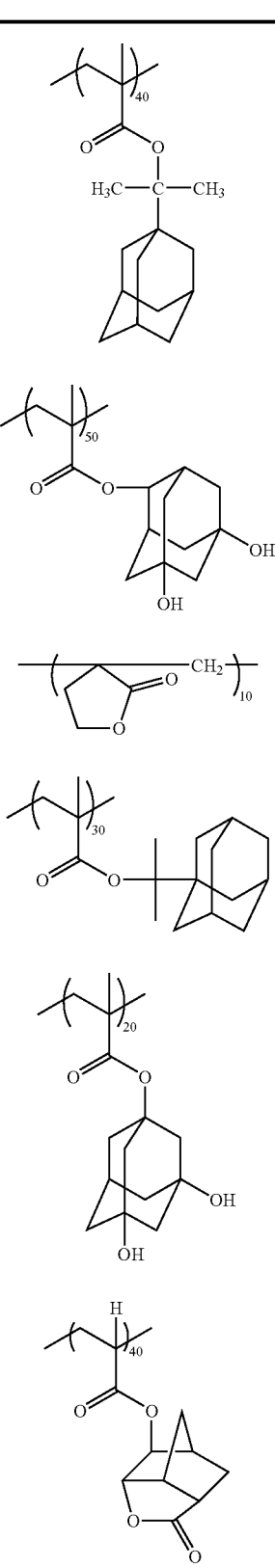

-continued

| | | Molecular weight |
|---|---|---|
| | 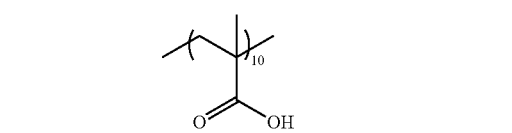 | |
| (29) | 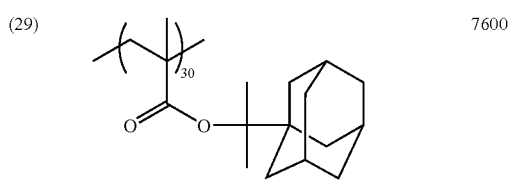 | 7600 |
| | 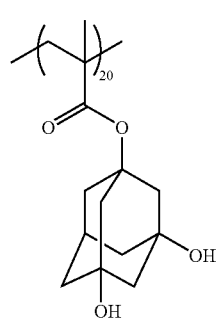 | |
| | 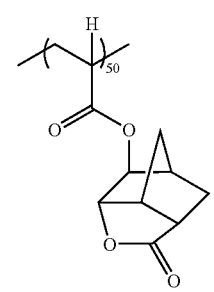 | |
| (30) | 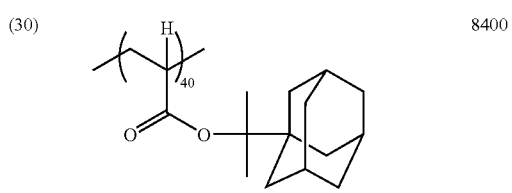 | 8400 |
| | 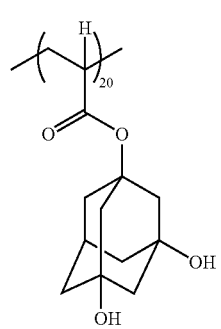 | |

-continued

| | | Molecular weight |
|---|---|---|
| | 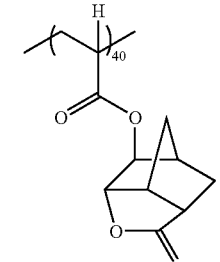 | |
| (31) | 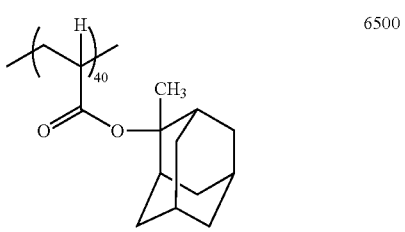 | 6500 |
| | 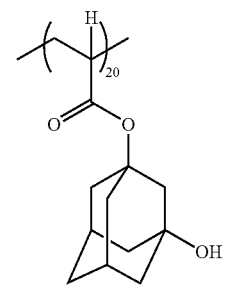 | |
| | 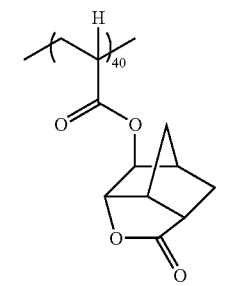 | |

Synthesis Example 4

Synthesis of Resin (RA21)

A mixture of t-butyl norbornenecarboxylate, norbornenecarboxylic acid, 2-hydroxyethyl norbornenecarboxylate, and maleic anhydride was dissolved in tetrahydrofuran to prepare a solution having a content of solids of 50% by weight. This solution was charged into a three-necked flask and heated at 60° C. under a nitrogen gas stream. When the reaction temperature became stable, 5% by mole of a radical initiator V-60, manufactured by Wako Pure Chemical Industries, Ltd. was added to initiate reaction. After heating for 6 hours, the reaction mixture was diluted two times with tetrahydrofuran, and the reaction solution was thrown into a five-time volume of hexane to deposit a white powder. The powder was again dissolved in tetrahydrofuran, and the solution was thrown into a five-time volume of hexane to deposit a white powder. The deposited powder was taken out by filtration and dried to obtain a desired resin (RA21) having the following repeating unit (formula (1) of JP-A-2000-241964).

The resulting resin (RA21) was subjected to molecular weight analysis (RI analysis) by GPC and found to be 7,900 (weight average) as reduced into polystyrene.

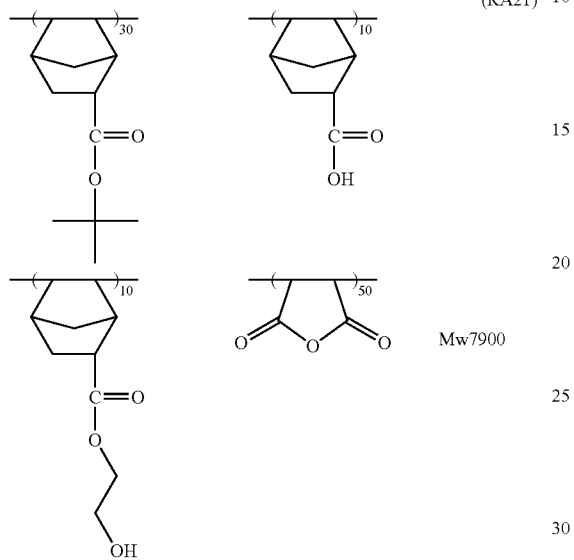
(RA21)
Mw 7900

The following resins (RA1) to (RA20) were obtained in the same manner.

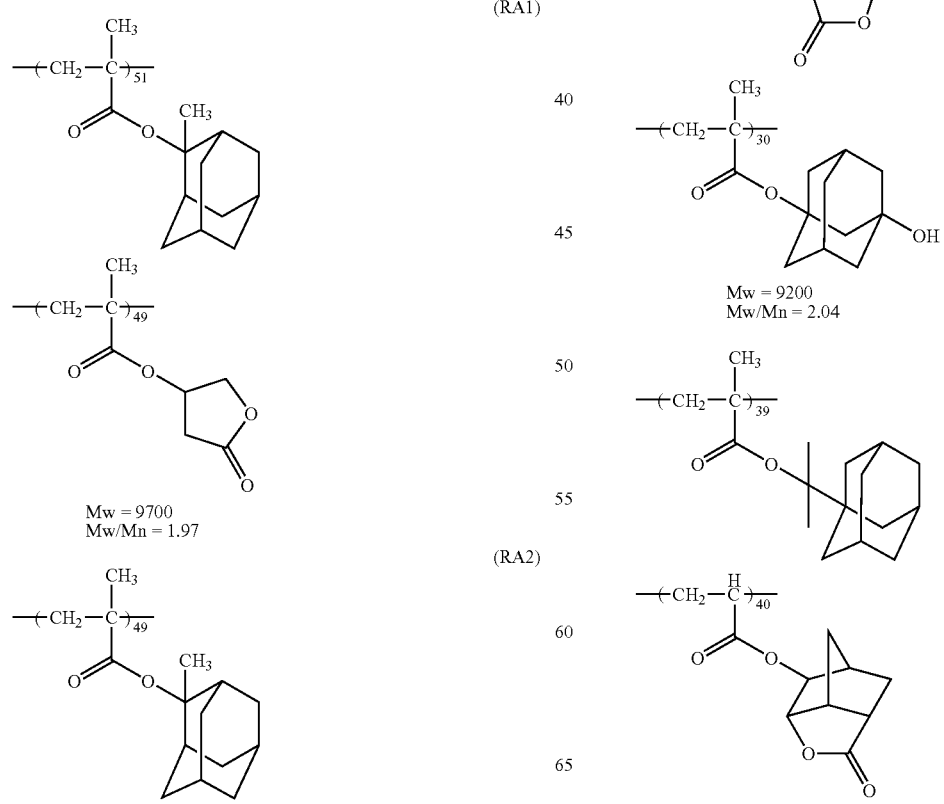

(RA1)
Mw = 9700
Mw/Mn = 1.97

(RA2)

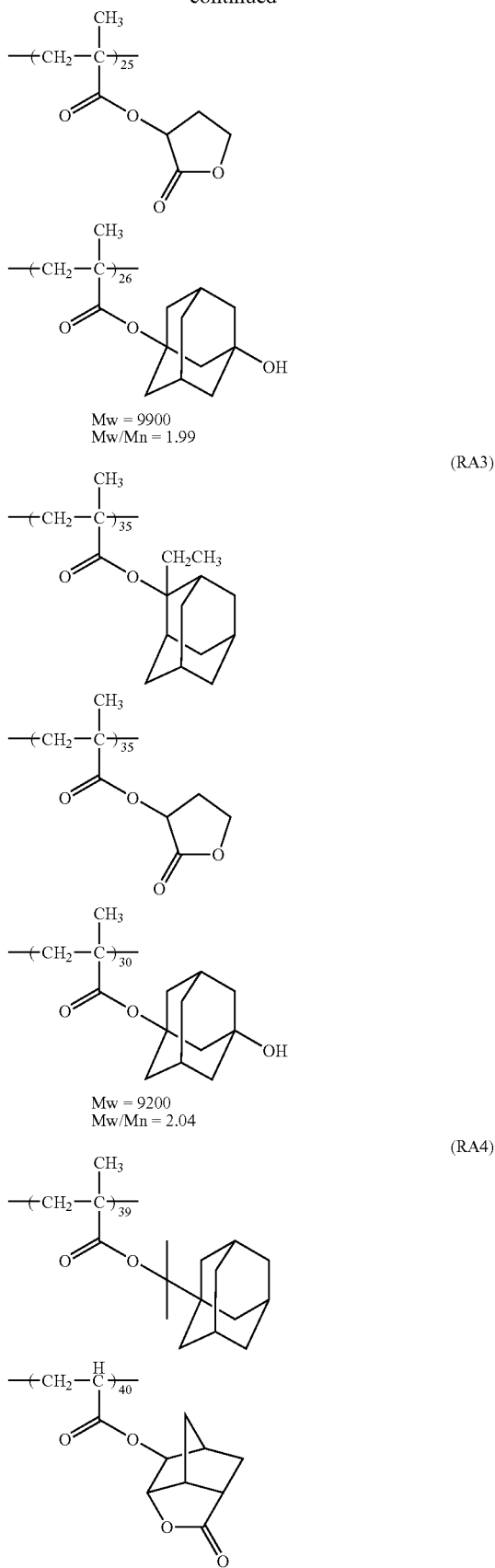

Mw = 9900
Mw/Mn = 1.99

(RA3)

Mw = 9200
Mw/Mn = 2.04

(RA4)

-continued
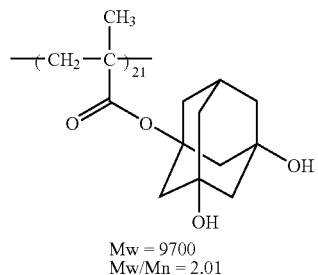
Mw = 9700
Mw/Mn = 2.01
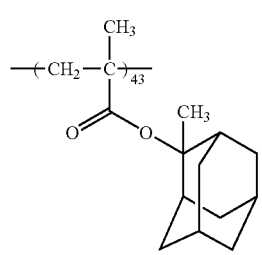
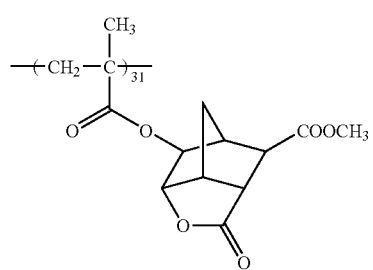
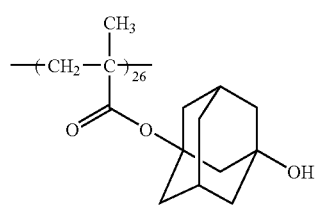
Mw = 8200
Mw/Mn = 1.91
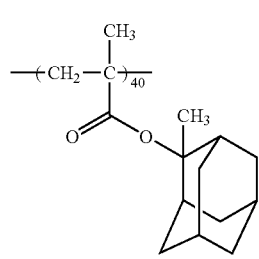
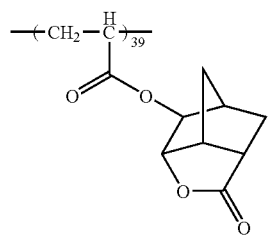
-continued
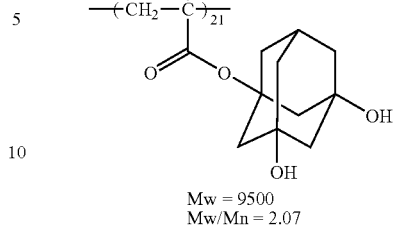
Mw = 9500
Mw/Mn = 2.07
(RA5)
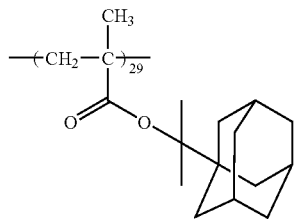
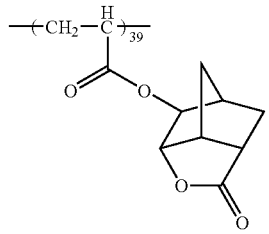
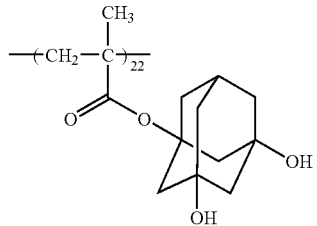
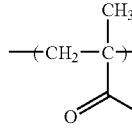
Mw = 8700
Mw/Mn = 1.98
(RA6)
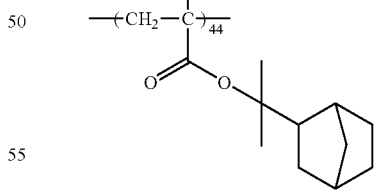
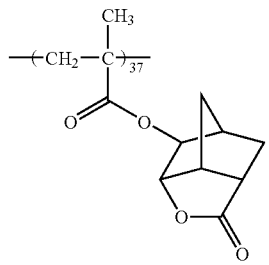
(RA7)
(RA8)

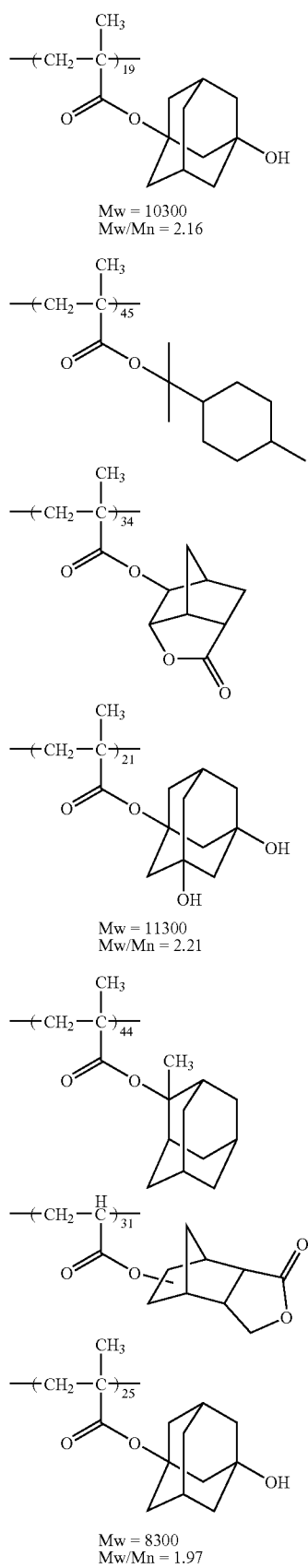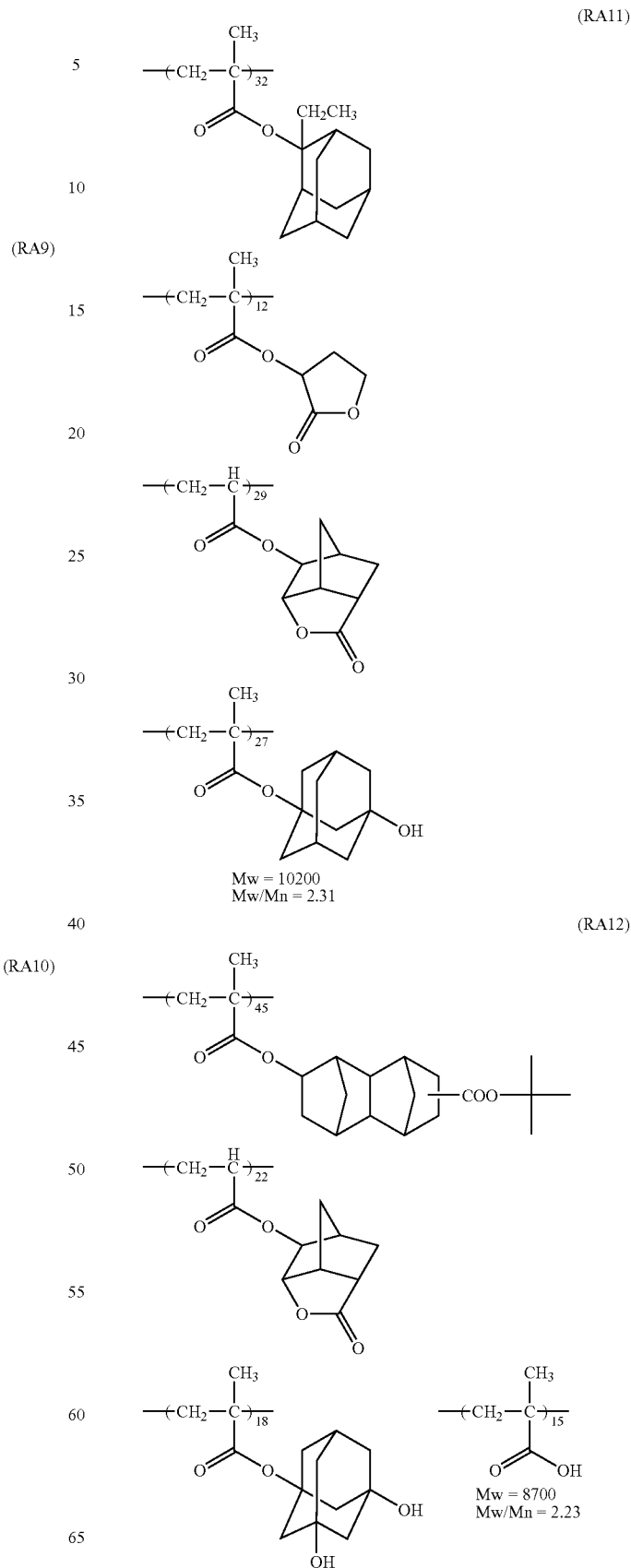

-continued
(RA13)
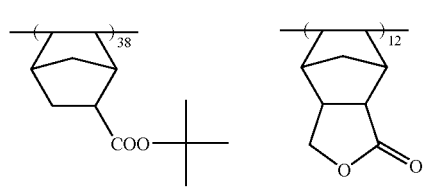
Mw = 7100
Mw/Mn = 2.42
(RA14)
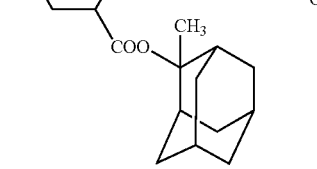
Mw = 8900
Mw/Mn = 2.19
(RA15)
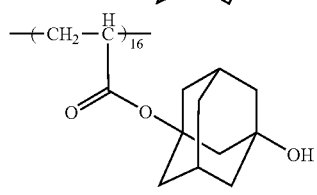
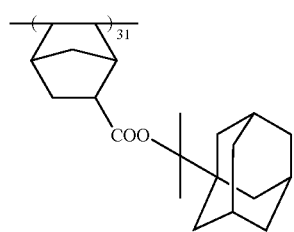
Mw = 11100
Mw/Mn = 2.37
(RA16)
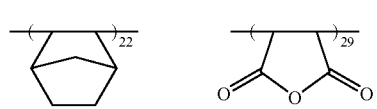
-continued
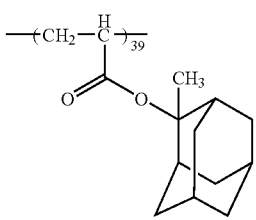
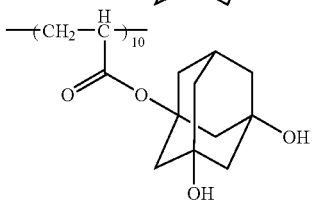
Mw = 10400
Mw/Mn = 2.51
(RA17)
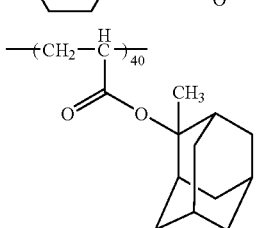
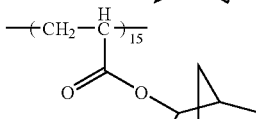
Mw = 10200
Mw/Mn = 2.51
(RA18)
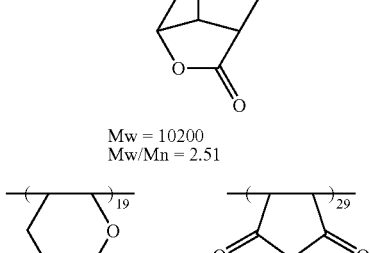
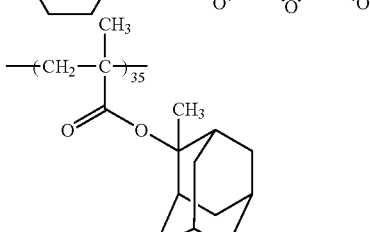
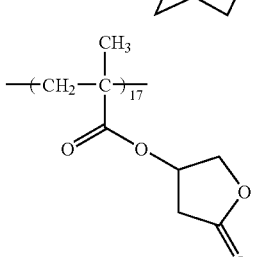
Mw = 7900
Mw/Mn = 2.33

-continued

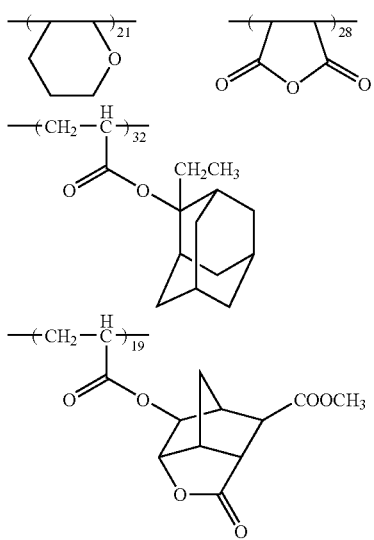
(RA19)

Mw = 9300
Mw/Mn = 2.26

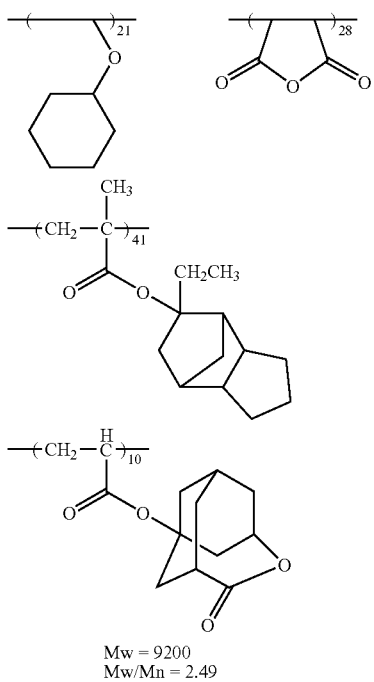
(RA20)

Mw = 9200
Mw/Mn = 2.49

Synthesis Example 5

Synthesis of Resin (RB1)

2-Methyl-2-adamantyl methacrylate, β-hydroxy-γ-butyro lactone methacrylate, and 3-hydroxy-1-adamantyl methacrylate were charged in a proportion of 50/25/25, and the mixture was dissolved in propylene glycol monomethyl ether acetate/propylene glycol monomethyl ether (70/30) (weight ratio) to prepare 450 g of a solution having a concentration of solids of 22% by weight. 1.5% by mole of a polymerization initiator V-601, manufactured by Wako Pure Chemical Industries, Ltd. was added to this solution, and the mixture was dropped in 50 g of a mixed solution of propylene glycol monomethyl ether acetate/propylene glycol monomethyl ether (70/30) (weight ratio) heated at 100° C. over 6 hours in a nitrogen atmosphere. After completion of dropping, the reaction solution was stirred for 2 hours. After completion of the reaction, the reaction solution was cooled to room temperature and crystallized from 5 L of a mixed solvent of hexane/ethyl acetate (9/1) (weight ratio). A deposited white powder was collected by filtration to recover a desired resin (RB1).

The polymer formulation ratio (2-methyl-2-adamantyl methacrylate/β-hydroxy-γ-butyrolactone methacrylate/3-hydroxy-1-adamantyl methacrylate) determined by the $^{13}$C-NMR and the weight average molecular weight and degree of dispersion (Mw/Mn) as reduced into standard polystyrene by the GPC measurement were as follows.

Alicyclic hydrocarbon based acid decomposable resins (RB2) to (RB14) were synthesized in the same manner.

Structures, weight average molecular weights, and degrees of dispersion of the alicyclic hydrocarbon based acid decomposable resins (RB1) to (RB14) will be given below.

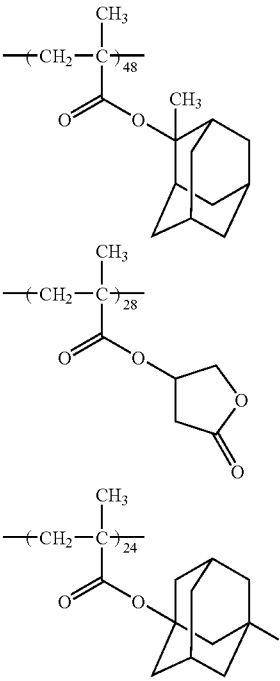
(RB1)

Mw = 9700
Mw/Mn = 2.03

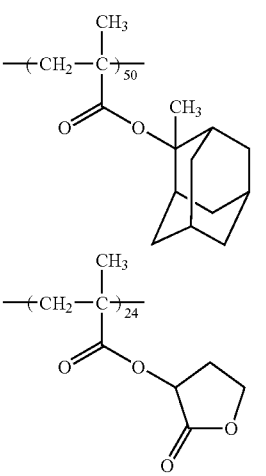
(RB2)

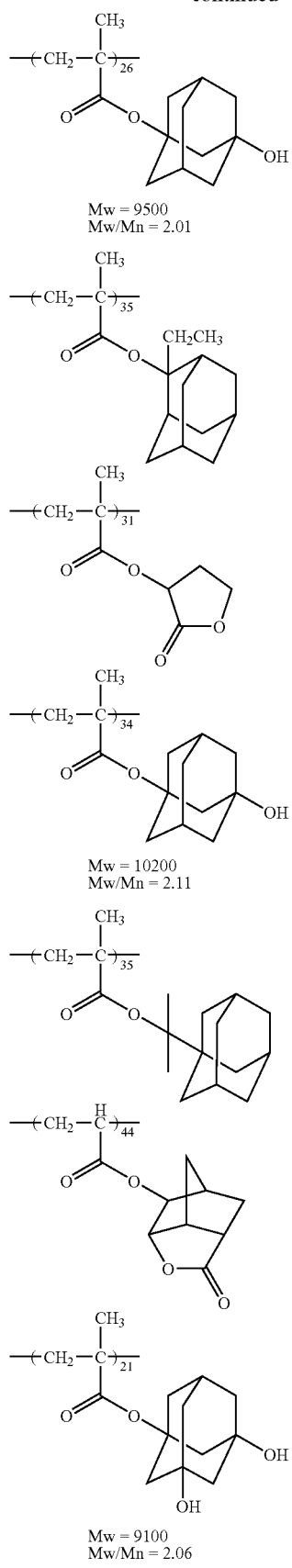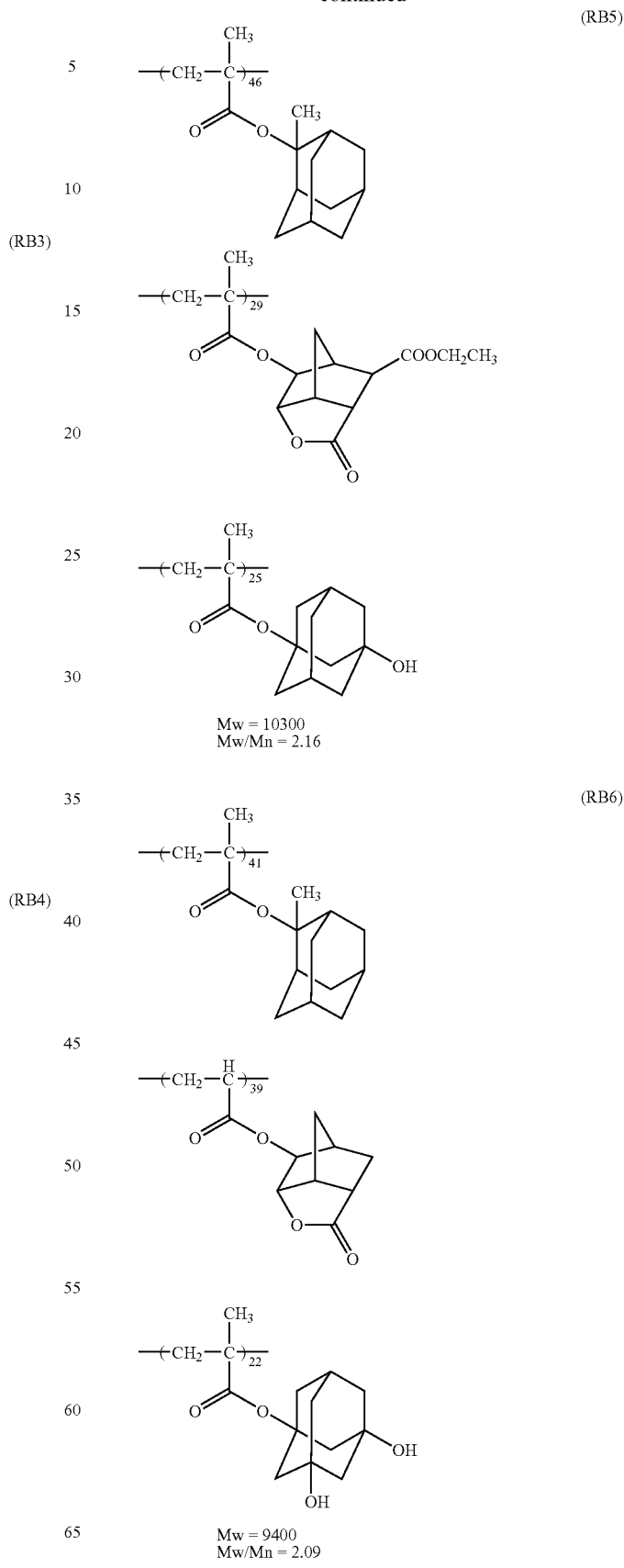

-continued
(RB7)
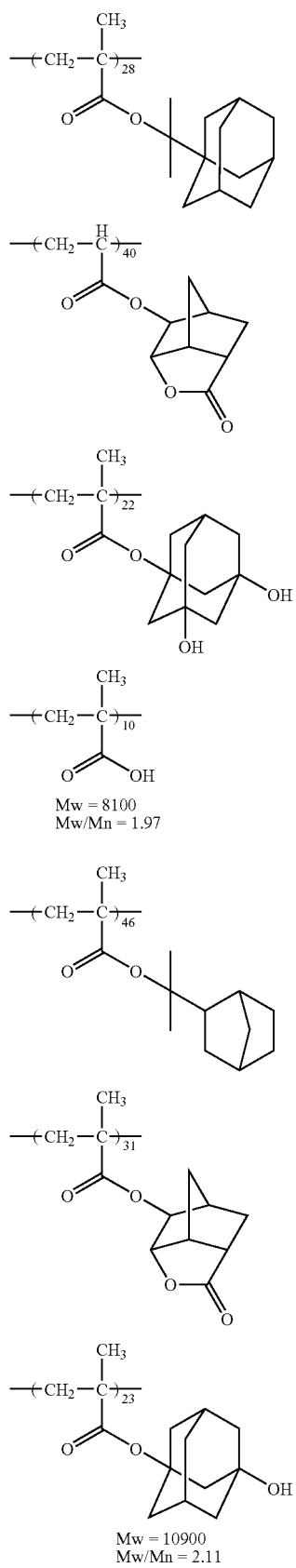
Mw = 8100
Mw/Mn = 1.97
Mw = 10900
Mw/Mn = 2.11
-continued
(RB9)
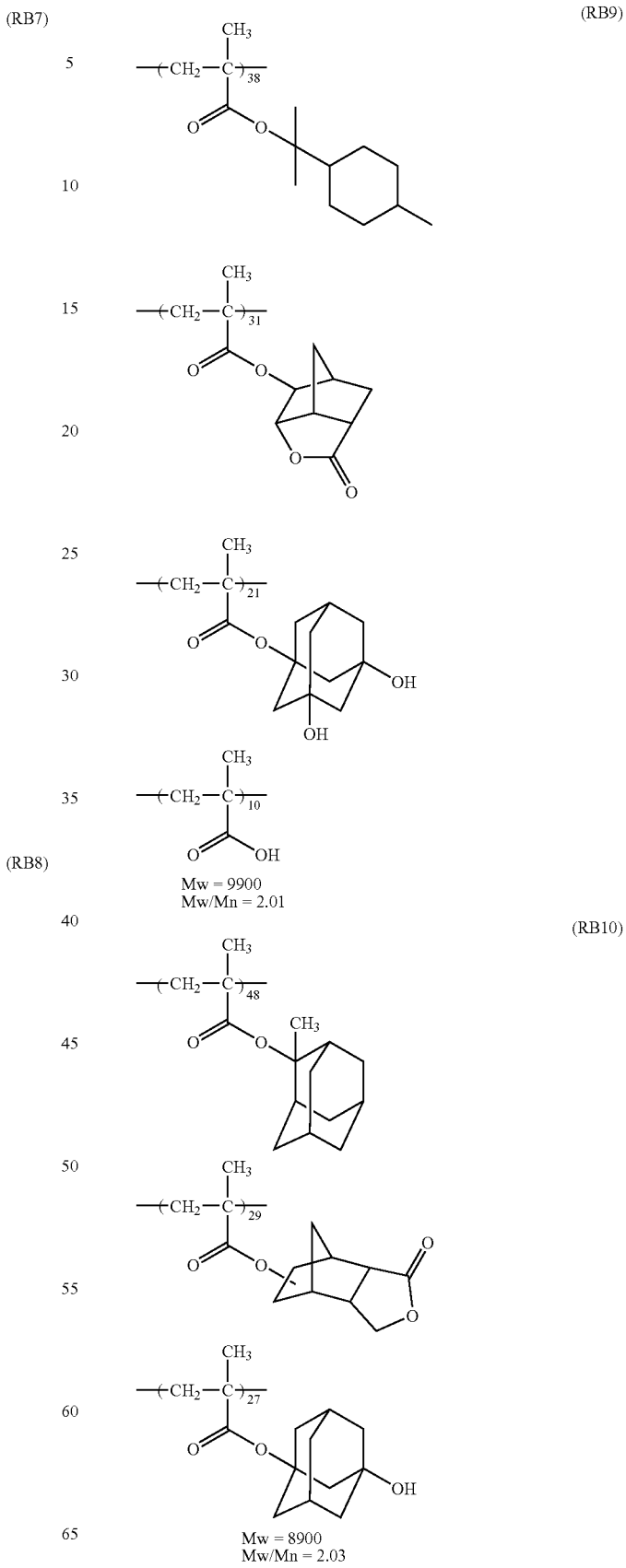
(RB8)
Mw = 9900
Mw/Mn = 2.01
(RB10)
Mw = 8900
Mw/Mn = 2.03

-continued
(RB11)
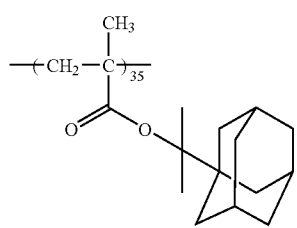
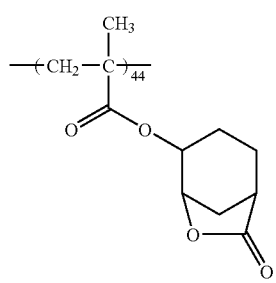
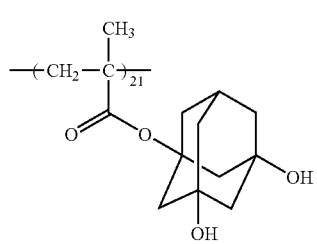
Mw = 9500
Mw/Mn = 2.02
(RB12)
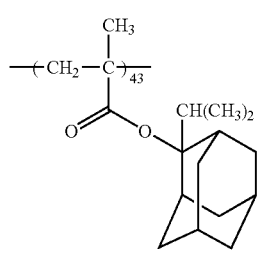
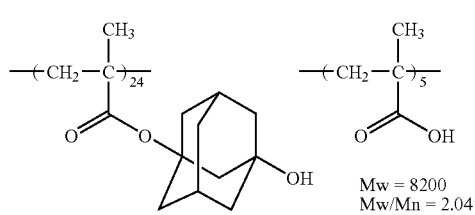
Mw = 8200
Mw/Mn = 2.04
-continued
(RB13)
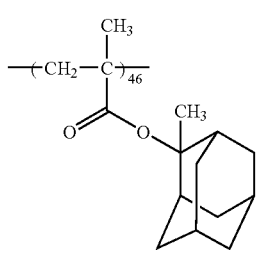
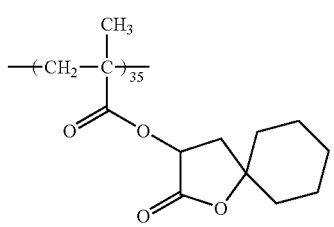
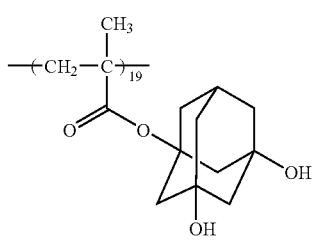
Mw = 9300
Mw/Mn = 1.97
(RB14)
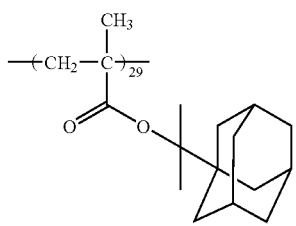
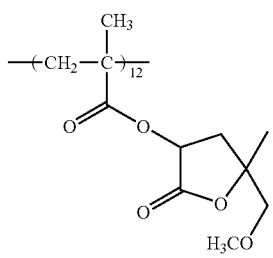
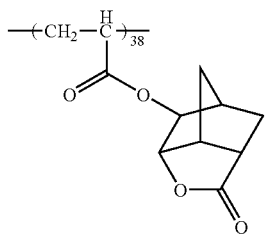

-continued

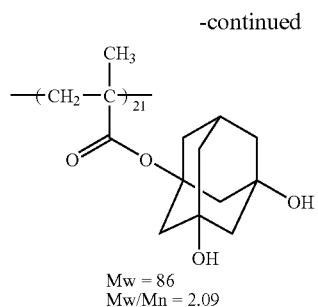

Mw = 86
Mw/Mn = 2.09

Also, Resin A4 of Synthesis Example 10 of JP-A-10-274852, Resin H of Synthesis Example 8 of JP-A-2000-137327, and Resin (1) of Synthesis Example (1) of JP-A-2001-109154 were synthesized and designated as resins R1, R2 and R3, respectively.

Structures of repeating units of these reins will be given below. The weight average molecular weight was 8,000 for R1, 14,000 for R2, and 7,200 for R3, respectively.

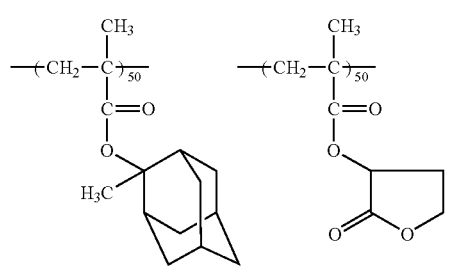
(R1)

-continued

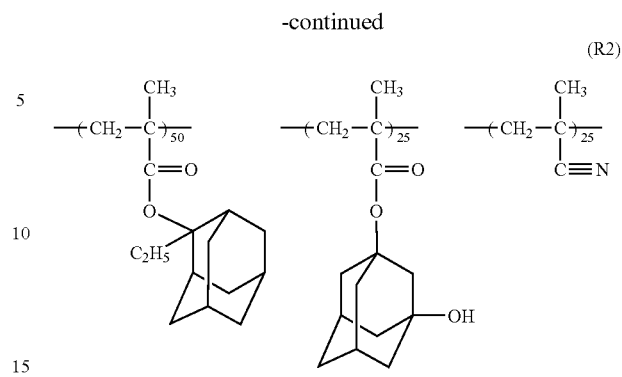

<Fluorine Group-containing Resin>

Structures of fluorine group-containing resins (FII-1) to (FII-40) to be used in the Examples will be given below.

Also, the following Tables 1 and 2 show weight average molecular weights of the fluorine group-containing resins (FII-1) to (FII-40).

TABLE 1

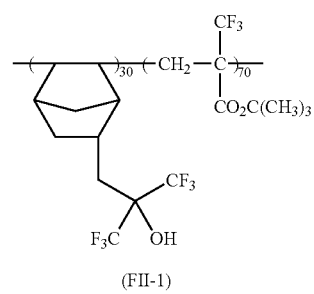

(FII-1)

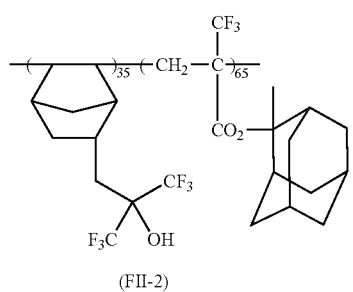

(FII-2)

TABLE 1-continued
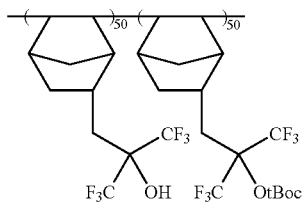
(FII-3)
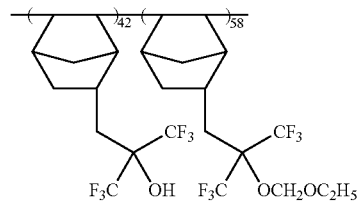
(FII-4)
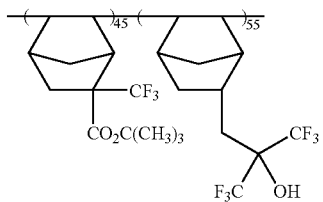
(FII-5)
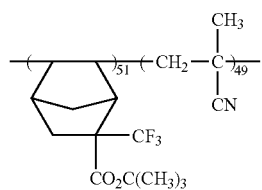
(FII-6)
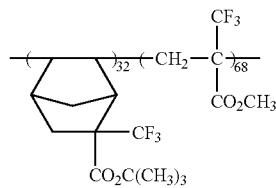
(FII-7)
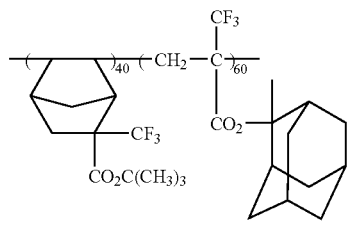
(FII-8)

TABLE 1-continued
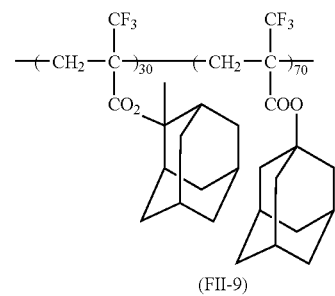
(FII-9)
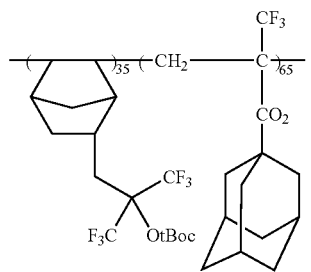
(FII-10)
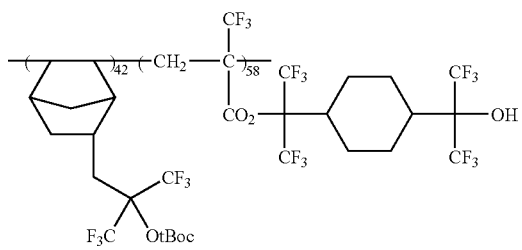
(FII-11)
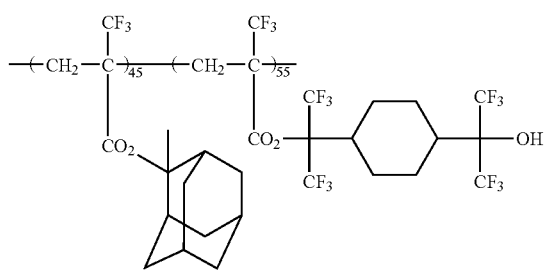
(FII-12)
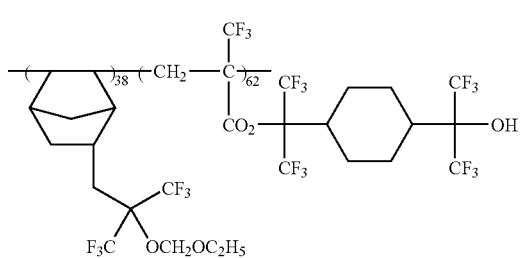
(FII-13)

TABLE 1-continued
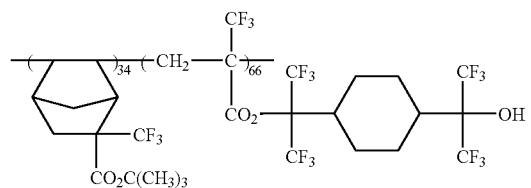
(FII-14)
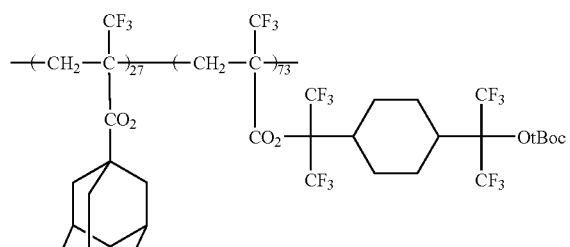
(FII-15)
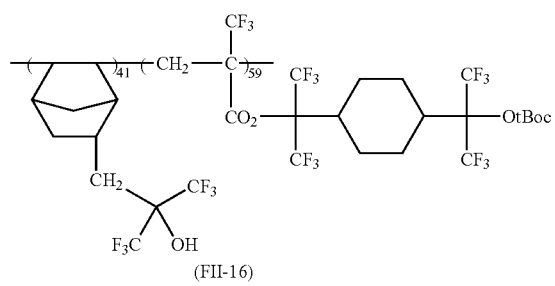
(FII-16)
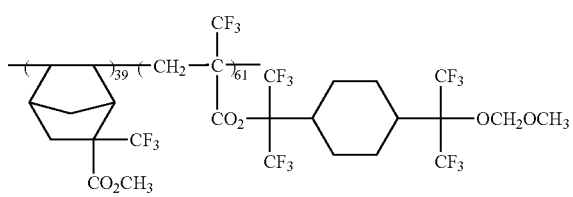
(FII-17)
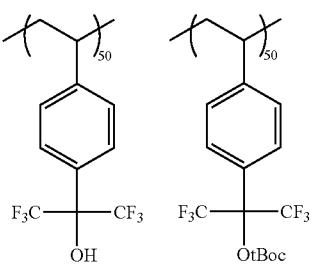
(FII-18)

TABLE 1-continued
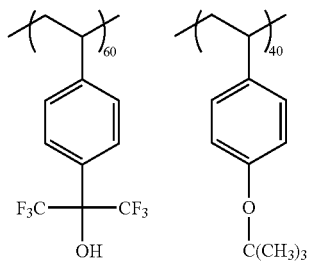
(FII-19)
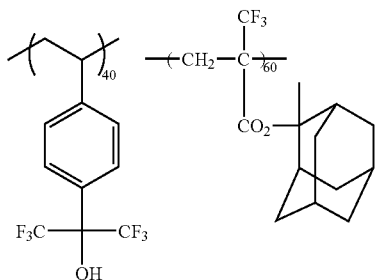
(FII-20)
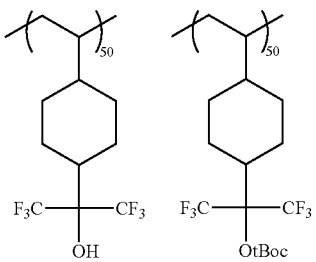
(FII-21)
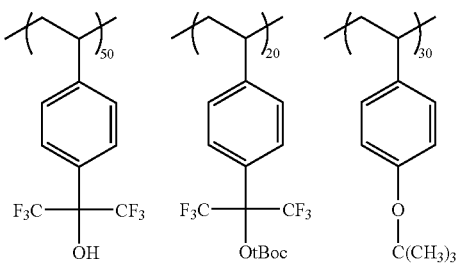
(FII-22)
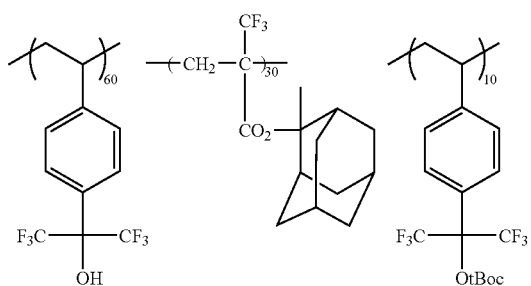
(FII-23)

TABLE 1-continued
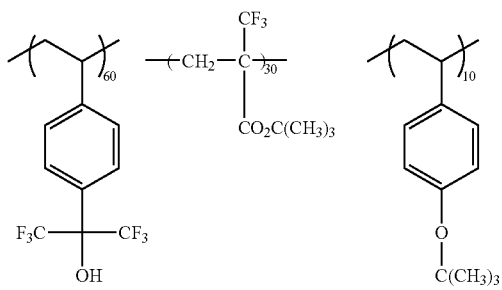
(FII-24)
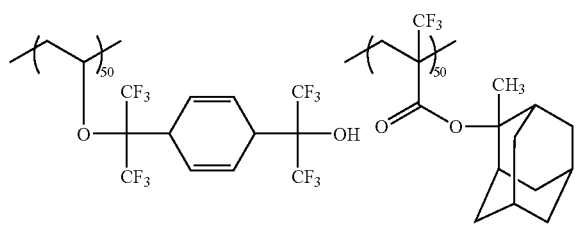
(FII-25)
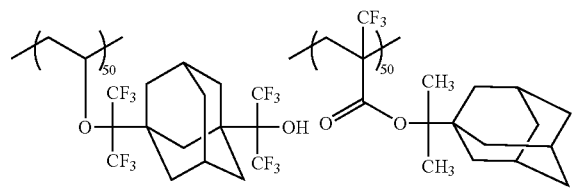
(FII-26)
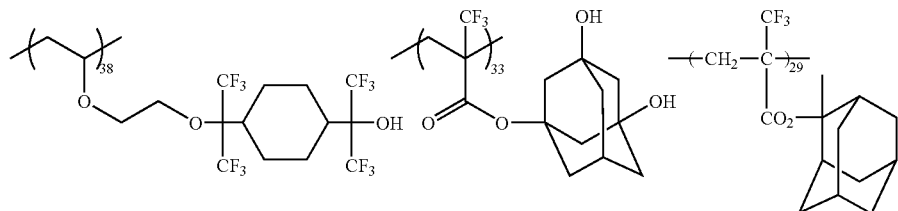
(FII-27)
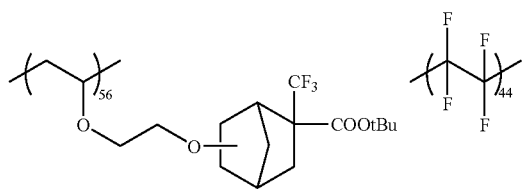
(FII-28)
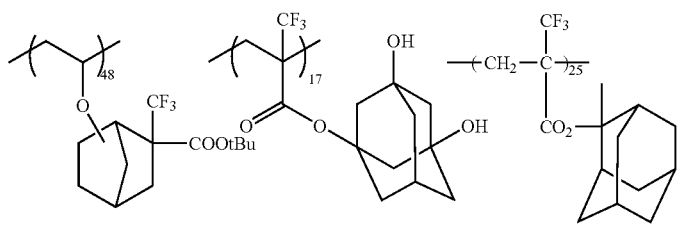
(FII-29)

TABLE 1-continued
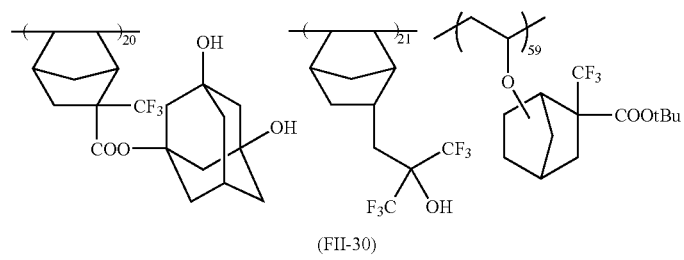
(FII-30)
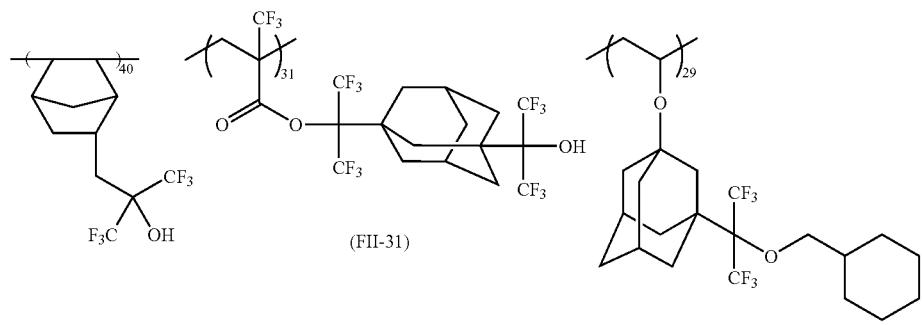
(FII-31)
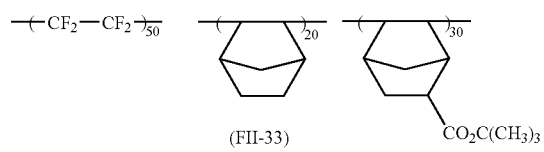
(FII-32)
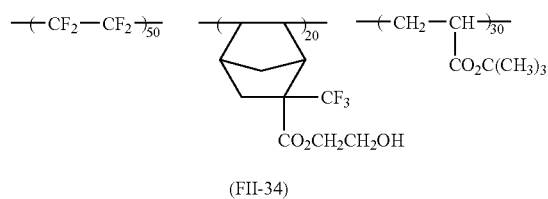
(FII-33)
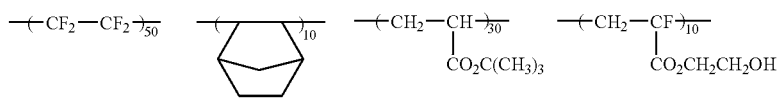
(FII-34)
(FII-35)

TABLE 1-continued
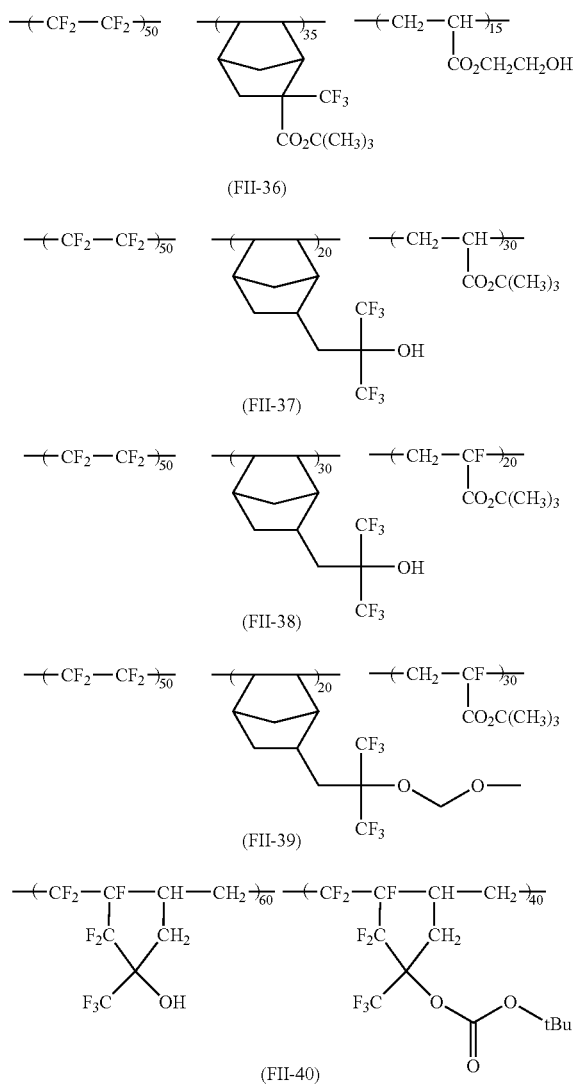
| Resin | Weight average molecular weight Mw | Degree of dispersion | Content of oligomer having a molecular weight of not more than 1,000 |
|---|---|---|---|
| (FII-1) | 15200 | 1.45 | 5 |
| (FII-2) | 24000 | 1.75 | 8 |
| (FII-3) | 18200 | 1.85 | 7 |
| (FII-4) | 16500 | 1.46 | 6 |
| (FII-5) | 9500 | 1.58 | 8 |
| (FII-6) | 19500 | 2.02 | 8 |
| (FII-7) | 6500 | 1.85 | 7 |
| (FII-8) | 28400 | 1.68 | 9 |
| (FII-9) | 28600 | 1.44 | 5 |
| (FII-10) | 12800 | 1.65 | 8 |
| (FII-11) | 16800 | 1.68 | 9 |
| (FII-12) | 28400 | 1.58 | 6 |
| (FII-13) | 19800 | 1.69 | 8 |
| (FII-14) | 8700 | 1.95 | 8 |
| (FII-15) | 15200 | 1.46 | 7 |
| (FII-16) | 19500 | 1.65 | 4 |
| (FII-17) | 16900 | 1.42 | 8 |
| (FII-18) | 15900 | 1.85 | 9 |
| (FII-19) | 15000 | 1.55 | 4 |
| (FII-20) | 12500 | 1.88 | 8 |
| (FII-21) | 25000 | 1.68 | 9 |
| (FII-22) | 16000 | 1.54 | 7 |
| (FII-23) | 14600 | 1.95 | 5 |

TABLE 1-continued

| | | | |
|---|---|---|---|
| (FII-24) | 17500 | 1.48 | 5 |
| (FII-25) | 16500 | 1.52 | 6 |
| (FII-26) | 14600 | 1.63 | 5 |

TABLE 2

| Resin | Weight average molecular weight Mw | Degree of dispersion |
|---|---|---|
| (FII-27) | 8300 | 1.55 |
| (FII-28) | 8300 | 1.62 |
| (FII-29) | 8000 | 1.52 |
| (FII-30) | 9200 | 1.71 |
| (FII-31) | 10200 | 1.47 |
| (FII-32) | 7900 | 1.35 |
| (FII-33) | 6800 | 1.60 |
| (FII-34) | 7400 | 1.59 |
| (FII-35) | 8300 | 1.70 |
| (FII-36) | 4800 | 1.55 |
| (FII-37) | 4700 | 1.51 |
| (FII-38) | 6400 | 1.69 |
| (FII-39) | 9600 | 1.70 |
| (FII-40) | 4600 | 1.68 |

Examples 1 to 25 and Comparative Examples 1 and 2

<Preparation of Resist>

Components shown in the following Tables 3 to 5 were dissolved in a solvent to prepare solutions each having a concentration of solids of 12% by weight. Each solution was filtered by a 0.1 μm polytetrafluoroethylene filter or polyethylene filter to prepare a positive working resin solution. The prepared positive resist solutions were evaluated according to the following methods. The results are shown in Tables 3 to 5.

Abbreviations in Tables 3 to 8 and Tables 10 to 13 are as follows. Resins and acid generating agents other than those described below are those enumerated previously. Also, in the respective tables, in the case where the plural number of resins or solvents are used, the given ratios are a weight ratio.

[Acid Generating Agent]

The compound (A) of the invention and the associative acid generating agent are those enumerated previously.

However, PGA-A is a compound described below.

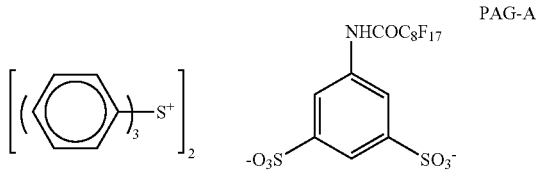

PAG-A

[Basic Compound]
DBN: 1,5-Diazabicyclo[4,3,0]nona-5-ene
TPI: 2,4,5-Triphenylimidazole
TPSA: Triphenylsulfonium acetate
HEP: N-Hydroxyethylpiperidine
DIA: 2,6-Diisopropylaniline
DCMA: Dicyclohexylmethylamine
TPA: Tripentylamine
TOA: Tri-n-octylamine
HAP: Hydroxyantipyrine
TBAH: Tetrabutylammonium hydroxide
TMEA: Tris(methoxyethoxyethyl)amine
PEA: N-Phenyldiethanolamine

[Surfactant]
W-1: Megaface F176 (manufactured by Dainippon Ink and Chemicals, Incorporated) (fluorine based)
W-2: Megaface $R_{08}$ (manufactured by Dainippon Ink and Chemicals, Incorporated) (fluorine and silicon based)
W-3: Polysiloxane polymer KP-341 (manufactured by Shin-Etsu Chemical Co., Ltd.) (silicon based)
W-4: Troysol S-366 (manufactured by Troy Chemical Industries, Inc.)

[Solvent]
A1: Propylene glycol methyl ether acetate
A2: 2-Heptanone
A3: Ethyl ethoxypropionate
A4: γ-Butyrolactone
A5: Cyclohexanone
B1: Propylene glycol methyl ether
B2: Ethyl lactate

[Dissolution Inhibitor]
LCB: t-Butyl lithocholate

<Evaluation of Resist>

An anti-refractive film DUV-42, manufactured by Brewer Science Limited was uniformly coated in a thickness of 600 angstrom on a hexamethyldisilazane-treated silicon substrate using a spin coater, dried on a hot plate at 100° C. for 90 seconds, and then dried by heating at 190° C. for 240 seconds. Thereafter, each of the positive working resist solutions was coated using a spin coater and dried at 120° C. for 90 seconds to form a 0.30 μm-thick resist film.

This resist film was exposed with an ArF excimer laser stepper (manufactured by ISI, NA=0.6) through a mask, and immediately after the exposure, heated on a hot plate at 120° C. for 90 seconds. Further, the resulting resist film was developed with a 2.38% by weight tetramethylammonium hydroxide aqueous solution at 23° C. for 60 seconds, rinsed with pure water for 30 seconds, and then dried to obtain a line pattern.

(Density Dependency)

In a line-and-space pattern with a line width of 0.13 μm (dense pattern: line-and-space=1/1) and an isolated line pattern (coarse pattern: line-and-space=1/5), an overlapping range of the depth of focus allowing (0.13 μm±10%) therebetween was determined. The larger the value, the smaller the performance difference between the dense pattern and the coarse pattern is, i.e., the density dependency is good.

(Exposure Latitude)

The exposure amount of reproducing a mask pattern of line-and-space with a line width of 0.13 μm was defined as an optimum exposure amount. When the exposure amount was changed, a width of the exposure amount allowing (0.13 μm±10%) of the pattern size was determined. This value was divided by the optimum exposure amount and expressed in terms of percentage. The larger the value, the smaller the performance change by the change of the exposure amount is, i.e., the exposure latitude is good.

TABLE 3

| | Formulation | | | | | | | Evaluation | |
|---|---|---|---|---|---|---|---|---|---|
| | Acid generating agent (g) | Associative acid generating agent (g) | Resin | Basic compound (g) | Surfactant (0.03 g) | Solvent (weight ratio) | Component (C) (g) | Density dependency (μm) | Exposure latitude (%) |
| Example 1 | I-1 (0.3) | — | (1) 10 g | DBN (002) | W-1 | A1/B1 (60/40) | — | 0.35 | 13.3 |
| Example 2 | I-2 (0.5) | — | (2) 10 g | TMEA (0.02) | W-1 | A1/B1 (60/40) | — | 0.35 | 13.7 |
| Example 3 | I-3 (0.4) | — | (3) 10 g | TPSA (0.02) | W-2 | A1/B1 (60/40) | — | 0.35 | 13.1 |
| Example 4 | I-4 (0.2) | z38 (0.15) z50 (0.2) | (4) 10 g | HEP (0.01) | W-2 | A3/B1 (80/20) | — | 0.40 | 14.4 |
| Example 5 | I-5 (0.5) | z27 (0.2) | (5) 10 g | TOA (0.03) | W-3 | A2/B1 (90/10) | — | 0.40 | 14.2 |
| Example 6 | I-6 (0.4) | z35 (0.2) | (6) 10 g | TBAH (0.01) | W-3 | A4/B1 (90/10) | LCB (1) | 0.40 | 14.7 |
| Example 7 | I-1 (0.4) | — | (7) 10 g | TPA (0.007) | W-4 | A1/B1 (50/50) | — | 0.40 | 14.1 |
| Example 8 | I-10 (0.4) | z18 (0.15) z49 (0.2) | (8) 10 g | DBN (0.02) | W-4 | A1/B1 (90/10) | — | 0.40 | 14.9 |
| Example 9 | I-7 (0.5) | z34 (0.1) z52 (0.2) | (9) 10 g | TPI (0.03) | W-1 | A5/B2 (90/10) | — | 0.40 | 14.3 |
| Example 10 | I-8 (0.4) | z3 (0.2) | (10) 5 g (13) 5 g | TPI (0.02) | W-1 | A1/B1 (95/5) | — | 0.35 | 13.4 |

TABLE 4

| | Formulation | | | | | | | Evaluation | |
|---|---|---|---|---|---|---|---|---|---|
| | Acid generating agent (g) | Associative acid generating agent (g) | Resin | Basic compound (g) | Surfactant (0.03 g) | Solvent (weight ratio) | Component (C) (g) | Density dependency (μm) | Exposure latitude (%) |
| Example 11 | I-11 (0.6) | z18 (0.1) z32 (0.2) | (11) 5 g (14) 5 g | DIA (0.02) | W-2 | A1/B1 (90/10) | — | 0.40 | 14.5 |
| Example 12 | I-13 (0.6) | z38 (0.15) | (12) 6 g (15) 4 g | DIA (0.01) HAP (0.01) | W-2 | A1/B1 (95/5) | — | 0.40 | 14.6 |
| Example 13 | I-12 (0.2) | z14 (0.15) z51 (0.2) | (16) 10 g | TPI (0.03) | W-3 | A1/B1 (95/5) | — | 0.325 | 12.7 |
| Example 14 | I-16 (0.5) | z38 (0.2) z54 (0.1) | (17) 10 g | DBN (0.02) | W-3 | A1/B1 (95/5) | — | 0.30 | 11.2 |
| Example 15 | I-18 (0.2) | z2 (0.1) z31 (0.1) | (18) 3 g (31) 7 g | DIA (0.02) | W-4 | A1/B1 (80/20) | — | 0.40 | 14.6 |
| Example 16 | I-14 (0.2) | z6 (0.1) z22 (0.1) | (19) 10 g | TPA (0.01) | W-4 | A1/B1 (60/40) | — | 0.30 | 11.6 |
| Example 17 | I-15 (0.6) | — | (20) 10 g | TPA (0.03) | W-4 | A1/B1 (60/40) | — | 0.30 | 11.3 |
| Example 18 | I-17 (0.2) | z44 (0.4) | (21) 10 g | DCMA (0.01) | W-4 | A1/B1 (60/40) | — | 0.325 | 12.7 |
| Example 19 | I-20 (0.2) | z38 (0.15) z40 (0.2) | (22) 10 g | TPI (0.02) | W-4 | A1/B1 (95/5) | — | 0.325 | 12.1 |
| Example 20 | I-23 (0.1) | z40 (0.3) z42 (0.1) | (26) 5 g (23) 5 g | TPI (0.03) | W-4 | A1/B1 (95/5) | — | 0.35 | 13.5 |

TABLE 5

| | Formulation | | | | | | | Evaluation | |
|---|---|---|---|---|---|---|---|---|---|
| | Acid generating agent (g) | Associative acid generating agent (g) | Resin | Basic compound (g) | Surfactant (0.03 g) | Solvent (weight ratio) | Component (C) (g) | Density dependency (μm) | Exposure latitude (%) |
| Example 21 | I-28 (0.1) | z38 (0.2) | (27) 5 g (24) 5 g | DBN (0.02) | W-1 | A1/B1 (95/5) | — | 0.35 | 13.4 |
| Example 22 | I-25 (0.2) | z44 (0.5) | (28) 5 g (25) 5 g | DIA (0.01) HAP (0.01) | W-1 | A1/B1 (80/20) | — | 0.40 | 14.2 |

TABLE 5-continued

| | Formulation | | | | | | | Evaluation | |
|---|---|---|---|---|---|---|---|---|---|
| | Acid generating agent (g) | Associative acid generating agent (g) | Resin | Basic compound (g) | Surfactant (0.03 g) | Solvent (weight ratio) | Component (C) (g) | Density dependency (μm) | Exposure latitude (%) |
| Example 23 | I-1 (0.2) | z2 (0.1) | (29) 10 g | TPSA (0.02) | W-2 | A1/B1 (90/10) | — | 0.40 | 14.6 |
| Example 24 | I-4 (0.2) | z42 (0.5) | (30) 10 g | HEP (0.01) | W-2 | A3/B2 (80/20) | — | 0.40 | 14.8 |
| Example 25 | I-17 (0.4) | z40 (0.2) | (31) 10 g | DIA (0.02) | W-3 | A2/B1 (90/10) | — | 0.40 | 14.9 |
| Comparative Example 1 | z2 (0.3) | — | (1) 10 g | DBN (0.02) | W-1 | A1/B1 (60/40) | — | 0.20 | 7.3 |
| Comparative Example 2 | PAG-A (0.3) | — | (1) 10 g | DBN (0.02) | W-1 | A1/B1 (60/40) | — | No image was formed. | No image was formed. |

From the results shown in Tables 3 to 5, it is clear that in the ArF exposure, the photosensitive compositions of the invention are excellent such that they are little in the density dependency and wide in the exposure latitude.

Examples 26 to 28 and Comparative Examples 3 and 4

(1) Formation of Lower Resist Layer:

An FHi-028DD resist (resist for i-rays, manufactured by Fujifilm Olin Co., Ltd.) was coated on a 6 inch silicon wafer using a spin coater Mark 8, manufactured by Tokyo Electron Limited and baked at 90° C. for 90 seconds to obtain a uniform film having a thickness of 0.55 μm.

This film was further heated at 200° C. for 3 minutes to form a lower resist layer having a thickness of 0.40 μm.

(2) Formation of Upper Resist Layer:

Components shown in the following Table 6 were dissolved in a solvent to prepare solutions each having a concentration of solids of 11% by weight. The solution was subjected to microfiltration with a membrane filter having an opening of 0.1 μm, to prepare an upper resist composition.

The upper resist composition was coated on the lower resist layer in the same way and heated at 130° C. for 90 seconds to form an upper resist layer having a thickness of 0.20 μm.

Resins (SI-1) to (SI-3) in Table 6 are as follows.

| | | Molecular weight |
|---|---|---|
| (SI-1) | | 15000 |
| (SI-2) | | 14500 |
| (SI-3) | | 9600 |

(3) Evaluation of Resist:

The resulting wafer was exposed by installing a resolution mask in an ArF excimer stepper 9300, manufactured by ISI and changing the exposure amount.

Next, after heating at 120° C. for 90 seconds, the exposed wafer was developed with a tetrahydroammonium hydroxide developer (2.38% by weight) for 60 seconds, rinsed with distilled water, and then dried to obtain an upper pattern.

The density dependency and exposure latitude were evaluated in the same manner as in Examples 1 to 25. The results are shown in Table 6.

on a vacuum contact type hot plate at 120° C. for 90 seconds to obtain a resist film having a thickness of 0.1 µm.

The resulting resist film was subjected to pattern exposure using an $F_2$ excimer laser stepper (157 nm), and immediately after the exposure, heated on a hot plate at 120° C. for 90 seconds. Further, the resulting resist film was developed with a 2.38% by weight tetramethylammonium hydroxide aqueous solution for 60 seconds and rinsed with pure water to obtain a sample wafer. The sample was evaluated with respect to the density dependency and exposure latitude.

TABLE 6

| | Formulation | | | | | | | Evaluation | |
|---|---|---|---|---|---|---|---|---|---|
| | Acid generating agent (g) | Associative acid generating agent (g) | Resin (10 g) | Basic compound (g) | Surfactant (0.03 g) | Solvent (weight ratio) | Component (C) (g) | Density dependency (µm) | Exposure latitude (%) |
| Example 26 | I-1 (0.3) | — | SI-1 | DIA (0.02) PEA (0.02) | W-4 | A1/B1 (60/40) | — | 0.350 | 10.1 |
| Example 27 | I-2 (0.5) | — | SI-2 | DIA (0.02) PEA (0.02) | W-4 | A1/B1 (60/40) | — | 0.300 | 11.4 |
| Example 28 | I-3 (0.4) | — | SI-3 | DIA (0.02) PEA (0.02) | W-4 | A1/B1 (60/40) | — | 0.325 | 10.8 |
| Comparative Example 3 | z2 (0.3) | — | SI-1 | DIA (0.02) PEA (0.02) | W-4 | A1/B1 (60/40) | — | 0.20 | 7.3 |
| Comparative Example 4 | PAG-A (0.3) | — | SI-1 | DIA (0.02) PEA (0.02) | W-4 | A1/B1 (60/40) | — | No image was formed. | No image was formed. |

From the results shown in Table 6, it is clear that in the case of using a double-layer resist, the photosensitive compositions of the invention are excellent such that they are little in the density dependency and wide in the exposure latitude.

Examples 29 to 48 and Comparative Examples 5 and 6

<Preparation of Resist>

Components shown in the following Tables 7 to 8 were dissolved in a solvent to prepare solutions each having a concentration of solids of 5% by weight. The solution was filtered by a 0.1 µm polyethylene filter to prepare a resist solution.

The resist solution was coated on a hexamethyl disilazane-treated wafer using a spin coater and dried by heating (Density Dependency)

In a line-and-space pattern with a line width of 80 nm (dense pattern: line-and-space=1/1) and an isolated line pattern (coarse pattern: line-and-space=1/5), an overlapping range of the depth of focus allowing (80 nm±10%) therebetween was determined. The larger the value, the smaller the performance difference between the dense pattern and the coarse pattern is, i.e., the density dependency is good.

(Exposure Latitude)

The exposure amount of reproducing a mask pattern of line-and-space with a line width of 80 nm was defined as an optimum exposure amount. When the exposure amount was changed, a width of the exposure amount allowing (80 nm±10%) of the pattern size was determined. This value was divided by the optimum exposure amount and expressed in terms of percentage. The larger the value, the smaller the performance change by the change of the exposure amount is, i.e., the exposure latitude is good.

The results are shown in Tables 7 to 8.

TABLE 7

| | Formulation | | | | | | | Evaluation | |
|---|---|---|---|---|---|---|---|---|---|
| | Acid generating agent (g) | Associative acid generating agent (g) | Resin (g) | Basic compound (g) | Surfactant (0.03 g) | Solvent (weight ratio) | Component (C) (g) | Density dependency (µm) | Exposure latitude (%) |
| Example 29 | I-1 (0.3) | — | FII-1 (10) | DIA (0.05) | W-1 | A1/B1 (60/40) | — | 0.325 | 11.2 |
| Example 30 | I-2 (0.5) | — | FII-2 (10) | TPI (0.04) | W-1 | A1/B2 (80/40) | — | 0.300 | 10.3 |

TABLE 7-continued

| | Formulation | | | | | | | Evaluation | |
|---|---|---|---|---|---|---|---|---|---|
| | Acid generating agent (g) | Associative acid generating agent (g) | Resin (g) | Basic compound (g) | Surfactant (0.03 g) | Solvent (weight ratio) | Component (C) (g) | Density dependency (μm) | Exposure latitude (%) |
| Example 31 | I-3 (0.4) | — | FII-8 (8) FII-33 (2) | TOA (0.04) | W-2 | A1/B1 (125/5) | — | 0.325 | 10.6 |
| Example 32 | I-4 (0.2) | z38 (0.15) z50 (0.2) | FII-11 (4) FII-34 (6) | HEP (0.06) | W-2 | A1/B1 (100/40) | — | 0.350 | 11.6 |
| Example 33 | I-5 (0.5) | z27 (0.2) | FII-12 (3) FII-35 (7) | DBN (0.05) | W-3 | A1/B2 (110/40) | — | 0.325 | 10.8 |
| Example 34 | I-6 (0.4) | z35 (0.2) | FII-13 (10) | DIA (0.04) PEA ((0.04) | W-1 | A1/B1 (80/70) | — | 0.375 | 10.2 |
| Example 35 | I-1 (0.4) | — | FII-14 (9) FII-39 (1) | TPA (0.04) | W-2 | A1/B2 (90/60) | — | 0.300 | 11.2 |
| Example 36 | I-10 (0.4) | z18 (0.15) z49 (0.2) | FII-16 (10) | TPSA (0.1) | W-4 | A1/B2 (70/40) | — | 0.325 | 11.8 |
| Example 37 | I-7 (0.5) | z34 (0.1) z52 (0.2) | FII-18 (5) FII-1 (5) | TBAH (0.03) | W-1 | A1/B2 (80/30) | — | 0.400 | 10.5 |
| Example 38 | I-8 (0.4) | z3 (0.2) | FII-20 (5) FII-5 (5) | TMEA (0.05) | W-1 | A1/B1 (80/70) | — | 0.365 | 11.4 |

TABLE 8

| | Formulation | | | | | | | Evaluation | |
|---|---|---|---|---|---|---|---|---|---|
| | Acid generating agent (g) | Associative acid generating agent (g) | Resin (g) | Basic compound (g) | Surfactant (0.03 g) | Solvent (weight ratio) | Component (C) (g) | Density dependency (μm) | Exposure latitude (%) |
| Example 39 | I-11 (0.6) | z18 (0.1) z32 (0.2) | FII-27 (5) FII-32 (5) | HAP (0.05) | W-1 | A1/B1 (60/40) | — | 0.325 | 10.1 |
| Example 40 | I-13 (0.6) | z38 (0.15) | FII-28 (5) FII-27 (5) | DBN (0.04) | W-2 | A2/B1 (70/80) | — | 0.300 | 11.8 |
| Example 41 | I-12 (0.2) | z14 (0.15) z51 (0.2) | FII-29 (8) FII-3 (2) | DIA (0.01) PEA (0.01) | W-1 | A1/B2 (100/60) | — | 0.375 | 10.4 |
| Example 42 | I-16 (0.5) | z38 (0.2) z54 (0.1) | FII-30 (2) FII-31 (5) | PEA (0.05) | W-1 | A1/B1 (110/70) | — | 0.325 | 10.3 |
| Example 43 | I-18 (0.2) | z2 (0.1) z31 (0.1) | FII-38 (10) | TPI (0.04) | W-1 | A1/B2 (80/40) | — | 0.350 | 11.4 |
| Example 44 | I-14 (0.2) | z6 (0.1) z22 (0.1) | FII-40 (5) FII-1 (5) | TOA (0.04) | W-2 | A1/B2 (125/5) | — | 0.300 | 11.8 |
| Example 45 | I-15 (0.6) | — | FII-19 (3) FII-28 (7) | HEP (0.06) | W-2 | A1/B1 (100/40) | — | 0.375 | 10.2 |
| Example 46 | I-17 (0.2) | z44 (0.4) | FII-11 (5) FII-3 (5) | DBN (0.03) | W-3 | A1/B2 (110/40) | — | 0.350 | 11.1 |
| Example 47 | I-20 (0.2) | z38 (0.15) z40 (0.2) | FII-32 (4) FII-30 (6) | DIA (0.04) PEA (0.04) | W-1 | A1/B1 (80/70) | — | 0.300 | 10.5 |
| Example 48 | I-23 (0.1) | z40 (0.3) z42 (0.1) | FII-5 (7) FII-28 (3) | TPA (0.04) | W-2 | A1/B2 (90/60) | — | 0.350 | 10.9 |
| Comparative Example 5 | z2 (0.3) | — | FII-1 (10) | DIA (0.05) | W-1 | A1/B1 (60/40) | — | 0.25 | 6.1 |
| Comparative Example 6 | PAG-A (0.3) | — | FII-1 (10) | DIA (0.05) | W-1 | A1/B1 (60/40) | — | No image was formed. | No image was formed. |

From the results shown in Tables 7 to 8, it is clear that in the $F_2$ excimer laser exposure, the photosensitive compositions of the invention are excellent such that they are little in the density dependency and wide in the exposure latitude.

Examples 49 to 60 and Comparative Examples 7 and 8

<Preparation of Resist>
Components shown in the following Table 10 were dissolved in a solvent and filtered by a 0.1 μm polytetrafluoroethylene filter to prepare positive working resist solutions each having a concentration of solids of 14% by weight.

The prepared positive working resist solutions were evaluated according to the following methods. The results are shown in Table 10.

The following Table 9 shows a molar ratio and a weight average molecular weight of each of resins (R-2) to (R-24) in Table 10.

TABLE 9

| Resin | Molar ratio of repeating units (corresponding in order from the left) | Weight average molecular weight |
|---|---|---|
| R-2 | 60/40 | 12000 |
| R-7 | 60/30/10 | 18000 |
| R-8 | 60/20/20 | 12000 |
| R-9 | 10/50/40 | 13000 |
| R-17 | 10/70/20 | 15000 |
| R-22 | 70/30 | 12000 |
| R-23 | 10/60/30 | 8000 |
| R-24 | 50/20/30 | 16000 |

PHS: Polyhydroxystyrene VP-8000 (manufactured by Nippon Soda Co., Ltd.)

Structures of dissolution inhibiting compounds (C-1) and (C-2) in Table 9 are as follows.

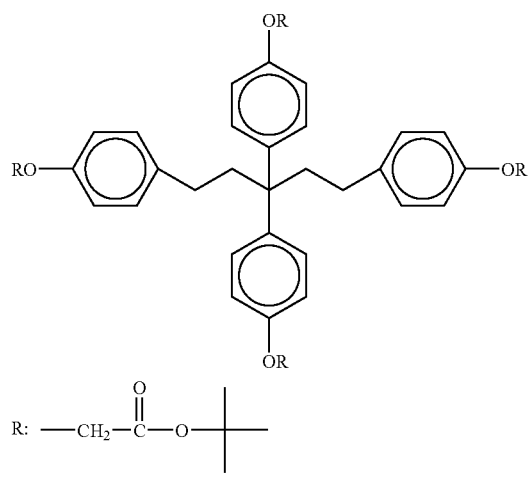

(C-1)

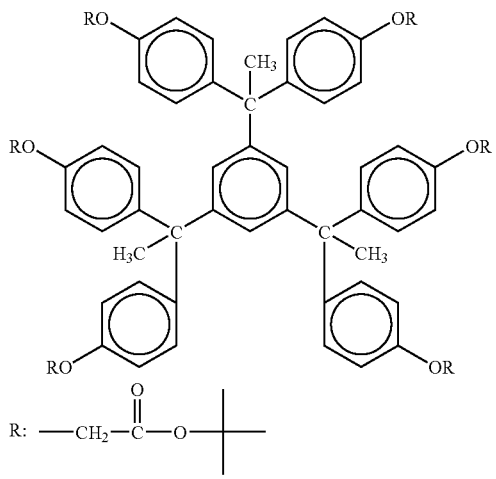

(C-2)

<Evaluation of Resist>

Each of the prepared positive working resist solutions was uniformly coated on a hexamethyldisilazne-treated silicon substrate using a spin coater and dried by heating on a hot plate at 120° C. for 90 seconds to form a 0.6 µm-thick resist film.

This resist film was subjected to pattern exposure using a mask for line-and-space and using a KrF excimer laser stepper (NA=0.63), and immediately after the exposure, dried on a hot plate at 110° C. for 90 seconds. Further, the resulting resist film was developed with a 2.38% by weight tetramethylammonium hydroxide aqueous solution at 23° C. for 60 seconds, rinsed with pure water for 30 seconds, and then dried to form a line pattern. The resulting resist film was evaluated with respect to the density dependency and exposure latitude.

(Density Dependency)

In a line-and-space pattern with a line width of 0.13 µm (dense pattern: line-and-space=1/1) and an isolated line pattern (coarse pattern: line-and-space=1/5), an overlapping range of the depth of focus allowing (0.13 µm±10%) therebetween was determined. The larger the value, the smaller the performance difference between the dense pattern and the coarse pattern is, i.e., the density dependency is good.

(Exposure Latitude)

The exposure amount of reproducing a mask pattern of line-and-space with a line width of 0.13 µm was defined as an optimum exposure amount. When the exposure amount was changed, a width of the exposure amount allowing (0.13 µm±10%) of the pattern size was determined. This value was divided by the optimum exposure amount and expressed in terms of percentage. The larger the value, the smaller the performance change by the change of the exposure amount is, i.e., the exposure latitude is good.

TABLE 10

| | Formulation | | | | | | | Evaluation | |
|---|---|---|---|---|---|---|---|---|---|
| | Acid generating agent (g) | Associative acid generating agent (g) | Resin (10 g) | Basic compound (g) | Surfactant (0.03 g) | Solvent (weight ratio) | Component (C) (g) | Density dependency (µm) | Exposure latitude (%) |
| Example 49 | I-1 (0.3) | — | R-2 | DBN (0.02) | W-1 | A1/B1 (60/40) | — | 0.40 | 14.4 |

TABLE 10-continued

| | Formulation | | | | | | | Evaluation | |
|---|---|---|---|---|---|---|---|---|---|
| | Associative | | | | | | | | |
| | Acid generating agent (g) | acid generating agent (g) | Resin (10 g) | Basic compound (g) | Surfactant (0.03 g) | Solvent (weight ratio) | Component (C) (g) | Density dependency (μm) | Exposure latitude (%) |
| Example 50 | I-2 (0.5) | — | R-7 | TPI (0.03) | W-1 | A1/B1 (60/40) | — | 0.50 | 13.9 |
| Example 51 | I-3 (0.4) | — | R-8 | TPSA (0.01) | W-2 | A1/B1 (60/40) | — | 0.40 | 13.3 |
| Example 52 | I-4 (0.2) | z4 (0.3) | R-9 | HEP (0.02) | W-2 | A3/B1 (80/20) | — | 0.55 | 14.6 |
| Example 53 | I-5 (0.4) | z12 (0.2) | R-17 | DIA (0.05) | W-3 | A2/B1 (90/10) | — | 0.45 | 13.2 |
| Example 54 | I-6 (0.4) | z14 (0.3) | R-23 | DCMA (0.03) | W-4 | A4/B1 (90/10) | — | 0.60 | 12.6 |
| Example 55 | I-1 (0.3) | z17 (0.3) | R-24 | TPA (0.01) | W-4 | A1/B1 (50/50) | — | 0.40 | 13.5 |
| Example 56 | I-10 (0.3) | z31 (0.4) z49 (0.2) | R-2/R-23 = 50/50 | TOA (0.005) | W-4 | A1/B1 (90/10) | — | 0.50 | 14.8 |
| Example 57 | I-7 (0.5) | z34 (0.3) z52 (0.2) | R-17/R-2 = 30/70 | TBAH (0.0015) | W-4 | A5/B2 (90/10) | — | 0.55 | 14.1 |
| Example 58 | I-8 (0.4) | z40 (0.2) | R-2/R-22 = 50/50 | TMEA (0.02) | W-4 | A1/B1 (95/5) | — | 0.60 | 13.2 |
| Example 59 | I-11 (0.6) | z1 (0.2) | PHS | HAP (0.01) | W-1 | A1/B1 (90/10) | C-1 (2) | 0.45 | 13.8 |
| Example 60 | I-21 (0.2) | z5 (0.2) | R-2 | DBN (0.002) | W-2 | A1/B1 (95/5) | C-2 (1) | 0.40 | 12.9 |
| Comparative Example 7 | z2 (0.3) | — | R-2 | DBN (0.02) | W-1 | A1/B1 (60/40) | — | 0.25 | 8.9 |
| Comparative Example 8 | PAG-A (0.3) | — | R-2 | DBN (0.02) | W-1 | A1/B1 (60/40) | — | 0.35 | 4.3 |

From the results shown in Table 10, it is noted that the photosensitive compositions of the invention are excellent as a positive working resist composition in the KrF excimer laser exposure such that they are little in the density dependency and wide in the exposure latitude.

Examples 61 to 72 and Comparative Examples 9 and 10

<Preparation of Resist>

Components shown in the following Table 11 were dissolved in a solvent and filtered by a 0.1 μm polytetrafluoroethylene filter to prepare negative working resist solutions each having a concentration of solids of 14% by weight.

The prepared negative working resist solutions were evaluated in the same methods as in Examples 49 to 60. The results are shown in Table 11.

Structures, molecular weights, and molecular weight distributions of alkali-soluble resins in Table 11 will be given below.

| | | Mw | Mw/Mn |
|---|---|---|---|
| P-1 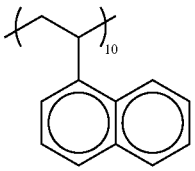 | | 17000 | 2.15 |
| P-2 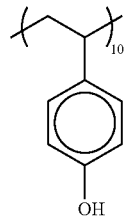 | | 16000 | 2.30 |
| P-3 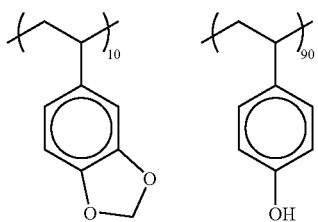 | | 19000 | 2.2 |
| P-4 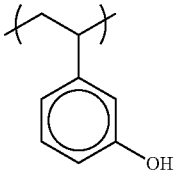 | | 12000 | 1.2 |

-continued
| | | Mw | Mw/Mn |
|---|---|---|---|
| P-5 | 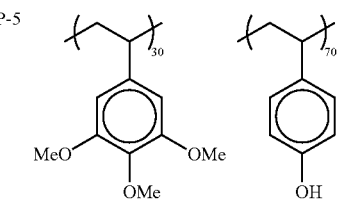 | 21000 | 2.1 |
-continued
| | | Mw | Mw/Mn |
|---|---|---|---|
| P-6 |  | 6000 | 1.2 |
VP-5000, manufactured by Nippon Soda Co. Ltd.
Structures of crosslinking agents in Table 11 will be given below.
TABLE 11
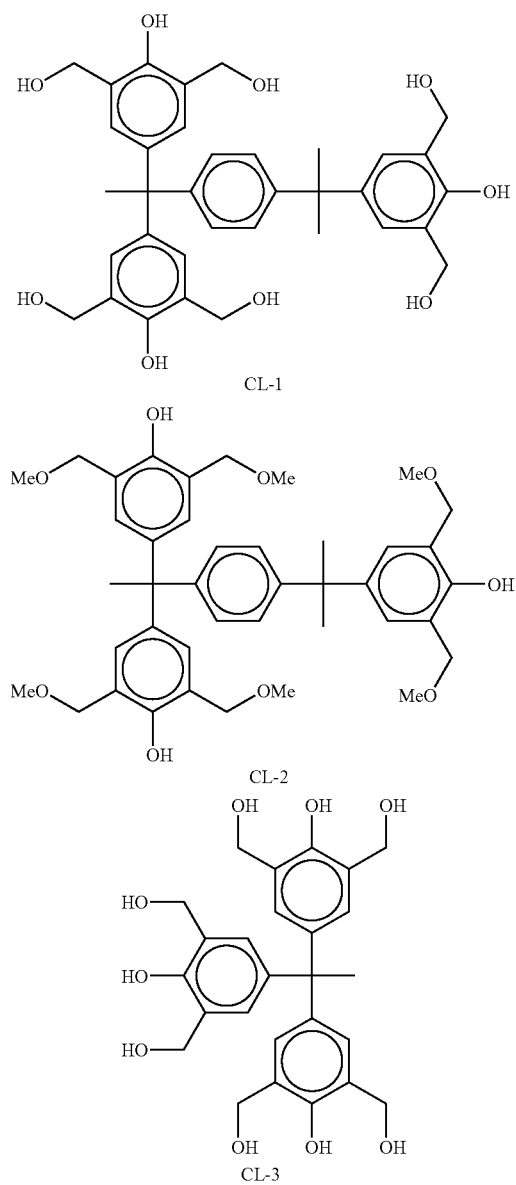
CL-1
CL-2
CL-3

TABLE 11-continued
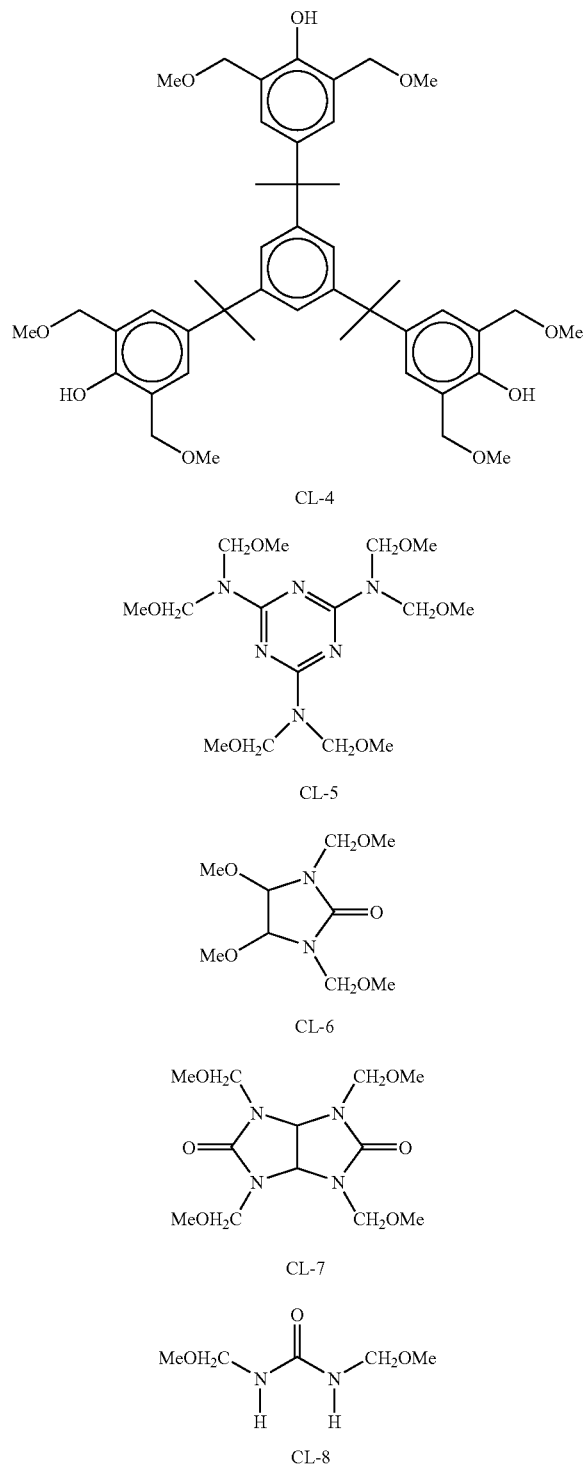
CL-4
CL-5
CL-6
CL-7
CL-8
| | Formulation | | | | | | | Evaluation | |
|---|---|---|---|---|---|---|---|---|---|
| | Acid generating agent (g) | Associative acid generating agent (g) | Resin (10 g) | Basic compound (g) | Surfactant (0.03 g) | Solvent (weight ratio) | Component (C) (g) | Density dependency (μm) | Exposure latitude (%) |
| Example 61 | I-1 (0.3) | — | P-1 | DIA (0.05) | W-1 | A1/B1 (60/40) | CL-1 (2) | 0.60 | 15.0 |

TABLE 11-continued

| | | | | | | | | | |
|---|---|---|---|---|---|---|---|---|---|
| Example 62 | I-2 (0.5) | — | P-2 | TPI (0.03) | W-1 | A1/B1 (60/40) | CL-2 (3) | 0.55 | 14.4 |
| Example 63 | I-3 (0.4) | — | P-3 | TOA (0.005) | W-2 | A1/B1 (60/40) | CL-3 (2.5) | 0.50 | 14.6 |
| Example 64 | I-4 (0.2) | z4 (0.3) | P-4 | HEP (0.02) | W-2 | A3/B1 (80/20) | CL-4 (3) | 0.45 | 13.9 |
| Example 65 | I-5 (0.4) | z12 (0.2) | P-5 | DBN (0.03) | W-3 | A2/B1 (90/10) | CL-5 (1.5) | 0.55 | 14.9 |
| Example 66 | I-6 (0.4) | z14 (0.3) | P-6 | DCMA (0.03) | W-4 | A4/B1 (90/10) | CL-6 (3) | 0.55 | 13.3 |
| Example 67 | I-1 (0.3) | z17 (0.3) | P-1 | TPA (0.01) | W-4 | A1/B1 (50/50) | CL-7 (2.5) | 0.60 | 12.9 |
| Example 68 | I-10 (0.3) | z31 (0.4) z49 (0.2) | P-2/P-6 (80/20) | TPSA (0.1) | W-4 | A1/B1 (90/10) | CL-8 (2.5) | 0.50 | 13.6 |
| Example 69 | I-7 (0.5) | z34 (0.3) z52 (0.2) | P-3 | TBAH (0.015) | W-4 | A5/B2 (90/10) | CL-1 (2) CL-5 (2) | 0.45 | 12.3 |
| Example 70 | I-8 (0.4) | z40 (0.2) | P-4 | TMEA (0.02) | W-4 | A1/B1 (95/5) | CL-2 (1) CL-7 (2) | 0.45 | 14.7 |
| Example 71 | I-11 (0.6) | z1 (0.2) | P-5 | HAP (0.01) | W-1 | A1/B1 (90/10) | CL-1 (2.5) | 0.50 | 13.5 |
| Example 72 | I-21 (0.2) | z5 (0.2) | P-6 | DBN (0.002) | W-2 | A1/B1 (95/5) | CL-2 (2.5) | 0.55 | 12.2 |
| Comparative Example 9 | z2 (0.3) | — | P-1 | DIA (0.05) | W-1 | A1/B1 (60/40) | CL-1 (2) | 0.20 | 9.1 |
| Comparative Example 10 | PAG-A (0.3) | — | P-1 | DIA (0.05) | W-1 | A1/B1 (60/40) | CL-1 (2) | 0.30 | 3.6 |

From the results shown in Table 11, it is noted that the photosensitive compositions of the invention are excellent as a negative working resist composition in the KrF excimer laser exposure such that they are little in the density dependency and wide in the exposure latitude.

Examples 73 to 84 and Comparative Examples 11 and 12

<Preparation of Resist>

Components shown in the following Table 12 were dissolved in a solvent and filtered by a 0.1 μm polytetrafluoroethylene filter to prepare positive working resist solutions each having a concentration of solids of 12% by weight.

The prepared positive working resist solutions were evaluated according to the following methods. The results are shown in Table 12.

<Evaluation of Resist>

Each of the prepared positive working resist solutions was uniformly coated on a hexamethyldisilazane-treated silicon substrate using a spin coater and dried by heating on a hot plate at 120° C. for 60 seconds to form a 0.3 μm-thick resist film.

This resist film was irradiated by an electron beam projection lithography device, manufactured by Nikon Corporation (accelerating voltage: 100 keV), and immediately after the exposure, heated on a hot plate at 110° C. for 90 seconds. Further, the resulting resist film was developed with a 2.38% by weight tetramethylammonium hydroxide aqueous solution at 23° C. for 60 seconds, rinsed with pure water for 30 seconds, and then dried to form a contact hole pattern.

(Density Dependency)

A pattern size of an isolated contact hole (pitch: 1,000 nm) in a dose for resolving a dense contact hole (pitch: 300 nm) of 100 nm was measured, and a difference from 100 nm was calculated. The smaller the value, the smaller the performance difference between a dense pattern and an isolated pattern is, i.e., the density dependency is good.

(Exposure Latitude)

A dose for resolving a dense contact hole (pitch: 300 nm) of 100 nm was defined as an optimum dose. When the dose was changed, a width of the dose allowing (100 nm±10%) of the pattern size was determined. This value was divided by the optimum dose and expressed in terms of percentage. The larger the value, the smaller the performance change by the change of the exposure amount is, i.e., the exposure latitude is good.

TABLE 12

| | Formulation | | | | | | | Evaluation | |
|---|---|---|---|---|---|---|---|---|---|
| | Acid generating agent (g) | Associative acid generating agent (g) | Resin (10 g) | Basic compound (g) | Surfactant (0.03 g) | Solvent (weight ratio) | Component (C) (g) | Density dependency (μm) | Exposure latitude (%) |
| Example 73 | I-1 (0.3) | — | R-2 | DBN (0.02) | W-1 | A1/B1 (60/40) | — | 5.2 | 12.4 |
| Example 74 | I-2 (0.5) | — | R-7 | TPI (0.03) | W-1 | A1/B1 (60/40) | — | 5.5 | 12.1 |
| Example 75 | I-3 (0.4) | — | R-8 | TPSA (0.01) | W-2 | A1/B1 (60/40) | — | 5.1 | 12.7 |
| Example 76 | I-4 (0.2) | z4 (0.3) | R-9 | HEP (0.02) | W-2 | A3/B1 | | 5.8 | 13.3 |

TABLE 12-continued

| | Formulation | | | | | | | | Evaluation | |
|---|---|---|---|---|---|---|---|---|---|---|
| | Acid generating agent (g) | Associative acid generating agent (g) | Resin (10 g) | Basic compound (g) | Surfactant (0.03 g) | Solvent (weight ratio) | | Component (C) (g) | Density dependency (μm) | Exposure latitude (%) |
| Example 77 | I-5 (0.4) | z12 (0.2) | R-17 | DIA (0.05) | W-3 | A2/B1 (80/20) | | — | 6.4 | 13.7 |
| Example 78 | I-6 (0.4) | z14 (0.3) | R-23 | DCMA (0.03) | W-4 | A4/B1 (90/10) | | — | 5.6 | 12.4 |
| Example 79 | I-1 (0.3) | z17 (0.3) | R-24 | TPA (0.01) | W-4 | A1/B1 (90/10) | | — | 6.4 | 14.5 |
| Example 80 | I-10 (0.3) | z31 (0.4) z49 (0.2) | R-2/R-23 = 50/50 | TOA (0.005) | W-4 | A1/B1 (50/50) | | — | 6.7 | 14.1 |
| Example 81 | I-7 (0.5) | z34 (0.3) z52 (0.2) | R-17/R-2 = 30/70 | TBAH (0.0015) | W-4 | A5/B2 (90/10) | | — | 7.8 | 13.1 |
| Example 82 | I-8 (0.4) | z40 (0.2) | R-2/R-22 = 50/50 | TMEA (0.02) | W-4 | A1/B1 (95/5) | | — | 6.6 | 12.2 |
| Example 83 | I-11 (0.6) | z1 (0.2) | PHS | HAP (0.01) | W-1 | A1/B1 (90/10) | | C-1 (2) | 7.4 | 13.8 |
| Example 84 | I-21 (0.2) | z5 (0.2) | R-2 | DBN (0.002) | W-2 | A1/B1 (95/5) | | C-2 (1) | 5.8 | 13.9 |
| Comparative Example 11 | z2 (0.3) | — | R-2 | DBN (0.02) | W-1 | A1/B1 (60/40) | | — | 12.5 | 7.4 |
| Comparative Example 12 | PAG-A (0.3) | — | R-2 | DBN (0.02) | W-1 | A1/B1 (60/40) | | — | 10.9 | 4.6 |

From the results shown in Table 12, it is noted that the photosensitive compositions of the invention are excellent as a positive working resist composition in the electron beam exposure such that they are little in the density dependency and wide in the exposure latitude.

Examples 85 to 96 and Comparative
Examples 13 and 14

<Preparation of Resist>
Components shown in the following Table 13 were dissolved in a solvent and filtered by a 0.1 μm polytetrafluoroethylene filter to prepare negative working resist solutions each having a concentration of solids of 12% by weight.

The prepared negative working resist solutions were evaluated according to the following methods. The results are shown in Table 13.

<Evaluation of Resist>
Each of the prepared negative working resist solutions was uniformly coated on a hexamethyldisilazane-treated silicon substrate using a spin coater and dried by heating on a hot plate at 120° C. for 60 seconds to form a 0.3 μm-thick resist film.

This resist film was irradiated by an electron beam projection lithography device, manufactured by Nikon Corporation (accelerating voltage: 100 keV), and immediately after the exposure, heated on a hot plate at 110° C. for 90 seconds. Further, the resulting resist film was developed with a 2.38% by weight tetramethylammonium hydroxide aqueous solution at 23° C. for 60 seconds, rinsed with pure water for 30 seconds, and then dried to form a line-and-space pattern.

(Density Dependency)
A pattern size of an isolated contact hole (pitch: 1,000 nm) in a dose for resolving a dense line-and-space (pitch: 200 nm) of 100 nm was measured, and a difference from 100 nm was calculated. The smaller the value, the smaller the performance difference between a dense pattern and an isolated pattern is, i.e., the density dependency is good.

(Exposure Latitude)
A dose for resolving a dense line-and-space (pitch: 200 nm) of 100 nm was defined as an optimum dose. When the dose was changed, a width of the dose allowing (100 nm±10%) of the pattern size was determined. This value was divided by the optimum dose and expressed in terms of percentage. The larger the value, the smaller the performance change by the change of the exposure amount is, i.e., the exposure latitude is good.

TABLE 13

| | Formulation | | | | | | | | Evaluation | |
|---|---|---|---|---|---|---|---|---|---|---|
| | Acid generating agent (g) | Associative acid generating agent (g) | Resin (10 g) | Basic compound (g) | Surfactant (0.03 g) | Solvent (weight ratio) | | Component (C) (g) | Density dependency (μm) | Exposure latitude (%) |
| Example 85 | I-1 (0.3) | — | P-1 | DIA (0.05) | W-1 | A1/B1 (60/40) | | CL-1 (2) | 5.6 | 14.9 |

TABLE 13-continued

| | Formulation | | | | | | | Evaluation | |
|---|---|---|---|---|---|---|---|---|---|
| | Acid generating agent (g) | Associative acid generating agent (g) | Resin (10 g) | Basic compound (g) | Surfactant (0.03 g) | Solvent (weight ratio) | Component (C) (g) | Density dependency (μm) | Exposure latitude (%) |
| Example 86 | I-2 (0.5) | — | P-2 | TPI (0.03) | W-1 | A1/B1 (60/40) | CL-2 (3) | 5.2 | 14.6 |
| Example 87 | I-3 (0.4) | — | P-3 | TOA (0.005) | W-2 | A1/B1 (60/40) | CL-3 (2.5) | 5.9 | 14.1 |
| Example 88 | I-4 (0.2) | z4 (0.3) | P-4 | HEP (0.02) | W-2 | A3/B1 (80/20) | CL-4 (3) | 6.4 | 14.4 |
| Example 89 | I-5 (0.4) | z12 (0.2) | P-5 | DBN (0.03) | W-3 | A2/B1 (90/10) | CL-5 (1.5) | 6.8 | 13.9 |
| Example 90 | I-6 (0.4) | z14 (0.3) | P-6 | DCMA (0.03) | W-4 | A4/B1 (90/10) | CL-6 (3) | 5.4 | 13.8 |
| Example 91 | I-1 (0.3) | z17 (0.3) | P-1 | TPA (0.01) | W-4 | A1/B1 (50/50) | CL-7 (2.5) | 7.1 | 12.5 |
| Example 92 | I-10 (0.3) | z31 (0.4) z49 (0.2) | P-2/P-6 (80/20) | TPSA (0.1) | W-4 | A1/B1 (90/10) | CL-8 (2.5) | 5.8 | 14.6 |
| Example 93 | I-7 (0.5) | z34 (0.3) z52 (0.2) | P-3 | TBAH (0.015) | W-4 | A5/B2 (90/10) | CL-1 (2) CL-5 (2) | 6.3 | 12.9 |
| Example 94 | I-8 (0.4) | z40 (0.2) | P-4 | TMEA (0.02) | W-4 | A1/B1 (95/5) | CL-2 (1) CL-7 (2) | 7.7 | 13.7 |
| Example 95 | I-11 (0.6) | z1 (0.2) | P-5 | HAP (0.01) | W-1 | A1/B1 (90/10) | CL-1 (2.5) | 5.6 | 14.5 |
| Example 96 | I-21 (0.2) | z5 (0.2) | P-6 | DBN (0.002) | W-2 | A1/B1 (95/5) | CL-2 (2.5) | 7.3 | 14.2 |
| Comparative Example 13 | z2 (0.3) | — | P-1 | DIA (0.05) | W-1 | A1/B1 (60/40) | CL-1 (2) | 13.1 | 8.4 |
| Comparative Example 14 | PAG-A (0.3) | — | P-1 | DIA (0.05) | W-1 | A1/B1 (60/40) | CL-1 (2) | 11.6 | 3.9 |

From the results shown in Table 13, it is noted that the photosensitive compositions of the invention are excellent as a negative working resist composition in the electron beam exposure such that they are little in the density dependency and wide in the exposure latitude.

Examples 97 to 118 and Comparative Examples 15 to 17

<Preparation of Resist>
Components shown in the following Tables 14 to 16 were dissolved in a solvent to prepare solutions each having a concentration of solids of 10% by weight. Each solution was filtered by a 0.1 μm polyethylene filter to prepare a positive working resin solution. The prepared positive resist solutions were evaluated according to the following methods. The results are shown in Tables 14 to 16. With respect to the respective components, in the case where the plural number of materials are used, the given ratios are a weight ratio.
Symbols in Tables 14 to 16 are as follows.
N'-1: N,N-Dibutylaniline
N'-2: N,N-Dipropylaniline
N'-3: N,N-Dihydroxyethylaniline
N'-4: 2,4,5-Triphenylimidazole
N'-5: 2,6-Diisopropylaniline
N'-6: Hydroxyantipyrine
W'-1: Megaface F176 (manufactured by Dainippon Ink and Chemicals, Incorporated) (fluorine based)
W'-2: Megaface $R_{08}$ (manufactured by Dainippon Ink and Chemicals, Incorporated) (fluorine and silicon based)
W'-3: Polysiloxane polymer KP-341 (manufactured by Shin-Etsu Chemical Co., Ltd.)
W'-4: Troysol S-366 (manufactured by Troy Chemical Industries, Inc.)
SL'-1: Cyclopentanone
SL'-2: Cyclohexanone
SL'-3: 2-Methylcyclohexanone
SL'-4: Propylene glycol monomethyl ether acetate
SL'-5: Ethyl lactate
SL'-6: Propylene glycol monomethyl ether
SL'-7: 2-Heptanone
SL'-8: γ-Butyrolactone
SL'-9: Propylene carbonate
SI'-1: t-Butyl lithocholate
SI'-2: t-Butyl adamantanecarboxylate <Evaluation of Resist>
ARC29A, manufactured by Brewer Science Limited was uniformly coated in a thickness of 78 nm on a silicon wafer using a spin coater and dried by heating at 205° C. for 60 seconds to form an anti-refractive film. Thereafter, each of the positive working resist compositions immediately after the preparation was coated using a spin coater and dried (PB) at a temperature shown in Tables 14 to 16 for 90 seconds to form a 300 nm-thick resist film.
This resist film was exposed with an ArF excimer laser stepper (PAS 5500/1100, manufactured by ASML, NA=0.75 (2/3 zonal illumination)) through a mask, and immediately after the exposure, heated (PEB) on a hot plate at a temperature shown in Tables 14 to 16 for 90 seconds. Further, the resulting resist film was developed with a 2.38% by weight tetramethylammonium hydroxide aqueous solution at 23° C. for 60 seconds, rinsed with pure water for 30 seconds, and then dried to obtain a resist pattern.

[Density Dependency and Exposure Latitude]
The density dependency and exposure latitude were evaluated in the same manner as in Example 1.

[Pattern Collapse]

With respect to a trench repeat pattern (pitch: 240 nm) with a line width of 110 nm, development and pattern formation were carried out while changing the exposure amount, and the presence or absence of the generation of pattern collapse due to an increase of the exposure amount was observed by an scanning electron microscope (SEM). The line width becomes thin with an increase of the exposure amount, whereby pattern collapse is finally caused. According to the present evaluation method, a line width (CDmin) immediately before the generation of pattern collapse due to a reduction of the line width was defined as an index of the pattern collapse. That is, it is meant that when the CDmin is small, the pattern does not collapse even if the line width becomes thin, i.e., the resist film is good such that the pattern collapse is hardly caused.

[Defocus Latitude (DOF) at the Time of Formation of Isolated Line Pattern]

In an exposure amount of reproducing an isolated pattern of 210 nm into a line width of 130 nm, the focus position was changed, and a width (nm) of the change of the focus satisfying the range of a line width of [130 nm±13 nm (±10%)] was determined.

TABLE 14

| | | Formulation | | | | | | | Evaluation | | | |
|---|---|---|---|---|---|---|---|---|---|---|---|---|
| Example | Resin (2 g) | Acid generating agent of the invention (mg) | Other acid generating agent (mg) | Solvent | Dissolution inhibiting compound (g) | Basic compound (4 mg) | Surfactant (5 mg) | Condition PB/PEB (° C.) | Density dependency (nm) | Exposure latitude (%) | Pattern collapse | Isolated DOF (nm) |
| 97 | RA1 | I-1 (20) | z1 (20) | SL'-2/SL'-4 = 50/50 | — | N'-1 | W'-1 | 130/130 | 0.35 | 14.3 | 75 | 350 |
| 98 | RA2 | I-2 (18) | z3 (20) | SL'-2/SL'-6 = 70/30 | — | N'-2 | W'-2 | 130/130 | 0.40 | 14.8 | 72 | 375 |
| 99 | RA3 | I-3 (23) | z2 (20) | SL'-1/SL'-4/SL'-8 = 40/58/2 | — | N'-3 | W'-3 | 120/120 | 0.40 | 14.5 | 72 | 375 |
| 100 | RA4 | I-1 (15) | z38 (20) | SL'-2/SL'-4 = 40/60 | — | N'-1 | W'-4 | 115/115 | 0.40 | 13.9 | 70 | 400 |
| 101 | RA5 | I-4 (15) | z2 (20) | SL'-2/SL'-4 = 40/60 | — | N'-2 | W'-4 | 130/130 | 0.40 | 14.1 | 70 | 375 |
| 102 | RA6 | I-7 (22) | z15 (20) | SL'-2/SL'-4/SL'-9 = 40/59/1 | — | N'-1/N'-3 = 1/1 | W'-4 | 130/130 | 0.45 | 15.6 | 68 | 400 |
| 103 | RA7 | I-1 (50) | — | SL'-2/SL'-4 = 50/50 | — | N'-1 | W'-1 | 115/120 | 0.45 | 15.8 | 70 | 425 |
| 104 | RA8 | I-17 (19) | z16 (20) | SL'-2/SL'-6 = 70/30 | — | N'-3/N'-6 = 1/1 | W'-1 | 115/115 | 0.40 | 14.2 | 72 | 375 |
| 105 | RA9 | I-1 (30) | z44 (15) | SL'-2/SL'-4/SL'-9 = 40/59/1 | — | N'-2 | W'-1 | 115/115 | 0.40 | 14.8 | 72 | 375 |
| 106 | RA10 | I-18 (30) | z14 (25) | SL'-2/SL'-4 = 40/60 | — | N'-3 | W'-2 | 130/130 | 0.40 | 14.6 | 72 | 375 |
| 107 | RA11 | I-1 (25) | z36 (12) | SL'-3/SL'-4 = 40/60 | — | N'-1 | W'-3 | 120/120 | 0.45 | 15.3 | 70 | 376 |
| 108 | RA12 | I-5 (30) | z40 (10) | SL'-2/SL'-4 = 40/60 | — | N'-1 | W'-4 | 130/130 | 0.40 | 14.7 | 75 | 350 |

TABLE 15

| | | Formulation | | | |
|---|---|---|---|---|---|
| Example | Resin (2 g) | Acid generating agent of the invention (mg) | Other acid generating agent (mg) | Solvent | Dissolution inhibiting compound (g) |
| 109 | RA13 | I-12 (20) | z38 (30) | SL'-1/SL'-7 = 40/60 | SI'-1 (0.1) |
| 110 | RA14 | I-2 (18) | z13 (27) | SL'-2/SL'-4/SL'-9 = 40/58/2 | — |
| 111 | RA15 | I-3 (12) | z14 (33) | SL'-3/SL'-7 = 60/40 | — |
| 112 | RA16 | I-2 (40) | z27 (3) | SL'-2/SL'-5 = 60/40 | — |
| 113 | RA17 | I-2 (50) | — | SL'-2/SL'-7 = 60/40 | SI'-2 (0.1) |
| 114 | RA18 | I-1 (18) | z13 (27) | SL'-2/SL'-7 = 60/40 | — |
| 115 | RA19 | I-3 (18) | z13 (29) | SL'-2/SL'-7 = 60/40 | — |

TABLE 15-continued

| | | | | | |
|---|---|---|---|---|---|
| 116 | RA20 | I-2 (18) | z13 (25) | SL'-2/SL'-4 = 40/60 | — |
| 117 | RA21 | I-1 (18) | z13 (29) | SL'-2 | — |
| 118 | RA1 | I-1 (20) | z1 (20) | SL'-4 | — |

| | Formulation | | | Evaluation | | | |
|---|---|---|---|---|---|---|---|
| Example | Basic compound (4 mg) | Surfactant (5 mg) | Condition PB/PEB (° C.) | Density dependency (nm) | Exposure latitude (%) | Pattern collapse | Isolated DOF (nm) |
| 109 | N'-6 | W'-4 | 135/135 | 0.35 | 14.2 | 75 | 300 |
| 110 | N'-4 | W'-4 | 130/130 | 0.35 | 13.9 | 77 | 275 |
| 111 | N'-4/N'-5 = 1/1 | W'-3 | 120/120 | 0.35 | 13.6 | 80 | 300 |
| 112 | N'-3 | W'-2 | 130/130 | 0.35 | 13.5 | 80 | 300 |
| 113 | N'-3 | W'-2 | 130/130 | 0.35 | 13.6 | 78 | 275 |
| 114 | N'-4/N'-5 = 1/1 | W'-1 | 130/130 | 0.35 | 13.8 | 68 | 275 |
| 115 | N'-3 | W'-1 | 120/120 | 0.35 | 13.7 | 69 | 275 |
| 116 | N'-3 | W'-4 | 130/130 | 0.35 | 13.6 | 69 | 275 |
| 117 | N'-6 | W'-1 | 130/130 | 0.35 | 13.9 | 78 | 300 |
| 118 | N'-1 | W'-1 | 130/130 | 0.35 | 14.0 | 95 | 175 |

TABLE 16

| | Formulation | | | | |
|---|---|---|---|---|---|
| Comparative Example | Resin (2 g) | Acid generating agent of the invention (mg) | Other acid generating agent (mg) | Solvent | Dissolution inhibiting compound (g) |
| 15 | RA1 | — | z1 (24) | SL'-2/SL'-4 = 50/50 | — |
| 16 | RA21 | — | z1 (24) | SL'-2 | — |
| 17 | RA21 | — | z1 (24) | SL'-2 | — |

| | Formulation | | | Evaluation | | | |
|---|---|---|---|---|---|---|---|
| Comparative Example | Basic compound (4 mg) | Surfactant (5 mg) | Condition PB/PEB (° C.) | Density dependency (nm) | Exposure latitude (%) | Pattern collapse | Isolated DOF (nm) |
| 15 | N'-1 | W'-1 | 130/130 | 0.30 | 9.8 | 95 | 125 |
| 16 | N'-1 | W'-1 | 130/130 | 0.30 | 8.9 | 90 | 125 |
| 17 | — | — | 130/130 | 0.30 | 10.0 | 95 | 50 |

From the results shown in Tables 14 to 16, it is noted that the resist compositions of the invention are excellent with respect to the density dependency and exposure latitude.

Also, from the results shown in Tables 14 to 16, it is noted that by using an alicyclic hydrocarbon based acid decomposable resin and a cyclic ketone, the resist compositions of the invention are excellent such that they hardly cause pattern collapse and have a large defocus latitude with respect to the isolated line pattern.

Examples 119 to 135 and Comparative Examples 18 to 19

<Preparation of Resist>

Components shown in the following Tables 17 to 18 were dissolved in a solvent to prepare solutions each having a concentration of solids of 10% by weight and filtered by a 0.1 μm polyethylene filter to prepare positive working resist solutions. The prepared positive working resist solutions were evaluated according to the following methods. The results are shown in Tables 17 to 18. With respect to the respective components, in the case where the plural number of materials are used, the given ratios are a weight ratio.

Symbols in Tables 17 to 18 are as follows.

[Photo Acid Generating Agent]
Corresponding to those enumerated previously.

[Basic Compound]
N"-1: N,N-Dibutylaniline
N"-2: N,N-Dipropylaniline
N"-3: N,N-Dihydroxyethylaniline
N"-4: 2,4,5-Triphenylimidazole
N"-5: 2,6-Diisopropylaniline
N"-6: Hydroxyantipyrine

[Surfactant]
W"-1: Megaface F176 (manufactured by Dainippon Ink and Chemicals, Incorporated) (fluorine based)
W"-2: Megaface R08 (manufactured by Dainippon Ink and Chemicals, Incorporated) (fluorine and silicon based)
W"-3: Polysiloxane polymer KP-341 (manufactured by Shin-Etsu Chemical Co., Ltd.) (silicon based)
W"-4: Troysol S-366 (manufactured by Troy Chemical Industries, Inc.)

[Solvent]
SL"-1: Propylene glycol monomethyl ether acetate
SL"-2: Propylene glycol monomethyl ether propionate
SL"-3: Propylene glycol monomethyl ether
SL"-4: 3-Methoxybutanol
SL"-5: Ethyl lactate SL"-6: Cyclohexanone
SL"-7: 2-Heptanone
SL"-8: γ-Butyrolactone
SL"-9: Propylene carbonate

[Dissolution Inhibiting Compound]
SI"-1: t-Butyl lithocholate
SI"-2: t-Butyl adamantanecarboxylate <Evaluation of Resist>

ARC29A, manufactured by Brewer Science Limited was uniformly coated in a thickness of 78 nm on a silicon wafer using a spin coater and dried by heating at 205° C. for 60 seconds to form an anti-refractive film. Thereafter, each of the positive working resist compositions immediately after the preparation was coated using a spin coater and dried (PB) at a temperature shown in Tables 17 to 18 for 60 seconds to form a 270 nm-thick resist film.

This resist film was exposed with an ArF excimer laser stepper (PAS 5500/1100, manufactured by ASML, NA=0.75 (2/3 zonal illumination)) through a mask, and immediately after the exposure, heated (PEB) on a hot plate at a temperature shown in Tables 17 to 18 for 60 seconds. Further, the resulting resist film was developed with a 2.38% by weight tetramethylammonium hydroxide aqueous solution at 23° C. for 60 seconds, rinsed with pure water for 30 seconds, and then dried to obtain a resist pattern.

[Density Dependency and Exposure Latitude]

The density dependency and exposure latitude were evaluated in the same manner as in Example 1.

[Evaluation Method of Process Window (Dense Pattern)]

With respect to a line-and-space pattern (pitch: 220 nm) with a mask size of 100 nm, when the exposure amount of reproducing in a size of 100 nm was defined as an optimum exposure amount ($E_{dense}$), and the maximum exposure amount and the minimum exposure amount of reproducing a line width of the range of (100 nm±10%) under the condition of defocusing with ±0.3 μm against the best focus were defined as $E_1$ and $E_2$, respectively, the process window was defined as follows.

$$|(E_1-E_2)/E_{dense}|\times100(\%)$$

[Evaluation Method of Process Window (Isolated Pattern)]

With respect to an isolated pattern with a mask size of 160 nm, when the exposure amount of reproducing in a size of 100 nm was defined as an optimum exposure amount ($E_{iso}$) and the maximum exposure amount and the minimum exposure amount of reproducing a Line width of the range of (100 nm±10%) under the condition of defocusing with ±0.3 μm against the best focus were defined as $E_{11}$ and $E_{12}$, respectively, the process window was defined as follows.

$$|(E_{11}-E_{12})/E_{iso}|\times100(\%)$$

[Evaluation Method of Process Window (Common)]

With respect to an exposure amount range capable of simultaneously forming a dense pattern and an isolated pattern under the condition of defocusing with ±0.3 μm against the best focus, the common process window was calculated according to the following expression.

$$|(E_{21}-E_{22})/E_{dense}|\times100(\%)$$

Here, the exposure amount of smaller one between $E_1$ and $E_{11}$ is defined as $E_{21}$, and the exposure amount of larger one between $E_2$ and $E_{12}$ is defined as $E_{22}$, respectively.

TABLE 17

| | | Formulation | | | |
|---|---|---|---|---|---|
| Example | Resin (2 g) | Photo acid generating agent of the invention (mg) | Other photo acid generating agent (mg) | Solvent | Dissolution inhibiting compound (g) |
| 119 | RB1 | I-1 (45) | — | SL"-1/SL"-8 = 95/5 | — |
| 120 | RB2 | I-10 (16) | z15 (35) | SL"-3/SL"-7 = 20/80 | — |
| 121 | RB3 | I-17 (33) | z14 (10) | SL"-2/SL"-8 = 95/5 | — |
| 122 | RB4 | I-1 (15) | z38 (30) | SL"-1/SL"-3 = 60/40 | — |
| 123 | RB5 | I-18 (30) | z14 (25) | SL"-1/SL"-3 = 70/30 | — |
| 124 | RB6 | I-17 (12) | z6 (30) | SL"-1/SL"-6 = 60/40 | — |
| 125 | RB7 | I-1 (26) | z2 (16) | SL"-1/SL"-3/SL"-9 = 60/38/2 | — |
| 126 | RB8 | I-2 (30) | z44 (20) | SL"-1/SL"-5 = 70/30 | — |
| 127 | RB9 | I-7 (18) | z13 (25) | SL"-1/SL"-6 = 60/40 | — |
| 128 | RB10 | I-4 (14) | z14 (15) z50 (26) | SL"-1/SL"-5/SL"-8 = 70/29/1 | SI"-1 (0.1) |
| 129 | RB11 | I-4 (25) | z2 (18) | SL"-1/SL"-3 = 60/40 | — |
| 130 | RB12 | I-8 (26) | z1 (15) | SL"-1/SL"-3 = 60/40 | — |

| | Formulation | | | Evaluation | | | | |
|---|---|---|---|---|---|---|---|---|
| | Basic | | Condition | Density | Exposure | Process window (%) | | |
| Example | compound (4 mg) | Surfactant (5 mg) | PB/PEB (° C.) | dependency (nm) | latitude (%) | Dense pattern | Isolated pattern | Common |
| 119 | N"-1 | W"-1 | 130/130 | 0.40 | 14.8 | 8.0 | 7.0 | 6.0 |
| 120 | N"-2 | W"-4 | 130/130 | 0.40 | 14.8 | 7.0 | 6.5 | 5.5 |
| 121 | N"-5 | W"-1 | 120/120 | 0.40 | 14.7 | 8.0 | 6.5 | 5.5 |
| 122 | N"-3/N"-5 = 1/1 | W"-4 | 115/115 | 0.40 | 14.5 | 9.0 | 8.0 | 7.0 |
| 123 | N"-1 | W"-1 | 130/130 | 0.45 | 14.6 | 8.0 | 6.0 | 5.5 |
| 124 | N"-1/N"-3 = 1/1 | W"-4 | 130/130 | 0.45 | 15.3 | 8.5 | 8.0 | 7.0 |
| 125 | N"-2/N"-3 = 1/1 | W"-4 | 115/120 | 0.40 | 14.7 | 9.0 | 8.5 | 8.0 |
| 126 | N"-3 | W"-2 | 120/120 | 0.40 | 14.4 | 8.0 | 7.5 | 6.5 |
| 127 | N"-3 | W"-3 | 120/120 | 0.40 | 14.9 | 8.0 | 7.5 | 7.0 |

TABLE 17-continued

| 128 | N"-1 | | W"-2 | 130/130 | 0.35 | 13.9 | 8.0 | 6.5 | 5.5 |
|---|---|---|---|---|---|---|---|---|---|
| 129 | N"-2/N"-3 = 1/1 | | W"-3 | 115/115 | 0.35 | 13.7 | 8.0 | 7.5 | 7.0 |
| 130 | N"-4 | | W"-1 | 115/115 | 0.35 | 13.6 | 8.0 | 7.0 | 5.5 |

TABLE 18

| | | Formulation | | | | | |
|---|---|---|---|---|---|---|---|
| | Resin (2 g) | Photo acid generating agent of the invention (mg) | Other photo acid generating agent (mg) | Solvent | Dissolution inhibiting compound (g) | Basic compound (4 mg) | Surfactant (5 mg) |
| Example | | | | | | | |
| 131 RB13 | | I-22 (30) | z14 (25) | SL"-1/SL"-6 = 60/40 | — | N"-2/N"-3 = 1/1 | W"-1 |
| 132 RB14 | | I-3 (30) | Z1 (15) | SL"-1/SL"-6 = 60/40 | SI"-2 (0.1) | N"-1 | W"-1 |
| 133 R1 | | I-1 (45) | — | SL"-1/SL"-8 = 95/5 | — | N"-1 | W"-1 |
| 134 R2 | | I-1 (45) | — | SL"-1/SL"-8 = 95/5 | — | N"-1 | W"-1 |
| 135 R3 | | I-1 (45) | — | SL"-1/SL"-8 = 95/5 | — | N"-1 | W"-1 |
| Comparative Example | | | | | | | |
| 18 RB1 | | — | z1 (40) | SL"-1/SL"-8 = 95/5 | — | N"-1 | W"-1 |
| 19 RB8 | | — | z2 (40) | SL"-1/SL"-6 = 70/30 | — | N"-3 | W"-2 |

| | Evaluation | | | | |
|---|---|---|---|---|---|
| | Condition | Density | Exposure | Process window (%) | | |
| | PB/PEB (° C.) | dependency (nm) | latitude (%) | Dense pattern | Isolated pattern | Common |
| Example | | | | | | |
| 131 | 130/130 | 0.35 | 13.8 | 8.5 | 7.5 | 7.0 |
| 132 | 115/115 | 0.35 | 13.7 | 8.5 | 7.0 | 6.5 |
| 133 | 130/130 | 0.35 | 13.8 | 3.5 | 3.0 | 2.0 |
| 134 | 130/130 | 0.35 | 13.3 | 3.0 | 2.0 | 1.0 |
| 135 | 130/130 | 0.35 | 13.5 | 3.5 | 2.5 | 1.5 |
| Comparative Example | | | | | | |
| 18 | 130/130 | 0.30 | 9.7 | 7.0 | 3.0 | 1.0 |
| 19 | 120/120 | 0.30 | 8.6 | 6.0 | 3.0 | 2.0 |

From the results shown in Tables 17 to 18, it is noted that the resist compositions of the invention are excellent with respect to the density dependency and exposure latitude.

Also, from the results shown in Tables 17 to 18, it is noted that by using an alicyclic hydrocarbon based acid decomposable resin (Baa), the positive working resist compositions of the invention can ensure a wide process window in the formation of an isolated line and a dense pattern.

According to the invention, it is possible to provide an excellent photosensitive composition and a pattern forming method using the same.

According to the invention, it is possible to provide an excellent photosensitive composition having a wide exposure margin and little density dependency and a pattern forming method using the same.

According to the invention, it is possible to provide a positive working resist composition that is low in the generation of pattern collapse in the formation of a fine pattern of not more than 110 nm and wide in the defocus latitude (DOF) in the formation of an isolated line pattern and a pattern forming method using the same.

According to the invention, it is possible to provide a positive working resist composition capable of ensuring a wide process window in the formation of isolated line and dense patterns and a pattern forming method using the same.

The entire disclosure of each and every foreign patent application from which the benefit of foreign priority has been claimed in the present application is incorporated herein by reference, as if fully set forth.

What is claimed is:

1. A photosensitive composition comprising (A) a compound that generates a sulfonic acid by irradiation with one of an actinic ray and a radiation, wherein the sulfonic acid is represented by general formula (I):

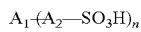   (I)

in which $A_1$ represents a connecting group having a valence of n;

each of $A_2$'s represents a single bond or a divalent aliphatic group, and $A_2$'s are the same or different, with proviso that at least one of a group represented by $A_1$ and groups represented by $A_2$'s has a fluorine atom; and n represents an integer of from 2 to 4.

2. A positive photosensitive composition which is a photosensitive composition according to claim 1, further comprising (B) a resin that increases an solubility of the resin (B) in an alkaline developer by an action of an acid.

3. The positive photosensitive composition of claim 2, wherein the resin (B) has a fluorine atom.

4. The positive photosensitive composition of claim 3, wherein the resin (B) has a hexafluoroisopropanol structure.

5. The positive photosensitive composition of claim 2, wherein the resin (B) has a hydroxystyrene structural unit.

6. The positive photosensitive composition of claim 2, wherein the resin (B) is (Ba) a resin having a monocyclic or polycyclic alicyclic hydrocarbon structure.

7. The positive photosensitive composition of claim 6, wherein the resin (B) further has a repeating unit having a lactone structure.

8. The positive photosensitive composition of claim 6, which further comprises:

(Ha) a solvent comprising at least one cyclic ketone.

9. The positive photosensitive composition of claim 2, wherein the resin (B) has at least one repeating unit selected from a repeating unit represented by general formula (1), a repeating unit represented by general formula (2), and a repeating unit represented by general formula (3), wherein the resin (Baa) increases a solubility of the resin (Baa) in an alkaline developer by an action of an acid:

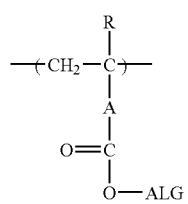   (1)

in which R represents a hydrogen atom or a methyl group;
A represents a single bond or a connecting group; and
ALG represents a group represented by any one of general formulae (pI) to (pV):

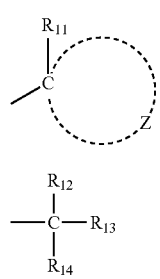

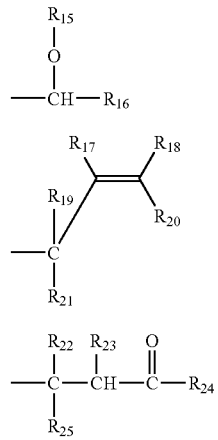

in which $R_{11}$ represents a methyl group, an ethyl group, an n-propyl group, an isopropyl group, an n-butyl group, an isobutyl group, or a sec-butyl group;

Z represents an atomic group necessary for forming an alicyclic hydrocarbon group together with a carbon atom;

$R_{12}$ to $R_{16}$ each independently represents a linear or branched alkyl group having from 1 to 4 carbon atoms or an alicyclic hydrocarbon group, with proviso that at least one of $R_{12}$ to $R_{14}$ and any one of $R_{15}$ and $R_{16}$ represents an alicyclic hydrocarbon group;

$R_{17}$ to $R_{21}$ each independently represents a hydrogen atom, a linear or branched alkyl group having from 1 to 4 carbon atoms or an alicyclic hydrocarbon group, with proviso that at least one of $R_{17}$ to $R_{21}$ represents an alicyclic hydrocarbon group and any one of $R_{19}$ and $R_{21}$ represents a linear or branched alkyl group having from 1 to 4 carbon atoms or an alicyclic hydrocarbon group; and $R_{22}$ to $R_{25}$ each independently represents a hydrogen atom, a linear or branched alkyl group having from 1 to 4 carbon atoms or an alicyclic hydrocarbon group, with proviso that at least one of $R_{22}$ to $R_{25}$ represents an alicyclic hydrocarbon group and $R_{23}$ and $R_{24}$ may be taken together to form a ring,

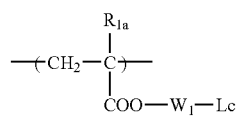   (2)

in which $R_{1a}$ represents a hydrogen atom or a methyl group;

$W_1$ represents a single bond, or a single group or a combination of two or more groups selected from the group consisting of an alkylene group, an ether group, a thioether group, a carbonyl group, and an ester group; and Lc represents a lactone residue represented by any one of general formulae (IV), (V-1) to (V-6) and (VI):

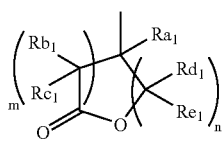 (IV)

in which $R_{a1}$, $R_{b1}$, $R_{c1}$, $R_{d1}$, and $R_{e1}$ each independently represents a hydrogen atom or an alkyl group having from 1 to 4 carbon atoms; and m and n each independently represents an integer of from 0 to 3, and (m+n) is from 2 to 6,

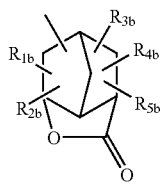 (V-1)

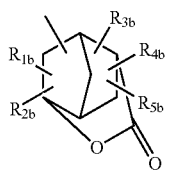 (V-2)

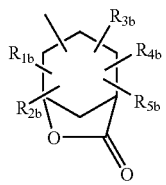 (V-3)

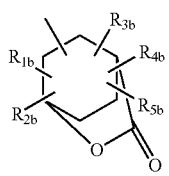 (V-4)

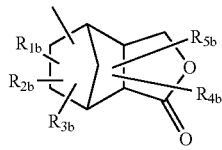 (V-5)

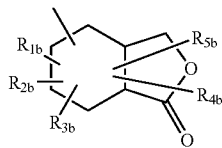 (V-6)

in which $R_{1b}$ to $R_{5b}$ each independently represents a hydrogen atom, an alkyl group, a cycloalkyl group, an alkenyl group, or $COOR_{6b}$, wherein $R_{6b}$ represents an alkyl group, and two of $R_{1b}$ to $R_{5b}$ may be taken together to form a ring, and

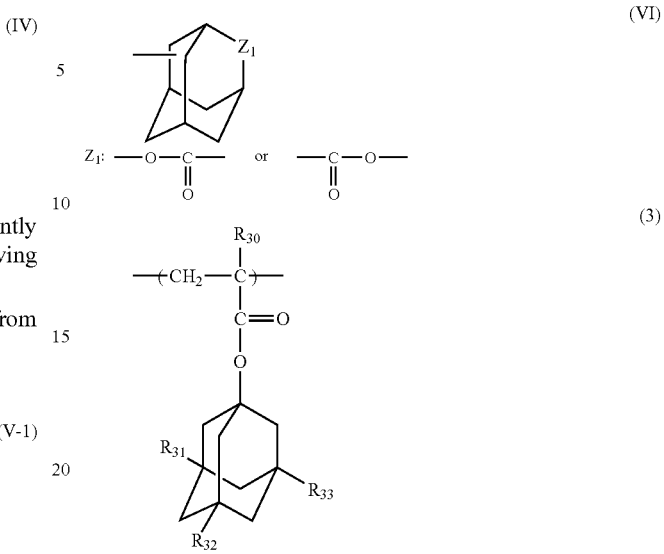

in which $R_{30}$ represents a hydrogen atom or a methyl group; and $R_{31}$ to $R_{33}$ each independently represents a hydrogen atom, a hydroxyl group or an alkyl group, with proviso that at least one of $R_{31}$ to $R_{33}$ represents a hydroxyl group.

10. The positive photosensitive composition of claim 9, wherein the resin (B) has a repeating unit represented by the general formula (1) and at least one repeating unit selected from a repeating unit represented by the general formula (2) and a repeating unit represented by the general formula (3).

11. The positive photosensitive composition of claim 9, wherein the resin (B) has a repeating unit represented by the general formula (1), a repeating unit represented by the general formula (2), and a repeating unit represented by the general formula (3).

12. The positive photosensitive composition of claim 2, which further comprises (C) a dissolution inhibiting compound that decomposes by an action of an acid and increases a solubility of the compound (C) in an alkaline developer, the compound (C) having a molecular weight of not more than 3,000.

13. A positive photosensitive composition which is a photosensitive composition according to claim 1, further comprising:
  (D) a resin soluble in an alkaline developer; and
  (C) a dissolution inhibiting compound that decomposes by an action of an acid and increases a solubility of the compound (C) in an alkaline developer, the compound (C) having a molecular weight of not more than 3,000.

14. A negative photosensitive composition which is a photosensitive composition according to claim 1, further comprising:
  (D) a resin soluble in an alkaline developer; and
  (E) an acid crosslinking agent that cross-links with the resin (D) by an action of an acid.

15. The photosensitive composition of claim 1, wherein in the general formula (I), $A_2$ represents an aliphatic group having a structure represented by general formula (II):

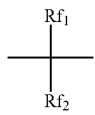 (II)

in which $Rf_1$ and $Rf_2$ each independently represents a hydrogen atom, a halogen atom, an alkyl group or a cycloalkyl group, with proviso that at least one of $Rf_1$ and $Rf_2$ represents a fluorine atom or a fluoroalkyl group.

16. The photosensitive composition of claim 1, wherein the compound (A) is one kind selected from a sulfonium salt compound of the sulfonic acid represented by the general formula (I), an iodonium salt compound of the sulfonic acid represented by the general formula (I), and an ester compound of the sulfonic acid represented by the general formula (I).

17. The photosensitive composition of claim 1, wherein each of —$SO_3H$'s in the sulfonic acid represented by the general formula (I) directly connects a carbon atom to which at least one of a fluorine atom and a fluoroalkyl group is directly connected.

18. The photosensitive composition of claim 1, which further comprises (A') a compound having one sulfonic acid group, the compound (A') generating a sulfonic acid by irradiation with one of an actinic ray and a radiation.

19. The photosensitive composition of claim 18, wherein the compound (A') is a monovalent perfluoroalkanesulfonic acid sulfonium salt.

20. The photosensitive composition of claim 1, which further comprises a mixed solvent of a solvent containing a hydroxyl group in its structure and a solvent not containing a hydroxyl group in its structure.

21. The photosensitive composition of claim 1, which further comprises at least one of (F) a basic compound and (G) at least one of a surfactant containing a fluorine atom, a surfactant containing a silicon atom and a surfactant containing a fluorine atom and a silicon atom.

22. The photosensitive composition of claim 21, wherein the basic compound (F) is at least one of (i) a compound having a structure selected from an imidazole structure, a diazabicyclo structure, an onium hydroxide structure, an onium carboxylate structure, a trialkylamine structure, an aniline structure, and a pyridine structure, (ii) an alkylamine derivative having at least one of a hydroxyl group and an ether bond and (iii) an aniline derivative having at least one of a hydroxyl group and an ether bond.

23. A pattern forming method comprising:
forming a film by using a photosensitive composition of claim 1;
exposing the film, so as to form a exposed film; and
developing the exposed film.

* * * * *